United States Patent
Jinta

(10) Patent No.: US 7,800,576 B2
(45) Date of Patent: Sep. 21, 2010

(54) SEMICONDUCTOR DEVICE, DISPLAY PANEL, AND ELECTRONIC APPARATUS

(75) Inventor: Seiichiro Jinta, Aichi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/457,570

(22) Filed: Jun. 16, 2009

(65) Prior Publication Data

US 2010/0007386 A1     Jan. 14, 2010

(30) Foreign Application Priority Data

Jul. 12, 2008     (JP) ............................. 2008-182115

(51) Int. Cl.
  *G09G 3/36*     (2006.01)
(52) U.S. Cl. .................. 345/100; 345/204; 326/83; 377/75
(58) Field of Classification Search ............... 326/88; 345/92, 98–100, 204–206, 214; 377/64–81; 327/142, 198, 200–218
See application file for complete search history.

(56) References Cited

U.S. PATENT DOCUMENTS

| | | | | |
|---|---|---|---|---|
| 5,517,543 A | * | 5/1996 | Schleupen et al. ............. | 377/79 |
| 6,091,393 A | * | 7/2000 | Park ........................... | 345/100 |
| 7,215,315 B2 | * | 5/2007 | Morosawa et al. .......... | 345/100 |
| 2003/0020520 A1 | * | 1/2003 | Miyake et al. ............... | 327/112 |
| 2006/0125518 A1 | * | 6/2006 | Morosawa et al. ............ | 326/38 |
| 2008/0079001 A1 | * | 4/2008 | Umezaki et al. .............. | 257/59 |
| 2009/0322716 A1 | * | 12/2009 | Azami et al. ................. | 345/204 |

FOREIGN PATENT DOCUMENTS

JP     2005-149624     6/2005

* cited by examiner

*Primary Examiner*—Rexford N Barnie
*Assistant Examiner*—Jany Tran
(74) *Attorney, Agent, or Firm*—Rader, Fishman & Grauer PLLC

(57) ABSTRACT

A single-channel thin-film transistor buffer includes a first output stage including first and second thin-film transistors connected in series, a seventh thin-film transistor having one main electrode connected to a control electrode of the first thin-film transistor (first control line), the other main electrode connected to a power source of the second thin-film transistor, and a control electrode connected to a second control line, an eighth thin-film transistor having one main electrode connected to a control electrode of the second thin-film transistor (second control line), the other main electrode connected to the power source of the second thin-film transistor, and a control electrode connected to the first control line, and an eleventh thin-film transistor having a control electrode connected to an output terminal of a second output stage connected in parallel with the first output stage and one main electrode connected to the first control line.

10 Claims, 126 Drawing Sheets k: EVEN NUMBER
N: INTEGER NUMBER

Ids-Vgs CHARACTERISTICS

Ids–Vgs CHARACTERISTICS

141

141

SEMICONDUCTOR DEVICE, DISPLAY PANEL, AND ELECTRONIC APPARATUS

BACKGROUND OF THE INVENTION

1. Field of the Invention

The present invention relates to a semiconductor device having a general-purpose buffer including single-channel thin-film transistors formed on an insulator substrate. The buffer is not limited to any particular application but finds a variety of applications as devices and products. The present invention also related to a display panel and an electronic apparatus.

2. Description of the Related Art

Through a low-temperature polysilicon (LTPS) process, a circuit can be produced based on both an n-channel metal oxide semiconductor (NMOS) type thin-film transistor (TFT) and a p-channel metal oxide semiconductor (PMOS) type TFT. A complementary metal oxide semiconductor (CMOS) circuit is thus typically manufactured based on the two types of thin-film transistors.

Since the CMOS circuit is composed of the two types of thin-film transistors, the number of process steps is increased. An increase in the number of process steps becomes one of the causes lowering production yield, and increasing manufacturing costs.

Even when a polysilicon process is used, a circuit having the same function as the CMOS is preferably constructed of single-channel thin-film transistors (either NMOS or PMOS thin-film transistors).

Such a single-channel circuit can find applications where amorphous silicon or organic semiconductor is used.

For example, amorphous silicon permits a circuit to be manufactured of an NMOS thin-film transistor only, and organic thin-film transistor permits a circuit be manufactured of a PMOS thin-film transistor only.

There is a need for a circuit made of a single-channel thin-film transistor only (either NMOS thin-film transistor or PMOS thin-film transistor) and able to execute the same function as a CMOS circuit.

A buffer is described in particular in this specification. The buffer is a widely used circuit finding a variety of applications. The buffer is thus not limited to any particular application. For convenience of explanation, however, the buffer is described below on the premise that the buffer is applied to a driver driving a display panel.

A buffer in the related art described below is applied as a driver for an active-matrix driving, organic electroluminescence (EL) panel as disclosed in Japanese Unexamined Patent Application Publication No. 2005-149624.

FIG. 1 illustrates a system configuration of an organic EL panel 1. The organic EL panel 1 illustrated in FIG. 1 includes a pixel array 3 on a panel substrate, a signal line driver 5, a first control line driver 7, and a second control line driver 9.

Sub pixels 11 are arranged in a matrix on the pixel array 3 in accordance with a display resolution. FIGS. 2 and 3 illustrate an equivalent circuit of the sub pixel 11. Each sub pixel 11 is constructed of NMOS thin-film transistors only.

As shown in FIGS. 2 and 3, N1 denotes a sampling transistor, N2 denotes a driver transistor, N3 denotes a light-on control transistor, and Cs denotes a hold capacitor. WSL denotes a write control line, LSL denotes a light-on control line, and PSL denotes a current supply line.

FIG. 2 illustrates a circuit operating in a drive method in which a light-on operation and a light-off operation of an organic EL element OLED are controlled in response to on-off control of the light-on control transistor N3.

FIG. 3 illustrates a circuit operating in a drive method in which the light-on operation and the light-off operation of the organic EL element OLED are controlled in response to a voltage change of the light-on control line LSL. Referring to FIG. 3, the light-on control line LSL also serves as a current supply line.

FIG. 4 is a timing diagram of a write operation in which a signal voltage Vsig (Data) is written onto the sub pixel 11 illustrated in FIGS. 2 and 3. FIG. 4 illustrates a drive waveform of a signal line DTL. The signal line DTL is supplied with the signal voltage Vsig responsive to pixel gradation Data. The magnitude of the signal voltage Vsig determines the magnitude of a drive current supplied by the driver transistor N2. The organic EL element OLED is a current driving element. The higher the drive current, the higher luminance results.

FIG. 4 also illustrates the write control line WSL. The sampling transistor N1 is conductive during a high-level period of the write control line WSL, and a voltage of the signal line DTL is written on a gate electrode of the driver transistor N2.

FIG. 4 also illustrates the light-on control line LSL. The light-on control line LSL is driven between a high level and a low level. With the voltage transition of the light-on control line LSL, the organic EL element OLED is switched between a light-on state and a light-off state.

The control amplitude of the light-on control line LSL is different from the sub pixel 11 illustrated in FIG. 2 to the sub pixel 11 illustrated in FIG. 3. As illustrated in FIG. 2, the light-on control line LSL simply drives the light-on control transistor N3. As illustrated in FIG. 3, the light-on control line LSL supplies an operating voltage to both the driver transistor N2 and the organic EL element OLED.

Referring to FIG. 4, after the write operation of the signal voltage Vsig, the organic EL element OLED is lit with the light-on control line LSL at a high level and the organic EL element OLED is extinguished with the light-on control line LSL at a low level.

A peak luminance level can be controlled by varying the duty factor of a light-on period to one field.

The light-on control line LSL (FIG. 4) is also used to adjust moving image characteristics. In order to adjust the moving image characteristics, the number of lightings and the timing of the light-on period within one field are adjusted.

A plurality of types of pulses are thus output from the second control line driver 9.

The pulses are then transferred in line-at-a-time scanning order in order to perform a typical ling-at-a-time scanning write operation on the active-matrix driving method.

More specifically, the control line driver has a function of permitting a pulse length of a control pulse to be freely set and a function of permitting the control pulse to be transferred to a next stage.

During the write operation of the signal voltage Vsig on the sub pixels 11 illustrated in FIGS. 2 and 3, a threshold offset operation and a mobility correction operation of the driver transistor N2 are also performed. FIG. 5 is a timing diagram of the sub pixel 11 illustrated in FIG. 2. It is noted that if the sub pixel 11 illustrated in FIG. 2 has the correction functions, the current supply line PSL is driven as illustrated in FIG. 5. FIG. 6 is a timing diagram of the sub pixel 11 illustrated in FIG. 3. The difference between the sub pixel 11 illustrated in FIG. 2 and the sub pixel 11 illustrated in FIG. 3 is related to whether an initialization operation is separated from light emission period control.

In the light emission period control, a duty factor of a light-on period to a light-off period is varied in order to adjust the peak luminance. Also in the light emission period control, the number of switchings between the light emission period and the light-off period within one field is modified. For these operations, the circuit structure of the second control line driver 9 become typically complex.

In the circuit structure illustrated in FIG. 2, the current supply line PSL for an initialization pulse for a preliminary timing of a threshold offset period is separated from the light-on control line LSL for the light-off period control pulse. The circuit structure illustrated in FIG. 2 is advantageous in view of simplification of a control interface. The circuit structure illustrated in FIG. 2 employs three control lines of the write control line WSL, the light-on control line LSL, and the current supply line PSL.

The threshold offset operation, the mobility correction operation, and a control operation of the sub pixel 11 including the light emission period control are described with reference to the pixel circuit illustrated in FIG. 3 in view of FIG. 6.

The control operation for the pixel circuit illustrated in FIG. 2 is generally similar to the control operation for the pixel circuit illustrated in FIG. 3 except that the initialization operation is separated from the light emission period control, and the discussion of the control operation for the pixel circuit illustrated in FIG. 2 is omitted here.

FIG. 6 illustrates the drive waveform of the signal at the write control line WSL. During a high level period of the write control line WSL, the sampling transistor N1 is conductive, and the voltage the signal line DTL is written on the gate electrode of the driver transistor N2.

The first high level period of the write control line WSL is used to correct variations of a threshold voltage value Vth of the driver transistor N2.

The second high level period of the write control line WSL is used to write the signal voltage Vsig responsive to the pixel gradation and to correct variations in mobility μ of the driver transistor N2.

The falling edge of the second high level period is sloped to set a mobility correction period optimum for all gradations ranging from the highest luminance level (high voltage signal) down to the lowest luminance level (low voltage signal).

The mobility correction operation is to correct a difference between the driver transistor N2 having a high mobility μ and the driver transistor N2 having a low mobility μ. A correction period is determined by the length of the high level period of the write control line WSL. The correction period becomes longer as the low luminance (low voltage signal) period is longer.

FIG. 6 also illustrates the drive waveform of the signal at the signal line DTL. The signal line DTL is supplied with voltages of the two levels. An offset voltage Vofs is used to offset the threshold value of the driver transistor N2. The signal voltage Vsig results in a pixel gradation. The magnitude of the signal voltage Vsig determines the drive current supplied by the driver transistor N2. The organic EL element OLED is a current driven element, and provides a higher luminance in response to a higher drive current.

FIG. 6 also illustrates the drive waveform of the signal at the light-on control line LSL. The light-on control line LSL is driven at either of the two levels of a high level and a low level. The first low level period of the light-on control line LSL serves as an initialization period. The second low level period serves as a light-off period subsequent to the start of light emission.

The initialization operation herein causes a gate-source voltage Vgs of the driver transistor N2 to be wider in voltage range than the threshold voltage value Vth. The initialization operation is performed prior to the execution of the threshold offset operation. The initialization operation is hereinafter referred to as a offset preparation operation.

Subsequent to the offset preparation operation, the gate electrode of the driver transistor N2 is supplied with the offset voltage Vofs and the voltage at the light-on control line LSL is transitioned to the high level. This operation related to voltage level is the threshold offset operation. When the threshold offset operation starts, a source voltage Vs of the driver transistor N2 gradually rises. At the moment the gate-source voltage Vgs of the driver transistor N2 reaches the threshold voltage value Vth, the source voltage Vs stops rising.

When the write operation of the signal voltage Vsig is completed, the light emission period starts and continues until a next write operation period. During the light emission period, the organic EL element OLED is lit with the light-on control line LSL at a high level and is extinguished with the light-on control line LSL at a low level. The peak luminance level is controlled by varying the duty factor of the length of the light-on period within one field.

FIG. 6 illustrates the signal voltage Vg appearing at the gate electrode of the driver transistor N2. Also, FIG. 6 illustrates the voltage Vs appearing at the source electrode of the driver transistor N2 (positive electrode of the organic EL element OLED).

As previously discussed, the write control signal at the write control line WSL and the light-on control signal at the light-on control line LSL illustrated in FIG. 6 become different in length depending on the purpose of driving operation.

For example, the write control signal at the write control line WSL becomes different in pulse length from the threshold offset operation to a signal write and mobility correction operation. The light-one control signal at the light-on control line LSL becomes different in pulse length from the threshold offset operation to the light-on/light-off control in the light emission period.

Each of the first control line driver 7 and the second control line driver 9 thus outputs pulses of a plurality of different pulse lengths. In the case of the line-at-a-time scanning typical of the active-matrix driving method, these pulse waveforms are transferred on a line-at-a-time scanning basis. This type of control line driver has to have the two functions, i.e., a function of setting freely the pulse length of the control pulse and a function of transferring the control pulse to the subsequent stage on a line-at-a-time scanning basis.

FIGS. 7-14 illustrate examples and driving operations of the control line driver satisfying the above-described condition. The control line driver here is composed of a shift register.

The shift register illustrated in FIG. 7 includes 2N cascaded shift stages SR(1)-SR(2N). Each shift stage uses output pulses from other shift stages present prior to and subsequent to the shift stage, and outputs a clock signal input thereto as an output pulse.

FIG. 8 illustrates drive pulse waveforms of the shift register. The pulse waveforms illustrated in FIG. 8 are caused by the shift register that is manufactured of NMOS thin-film transistors only.

FIG. 8 also illustrates the start pulse st for driving the first shift stage, an end pulse end for driving the 2N-th shift stage, and a clock signal ck1 for shift stages positioned at even-numbered stages.

FIG. 8 also illustrates a clock signal ck2 for shift stages positioned at odd-numbered stages, and an output pulse o1 of the shift stage SR(1). FIG. 8 also illustrates an output pulse o(k−1) of the shift stage SR(k−1) at the (k−1)-th stage. FIG. 8 also illustrates output pulses o at respective shift stages.

FIG. 9 illustrates an internal circuit example of the shift stage SR at the k-th stage. As illustrated in FIG. 9, thin-film transistors forming the shift stage SR are all NMOS types. The output of the shift stage NMOS SR includes thin-film transistors N11 and N12 connected in series between a power source voltage VSS and a clock input terminal. An intermediate junction point between the thin-film transistors N11 and N12 is connected to an output terminal. A auxiliary capacitance Cb1 is connected between the gate electrode of the thin-film transistor N11 and the power source voltage VSS. On the other hand, the auxiliary capacitance Cb2 is connected between the gate electrode of the thin-film transistor N12 and the clock input terminal. The auxiliary capacitance Cb2 assists in a bootstrap operation.

FIG. 10 illustrates the relationship of input and output pulses and voltages at nodes A and B of the shift stage SR. FIG. 10 also illustrates the waveforms of a clock signal ck, a first drive pulse in(k)(output pulse out(k−1) of the immediately preceding shift stage), and a second drive pulse in2(k) (output pulse out(k+1) of the immediately subsequent shift stage). FIG. 10 also illustrates the waveforms of a voltage at node B (control line voltage of the thin-film transistor N11), a voltage at node A (control line voltage of the thin-film transistor N12), and an output pulse out appearing at the output terminal.

Referring to FIG. 10, the voltages at nodes A and B are complementarily switched at each of the timing of the rising edge of the high level of the first drive pulse in1(k) and the timing of the rising edge of the high level of the second drive pulse in2(k).

This complementary operation is performed by thin-film transistors N13-N16.

With the first drive pulse in1(k) at the high level and the first drive pulse in2(k) at the low level, the thin-film transistors N13 and N14 are conductive and the thin-film transistors N15 and N16 are non-conductive. With the first drive pulse in1(k) at the low level and the first drive pulse in2(k) at the high level, the thin-film transistors N13 and N14 are non-conductive and the thin-film transistors N15 and N16 are conductive.

The auxiliary capacitance Cb2 is charged with the node A at the high level. The output pulse out(k) is transitioned to the high level with the node A at the high level at the timing the clock signal ck is transitioned to the high level. The voltage at the node A is raised by a charge voltage of the auxiliary capacitance Cb2. The gate-source voltage Vgs of the thin-film transistor N12 is maintained at a voltage equal to or higher than the threshold voltage value Vth in accordance with the bootstrap operation. The voltage waveform of the output pulse out(k) is identical to the voltage waveform of the clock signal ck.

The shift register illustrated in FIG. 7 picks up the clock signal ck from the shift stages, starting with the first shift stage and then outputs the clock signal ck. The variable range of the pulse width of the output pulse out is thus limited to a range of 1 H (horizontal scanning period) within which the pulse width of the clock signal ck is variable.

The shift register can transfer a plurality of pulse signals within the 1 H period.

FIG. 11 illustrates a transfer operation with the clock signal ck containing two pulses. The waveforms illustrated in FIG. 11 respectively correspond to the waveform diagrams illustrated in FIG. 8.

FIG. 12 illustrates the drive waveforms of the signals at the shift stage SR, respectively corresponding to the waveforms illustrated in FIG. 10. Referring to FIG. 12, the bootstrap operation is also performed with the two pulses.

The shift register illustrated in FIG. 7 can reproduce the same waveform in the output pulse by adjusting the rising rate and the falling rate of the clock signal ck.

FIG. 13 illustrates a transfer operation when a trapezoidal clock signal ck is input as the clock signal ck. The drive waveforms illustrated in FIG. 13 correspond to the drive waveforms illustrated in FIG. 8.

FIG. 14 illustrates the drive waveforms of the shift register. The drive waveforms illustrated in FIG. 14 respectively correspond to the drive waveforms illustrated in FIG. 10. The bootstrap operation is performed in accordance with the same trapezoidal waveform as the clock signal ck and the output pulse out has the same trapezoidal waveform.

SUMMARY OF THE INVENTION

The thin-film transistors N11 and N12 forming the output stage of the shift register discussed with reference to FIG. 7 (FIG. 9) operate in a complementary fashion. This arrangement inhibits a through-current from flowing in the output stage, thereby leading to a low power consumption.

In the shift register illustrated in FIG. 7 (FIG. 9), however, the clock signal ck is output as is as an output clock (transfer clock). As illustrated in FIG. 15, a buffer 21 supplying the first control line driver 7 (shift register) with a clock signal has a driving power for driving all the pixels as a supply target of the output pulse.

On the other hand, a buffer 23 supplying the first control line driver 7 with the start pulse st and the end pulse end simply drives the SR stages only in the shift register.

For this reason, the buffer 21 becomes naturally larger in circuit size than the buffer 23.

Although the power consumption of the shift register (first control line driver 7) illustrated in FIG. 7 (FIG. 9) is low, power consumed by the buffer 21 positioned prior to the first control line driver 7 is increased.

Moreover, the clock signal ck drives all the pixels present at a horizontal line as previously discussed. The pixel size in the buffer 21 becomes large as the number of pixels arranged along a horizontal line increases and the load of each pixel becomes high. The power consumption is thus increased.

Control line drivers (semiconductor device) presently proposed have a technical problem to be overcome. The inventor of the present invention thus proposes a buffer having a circuit structure that drives a high drive load even with a low driving power of a front section.

The inventor proposes a buffer of a semiconductor device having single-channel thin-film transistors formed on an insulator substrate. The buffer has a structure described below.

The buffer includes:

(a) a first output stage including a first thin-film transistor and a second thin-film transistor connected in series with the first thin-film transistor, the first output stage having as an output terminal as an intermediate junction point between the first thin-film transistor and the second thin-film transistor, (b) a first input stage including a third thin-film transistor and a fourth thin-film transistor connected in series with the third thin-film transistor with the third thin-film transistor controlled by a set pulse and the fourth thin-film transistor controlled by a reset pulse, the first input stage controlling a voltage status of a first control line connected to a control electrode of the first thin-film transistor in response to a voltage appearing at an intermediate junction point between the third thin-film transistor and the fourth thin-film transistor so that the voltage status of the first control line is switched between a period from an application start timing of the set pulse to an application start timing of the reset pulse and the remaining period, (c) a second input stage including a sixth thin-film transistor and a fifth thin-film transistor connected in series with the sixth thin-film transistor with the six thin-film transistor controlled by the set pulse and the fifth thin-film transistor controlled by the reset pulse, the second input stage controlling a voltage status of a second control line connected to a control electrode of the second thin-film transistor in response to a voltage appearing at an intermediate junction point between the fifth thin-film transistor and the sixth thin-film transistor so that the voltage status of the second control line is switched in reverse phase to the voltage change of the first control line, (d) a seventh thin-film transistor having one main electrode connected to the first control line, the other main electrode connected to a power source commonly shared by the second, fourth, and sixth thin-film transistors, and a control electrode connected to the second control line, (e) an eighth thin-film transistor having one main electrode connected to the second control line, the other main electrode connected to the power source commonly shared by the second, fourth, and sixth thin-film transistors, and a control electrode connected to the first control line, (f) a second output stage including a ninth thin-film transistor and a tenth thin-film transistor connected in series with the ninth thin-film transistor with the ninth thin-film transistor having a control electrode connected to the first control line and the tenth thin-film transistor having a control electrode connected to the second control line, the second output stage supplying a voltage appearing at an intermediate junction point between the ninth thin-film transistor and the tenth thin-film transistor to a third control line, and (g) an eleventh thin-film transistor having one main electrode connected to the first control line, and a control electrode connected to the third control line, the eleventh thin-film transistor supplying to the first control line a voltage at the same logical level as the set pulse for a period throughout which an output pulse appears at the output terminal.

Each of the set pulse and the reset pulse may be smaller in amplitude than the output pulse appearing at the output terminal. With a small-amplitude input pulse, a front section consumes less power.

The set pulse and the reset pulse may be supplied by respective shift registers. With a shift register for the set pulse and a shift register for the reset pulse, the semiconductor device finds applications where a large number of loads are driven at a high speed.

The output pulse from the buffer may control a sampling timing on a display panel.

The output pulse of the buffer may control a current supplying line on the display panel.

The output pulse of the buffer may control a light-on operation of a self-luminous type display panel so that the period from the application start timing of the set pulse to the application start timing of the reset pulse results in the length of each light emission period falling within one field period.

In the above-described buffer, one main electrode of the first thin-film transistor may receive a pulse signal that generates a plurality of output pulses within the period from the application start timing of the set pulse to the application start timing of the reset pulse. This arrangement permits complex pulse control.

In the above-described buffer, the ninth thin-film transistor may be diode-connected. This arrangement eliminates a power source line connected to one main electrode of the ninth thin-film transistor, thereby reducing a layout area for the buffer.

The semiconductor device having the above-described buffer may form part of a driver forming a pixel array.

According to one embodiment of the present invention, an electronic apparatus includes a display panel. The electronic apparatus includes the pixel array, a system controller controlling operation of the entire system of the apparatus, and an operation input unit for the system controller.

In the buffer, the output voltages of the first and second input stages are supplied to the control electrodes of the first and second thin-film transistors forming the output stage. The driving targets of the set pulse and the reset pulses are the thin-film transistors forming the first and second input stages. A small-driving power source supplying the set pulse and the reset pulse suffices.

The use of the first and second input stages allows the voltage status of the control electrodes of the first and second thin-film transistors forming the output stage to be maintained during a period throughout which the set pulse and the reset pulse at an effective level are not applied. Even when a current load is connected to the output stage, the voltage of the output pulse is continuously maintained.

With the seventh and eighth thin-film transistors employed, the voltage of the one control line can fix the voltage of the other control line to an ideal off voltage. As a result, the through current at the output stage is reliably controlled. Since the voltage of the control line is fixed, the buffer becomes robust to signals incoming from outside. Operational reliability of the semiconductor device is thus increased.

The buffer thus constructed includes the first output stage and the second output stage connected in parallel with the first output stage. The operation of the eleventh thin-film transistor is controlled by an output pulse of the same phase as an output pulse appearing at the first output terminal. One main electrode of the eleventh thin-film transistor is connected to the first control line. The first control line is thus fixed to an ideal on voltage for a duration of time throughout which the output pulse appears at the output terminal. The buffer becomes robust to signals incoming from outside. Operational reliability of the semiconductor device is thus increased.

DESCRIPTION OF THE PREFERRED EMBODIMENTS

Figure 1:
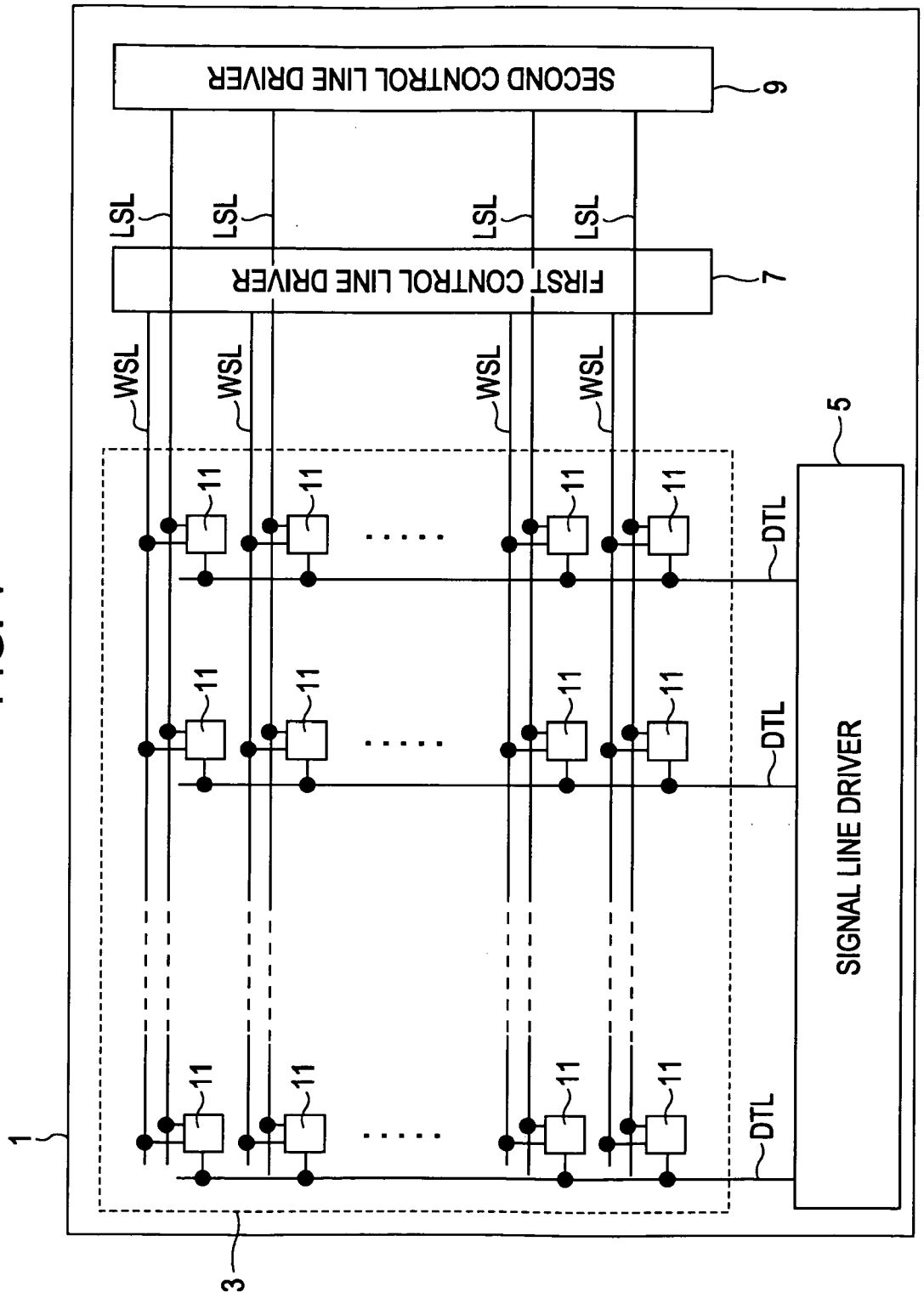
FIG. 1 illustrates a system configuration of an organic EL panel.

The present invention proposed herein is applied to a driver in an active-matrix display panel.

Techniques publicly disclosed in the technical field of the invention apply in an area not illustrated in the drawings nor described in this specification.

The embodiments of the present invention are described for exemplary purposes only and the present invention is not limited to the embodiments described herein.

Figure 16:
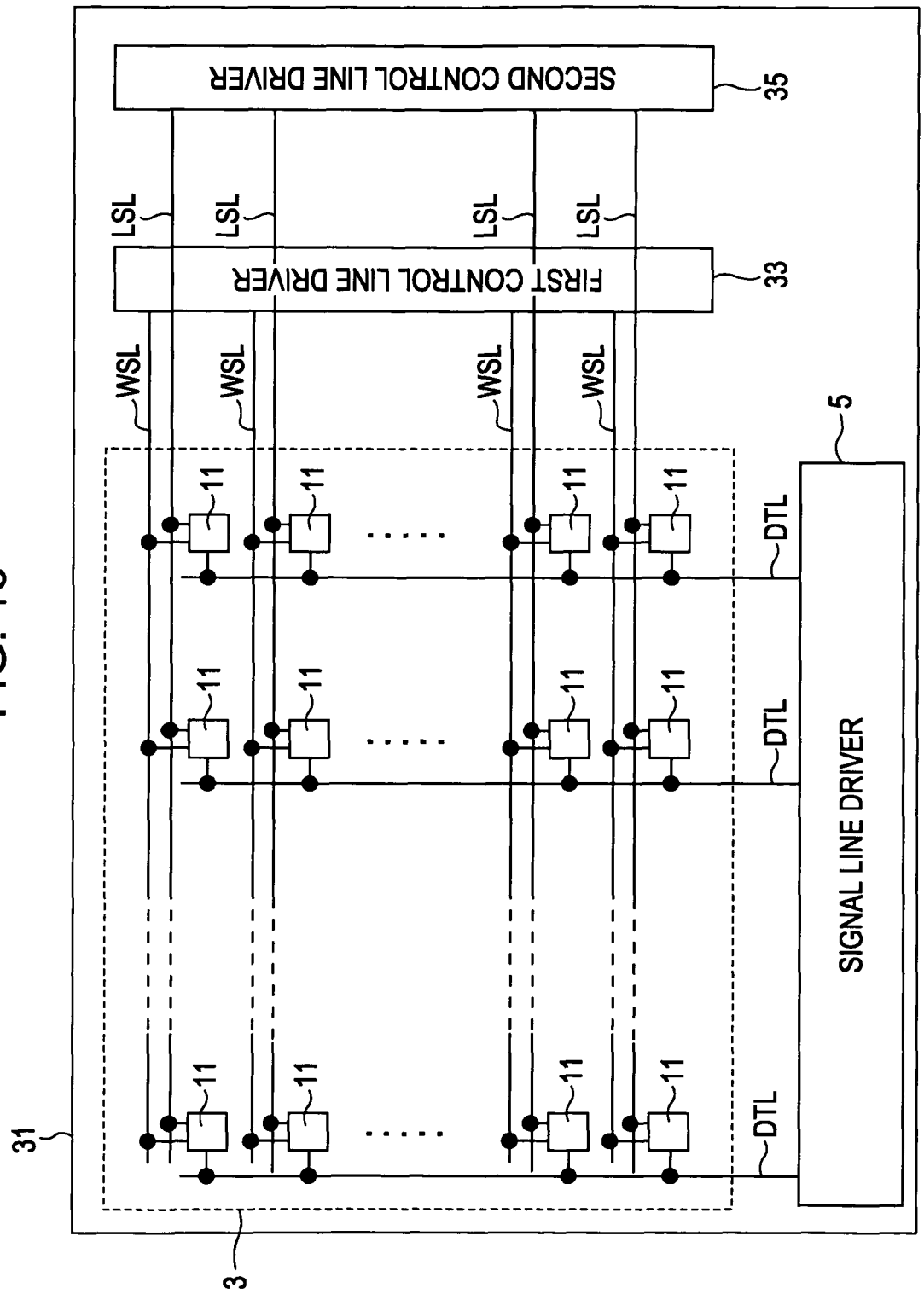
FIG. 16 illustrates a system configuration of an organic EL panel according to one embodiment of the present invention.

An organic electroluminescence (EL) panel 31 is described below as one embodiment of the present invention. FIG. 16 illustrates a system configuration of the EL panel 31 of the present embodiment. As illustrated in FIG. 16, elements identical to those illustrated in FIG. 1 are designated with the same reference numerals.

The EL panel 31 includes a pixel array 3 on a panel substrate, a signal line driver 5, a first control line driver 33, and a second control line driver 35.

A buffer of one embodiment of the present is included in the first control line driver 33 and the second control line driver 35, each transferring a drive pulse in a vertical direction.

Figure 17:
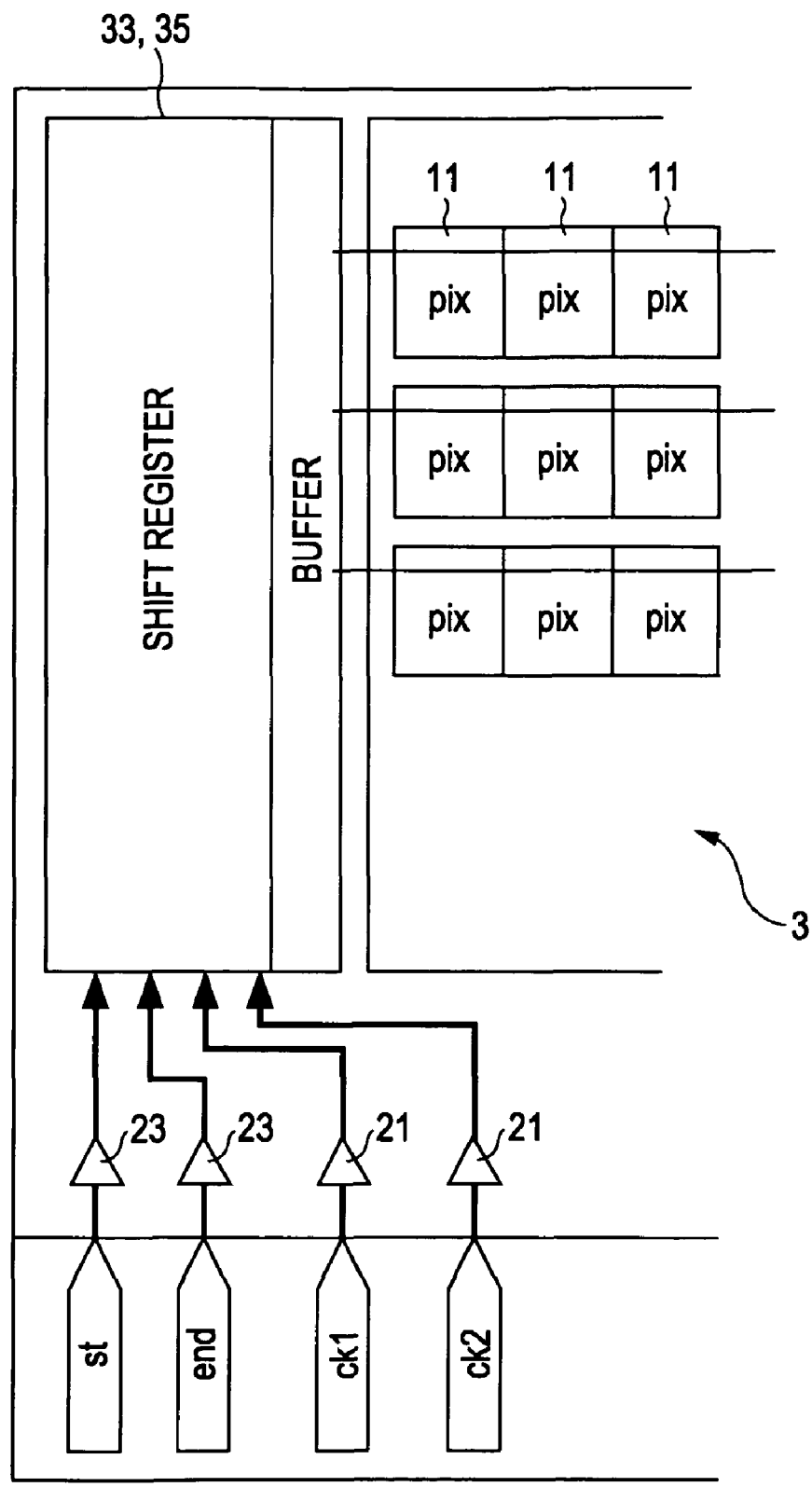
FIG. 17 illustrates a panel structure in which a buffer of one embodiment of the present invention is used in the driver.

Referring to FIG. 17, the first control line driver 33 (35) having a two-stage structure includes a shift register for transferring the pulse signal in accordance with a clock signal, and a buffer for driving a control line in response to the pulse signal.

As will be described later, the buffer of the present embodiment uses the output of the shift register as a set pulse and a reset pulse. It suffices if the output pulse of the shift register can drive the buffer rather than all the sub pixels 11 connected to the control line.

It is sufficient if the buffer 21 for the clock signal placed at a stage prior to the shift register has a drive power as high as the buffer 23 for a start pulse st and an end pulse.

According to the present embodiment, the set pulse provides a switching timing at which the voltage of the output pulse of the buffer is switched to a set voltage.

The reset pulse provides a switching timing at which the voltage of the output pulse of the buffer is switched to a reset voltage.

Figure 18:
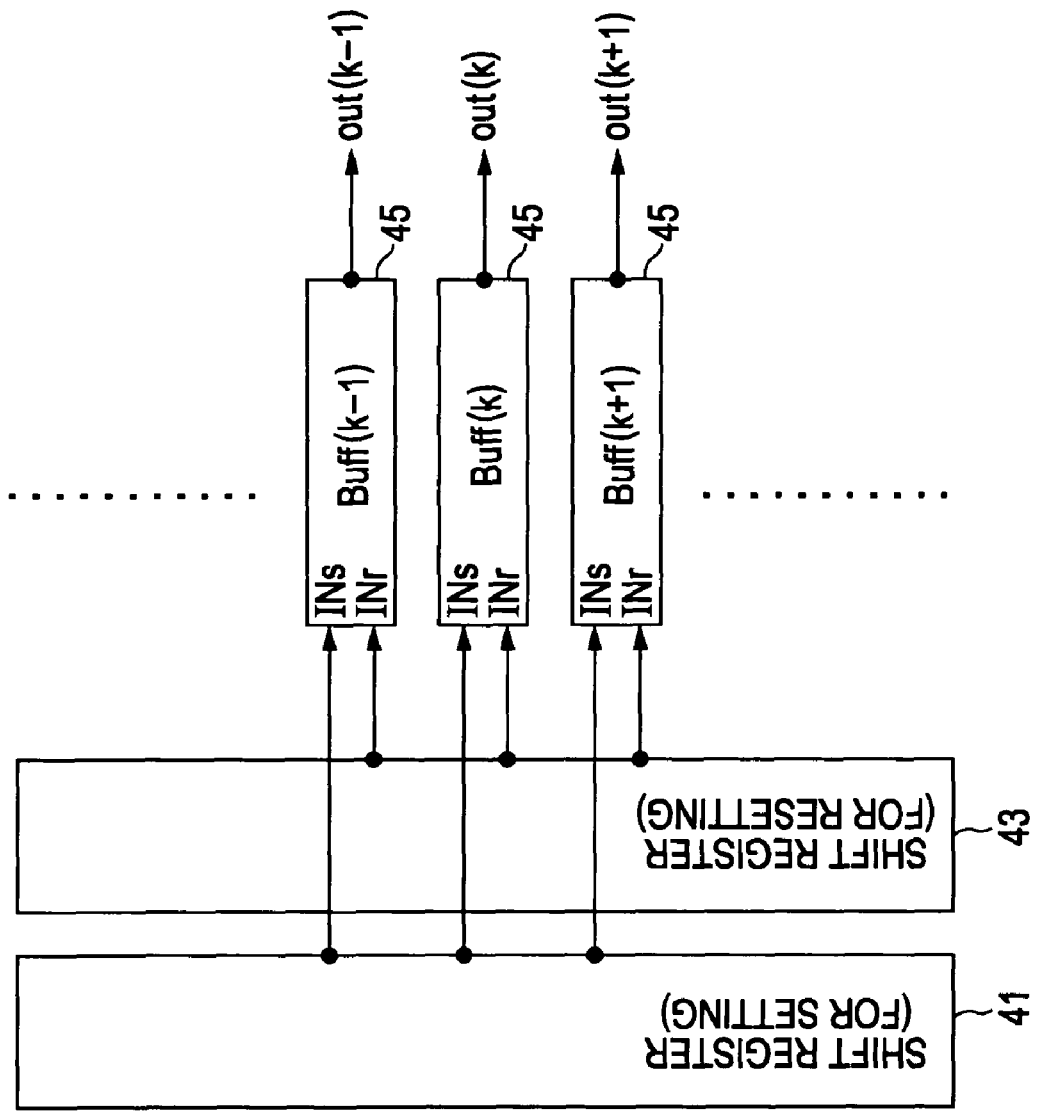
FIG. 18 is a circuit structure of a control line driver.

FIG. 18 illustrates a control line driver composed of NMOS thin-film transistors only.

The control line driver illustrated in FIG. 18 includes a shift register 41 for transferring the set pulse, a shift register 43 for transferring the reset pulse, and buffers 45 performing a complementary operation in response to the set pulse and the reset pulse output from each shift stage.

The buffer 45 outputs a high-level voltage (set voltage) in response to the inputting of the set pulse and a low-level voltage (reset voltage) in response to the inputting of the reset pulse.

Figure 19:
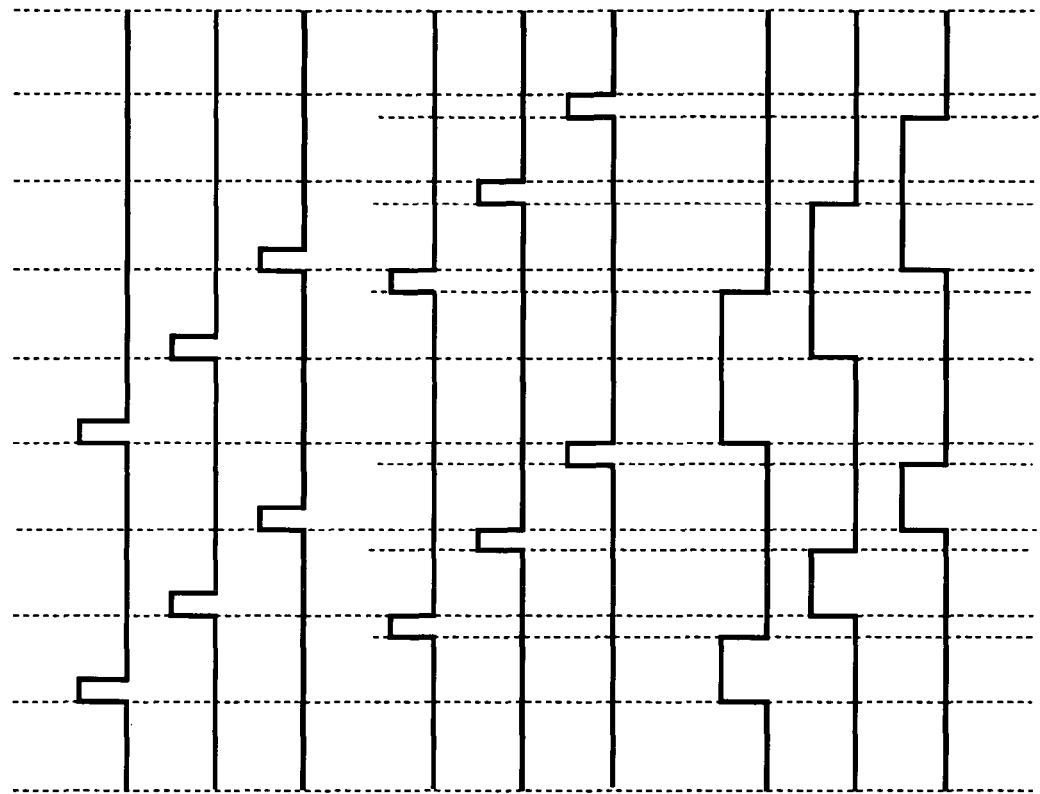
FIG. 19 illustrates drive waveforms of an NMOS control line driver according to one embodiment of the present invention.

FIG. 19 illustrates drive pulse waveforms of the control line driver, namely, outputs pulses scan1 of the shift register 41 for transferring the set signal. FIG. 19 also illustrates output pulses scan2 of the shift register 43 for transferring the reset signal. FIG. 19 also illustrates output pulses out of the buffer 45.

The pulsewidth of the output pulse out of the buffer 45 equals a time difference between the input timings of the set pulse and the reset pulse input to the buffer 45. By controlling a transfer interval between the set pulse and the reset pulse, the pulsewidth of the output pulse out of the buffer 45 can be freely set.

Embodiments of the buffer 45 are described below.

Embodiment 1

Figure 20:
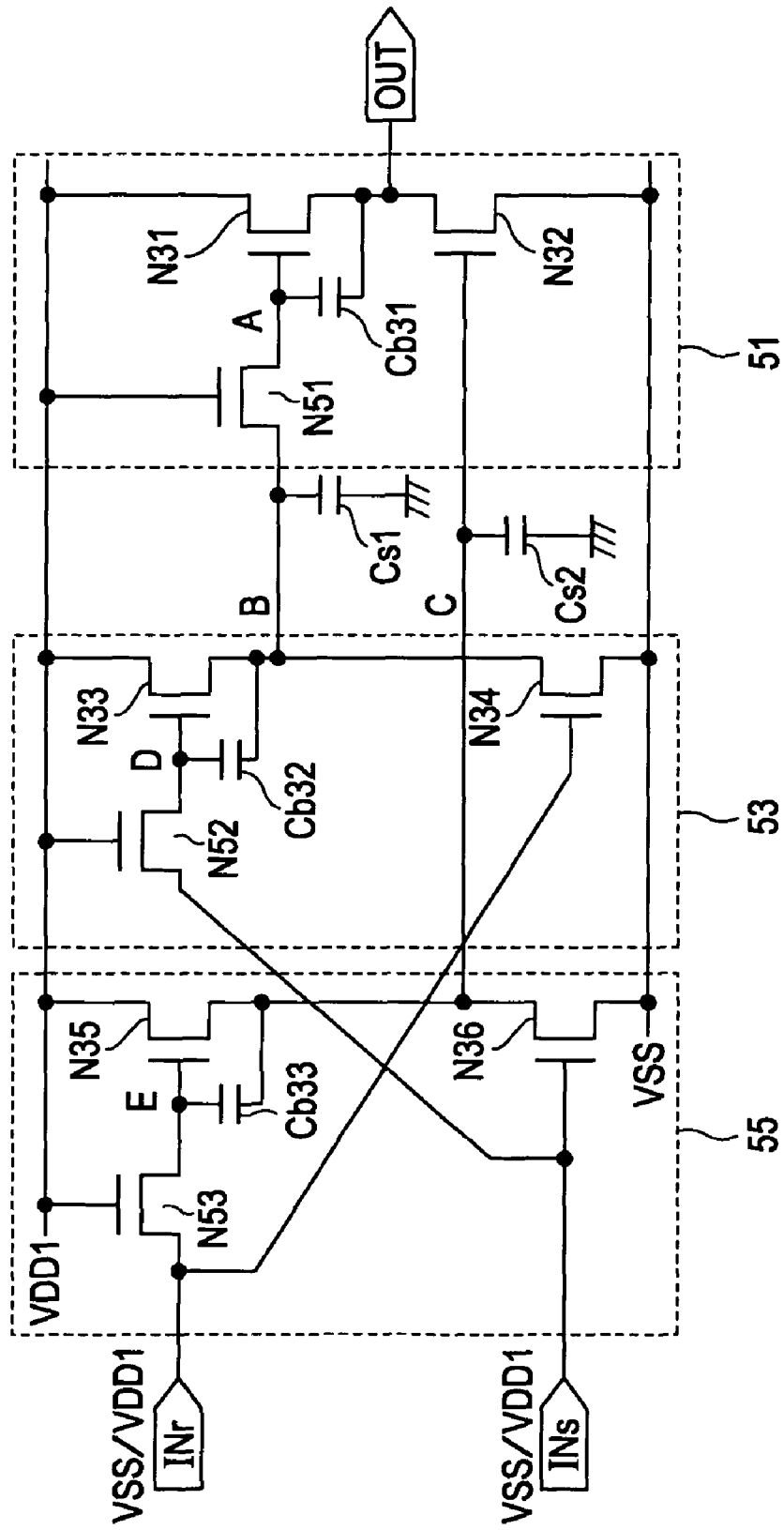
FIG. 20 is a circuit diagram of a buffer according to one embodiment of the present invention.
Figure 21:
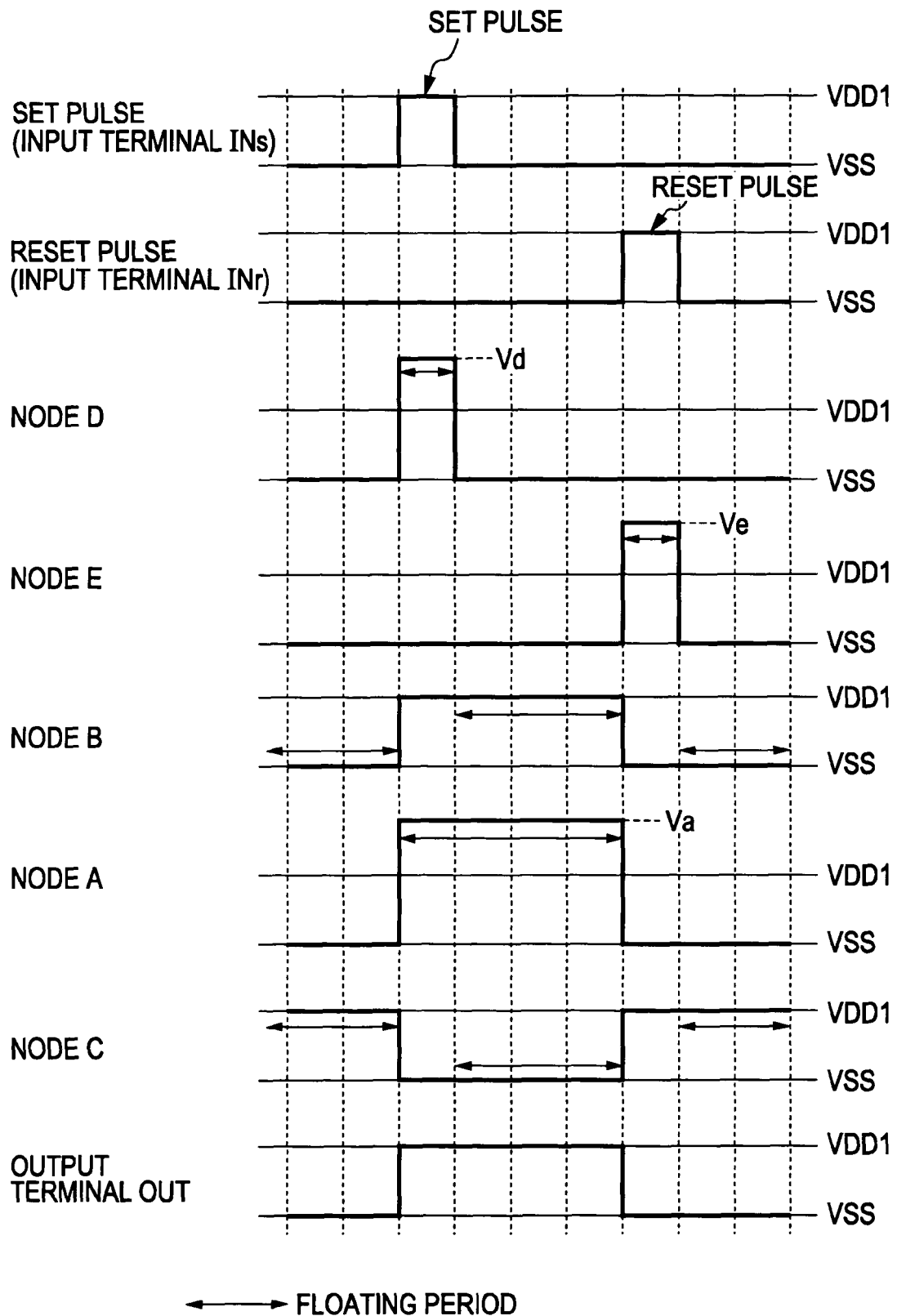
FIG. 21 illustrates drive waveforms of the buffer illustrated in FIG. 20.

FIG. 20 illustrates the buffer 45 as an embodiment 1 of the present invention, and FIG. 21 illustrates drive waveforms of the buffer 45.

The buffer 45 illustrated in FIG. 20 includes an output stage 51, a first input stage 53, and a second input stage 55.

The output stage 51 includes NMOS thin-film transistors N31 and N32 connected in series between a high power-source voltage VDD1 and a low power-source voltage VSS. The thin-film transistor N31 is connected to the first high power-source voltage VDD1. The thin-film transistor N32 is connected to the low power-source voltage VSS. The intermediate junction point between the thin-film transistors N31 and N32 serves as an output terminal OUT of the buffer 45.

In this embodiment, a bootstrap auxiliary capacitance Cb31 is connected between the gate electrode of the thin-film transistor N31 and the output terminal. If the gate capacitance of the thin-film transistor N31 is sufficiently high, the bootstrap auxiliary capacitance Cb31 is not necessary.

The output stage 51 includes a thin-film transistor N51 that absorbs a voltage difference between a gate voltage Vg at the bootstrap operation of the thin-film transistor N31 and an output voltage of the first input stage 53. The NMOS thin-film transistor N51 has one main electrode connected to a gate electrode (node A as a control line) of the thin-film transistor N31 and the other main electrode connected to a node B serving as a control line. The gate electrode of the thin-film transistor N51 is connected the first high power-source voltage VDD1.

The node B connects to a capacitance Cs1 for holding a voltage (hereinafter referred to as "hold capacitance"). Similarly, the gate electrode of the thin-film transistor N32 (node C as a control line) connects to a hold capacitance Cs2. If the nodes B and C have small wiring capacitance values, the hold capacitances serve as a supplement. These auxiliary capacitances reduce variations in the node voltage. Such variations may cause erratic operations including an off-leak current in the thin-film transistor and an interference signal incoming via a wiring capacitance.

Each of the first input stage 53 and the second input stage 55 is generally identical in circuit structure to the output stage 51.

The circuit structure of the first input stage 53 is described below. The first input stage 53 includes the NMOS thin-film transistors N33 and N34 connected in series between the first high power-source voltage VDD1 and the low power-source voltage VSS. The thin-film transistor N33 is connected to the first high power-source voltage VDD1 and the thin-film transistor N34 is connected the low power-source voltage VSS. An intermediate junction point between the NMOS thin-film transistors N33 and N34 serves as an output terminal and is connected to the node B.

A bootstrap auxiliary capacitance Cb32 is connected between the gate electrode of the thin-film transistor N33 and the output terminal. If the gate capacitance of the thin-film transistor N33 is sufficiently high, the bootstrap auxiliary capacitance Cb32 is not necessary. The output stage 53 includes a thin-film transistor N52 that absorbs a voltage difference between a gate voltage Vg at the bootstrap operation of the thin-film transistor N33 and a voltage appearing at the input terminal INs of the set pulse. The NMOS thin-film transistor N52 has one main electrode connected to a gate electrode (node D as a control line) of the thin-film transistor N33 and the other main electrode connected to the input terminal INs of the set pulse. The gate electrode of the thin-film transistor N52 is connected to the first high power-source voltage VDD1.

The gate electrode of the thin-film transistor N34 is connected to an input terminal INr for the reset pulse. The first input stage 53 is thus controlled by the set pulse and the reset pulse.

The circuit structure of the second input stage 55 is described below. The second input stage 55 includes NMOS thin-film transistors N35 and N36 connected in series between the first high power-source voltage VDD1 and the low power-source voltage VSS. The thin-film transistor N35 is connected to the first high power-source voltage VDD1 and the thin-film transistor N36 is connected to the low power-source voltage VSS. An intermediate junction point between NMOS thin-film transistors N35 and N36 serves as an output terminal and is connected the node C.

A bootstrap auxiliary capacitance Cb33 is connected between the gate electrode and the output terminal of the thin-film transistor N35. If the gate capacitance of the thin-film transistor N35 is sufficiently high, the bootstrap auxiliary capacitance Cb33 is not necessary.

The output stage 55 includes a thin-film transistor N53 that absorbs a voltage difference between a gate voltage Vg at the bootstrap operation of the thin-film transistor N35 and a voltage appearing at the input terminal INr of the reset pulse.

The NMOS thin-film transistor N53 has one main electrode connected to the gate electrode (node E as a control line) of the thin-film transistor N35 and the other main electrode connected to the input terminal INr of the reset pulse. The gate electrode of the thin-film transistor N53 is connected to the first high power-source voltage VDD1.

The gate electrode of the thin-film transistor N36 is connected to the input terminal INs of the set pulse. A connection relation of the second input stage 55 to the set pulse and the reset pulse is reversal to the connection relation of the first input stage 53 to the set pulse and the reset pulse.

A boot gain gb of each of the thin-film transistors N31, N33, and N35 is calculated in accordance with the following equation:

$$gb=(Cg+Cb)/(Cg+Cb+Cp)$$

where Cg represents the gate capacitance of each thin-film transistor, Cb represents the bootstrap auxiliary capacitance connected to the gate electrode of each thin-film transistor, and Cp represents the parasitic capacitance (wiring capacitance excluding Cg and Cb) of at each of the nodes A, D, and E.

The presence of the parasitic capacitance Cp is a cause of degradation of the bootstrap gain. As previously discussed, increasing the bootstrap gain by using the bootstrap auxiliary capacitance is useful in order to assure a reliable on operation of each thin-film transistor.

The relationship of a voltage status of each of the set pulse and the reset pulse to a voltage status at each node is described below with reference to FIG. 21.

FIG. 21 illustrates the voltage statuses of the set pulse at the input terminal INs and the reset pulse at the input terminal INr.

FIG. 21 also illustrates the voltage status of the gate electrode (node D) of the thin-film transistor N33.

FIG. 21 further illustrates the voltage statuses of the gate electrode of the thin-film transistor N35 (node E), the control line (node B) connected to the output terminal of the first input stage 53, and the gate electrode of the thin-film transistor N31 (node A). FIG. 21 further illustrates the voltage statuses of the control line (node C) connected to the output terminal of the second input stage 55, and the output terminal OUT of the output stage 51.

Referring to FIG. 21, a signal amplitude of the set pulse (input terminal INs) is given between the two values VSS and VDD1. A signal amplitude of the reset pulse (input terminal INr) is given between the two values VSS and VDD1. The pulse signals supplied from the shift registers 41 and 43 have the same levels as the two power source voltages supplied to the buffer 45.

In accordance with the present embodiment, the timing of the rising edge of the set pulse rising to a high level is defined as a timing that matches the timing of the rising edge of the output pulse appearing at the output terminal of the output stage 51. On the other hand, the timing of the rising edge of the reset pulse rising to a high level is defined as a timing that matches the timing of the falling edge of the output pulse appearing at the output terminal of the output stage 51. Referring to FIG. 21, the set pulse rises to the high level first, then followed by the rising of the reset pulse to the high level with a delay.

The node D of the first input stage 53 rises at the timing the set pulse rises to the high level. In this way, the thin-film transistor N33 becomes conductive, raising the voltage at the node B as illustrated in FIG. 21.

As the voltage at the node B rises, the gate voltage of the thin-film transistor N33 (voltage at the node D) rises by a voltage excursion responsive to a charge accumulated on the bootstrap auxiliary capacitance Cb32. The resulting voltage subsequent to the voltage rising becomes Vd. With the voltage Vd satisfying Vd−VDD1>Vth(N33), the voltage at the node B becomes the first high power-source voltage VDD1 with the thin-film transistor N33 being conductive as illustrated in FIG. 21.

If the node B rises to the first high power-source voltage VDD1 as previously discussed, the node A also rises to a high level. The thin-film transistor N31 becomes conductive, thereby raising the voltage at the output terminal OUT as illustrated in FIG. 21.

As the voltage of the output terminal OUT rises, the gate voltage of the thin-film transistor N31 (voltage at the node A) rises by a voltage excursion responsive to a charge accumulated on the bootstrap auxiliary capacitance Cb31 as illustrated in FIG. 21. The resulting voltage subsequent to the voltage rising becomes Va. With the voltage Va satisfying Va−VDD1>Vth(N31), the voltage at the output terminal OUT becomes the first high power-source voltage VDD1 with the thin-film transistor N31 being conductive as illustrated in FIG. 21.

During the high level period of the set pulse, the thin-film transistor N36 also remains conductive. For this reason, the gate voltage of the thin-film transistor N32 (voltage at the node C) forming the output stage 51 is controlled to the low power-source voltage VSS as illustrated in FIG. 21.

The set pulse then is transitioned from the high level to the low level. The hold capacitances Cs1 and Cs2 are respectively connected to the nodes B and C, and the voltage with the set pulse at the high level is thus maintained. This voltage status is maintained until the reset pulse is subsequently transitioned from the low level to the high level.

With the reset pulse transitioned to the high level (at the input terminal INr in FIG. 21), the thin-film transistor N35 becomes conductive, raising the voltage at the node C as illustrated in FIG. 21. As the voltage at the node C rises, the gate voltage of the thin-film transistor N35 (voltage at the node E) rises by a voltage excursion responsive to a charge accumulated on the bootstrap auxiliary capacitance Cb33 (voltage the node E illustrated in FIG. 21). The resulting voltage subsequent to the voltage rising becomes Ve. With the voltage Ve satisfying Ve−VDD1>Vth(N35), the voltage at the node C becomes the first high power-source voltage VDD1 with the thin-film transistor N35 being conductive as illustrated in FIG. 21.

If the node C rises to the first high power-source voltage VDD1 as previously discussed, the thin-film transistor N32 becomes conductive, transitioning the voltage at the output terminal OUT down to the low power-source voltage VSS (voltage at the output terminal OUT illustrated in FIG. 21).

During the high level period of the reset pulse, the thin-film transistor N34 also remains conductive. For this reason, the gate voltage at the node B is controlled to the low power-source voltage VSS (voltage at the node B illustrated in FIG. 21). Along with the operation, the gate voltage of the thin-film transistor N31 forming the output stage 51 (voltage at the node A) is also transitioned to the low power-source voltage VSS.

The reset pulse is then transitioned from the high level to the low level. The hold capacitances Cs1 and Cs2 are respectively connected to the nodes B and C, and the voltage with the reset pulse at the high level is thus maintained. This voltage status is maintained until the set pulse is subsequently transitioned from the low level to the high level.

In the buffer 45, the output pulse rises to the high level at the timing the set pulse rises to the high level and then falls at the timing the reset pulse rises to the high level.

As described above, the use of the buffer 45 thus constructed limits the load to be driven by the set pulse and the reset pulse to the gate capacitances of the thin-film transistors N33, N36, N34 and N35. The source of the set pulse and the reset pulse with a low driving power can still function. The power consumption of the source of the drive pulses is thus reduced.

With the first and second input stages, the control lines (nodes A and C) of the thin-film transistors N31 and N32 forming the output stage 51 are continuously supplied with the voltages for a duration of time throughout which the set pulse and the reset pulse remain at the low level. The voltage of the output pulse is thus maintained even with the current load connected to the output stage 51.

Figure 2:
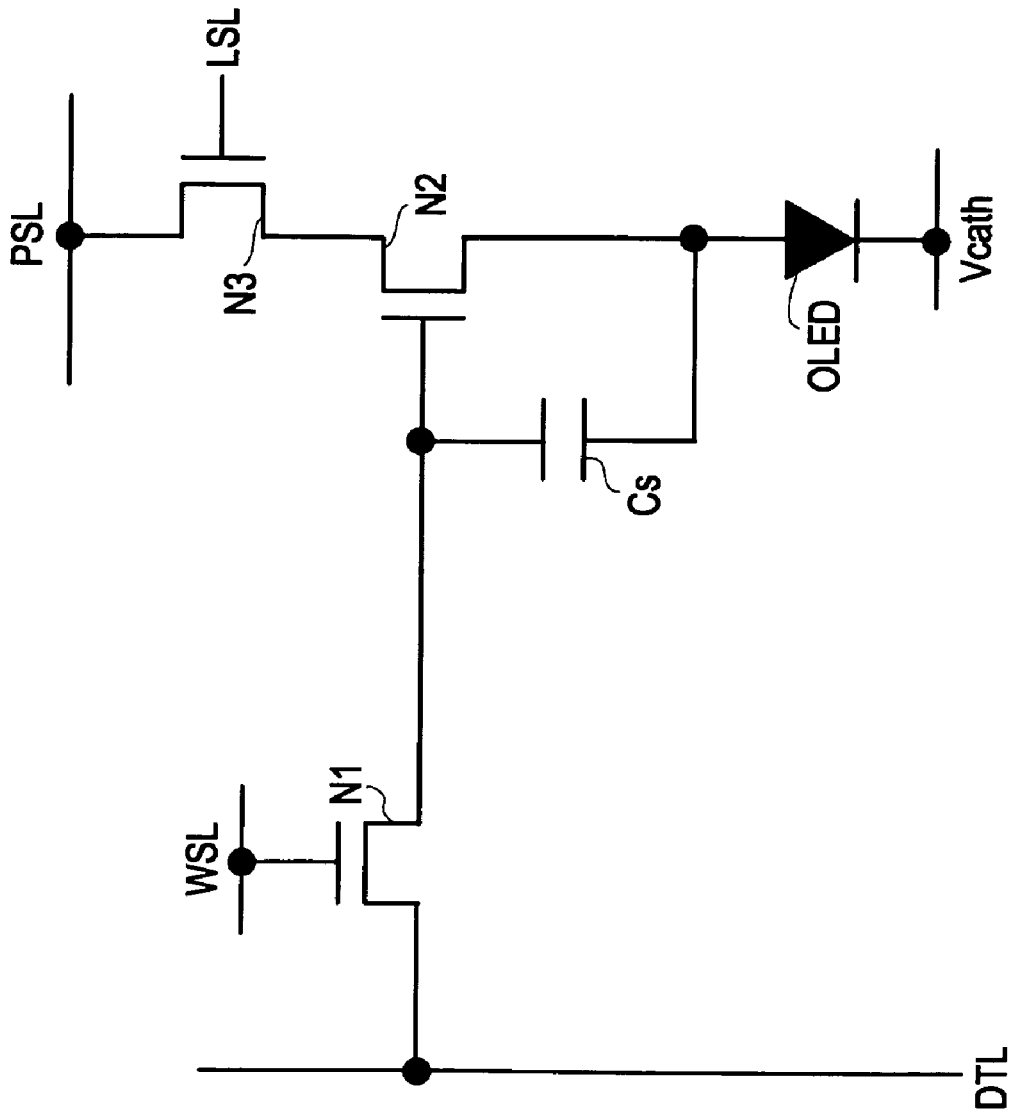
FIG. 2 is an equivalent circuit diagram of an NMOS sub pixel.
Figure 3:
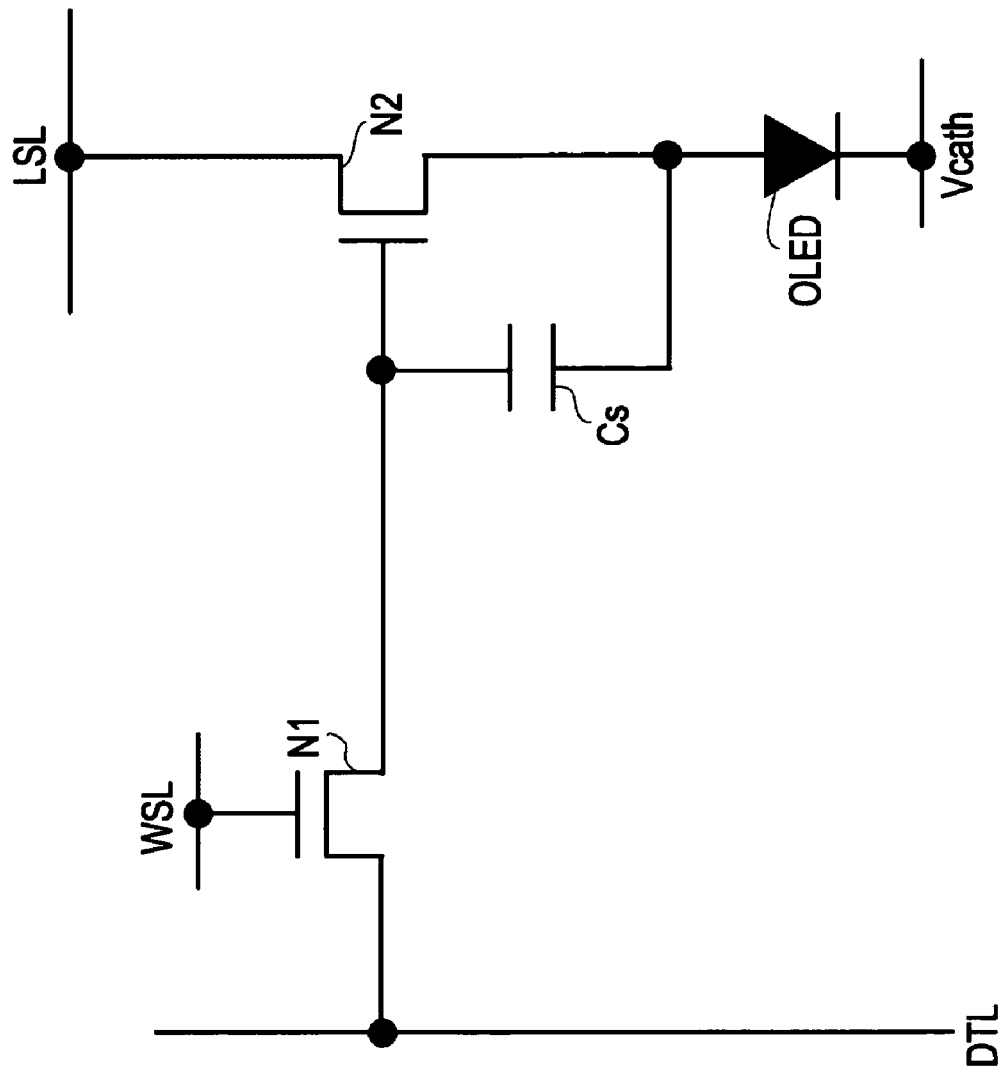
FIG. 3 is an equivalent circuit diagram of an NMOS sub pixel.

The buffer 45 of the present embodiment can thus be incorporated in the second control line driver 35 driving the current supply line PSL of the sub pixel 11 illustrated in FIG. 2 and the second control line driver 35 driving the light-on control line LSL of the sub pixel 11 illustrated in FIG. 3. The buffer 45 may also be incorporated in a control driver driving another control line. For example, the buffer 45 may be incorporated in the first control line driver 33 controlling the gate voltage of a thin-film transistor in the sub pixel 11.

The voltages at the nodes A and C illustrated in FIG. 21 show that both the thin-film transistors N31 and N32 are not conductive together at any given moment. More specifically, the thin-film transistors N31 and N32 operate in a complementary fashion. This arrangement prevents the through current from flowing through the output stage 51. The buffer 45 thus becomes a single-channel type buffer that operates in the same low-power-consumption mode as a CMOS type output buffer.

Embodiment 2

The buffer 45 of the embodiment 1 is a low-power-consumption device that basically prevents a through current from flowing therethrough. In the buffer 45 of the embodiment 1, however, the thin-film transistors N33 and N35 having a high gate capacitance value and the bootstrap auxiliary capacitances Cb32 and Cb33 having a high capacitance value are employed to increase the bootstrap gain.

The use of a high capacitance value means that a voltage change in the set pulse and the reset pulse easily interferes with the output terminals of each input stage (nodes B and C). More specifically, the voltage at the output terminals (nodes B and C) drops from the intended voltage in response to the voltage change in the transition of each of the set pulse and the reset pulse from the high level to the low level. In such a case, a gate diffusion capacitance and the bootstrap auxiliary capacitances Cb32 and Cb33 function as a coupling capacitance. The gate diffusion capacitance refers to a parasitic capacitance between the gate and source of a thin-film transistor (or between the gate and drain). The gate capacitance refers to a capacitance caused between the channel and the gate when the thin-film transistor is conductive.

Figure 22:
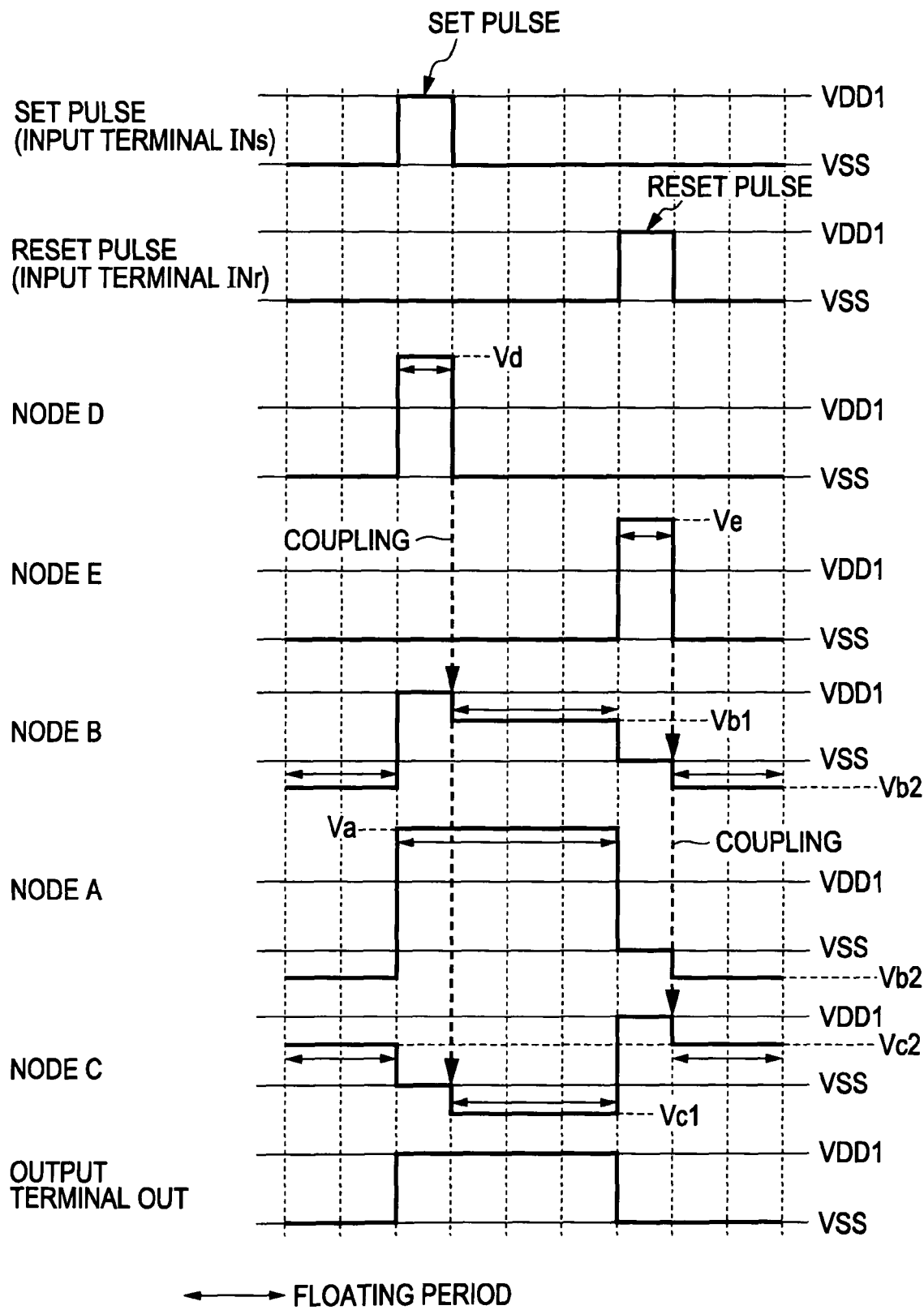
FIG. 22 illustrates drive waveforms of the buffer illustrated in FIG. 20 with the coupling effect taken into consideration.

FIG. 22 is a timing diagram that takes into consideration a pulse interference generated by the gate diffusion capacitance and the bootstrap auxiliary capacitances Cb32 and Cb33.

At the node B (FIG. 22), the voltage, which is otherwise at the first high power-source voltage VDD1, drops down to Vb1, and the voltage, which is otherwise at the low power-source voltage VSS, drops down to Vb2. At the node C (FIG. 22), the voltage, which is otherwise at the first high power-source voltage VDD1, drops down to Vc2, and the voltage, which is otherwise at the low power-source voltage VSS, drops down to Vc1.

While both of the set pulse and the reset pulse are at the low level, the node B and the node C stay at a floating state as illustrated in FIG. 22. As long as the circuit structure illustrated in FIG. 20 is used, a voltage drop due to the pulse interference is unavoidable. If an amount of pulse interference is small, no operational problem is created in the buffer 45. If conditions of VDD1−Vb1<Vth(N51) and Vc2−VSS>Vth(N32) are satisfied, no operational problem is created.

If the condition of VDD1−Vb1<Vth(N51) is satisfied, the thin-film transistor N51 is prevented from being conductive during the floating period of the node A, and the node A is maintained at the first high power-source voltage VDD1. The first high power-source voltage VDD1 is thus output as a high-level output pulse.

If the condition of Vc2−VSS>Vth(N32) is satisfied, the thin-film transistor N32 is enabled to be conductive, and the output pulse is reliably transitioned to the low power-source voltage VSS.

From the power saving standpoint, however, the problem is that the voltage at the nodes B and C drops below the low power-source voltage VSS due to the pulse interference.

Figure 23:
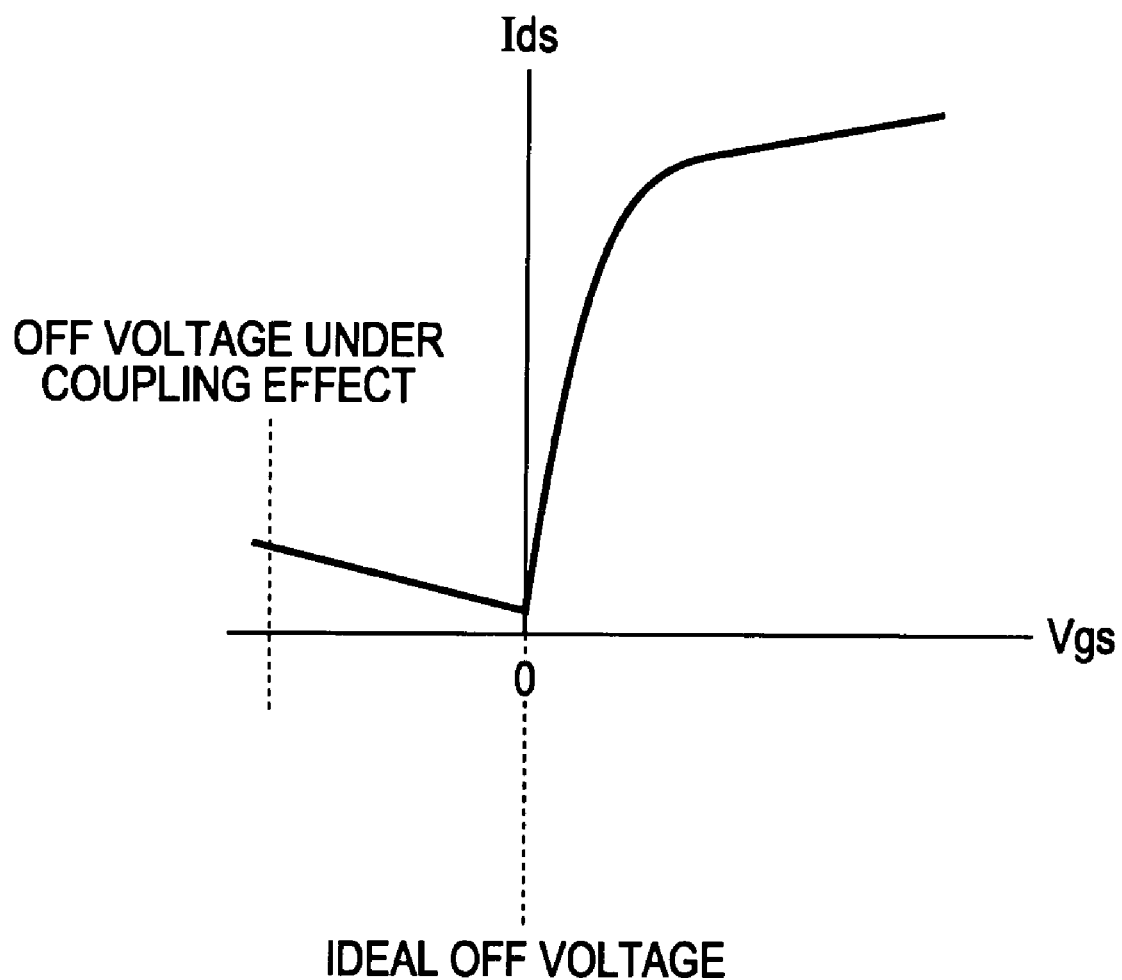
FIG. 23 illustrates Ids-Vgs characteristics of an NMOS transistor.
Figure 24:
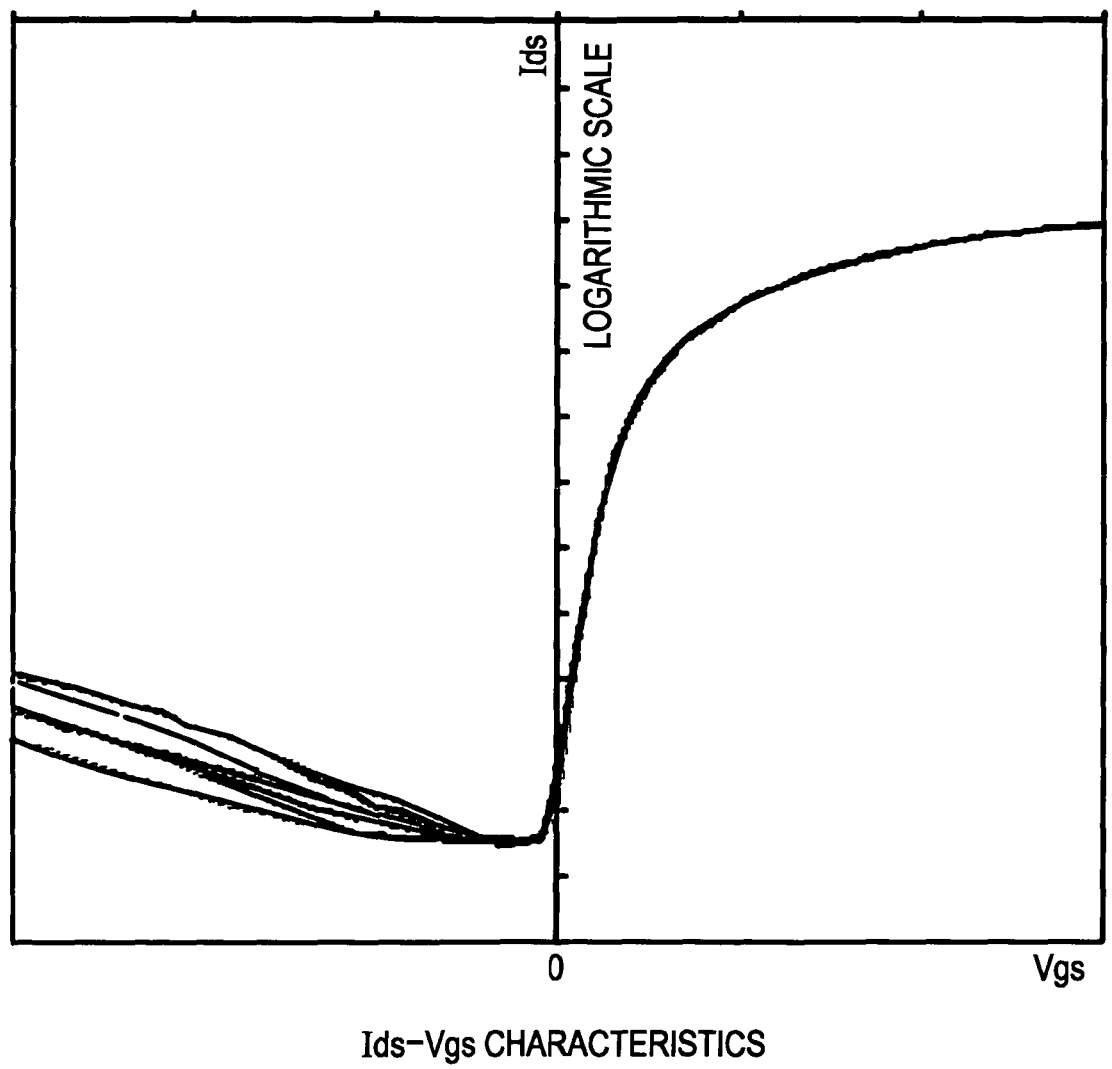
FIG. 24 illustrates measurement results of the Ids-Vgs characteristics of the NMOS transistor.

FIG. 23 illustrates Ids-Vgs characteristics of an NMOS thin-film transistor. As illustrated in FIG. 23, a current Ids tends to increase in a negative region of the gate-source Vgs (<0) in the NMOS thin-film transistor having a typical structure. This phenomenon is here referred to as Iback ramp. FIG. 24 illustrates measurement results of the Ids-Vgs characteristics of the NMOS thin-film transistor.

FIG. 24 shows that the Iback ramp is created and that there are variations in the Iback ramp.

From the power saving standpoint (from the standpoint of minimizing the through current), the gage-source voltage Vgs of each of the thin-film transistors N31 and N32 in an off operation is desirably at or close to Vgs=0 where Ids is minimized.

If the voltage at each of the nodes B (A) and C becomes lower than the low power-source voltage VSS (=0 V) due to the pulse interference as previously discussed, the operational point of each of the thin-film transistors N31 and N32 shifts into the region of the Iback ramp. As illustrated in FIG. 24, the leak current Ids in this region is subject to characteristic variations of thin-film transistors.

No operational problem is created if an off current is sufficiently smaller than an on current in the complementary circuit. A difference in the leak current Ids affects the waveform of the output pulse in view of the output pulse rising and falling characteristics (transient characteristics).

Moreover, an amount of pulse interference can be increased more than expected. For example, an amount of coupling from the node D to the node B increases above an expected level, and the voltage Vb1 at the node B can drop below the cutoff voltage of the thin-film transistor N51. In such a case, the condition of VDD1−Vb1>Vth(N51) holds, causing the thin-film transistor N51 to be conductive.

Figure 25:
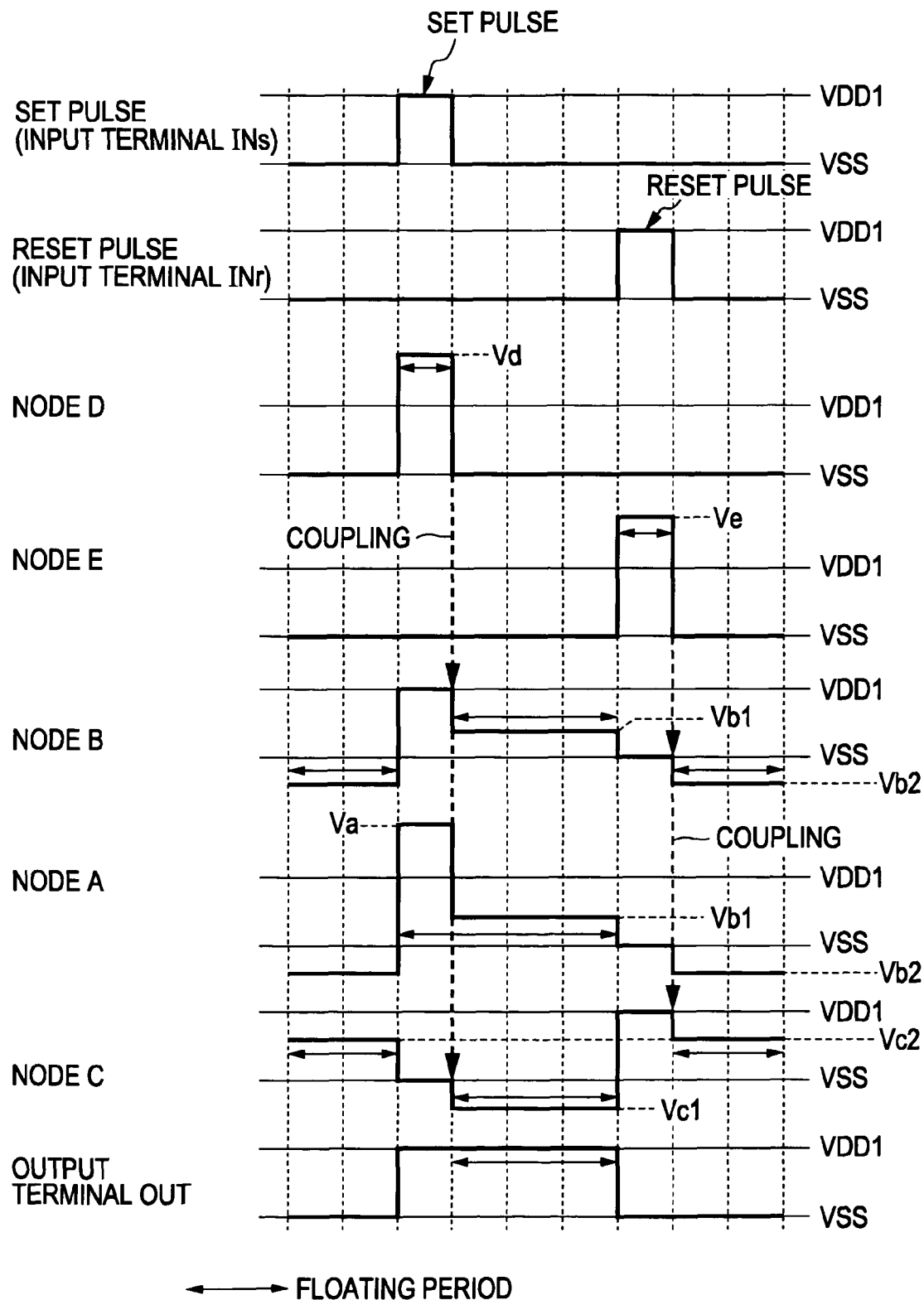
FIG. 25 illustrates drive waveforms of the buffer illustrated in FIG. 20 with the coupling effect being predominant.

FIG. 25 is a timing diagram with an amount of coupling from the node D to the node B increased. The drive waveforms illustrated in FIG. 25 correspond to the respective drive waveforms illustrated in FIG. 22.

The voltage at the node A and the voltage at the node B are the same level after the set pulse is transitioned from the high level to the low level. With reference to the voltage at the node A in FIG. 25, the node A drops down to Vb1. The voltage Vb1 does not cause the thin-film transistor N31 to be conductive. In other words, the thin-film transistor N31 remains in an off state. As a result, the output terminal OUT remains floating as represented by the voltage at the output terminal OUT in FIG. 25.

The output terminal OUT at a floating state is susceptible to leak and interference. The voltage of the output terminal OUT varies due to leak and interference, possibly causing a subsequent stage to malfunction. If the buffer 45 illustrated in FIG. 20 is used to drive the light-on control line LSL of the sub pixel 11 illustrated in FIG. 3, a leak current lowers the voltage at the output terminal OUT and a drive current may not be continuously supplied.

An embodiment 2 of the present invention described here provides a circuit structure in which the thin-film transistors N31 and N32 are operated at an off-operation point where the leak current is low and variations in the leak current are small. More specifically, the circuit structure is free from a floating state during the low-level period of the node B and the node C. In other words, the low level of the node B and the node C is fixed to the low power-source voltage VSS.

The embodiment 2 of the present invention also provides the circuit structure in which the bootstrap operation of the thin-film transistor N31 is assured during the output period of the output pulse. The circuit structure thus assures the on operation of the thin-film transistor N31 during the output period of the output pulse. More specifically, the floating state is disabled with the node B fixed to the high level during the high-level period of the node B.

Figure 26:
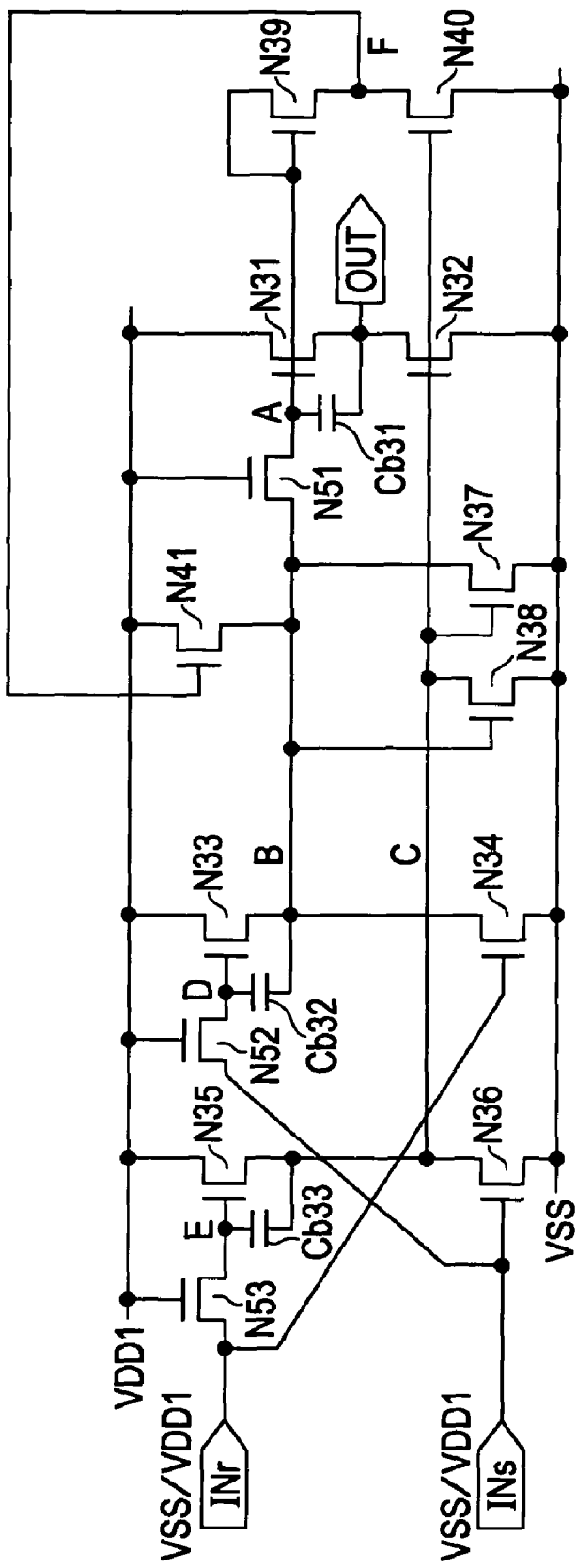
FIG. 26 is a circuit diagram of a buffer according to one embodiment of the present invention.

FIG. 26 illustrates the buffer 45 as the embodiment 2 of the present invention. Referring to FIG. 26, elements identical to those described with reference to FIG. 20 are designated with the same reference numerals.

The basic circuit structure of the buffer 45 of the embodiment 2 of the present invention is generally similar in structure to the buffer 45 of the embodiment 1. The buffer 45 of the embodiment 2 also includes a first output stage (thin-film transistors N31, N32, and N51), a first input stage (thin-film transistors N33, N34, and N52), and a second input stage (thin-film transistors N35, N36, and N53).

The buffer 45 of the embodiment 2 is different in the following four points from the buffer 45 of the embodiment 1.

The first difference is that a thin-film transistor N37 supplying the low power-source voltage VSS to the node B during the high-level period of the node C is employed.

The second difference is that a thin-film transistor N38 supplying the low power-source voltage VSS to the node C during the high-level period of the node B is employed.

The third different is that a second output stage is connected in parallel with the first output stage. The fourth difference is that a thin-film transistor N41 supplying the high-level voltage to the node B during the output period of the output pulse from the first output stage is employed. The hold capacitance Cs2 of the node C is employed as necessary. Since the node B is free from the floating state, the hold capacitance Cs1 is not necessary.

The thin-film transistor N37 has one main electrode connected to the node B, the other main electrode connected to the low power-source voltage VSS, and a gate electrode connected to the node C.

The thin-film transistor N38 has one main electrode connected to the node C, the other main electrode connected to the low power-source voltage VSS, and a gate electrode connected to the node B.

With this circuit structure, the thin-film transistor fixes the voltage at the node C to the low level during the high-level period of the node B. On the other hand, the thin-film transistor N37 fixes the voltage at the node B to the low level during the high-level period of the node C.

The second output stage includes thin-film transistors N39 and N40 connected in series. The thin-film transistor N39 is connected to the high-level side (the side of the power source supplying a high-level voltage) and the thin-film transistor N40 is connected to the low-level side (the side of the power source supplying a low-level voltage).

In accordance with the second embodiment, the gate electrode and the one main electrode of the thin-film transistor N39 are connected to the node A. In other words, the thin-film transistor N39 is diode-connected.

The other main electrode of the thin-film transistor N39 is connected to an output terminal of the second output stage (node F as a control line). The output terminal here is an intermediate junction point between the thin-film transistors N39 and N40.

The thin-film transistor N40 has a gate electrode connected to the node C, one main electrode connected to the output terminal of the second output stage (node F as the control line), and the other main electrode connected to the low power-source voltage VSS.

The output terminal of the second output stage connected to the control line (the node F) is connected the gate electrode of the thin-film transistor N41.

The thin-film transistor N41 has one main electrode connected to the first high power-source voltage VDD1, and the other main electrode connected to the node B. This circuit structure enables the first high power-source voltage VDD1 to be continuously supplied to the node B with the thin-film transistor N41 conductive. With the first high power-source voltage VDD1 supplied to the node B, the buffer 45 prevents the node B from being in the floating state while a high-level voltage (high power-source voltage VDD1) appears at the output terminal OUT of the first output stage (thin-film transistors N31, N32, and N51).

The relationship of the voltage status of each of the set pulse and the reset pulse and the voltage status of each node is described below with reference to FIG. 27.

Figure 27:
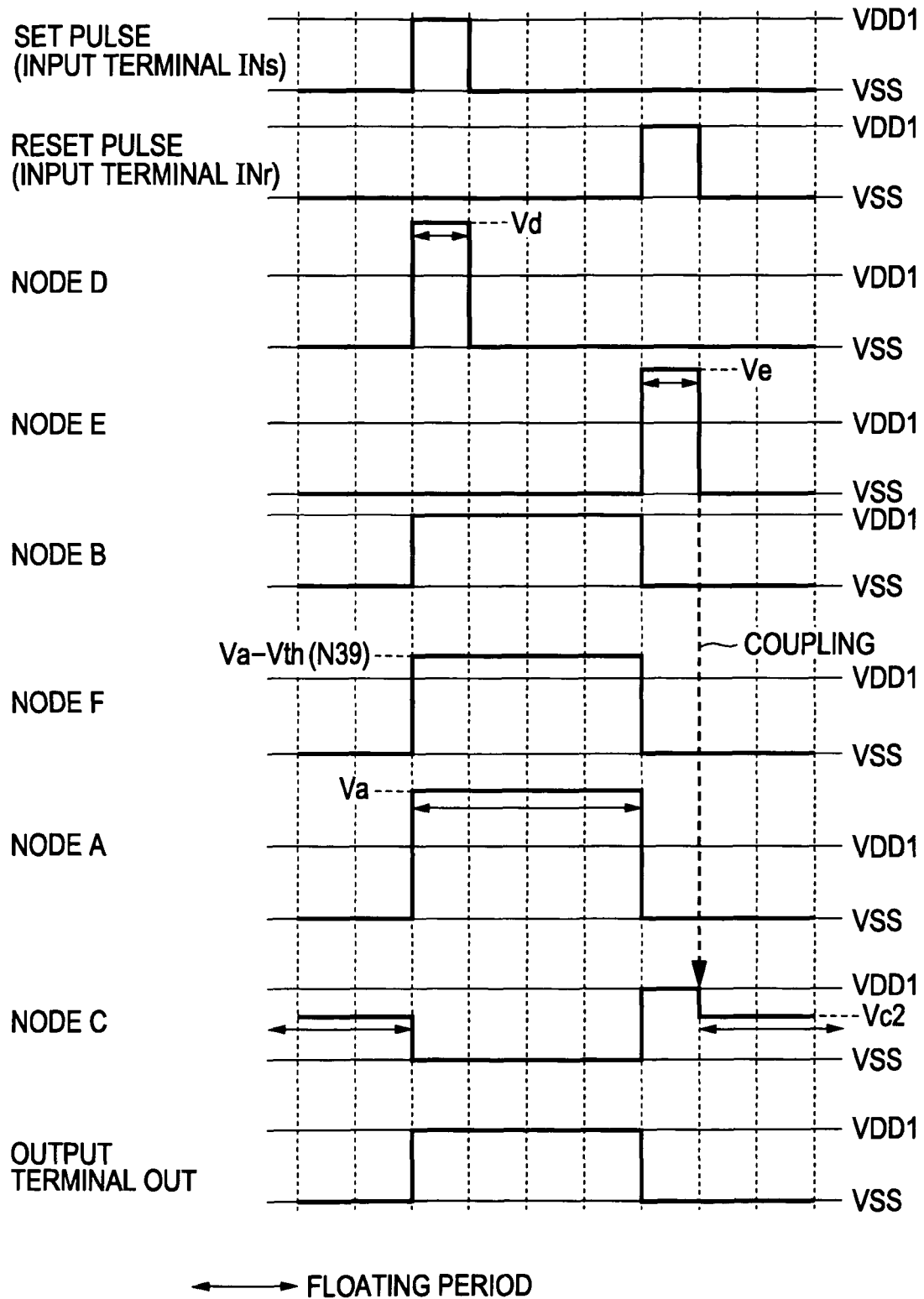
FIG. 27 illustrates drive waveforms of the buffer illustrated in FIG. 26.

FIG. 27 illustrates the voltage statuses of the set pulse at the input terminal INs, the reset pulse at the input terminal INr, and the gate electrode of the thin-film transistor N33 (node D).

FIG. 27 also illustrates the voltage statuses of the gate electrode of the thin-film transistor N35 (node E), the control line (node B) connected to the output terminal of the first input stage, the control line (node F) connected to the output terminal of the second output stage, the gate electrode of the thin-film transistor N31 (node A), the control line connected to the output terminal of the second input stage (node C), and the output terminal OUT of the first output stage.

In accordance with the embodiment 2 of the present invention, each of the signal amplitude of the set pulse (input terminal INs) and the signal amplitude of the reset pulse (input terminal INr) is given between the two values VSS and VDD1.

The node D of the first input stage rises to a high level at the timing the set pulse rises to the high level (voltage at the node D illustrated in FIG. 27). The thin-film transistor N33 becomes conductive, raising the voltage at the node B as illustrated in FIG. 27.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 27. If the voltage Vd subsequent to the voltage rising satisfies the condition of Vd−VDD1>Vth(N33), the voltage at the node B becomes the first high power-source voltage VDD1 with the thin-film transistor N33 conductive as illustrated in FIG. 27.

If the node B rises to the first high power-source voltage VDD1, the voltage at the node A rises to a high level. The thin-film transistors N31 and N39 become conductive, thereby causing the voltages at the output terminal OUT and the node F to rise as illustrated in FIG. 27.

As the voltages of the output terminal OUT and the node F rise, the voltage at the node A rises by a voltage excursion responsive to a charge accumulated on the bootstrap auxiliary capacitance Cb31 as illustrated in FIG. 27.

If the voltage Va subsequent to the voltage rising satisfies a condition of Va−VDD1>Vth(N31), the voltage at the output terminal OUT becomes the first high power-source voltage VDD1 with the thin-film transistor N31 conductive as illustrated in FIG. 27.

The voltage at the node F rises to a voltage determined by Va−Vth(N39) as illustrated in FIG. 27. This is because the thin-film transistor N39 is diode-connected.

In accordance with the second embodiment, the thin-film transistor N41 becomes conductive if a condition of Va−Vth(N39)−VDD1>Tth(N41) is satisfied. The node B is supplied with the first high power-source voltage VDD1.

The thin-film transistor N36 is also conductive during the high-level period of the set pulse. For this reason, the gate voltage of the thin-film transistor N32 forming the output stage (voltage at the node C) is thus controlled to the low power-source voltage VSS as illustrated in FIG. 27.

The set pulse then falls from the high level to the low level. During this voltage transition, a voltage change of the set pulse can interfere with the node B and the node C because of the coupling effect.

As previously discussed, however, the gate electrode of the thin-film transistor N41 is supplied with the voltage determined by Va−Vth(N39) via the node F as illustrated in FIG. 27. For this reason, the node B is fixed to the first high power-source voltage VDD1 by the thin-film transistor N41 remaining conductive (as represented by the voltage at the node B in FIG. 27). This voltage status is characteristic of the embodiment 2 of the present invention.

Even after the set pulse falls down to the low level, the nodes A, B, and F are maintained at the same levels thereof as when the set pulse is at the high level.

With the node B remaining at the first high power-source voltage VDD1, the node C is supplied with the low power-source voltage VSS via the conductive thin-film transistor N38 as illustrated in FIG. 27.

This means that the node C is insusceptible to the interference responsive to the voltage change of the set pulse (means that the off-operation point of the thin-film transistor N32 is not shifted).

The above-described voltage status is maintained while the node B is at the first high power-source voltage VDD1. More specifically, the node C is kept to the low power-source voltage VSS until the reset pulse is subsequently transitioned to the high level. As a result, the leak current of the thin-film transistor N32 is minimized.

The node B biased at the first high power-source voltage VDD1 means that the thin-film transistor N51 is at the cutoff state. The node A is maintained at the floating state at a bootstrap voltage (i.e., Va) as illustrated in FIG. 27. For this reason, the first high power-source voltage VDD1 continuously appears at the output terminal OUT of the first output stage as illustrated in FIG. 27.

When the reset pulse is transitioned from the low level to the high level at the input terminal INr in FIG. 27, the thin-film transistor N35 becomes conductive. The voltage at the node C rises as illustrated in FIG. 27. As the voltage at the node C rises, the gate voltage of the thin-film transistor N35 rises by a voltage excursion responsive to a charge accumulated on the bootstrap auxiliary capacitance Cb33 as illustrated in FIG. 27. The resulting voltage subsequent to the voltage rising is Ve. If the voltage Ve satisfies a condition of Ve−VDD1>Vth(N35), the node C reaches the first high power-source voltage VDD1 with the thin-film transistor N35 conductive as illustrated in FIG. 27.

When the node C rises to the first high power-source voltage VDD1, the thin-film transistors N32 and N40 become conductive. The voltage of the output terminal OUT and the voltage at the node F then fall to the low power-source voltage VSS as illustrated in FIG. 27.

While the reset pulse remains at the high level, the thin-film transistor N34 remains conductive. The voltage at the node B is thus controlled to the low power-source voltage VSS as illustrated in FIG. 27. The gate electrode of the thin-film transistor N31 forming the first output stage (voltage at the node A) also falls down to the low power-source voltage VSS.

The reset pulse then falls from the high level to the low level. During this voltage transition, a voltage change of the reset pulse can interfere with the node B and the node C because of the coupling effect.

Although the node C still maintains a high level, the voltage thereof falls from the first high power-source voltage VDD1 to a voltage Vc2 as illustrated in FIG. 27.

The voltage Vc2 at the node C satisfies a condition of Vc2−VSS>Vth(N32). The thin-film transistor N32 continues to be conductive, and the voltage at the output terminal OUT is maintained at the low power-source voltage VSS as illustrated in FIG. 27. The voltage Vc2 at the node C also satisfies a condition of Vc2−VSS>Vth(N40). The thin-film transistor N40 thus continues to be conductive, and the voltage at the node F is maintained at the low power-source voltage VSS as illustrated in FIG. 27.

Also, the voltage Vc2 at the node C satisfies Vc2−VSS>Vth(N37). The thin-film transistor N37 thus becomes conductive, and the low power-source voltage VSS is continuously supplied to the node B.

This means that the node B is insusceptible to the interference responsive to the voltage change of the set pulse (means that the off-operation point of the thin-film transistor N31 is not shifted).

The above-described voltage status is maintained while the node C is at the voltage Vc2. More specifically, the node B is kept to the low power-source voltage VSS until the set pulse is subsequently transitioned to the high level. As a result, the leak current of the thin-film transistor N31 is minimized.

The buffer 45 thus constructed provides the same operation and advantages as those of the buffer 45 of the embodiment 1.

With the above-described circuit structure, one of the nodes B and C is at the high level while the voltage of the other of the nodes B and C is fixed to the low level. This arrangement prevents the off-operation point of each of the thin-film transistors N31 and N32 from being shifted. More specifically, the buffer 45 becomes insusceptible to the pulse interference and suffers less from the leak current.

The buffer 45 thus constructed can continuously supply the high-level voltage to the node B throughout a period from the rising edge of the set pulse to the high level to the rising edge of the reset pulse to the high level (a period throughout which a high-level output pulse appears at the output terminal OUT).

The voltage change of the set pulse is thus reliably prevented from interfering with the node B. More specifically, the voltage at the node A is reliably maintained at the bootstrap voltage Va. The first high power-source voltage VDD1 is continuously supplied to the output terminal OUT. The buffer 45, with a current load connected thereto, maintains the voltage of the output terminal OUT. The drive current is continuously supplied to the current load.

Embodiment 3

A modification of the buffer 45 of the embodiment 2 is described below as an embodiment 3 of the present invention.

Figure 28:
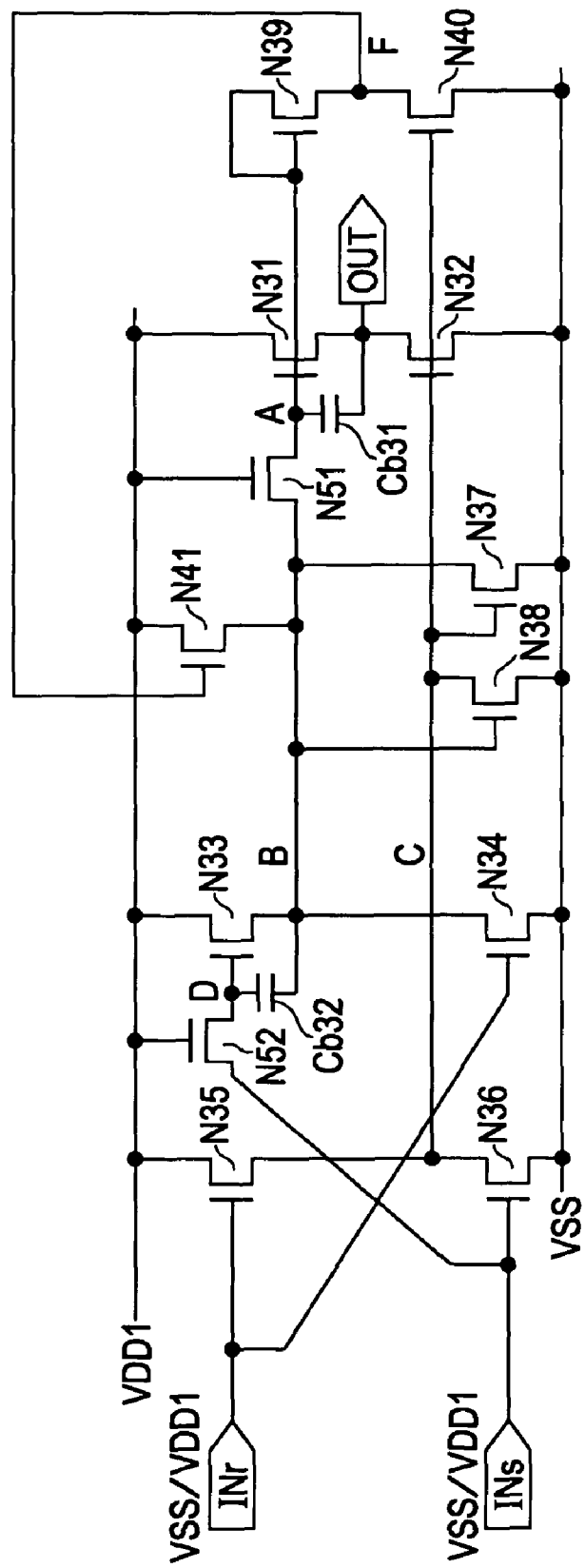
FIG. 28 is a circuit diagram of a buffer according to one embodiment of the present invention.

FIG. 28 illustrates the buffer 45 as the embodiment 3 of the present invention. In FIG. 28, elements identical to those illustrated in FIG. 26 are designated with the same reference numerals.

The buffer 45 is generally similar in structure to the buffer 45 of the embodiment 2 but with the thin-film transistor N53 removed. More specifically, the buffer 45 of the embodiment 3 is generally similar in structure to the circuit structure of the embodiment 2 but with the bootstrap circuit removed therefrom. With such a circuit structure, the buffer 45 has a component count smaller than that of the second embodiment.

Figure 29:
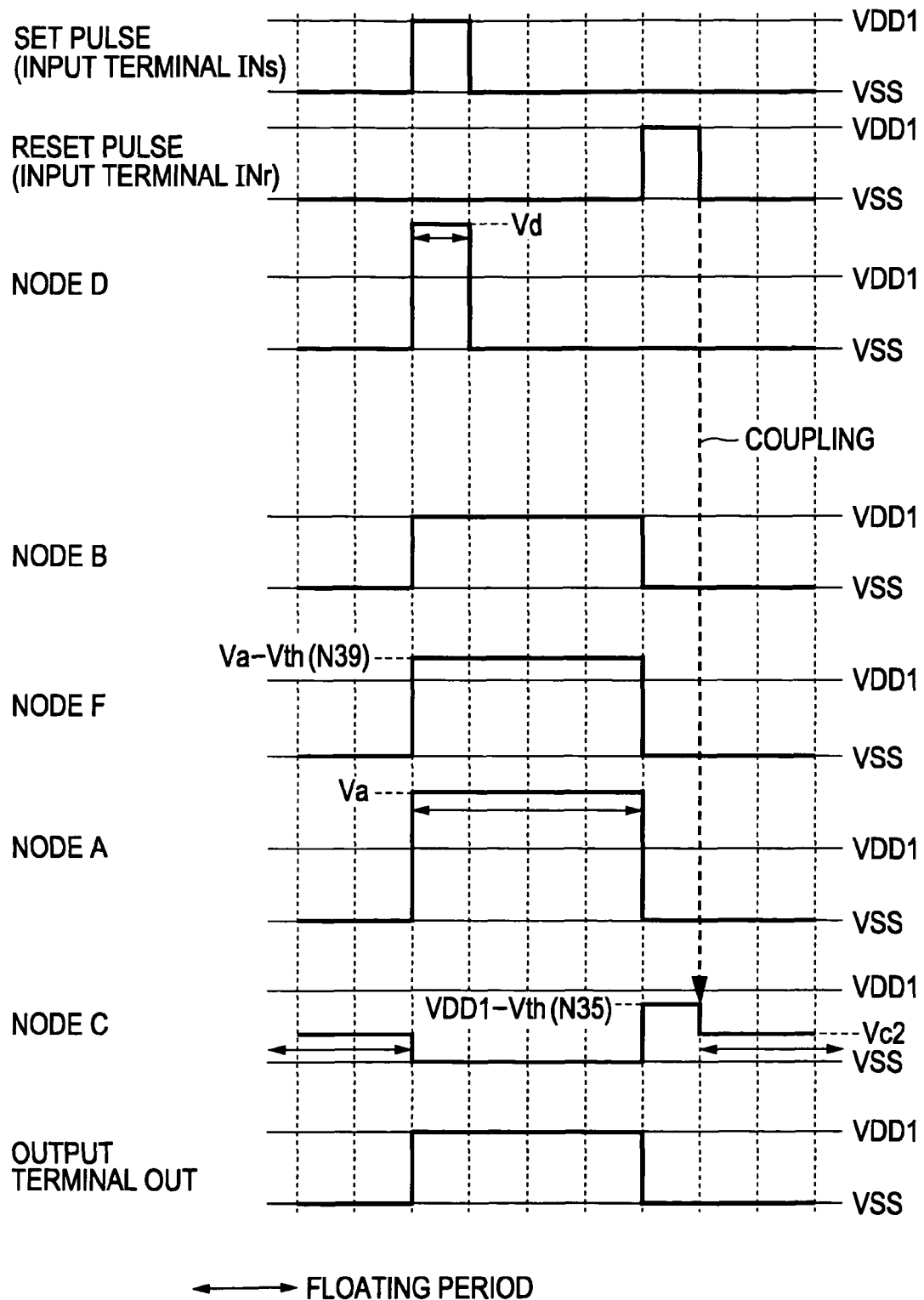
FIG. 29 illustrates drive waveforms of the buffer illustrated in FIG. 28.

FIG. 29 illustrates the relationship of the voltage statuses of the set pulse and the reset pulse and the voltage status of each node.

FIG. 29 also illustrates the voltage statuses of the set pulse at the input terminal INs, and the reset pulse at the input terminal INr.

FIG. 29 also illustrates the voltage status of the gate electrode of the thin-film transistor N33 (node D).

FIG. 29 further illustrates the voltage statuses of the control line connected to the output terminal of the first input stage (node B), the control line connected to the output terminal of the second output stage (node F), the gate electrode of the thin-film transistor N31 (node A), the control line connected to the output terminal of the second input stage (node C), and the output terminal OUT of the first output stage.

In accordance with the embodiment 3 of the present invention, each of the signal amplitude of the set pulse (input terminal INs) and the signal amplitude of the reset pulse (input terminal INr) is also given between the two values VSS and VDD1.

Referring to FIG. 29, the operation of the buffer 45 of the embodiment 3 remains unchanged from the operation of the buffer 45 of the embodiment 2 in the period from the rising edge of the set pulse to the high level to the rising edge of the reset pulse to the high level.

The operation of the buffer 45 of the embodiment 3 starting with the rising edge of the reset pulse is described below.

When the reset pulse rises from the low level to the high level, the thin-film transistors N34 and N35 become conductive.

In response, the node B falls to the low power-source voltage VSS, and the voltage at the node C rises as illustrated in FIG. 29. The voltage at the node C is lower than the first high power-source voltage VDD1 by a threshold voltage Vth (N35) of the thin-film transistor N35. More specifically, the voltage at the node C is at VDD1−Vth(N35).

The high level (VDD1−Vth(N35)) satisfies the following three conditions:

$VDD1-Vth(N35)-VSS>Vth(N32)$, $VDD1-Vth(N35)-VSS>Vth(N37)$, and $VDD1-Vth(N35)-VSS>Vth(N40)$.

Generally, the pulse amplitude (VDD1−VSS) is sufficiently larger than the threshold voltage value Vth, and all the above three conditions are satisfied.

When the node C rises to the high level, the thin-film transistor N32 turns conductive, and the voltage at the output terminal OUT falls to the low power-source voltage VSS as illustrated in FIG. 29.

The reset pulse falls from the high level to the low level. During this voltage transition, a voltage change of the reset pulse interferes with the node C because of the capacitive coupling effect of the thin-film transistor N35 as illustrated in FIG. 29. Although the node C still maintains a high level, the voltage thereof falls from the first high power-source voltage VDD1 to a voltage Vc2 as illustrated in FIG. 29.

The voltage Vc2 satisfies the following three conditions:

$Vc2-VSS>Vth(N32)$, $Vc2-VSS>Vth(N37)$, and $Vc2-VSS>Vth(N40)$.

As long as the three conditions are satisfied, the thin-film transistors N32, N37, and N40 remain continuously conductive.

More specifically, the thin-film transistor N32 causes the low power-source voltage VSS to be supplied continuously to the output terminal OUT.

The thin-film transistor N37 causes the low power-source voltage VSS to be supplied continuously to the node B. This arrangement prevents the voltage change of the reset pulse from interfering with the node A via the thin-film transistor N34. The thin-film transistor N31 is free from the shifting of the off-operation point.

The voltage status described above is maintained for a period throughout which the voltage at the node C is maintained at the voltage Vc2. More specifically, the voltage at the node A is maintained at the low power-source voltage VSS until the set pulse is subsequently transitioned to the high level. As a result, the leak current of the thin-film transistor N31 is minimized.

As described above, the buffer 45 of the embodiment 3 even with a smaller component count provides the same operation and advantages as those of the buffer 45 of the second embodiment.

Embodiment 4

A modification of the buffer 45 of the embodiment 2 is described below as an embodiment 4 of the present invention.

Figure 30:
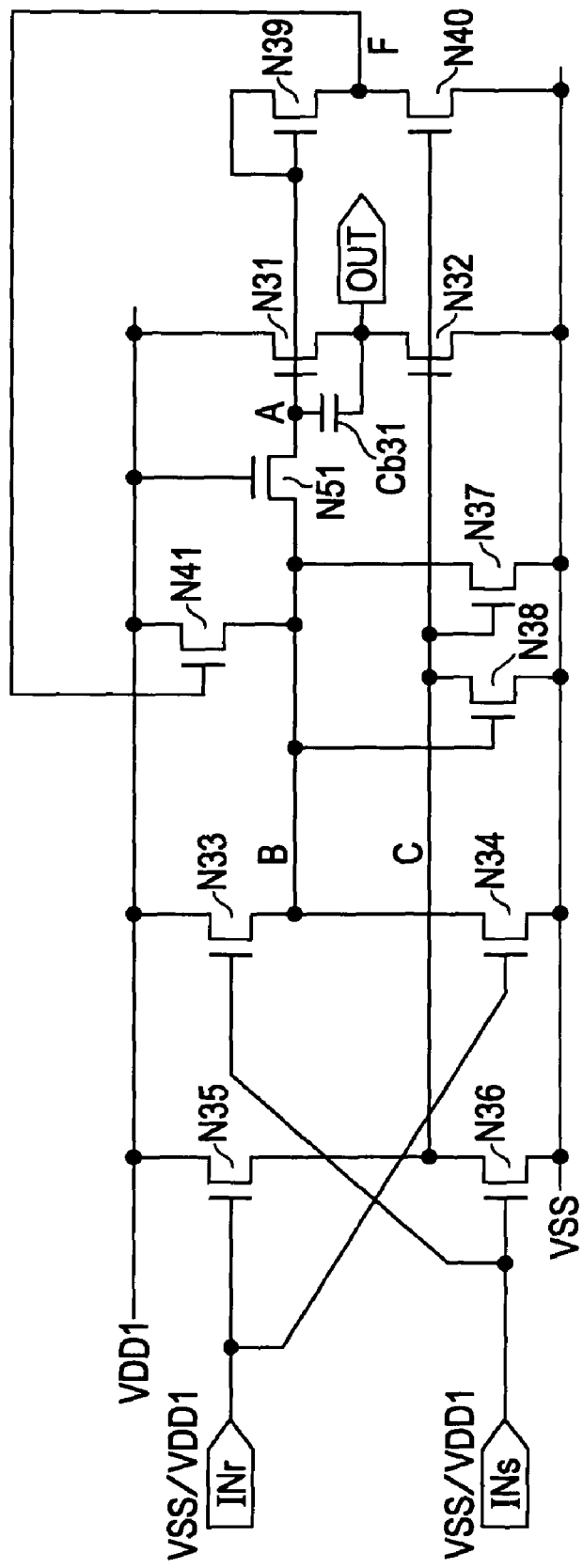
FIG. 30 is a circuit diagram of a buffer according to one embodiment of the present invention.

FIG. 30 illustrates the buffer 45 as the embodiment 4 of the present invention. In FIG. 30, elements identical to those illustrated in FIG. 28 are designated with the same reference numerals.

The buffer 45 of the embodiment 4 has the same circuit structure as the embodiment 3 but with the thin-film transistor N52 removed therefrom. More specifically, the buffer 45 of the embodiment 4 has the circuit structure of the embodiment 2 but with the bootstrap circuits removed from the first and second input stages thereof. In this way, the embodiment 4 of the present invention provides a buffer with a smaller component count.

Figure 31:
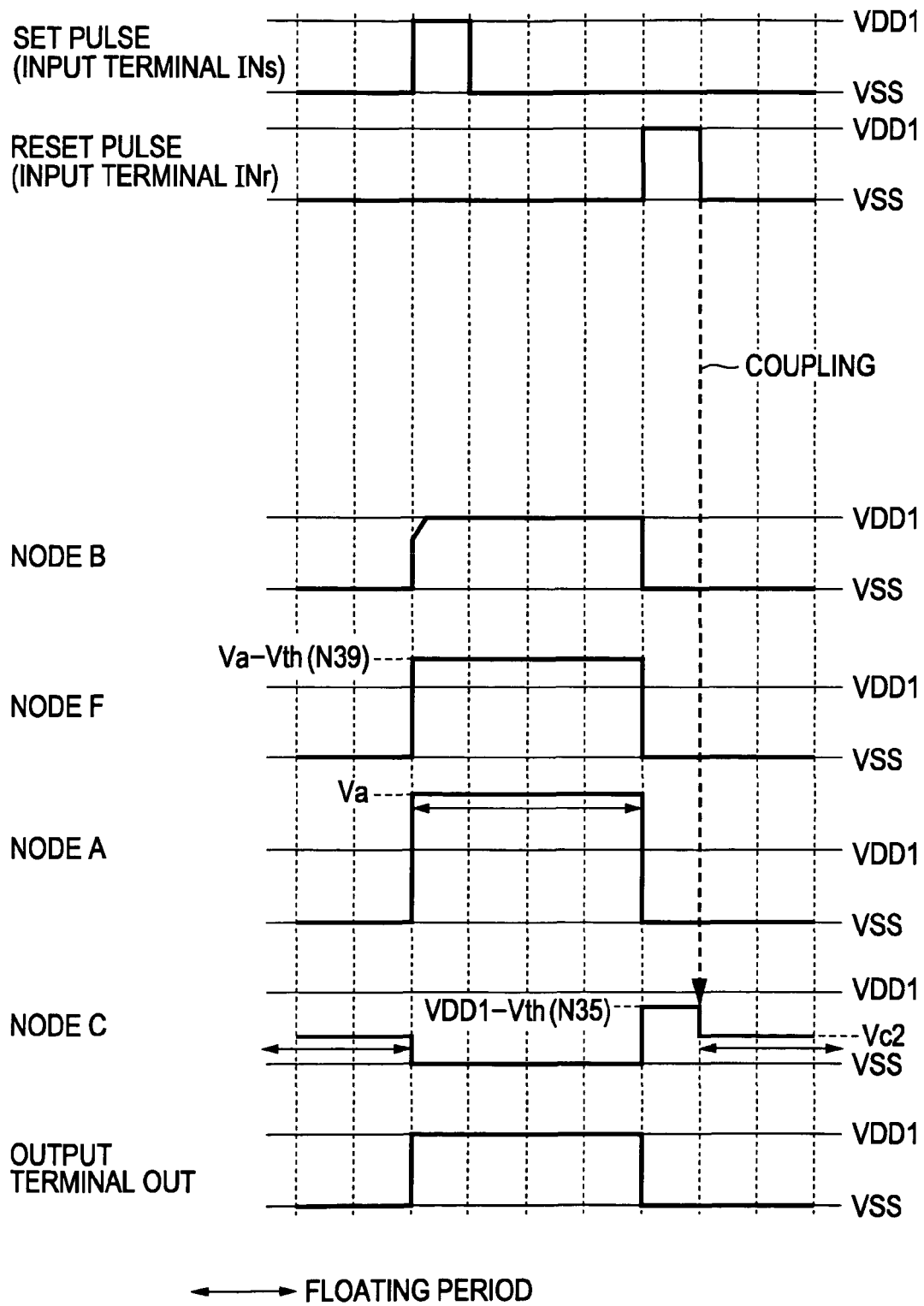
FIG. 31 illustrates drive waveforms of the buffer illustrated in FIG. 30.

FIG. 31 illustrates the relationship of the voltage statuses of the set pulse and the reset pulse and the voltage status of each node.

FIG. 31 also illustrates the voltage statuses of the set pulse at the input terminal INs, and the reset pulse at the input terminal INr.

FIG. 31 also illustrates the voltage status of a control line connected to an output terminal of the first input stage (node B).

FIG. 31 further illustrates the control line connected to the output terminal of the second output stage (node F), the gate electrode of the thin-film transistor N31 (node A), the control line connected to the output terminal of the second input stage (node C), and the output terminal OUT of the first output stage.

In accordance with the embodiment 4 of the present invention, each of the signal amplitude of the set pulse (input terminal INs) and the signal amplitude of the reset pulse (input terminal INr) is given between the two values VSS and VDD1.

As previously discussed, the buffer 45 of the embodiment 4 is identical in structure to the buffer 45 of the embodiment 3 in that the thin-film transistor N53 is eliminated. The operation of the buffer 45 subsequent to the rising edge of the reset pulse to the high level remains thus unchanged from the operation of the buffer 45 of the embodiment 3.

The discussion that follows focuses on the operation within the period from the rising edge of the set pulse to the high level to the rising edge of the reset pulse to the high level.

When the set pulse rises to the high level, the thin-film transistors N33 and N36 turn conductive.

In response, the voltage at the node B rises and the voltage at the node C falls to the low power-source voltage VSS as illustrated in FIG. 31.

The buffer 45 of the embodiment 4 includes no bootstrap circuit on the gate electrode side of the thin-film transistor N33. The voltage at the node B immediately subsequent to the rising edge of the set pulse to the high level rises only to a high level determined by VDD1−Vth(N33).

A bootstrap operation to the node A responsive to the rising of the node B to the high level allows the voltage at the node F to rise to Va−Vth(N39).

The voltage (Va−Vth(N39)) subsequent to the rising satisfies a condition of (Va−Vth(N39)−VDD1>Vth(N41)). The thin-film transistor N41 thus turns conductive, thereby supplying the first high power-source voltage VDD1 to the node B as illustrated in FIG. 31.

This operation is characteristic of the buffer 45 of the embodiment 4.

When the set pulse falls from the high level to the low level, the thin-film transistor N41 causes the node B to be maintained at the first high power-source voltage VDD1. While the node B is at the high level, the thin-film transistor N38 fixes the node C to the low power-source voltage VSS.

As described above, the buffer 45 of the embodiment 4 with a smaller component count thereof provides the same operation and advantages as those of the second embodiment.

Embodiment 5

A modification of the buffer 45 of the embodiment 2 is described below as an embodiment 5 of the present invention.

Figure 32:
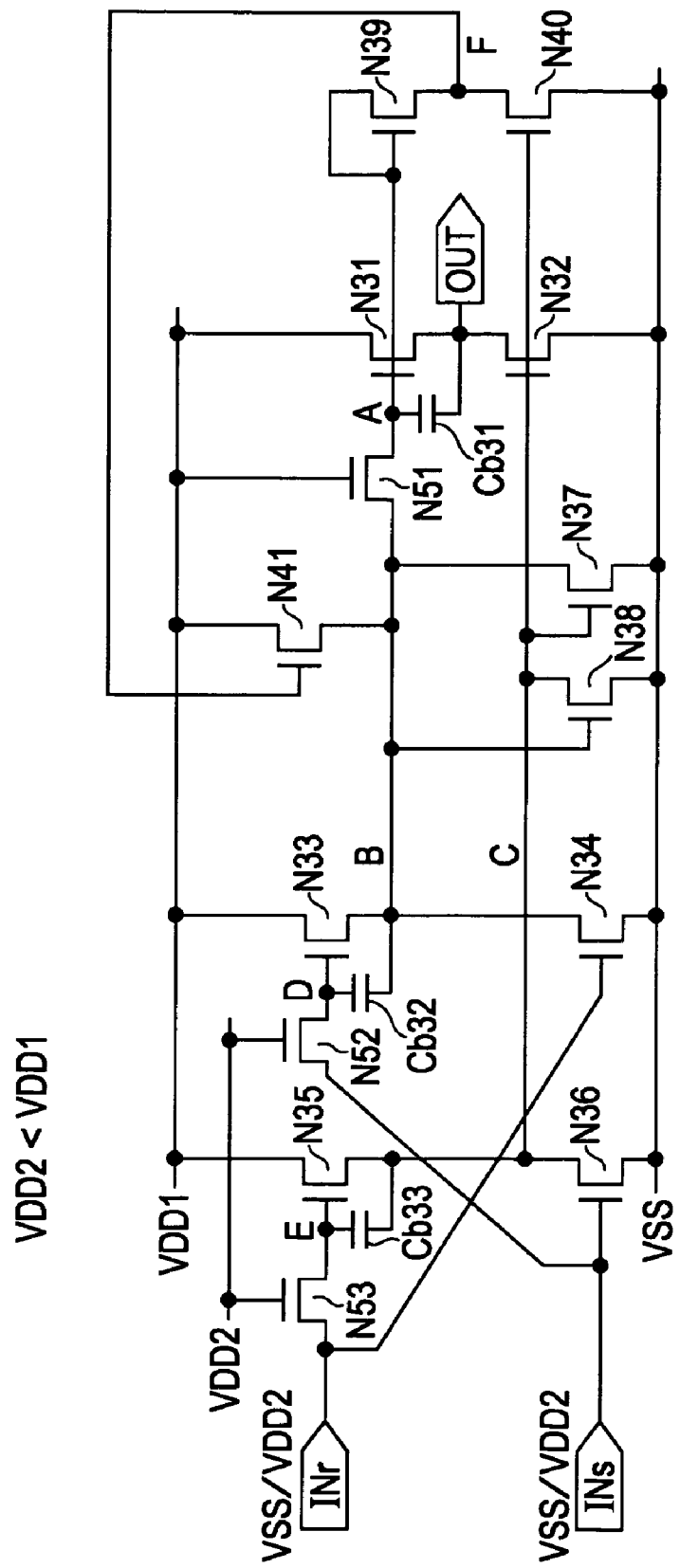
FIG. 32 is a circuit diagram of a buffer according to one embodiment of the present invention.

FIG. 32 illustrates the buffer 45 of the embodiment 5 of the present invention. In FIG. 32, elements identical to those illustrated in FIG. 26 are designated with the same reference numerals.

The buffer 45 of the embodiment 5 has the circuit structure of the embodiment 2 but with level shifting performed at the first and second input stages.

The thin-film transistors N52 and N53 forming bootstrap circuits for the first and second input stages are respectively connected to a second high power-source voltage VDD2 (<VDD1). With this arrangement, each of the set pulse and the reset pulse has a smaller amplitude and the power consumption of the front section is even more reduced.

Bootstrap auxiliary capacitances Cb31, Cb32, and Cb33 are respectively connected to the output terminals of the first and second input stages and the first output stage.

If the gate capacitances of the thin-film transistors N31, N33, and N35 are sufficiently high, the bootstrap auxiliary capacitances Cb31, Cb32, and Cb33 are not necessary.

The relationship of the voltage statuses of the set pulse and the reset pulse and the voltage status of each node is described with reference to FIG. 33. The drive waveforms illustrated in FIG. 33 respectively correspond to the drive waveforms illustrated in FIG. 27.

In accordance with the embodiment 5 of the present invention, each of the signal amplitude of the set pulse (input terminal INs) and the signal amplitude of the reset pulse (input terminal INr) is given between the two values VSS and VDD2 (<VDD1).

At the moment the set pulse rises to the high level, the node D at the first input stage rises to the high level. The thin-film transistor N33 then turns conductive, causing the voltage at the node B to rise as illustrated in FIG. 33.

Figure 33:
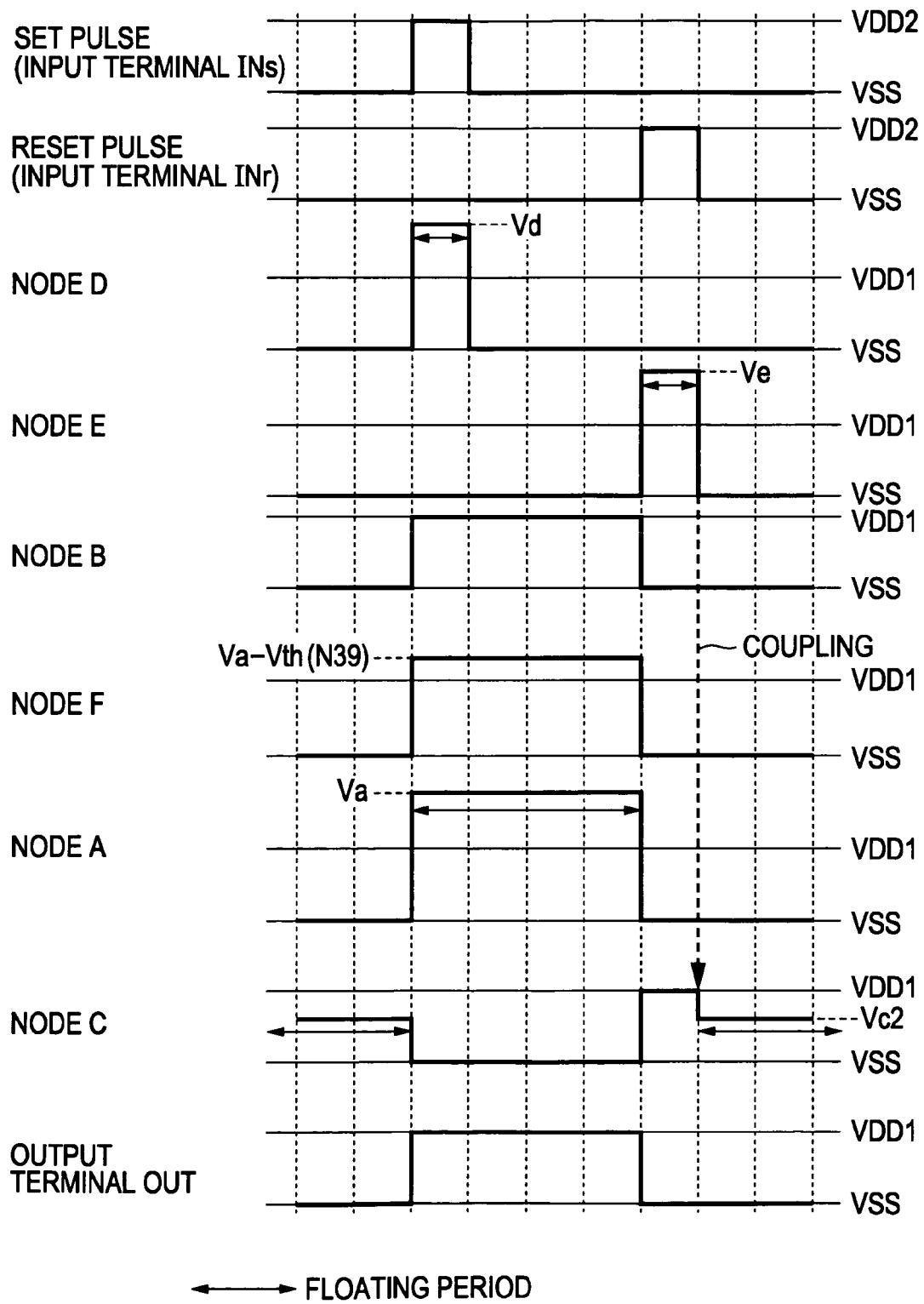
FIG. 33 illustrates drive waveforms of the buffer illustrated in FIG. 32.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 33. If the voltage Vd subsequent to the voltage rising satisfies Vd−VDD1>Vth(N33), the voltage at the node B becomes the first high power-source voltage VDD1 with the thin-film transistor N33 conductive as illustrated in FIG. 33.

When the node B rises to the first high power-source voltage VDD1 as described above, the node A also rises to a high level. The thin-film transistors N31 and N39 turn conductive, raising the voltage at the output terminal OUT and the voltage at the node F as illustrated in FIG. 33.

As the voltages at the output terminal OUT and the node F rise, the voltage at the node A rises by a voltage excursion responsive to a charge accumulated on the bootstrap auxiliary capacitance Cb31 as illustrated in FIG. 33.

If the voltage Va subsequent to the voltage rising satisfies Va−VDD1>Vth(N31), the voltage at the output terminal OUT becomes the first high power-source voltage VDD1 with the thin-film transistor N31 conductive as illustrated in FIG. 33.

The node F rises to a voltage determined by Va−Vth(N39) as illustrated in FIG. 33 because the thin-film transistor N39 is diode-connected.

If a condition of (Va−Vth(N39)−VDD1)>Vth(N41) is satisfied in accordance with the embodiment 5, the thin-film transistor N41 turns conductive, thereby supplying the first high power-source voltage VDD1 to the node B.

The thin-film transistor N36 is also conductive with the set pulse at the high level. The gate voltage of the thin-film transistor N32 forming the output stage (voltage at the node C) is thus controlled to the low power-source voltage VSS as illustrated in FIG. 33.

The set pulse then falls from the high level to the low level. During this voltage transition, a voltage change of the set pulse can interfere with the nodes B and C because of the coupling effect.

The gate electrode of the thin-film transistor N41 is supplied with the voltage determined by Va−Vth (N39) via the node F as illustrated in FIG. 33. For this reason, the thin-film transistor N41 remaining conductive causes the voltage at the node B to be fixed to the first high power-source voltage VDD1 as illustrated in FIG. 33.

Even after the set pulse falls to the low level, the voltages at the nodes A, B, and F remain at the same levels as when the set pulse is at the high level.

Since the voltage at the node B is maintained at the first high power-source voltage VDD1, the thin-film transistor N38 remaining conductive continuously supplies the low power-source voltage VSS to the node C as illustrated in FIG. 33.

This means that the node C is insusceptible to the interference responsive to the voltage change of the set pulse (means that the off-operation point of the thin-film transistor N32 is not shifted).

This voltage status is maintained while the node B is at the first high power-source voltage VDD1. More specifically, the node C is maintained at the low power-source voltage VSS until the reset pulse is subsequently transitioned to the high level. As a result, the leak current of the thin-film transistor N32 is minimized.

The node B biased at the first high power-source voltage VDD1 means that the thin-film transistor N51 is at the cutoff state. The node A is maintained at the floating state at a bootstrap voltage (i.e., Va) as illustrated in FIG. 33. For this reason, the first high power-source voltage VDD1 continuously appears at the output terminal OUT of the first output stage as illustrated in FIG. 33.

When the reset pulse is transitioned from the low level to the high level at the input terminal INr in FIG. 33, the thin-film transistor N35 becomes conductive. The voltage at the node C rises as illustrated in FIG. 33. As the voltage at the node C rises, the gate voltage of the thin-film transistor N35 rises by a voltage excursion responsive to a charge accumulated on the bootstrap auxiliary capacitance Cb33 as illustrated in FIG. 33. The resulting voltage subsequent to the voltage rising is Ve. If the voltage Ve satisfies a condition of Ve−VDD1>Vth(N35), the node C reaches the first high power-source voltage VDD1 with the thin-film transistor N35 conductive as illustrated in FIG. 33.

When the node C rises to the first high power-source voltage VDD1, the thin-film transistors N32 and N40 become conductive. The voltage of the output terminal OUT and the voltage at the node F then fall to the low power-source voltage VSS as illustrated in FIG. 33.

While the reset pulse is at the high level, the thin-film transistor N34 remains conductive. The voltage at the node B is controlled to the low power-source voltage VSS as illustrated in FIG. 33. The gate voltage of the thin-film transistor N31 (voltage at the node A) forming the first output stage also falls to the low power-source voltage VSS.

The reset pulse then falls from the high level to the low level. During this voltage transition, a voltage change of the reset pulse may interfere with the node B and the node C because of the coupling effect.

Although the node C still maintains a high level, the voltage thereof falls from the first high power-source voltage VDD1 to a voltage Vc2 as illustrated in FIG. 33.

The voltage Vc2 at the node C satisfies a condition of Vc2−VSS>Vth(N32). The thin-film transistor N32 continues to be conductive, and the voltage at the output terminal OUT is maintained at the low power-source voltage VSS as illustrated in FIG. 33. The voltage Vc2 at the node C also satisfies a condition of Vc2−VSS>Vth(N40). The thin-film transistor N40 thus continues to be conductive, and the voltage at the node F is maintained at the low power-source voltage VSS as illustrated in FIG. 33.

Also, the voltage Vc2 at the node C satisfies Vc2−VSS>Vth(N37). The thin-film transistor N37 thus becomes conductive, and the low power-source voltage VSS is continuously supplied to the node B.

This means that the node B is insusceptible to the interference responsive to the voltage change of the set pulse (means that the off-operation point of the thin-film transistor N31 is not shifted).

The above-described voltage status is maintained while the node C is at the voltage Vc2. More specifically, the node B is kept to the low power-source voltage VSS until the set pulse is subsequently transitioned to the high level. As a result, the leak current of the thin-film transistor N31 is minimized.

The buffer 45 thus constructed provides the same operation and advantages as those of the buffer 45 of the embodiment 2.

Moreover, the buffer 45 of the embodiment 5 causes a signal amplitude of each of the set pulse and the reset pulse to be smaller than the signal amplitude of the output pulse. For this reason, the power consumption of a front section (such as the shift register) is reduced to be lower than that of the other embodiments.

Embodiment 6

A modification of the buffer 45 of the embodiment 2 is described below as an embodiment 6 of the present invention.

Figure 34:
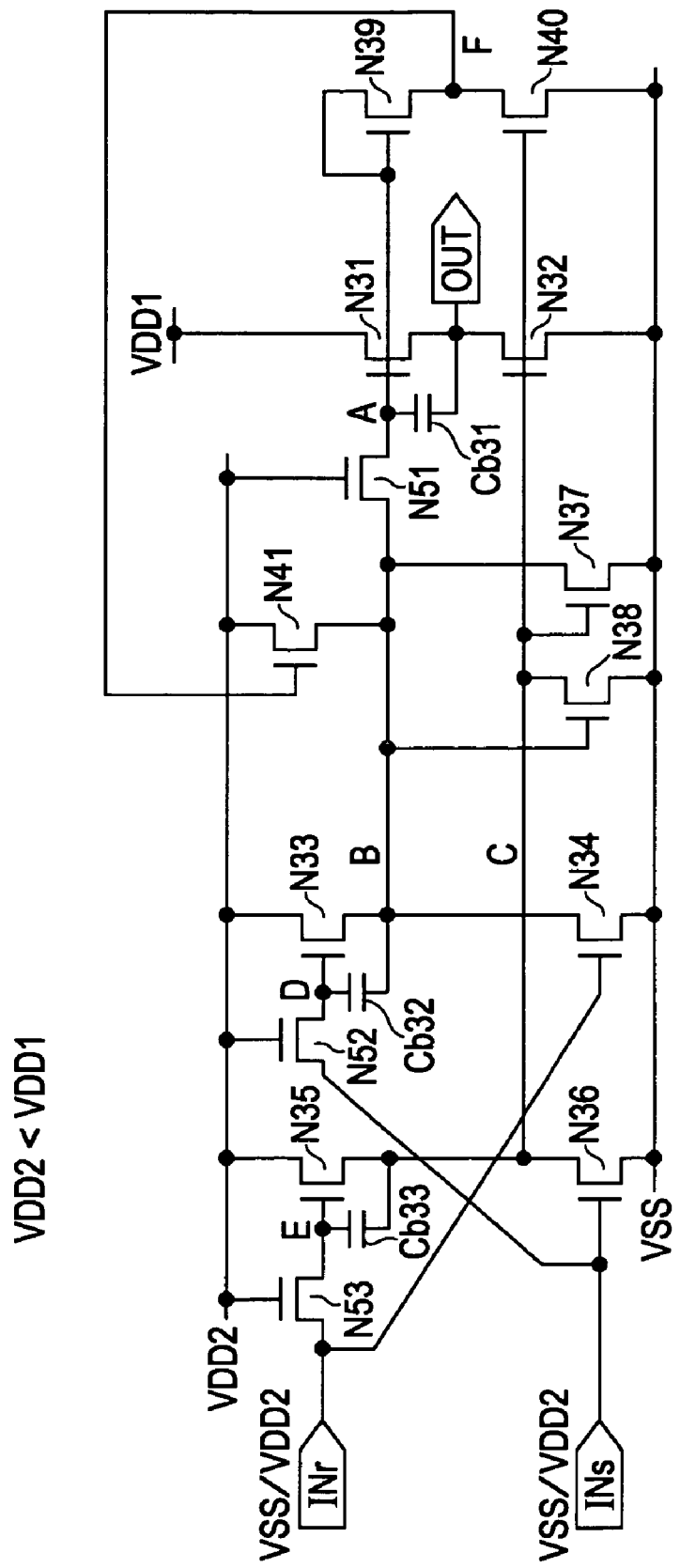
FIG. 34 is a circuit diagram of a buffer according to one embodiment of the present invention.

FIG. 34 illustrates the buffer 45 of the embodiment 6 of the present invention. In FIG. 34, elements identical to those illustrated in FIG. 32 are designated with the same reference numerals.

In the buffer 45 of the embodiment 6, level shifting is performed at the first output stage.

The first high power-source voltage VDD1 is supplied to only the thin-film transistors N31 and N32 at the final portion of the first output stage and the high power-source voltage VDD2 (<VDD1) is supplied to thin-film transistors placed prior to the final portion of the first output stage. This arrangement not only reduces the amplitude of each of the set pulse and the reset pulse but also reduces the power consumed by the buffer 45.

The relationship of the voltage statuses of the set pulse and the reset pulse and the voltage status of each node is described below with reference to FIG. 35. The drive waveforms illustrated in FIG. 35 correspond to the respective drive waveforms illustrated in FIG. 27.

In accordance with the embodiment 6 of the present invention, each of the signal amplitude of the set pulse (input terminal INs) and the signal amplitude of the reset pulse (input terminal INr) is given between the two values VSS and VDD2 (<VDD1).

At the moment the set pulse rises to the high level, the node D at the first input stage rises to the high level. The thin-film transistor N33 then turns conductive, causing the voltage at the node B to rise as illustrated in FIG. 33.

Figure 35:
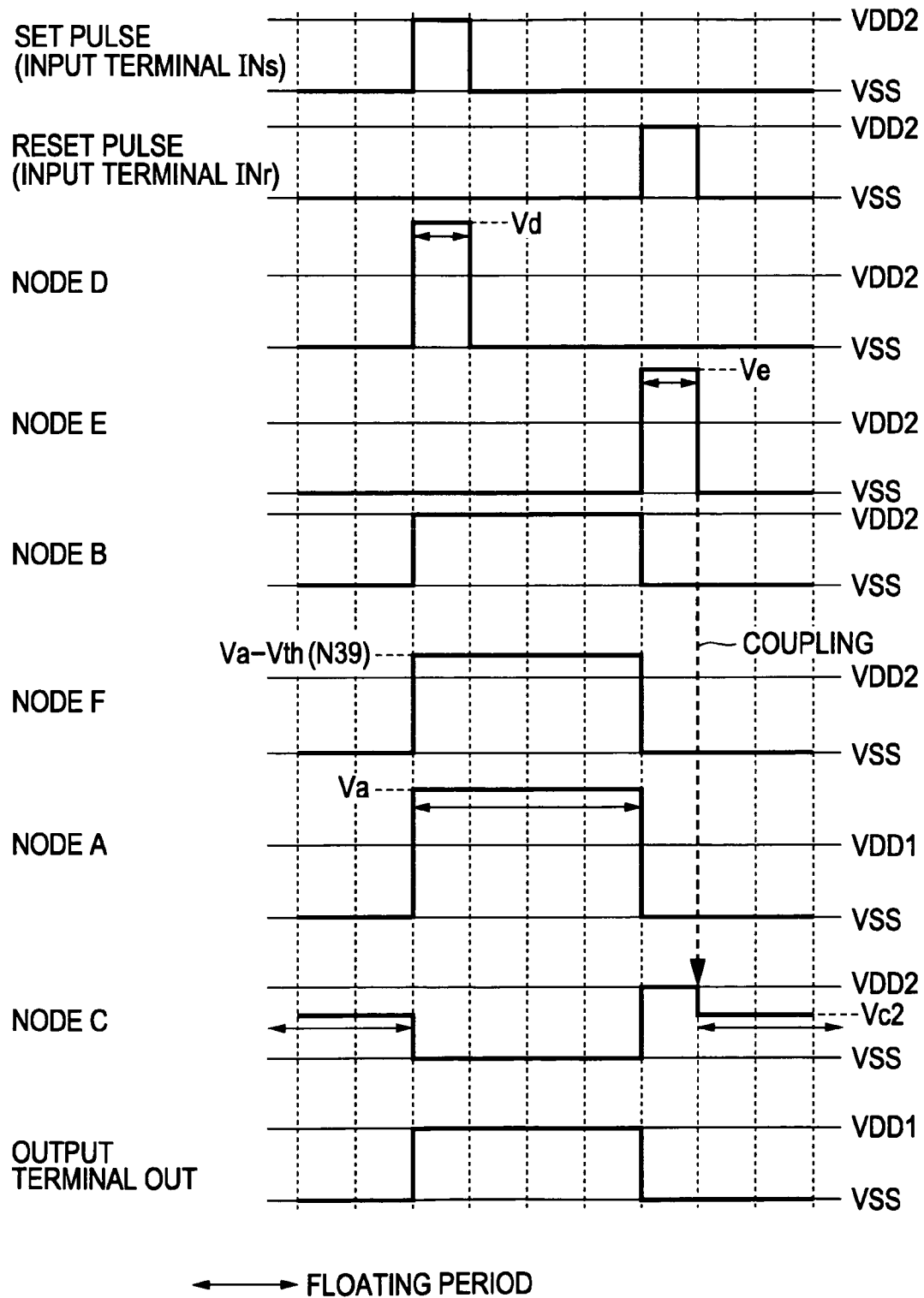
FIG. 35 illustrates drive waveforms of the buffer illustrated in FIG. 34.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 35. If the voltage Vd subsequent to the voltage rising satisfies Vd−VDD2>Vth(N33), the voltage at the node B becomes the high power-source voltage VDD2 with the thin-film transistor N33 conductive as illustrated in FIG. 35.

When the node B rises to the high power-source voltage VDD2 as described above, the node A also rises to a high level. The thin-film transistors N31 and N39 turn conductive, raising the voltage at the output terminal OUT and the voltage at the node F as illustrated in FIG. 35.

As the voltages at the output terminal OUT and the node F rise, the voltage at the node A rises by a voltage excursion responsive to a charge accumulated on the bootstrap auxiliary capacitance Cb31 as illustrated in FIG. 35.

If the voltage Va subsequent to the voltage rising satisfies Va−VDD1>Vth(N31), the voltage at the output terminal OUT becomes the first high power-source voltage VDD1 with the thin-film transistor N31 conductive as illustrated in FIG. 35. Changing of the pulse amplitude is thus performed.

The node F rises to a voltage determined by Va−Vth(N39) as illustrated in FIG. 33 because the thin-film transistor N39 is diode-connected.

If a condition of (Va−Vth(N39)−VDD2)>Vth(N41) is satisfied in accordance with the embodiment 6, the thin-film transistor N41 turns conductive, thereby supplying the second high power-source voltage VDD2 to the node B.

The thin-film transistor N36 is also conductive during the high-level period of the set pulse. For this reason, the gate voltage of the thin-film transistor N32 forming the output stage (voltage at the node C) is thus controlled to the low power-source voltage VSS as illustrated in FIG. 35.

The set pulse then falls from the high level to the low level. During this voltage transition, a voltage change of the set pulse can interfere with the node B and the node C because of the coupling effect.

As previously discussed, however, the gate electrode of the thin-film transistor N41 is supplied with the voltage determined by Va−Vth(N39) via the node F as illustrated in FIG. 35. For this reason, the node B is fixed to the second high power-source voltage VDD2 by the thin-film transistor N41 remaining conductive (as represented by the voltage at the node B in FIG. 35).

Even after the set pulse falls down to the low level, the nodes A, B, and F are maintained at the same levels thereof as when the set pulse is at the high level.

With the node B remaining at the high power-source voltage VDD2, the node C is supplied with the low power-source voltage VSS via the conductive thin-film transistor N38 as illustrated in FIG. 35.

This means that the node C is insusceptible to the interference responsive to the voltage change of the set pulse (means that the off-operation point of the thin-film transistor N32 is not shifted).

The above-described voltage status is maintained while the node B is at the high power-source voltage VDD2. More specifically, the node C is kept to the low power-source voltage VSS until the reset pulse is subsequently transitioned to the high level. As a result, the leak current of the thin-film transistor N32 is minimized.

The node B biased at the second high power-source voltage VDD2 means that the thin-film transistor N51 is at the cutoff state. The node A is maintained at the floating state at a bootstrap voltage (i.e., Va) as illustrated in FIG. 35. For this reason, the first high power-source voltage VDD1 continuously appears at the output terminal OUT of the first output stage as illustrated in FIG. 35.

When the reset pulse is transitioned from the low level to the high level at the input terminal INr in FIG. 35, the thin-film transistor N35 becomes conductive. The voltage at the node C rises as illustrated in FIG. 35. As the voltage at the node C rises, the gate voltage of the thin-film transistor N35 rises by a voltage excursion responsive to a charge accumulated on the bootstrap auxiliary capacitance. Cb33 as illustrated in FIG. 35. The resulting voltage subsequent to the voltage rising is Ve. If the voltage Ve satisfies a condition of Ve−VDD2>Vth(N35), the node C reaches the second high power-source voltage VDD2 with the thin-film transistor N35 conductive as illustrated in FIG. 35.

When the node C rises to the high power-source voltage VDD2, the thin-film transistors N32 and N40 become conductive. The voltage of the output terminal OUT and the voltage at the node F then fall to the low power-source voltage VSS as illustrated in FIG. 35.

While the reset pulse remains at the high level, the thin-film transistor N34 remains conductive. The voltage at the node B is thus controlled to the low power-source voltage VSS as illustrated in FIG. 35. The gate electrode of the thin-film transistor N31 forming the first output stage (voltage at the node A) also falls down to the low power-source voltage VSS.

The reset pulse then falls from the high level to the low level. During this voltage transition, a voltage change of the reset pulse can interfere with the node B and the node C because of the coupling effect.

Although the node C still maintains a high level, the voltage thereof falls from the second high power-source voltage VDD2 to a voltage Vc2 as illustrated in FIG. 35.

The voltage Vc2 at the node C satisfies a condition of Vc2−VSS>Vth(N32). The thin-film transistor N32 continues to be conductive, and the voltage at the output terminal OUT is maintained at the low power-source voltage VSS as illustrated in FIG. 35. The voltage Vc2 at the node C also satisfies a condition of Vc2−VSS>Vth(N40). The thin-film transistor N40 thus continues to be conductive, and the voltage at the node F is maintained at the low power-source voltage VSS as illustrated in FIG. 35.

Also, the voltage Vc2 at the node C satisfies Vc2−VSS>Vth(N37). The thin-film transistor N37 thus becomes conductive, and the low power-source voltage VSS is continuously supplied to the node B.

This means that the node B is insusceptible to the interference responsive to the voltage change of the set pulse (means that the off-operation point of the thin-film transistor N31 is not shifted).

The above-described voltage status is maintained while the node C is at the voltage Vc2. More specifically, the node B is kept to the low power-source voltage VSS until the set pulse is subsequently transitioned to the high level. As a result, the leak current of the thin-film transistor N31 is minimized.

The buffer 45 of the embodiment 6 not only reduces the signal amplitude of each of the set pulse and the reset pulse but also reduces the signal amplitudes of drive signals within the remaining stages of the buffer 45 other than the final output stage. For this reason, not only power consumed by a front section (such as the shift register) but also power consumed by the buffer 45 is reduced more than in the other embodiments.

Embodiment 7

A modification of the buffer 45 of the embodiment 2 is described below as an embodiment 7 of the present invention.

Figure 36:
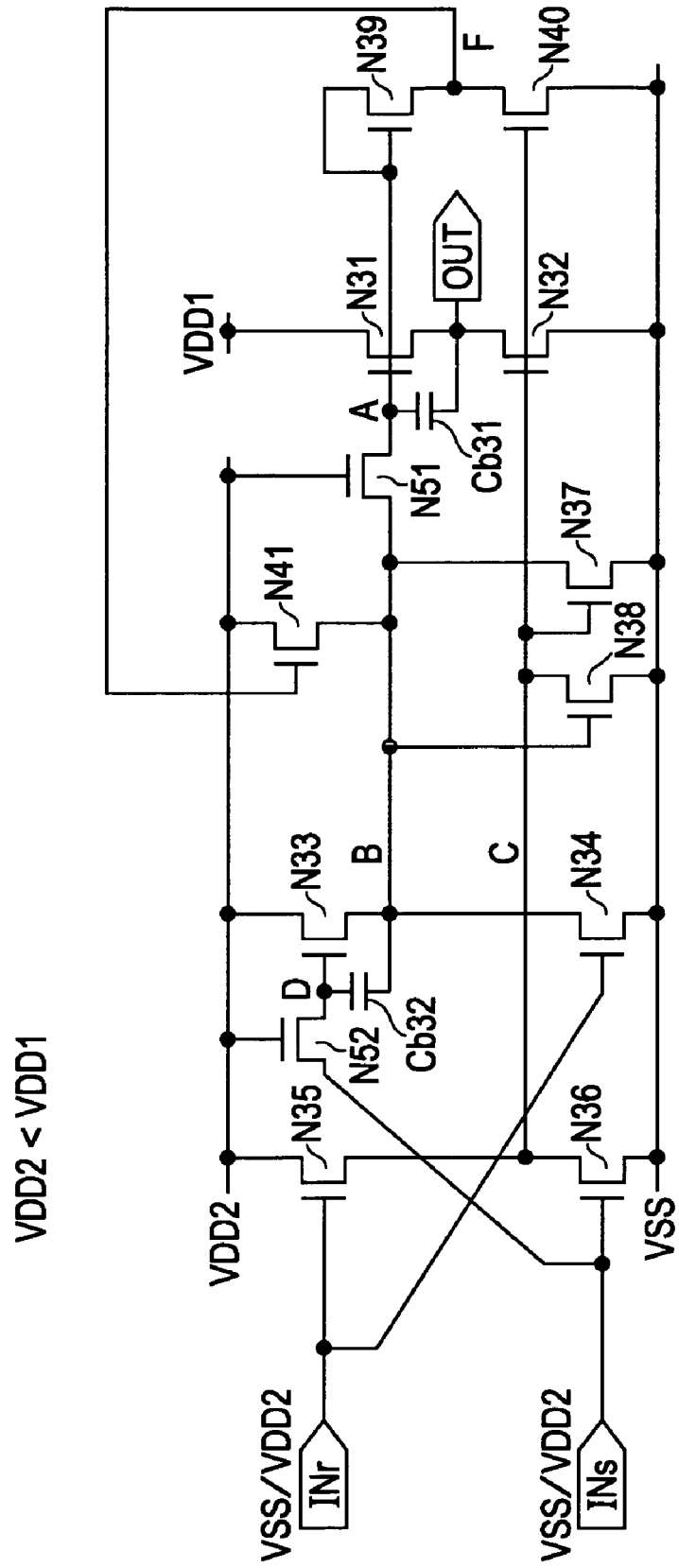
FIG. 36 is a circuit diagram of a buffer according to one embodiment of the present invention.

FIG. 36 illustrates the buffer 45 as the embodiment 7 of the present invention. In FIG. 36, elements identical to those illustrated in FIG. 34 are designated with the same reference numerals.

The buffer 45 of the embodiment 7 has the circuit structure of the embodiment 6 but with the thin-film transistor N53 removed therefrom. More specifically, the buffer 45 of the embodiment 7 has no bootstrap circuit on the second input stage. With this arrangement, the buffer 45 has a component count smaller than that of the embodiment 6.

The relationship of the voltage statuses of the set pulse and the reset pulse and the voltage status of each node is described with reference to FIG. 37.

Figure 37:
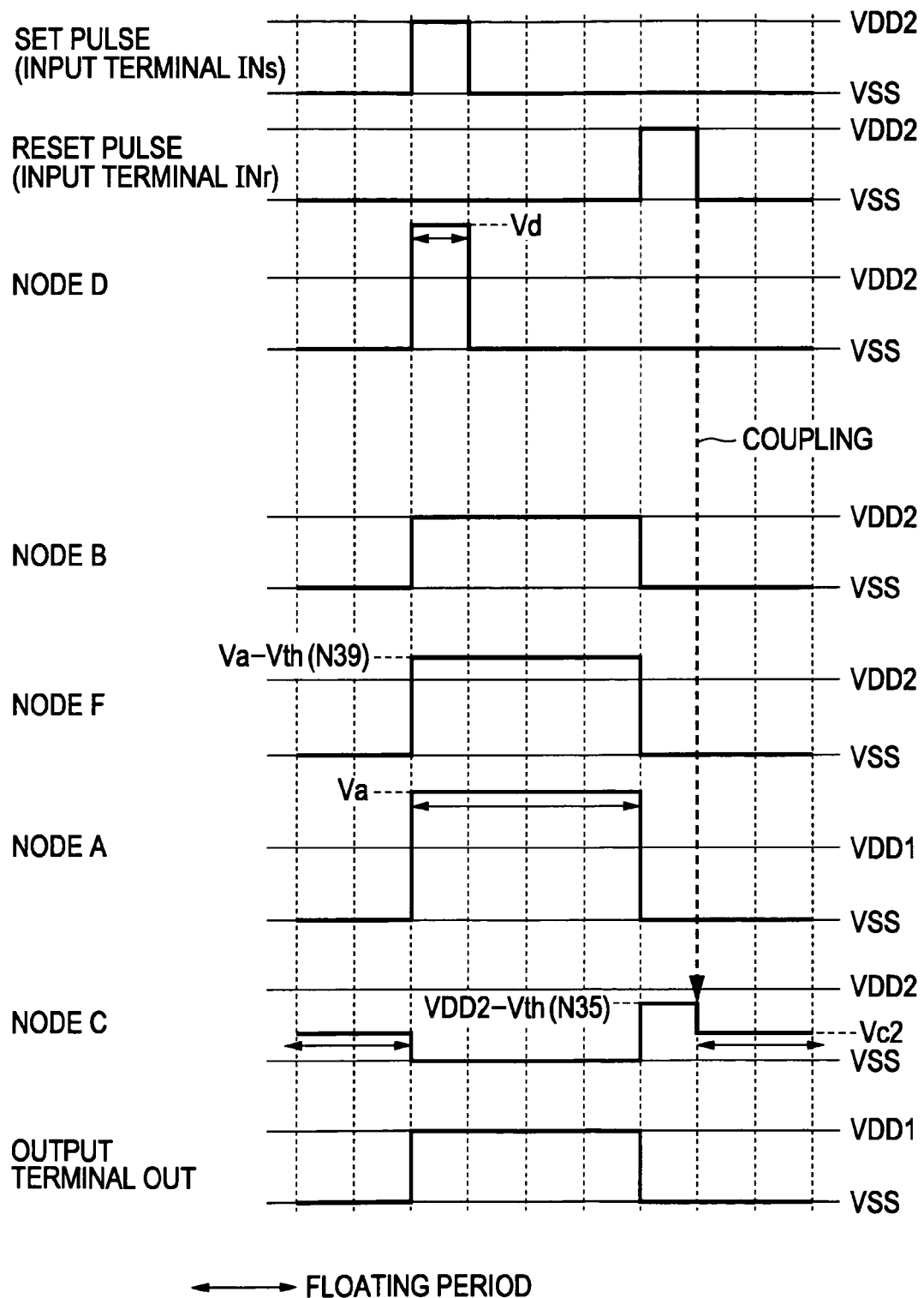
FIG. 37 illustrates drive waveforms of the buffer illustrated in FIG. 36.

FIG. 37 illustrates the voltage statuses of the set pulse at the input terminal INs, and the reset pulse at the input terminal INr.

FIG. 37 also illustrates the voltage status of the gate electrode of the thin-film transistor N33 (node D).

FIG. 37 further illustrates the voltage statuses of the control line connected to the output terminal of the first input stage (node B), the control line connected to the output terminal of the second output stage (node F), the gate electrode of the thin-film transistor N31 (node A), the control line connected to the output terminal of the second input stage (node C), and the output terminal OUT of the first output stage.

In accordance with the embodiment 7 of the present invention, each of the signal amplitude of the set pulse (input terminal INs) and the signal amplitude of the reset pulse (input terminal INr) is also given between the two values VSS and VDD2 (<VDD1).

Referring to FIG. 37, the operation of the buffer 45 of the embodiment 7 remains unchanged from the operation of the buffer 45 of the embodiment 6 in the period from the rising edge of the set pulse to the high level to the rising edge of the reset pulse to the high level.

The operation of the buffer 45 of the embodiment 7 starting with the rising edge of the reset pulse is described below.

When the reset pulse rises from the low level to the high level, the thin-film transistors N34 and N35 become conductive.

In response, the node B falls to the low power-source voltage VSS, and the voltage at the node C rises as illustrated in FIG. 37. The voltage at the node C is lower than the high power-source voltage VDD2 by a threshold voltage Vth(N35) of the thin-film transistor N35. More specifically, the voltage at the node C rises to VDD2−Vth(N35).

The high level (VDD2−Vth(N35)) satisfies the following three conditions:

$VDD2-Vth(N35)-VSS>Vth(N32),$ $VDD2-Vth(N35)-VSS>Vth(N37),$ and $VDD2-Vth(N35)-VSS>Vth(N40).$ Generally, the pulse amplitude (VDD2−VSS) is sufficiently larger than the threshold voltage value Vth, and all the above three conditions are satisfied.

When the node C rises to the high level, the thin-film transistor N32 turns conductive, and the voltage at the output terminal OUT falls to the low power-source voltage VSS as illustrated in FIG. 37. Also, the thin-film transistor N40 turns conductive, causing the node F to fall to the low power-source voltage VSS as illustrated in FIG. 37.

The thin-film transistor N34 that has turned conductive controls the voltage at the node B to the low power-source voltage VSS as illustrated in FIG. 37. As a result, the voltage at the node A is also controlled to the low power-source voltage VSS.

The reset pulse falls from the high level to the low level. During this voltage transition, a voltage change of the reset pulse interferes with the node C because of the capacitive coupling effect of the thin-film transistor N35 as illustrated in FIG. 37. Although the node C still maintains a high level, the voltage thereof falls to a voltage Vc2 as illustrated in FIG. 37.

The voltage Vc2 satisfies the following three conditions:

$Vc2-VSS>Vth(N32),$ $Vc2-VSS>Vth(N37),$ and $Vc2-VSS>Vth(N40).$

As long as the three conditions are satisfied, the thin-film transistors N32, N37, and N40 remain continuously conductive.

More specifically, the thin-film transistor N32 causes the low power-source voltage VSS to be supplied continuously to the output terminal OUT.

The thin-film transistor N37 causes the low power-source voltage VSS to be supplied continuously to the node B. This arrangement prevents the voltage change of the reset pulse from interfering with the node A via the thin-film transistor N34. The thin-film transistor N31 is free from the shifting of the off-operation point.

The voltage status described above is maintained for a period throughout which the voltage at the node C is maintained at the voltage Vc2. More specifically, the voltage at the node A is maintained at the low power-source voltage VSS until the set pulse is subsequently transitioned to the high level. As a result, the leak current of the thin-film transistor N31 is minimized.

As described above, the buffer 45 of the embodiment 7 even with a smaller component count provides the same operation and advantages as those of the buffer 45 of the embodiment 6.

Embodiment 8

A modification of the buffer 45 of the embodiment 2 is described below as an embodiment 8 of the present invention.

Figure 38:
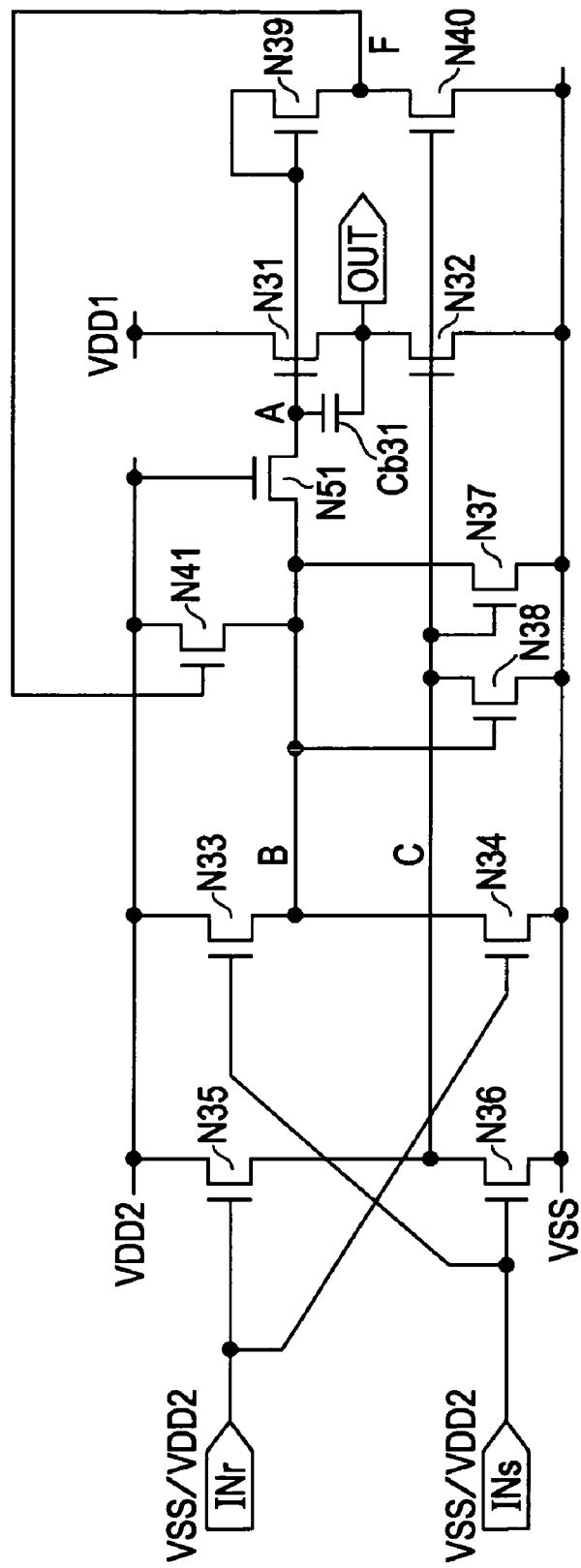
FIG. 38 is a circuit diagram of a buffer according to one embodiment of the present invention.

FIG. 38 illustrates the buffer 45 as the embodiment 8 of the present invention. In FIG. 38, elements identical to those illustrated in FIG. 36 are designated with the same reference numerals.

The buffer 45 of the embodiment 8 has the same circuit structure as the embodiment 7 but with the thin-film transistor N52 removed therefrom. More specifically, the buffer 45 of the embodiment 8 has the circuit structure of the embodiment 6 but with the bootstrap circuits removed from the first and second input stages thereof. In this way, the embodiment 8 of the present invention provides the buffer 45 having a component count smaller than that of the buffer 45 of the embodiment 7.

Figure 39:
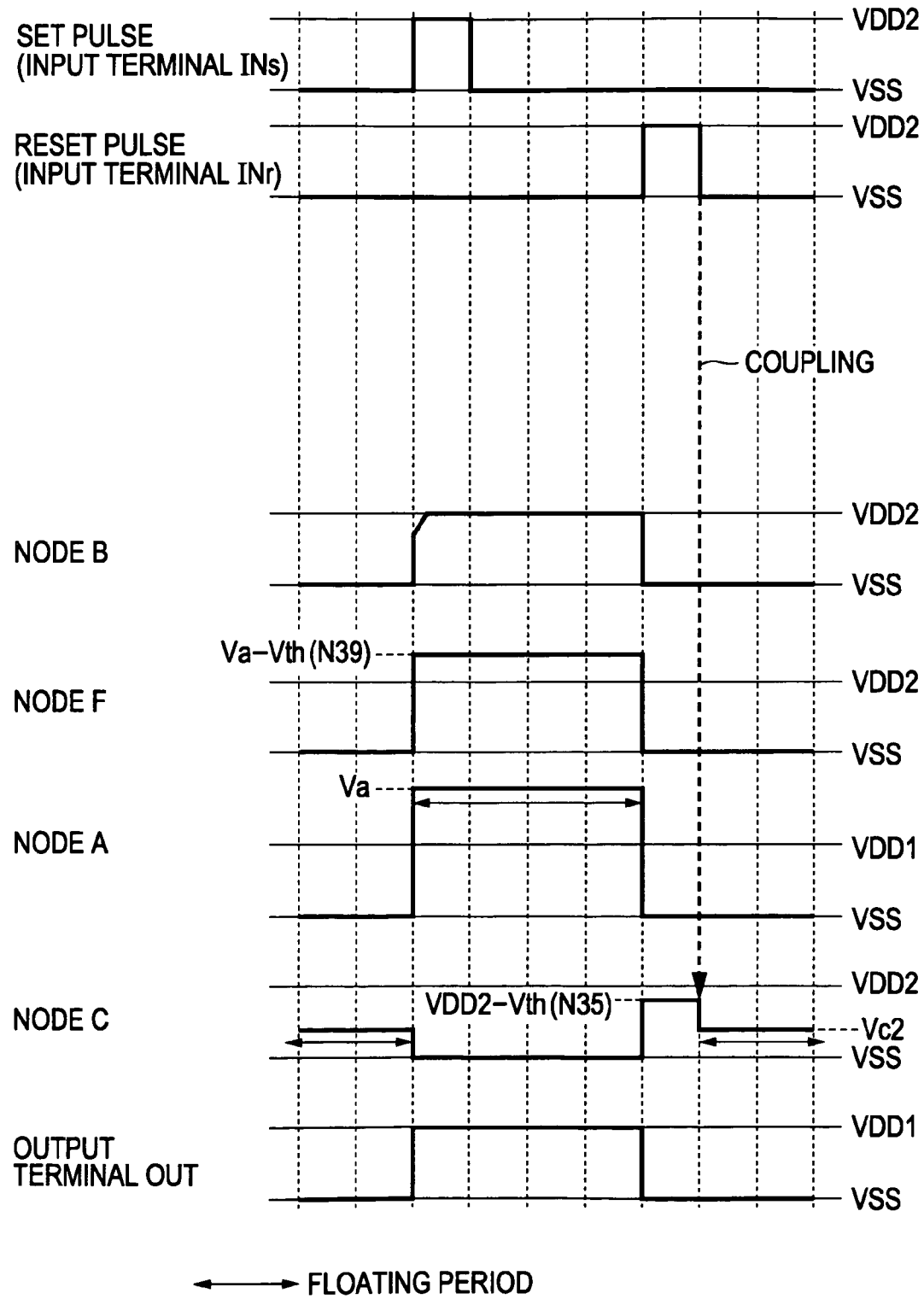
FIG. 39 illustrates drive waveforms of the buffer illustrated in FIG. 38.

FIG. 39 illustrates the relationship of the voltage statuses of the set pulse and the reset pulse and the voltage status of each node.

FIG. 39 also illustrates the voltage statuses of the set pulse at the input terminal INs, and the reset pulse at the input terminal INr.

FIG. 39 also illustrates the voltage status of the control line connected to the output terminal of the first input stage (node B).

FIG. 39 further illustrates the control line connected to the output terminal of the second output stage (node F), the gate electrode of the thin-film transistor N31 (node A), the control line connected to the output terminal of the second input stage (node C), and the output terminal OUT of the first output stage.

In accordance with the embodiment 8 of the present invention, each of the signal amplitude of the set pulse (input terminal INs) and the signal amplitude of the reset pulse (input terminal INr) is also given between the two values VSS and VDD2 (<VDD1).

As previously discussed, the buffer 45 of the embodiment 8 is identical in structure to the buffer 45 of the embodiment 7 in that the thin-film transistor N53 is eliminated. The operation of the buffer 45 subsequent to the rising edge of the reset pulse to the high level remains thus unchanged from the operation of the buffer 45 of the embodiment 7.

The discussion that follows focuses on the operation within the period from the rising edge of the set pulse to the high level to the rising edge of the reset pulse to the high level.

When the set pulse rises to the high level, the thin-film transistors N33 and N36 turn conductive.

In response, the voltage at the node B rises and the voltage at the node C falls to the low power-source voltage VSS as illustrated in FIG. 39.

The buffer 45 of the embodiment 8 includes no bootstrap circuit on the gate electrode side of the thin-film transistor N33. The voltage at the node B immediately subsequent to the rising edge of the set pulse to the high level rises only to a high level determined by VDD2−Vth(N33).

When the node B rises to the high level, the voltage at the output terminal OUT also rises to the high level. A bootstrap operation to the node A responsive to the rising of the node B to the high level allows the voltage at the node F to rise to Va−Vth(N39).

The voltage (Va−Vth(N39)) subsequent to the voltage rising satisfies a condition of (Va−Vth(N39)−VDD2>Vth (N41)). The thin-film transistor N41 thus turns conductive, thereby supplying the second high power-source voltage VDD2 to the node B as illustrated in FIG. 39.

This operation is characteristic of the buffer 45 of the embodiment 8.

When the set pulse falls from the high level to the low level, the thin-film transistor N41 causes the node B to be maintained at the high power-source voltage VDD2. While the node B is at the high level, the thin-film transistor N38 fixes the node C to the low power-source voltage VSS.

As described above, the buffer 45 of the embodiment 8 with a smaller component count thereof provides the same operation and advantages as those of the embodiment 7.

Embodiment 9

A modification of the buffer 45 of the embodiment 2 is described below as an embodiment 9 of the present invention.

Figure 40:
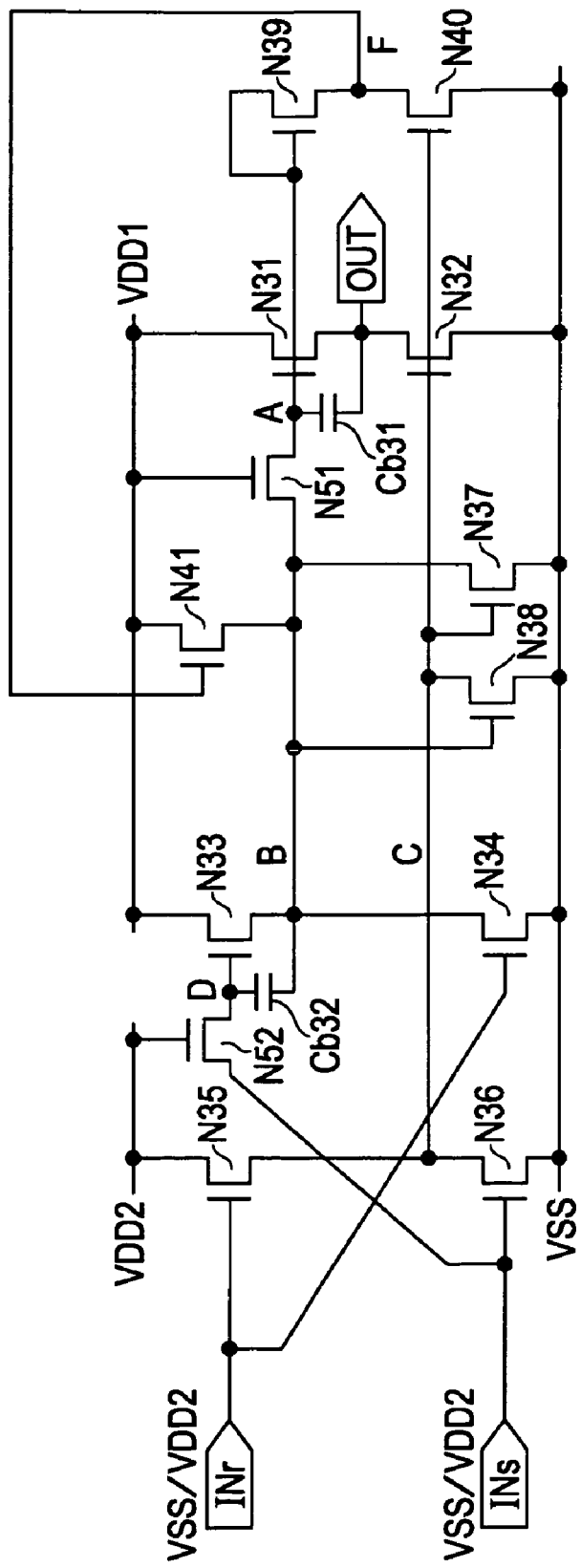
FIG. 40 is a circuit diagram of a buffer according to one embodiment of the present invention.

FIG. 40 illustrates the buffer 45 of the embodiment 9 of the present invention. In FIG. 40, elements identical to those illustrated in FIG. 28 are designated with the same reference numerals.

The buffer 45 of the embodiment 9 has the circuit structure of the embodiment 3 but with level shifting performed at the first input stage.

One of the main electrodes of the thin-film transistor N35 forming the second input stage and the gate electrode of the thin-film transistor N52 forming the first input stage are connected to the second high power-source voltage VDD2 (<VDD1). The buffer 45 thus constructed reduces the amplitude of each of the set pulse and the reset pulse and consumes less power than the buffer 45 of the embodiment 3.

Figure 41:
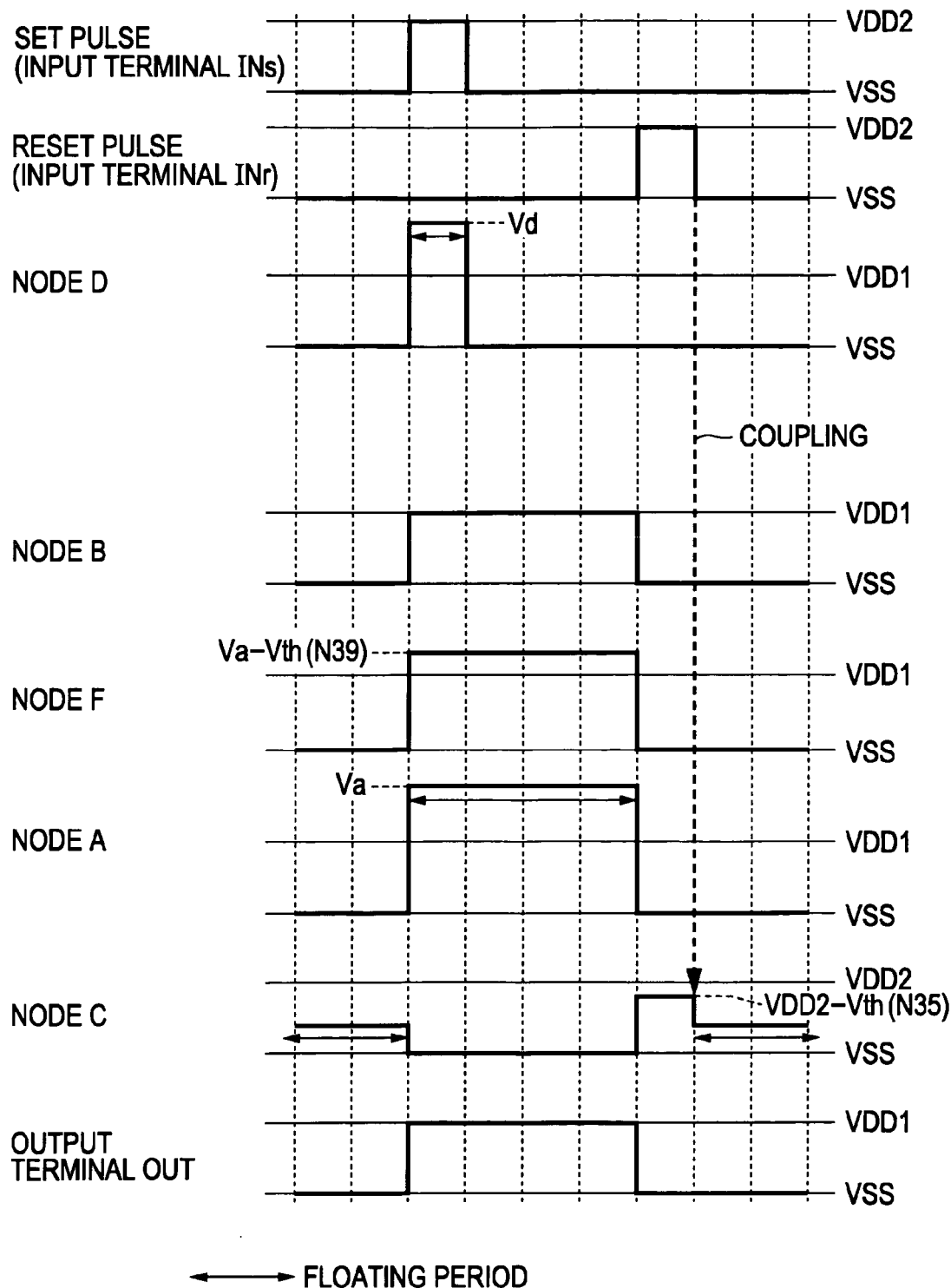
FIG. 41 illustrates drive waveforms of the buffer illustrated in FIG. 40.

FIG. 41 illustrates the relationship of the voltage statuses of the set pulse and the reset pulse and the voltage status of each node. The drive waveforms illustrated in FIG. 41 correspond to the respective drive waveforms illustrated in FIG. 29.

In accordance with the embodiment 9 of the present invention, each of the signal amplitude of the set pulse (input terminal INs) and the signal amplitude of the reset pulse (input terminal INr) is given between the two values VSS and VDD2 (<VDD1).

At the moment the set pulse rises to the high level, the node D at the first input stage rises to the high level. The thin-film transistor N33 then turns conductive, causing the voltage at the node B to rise as illustrated in FIG. 41.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 41. If the voltage Vd subsequent to the voltage rising satisfies Vd−VDD1>Vth(N33), the voltage at the node B becomes the first high power-source voltage VDD1 with the thin-film transistor N33 conductive as illustrated in FIG. 41. In other words, changing of the pulse amplitude is performed.

When the node B rises to the first high power-source voltage VDD1 as described above, the node A also rises to a high level. The thin-film transistors N31 and N39 turn conductive, raising the voltage at the output terminal OUT and the voltage at the node F as illustrated in FIG. 41.

As the voltages at the output terminal OUT and the node F rise, the voltage at the node A rises by a voltage excursion responsive to a charge accumulated on the bootstrap auxiliary capacitance Cb31 as illustrated in FIG. 41.

If the voltage Va subsequent to the voltage rising satisfies Va−VDD1>Vth(N31), the voltage at the output terminal OUT becomes the first high power-source voltage VDD1 with the thin-film transistor N31 conductive as illustrated in FIG. 41.

The node F rises to a voltage determined by Va−Vth(N39) as illustrated in FIG. 41 because the thin-film transistor N39 is diode-connected.

If a condition of (Va−Vth(N39)−VDD1)>Vth(N41) is satisfied in accordance with the embodiment 9, the thin-film transistor N41 turns conductive, thereby supplying the first high power-source voltage VDD1 to the node B.

The thin-film transistor N36 is also conductive with the set pulse at the high level. The gate voltage of the thin-film transistor N32 forming the output stage (voltage at the node C) is thus controlled to the low power-source voltage VSS as illustrated in FIG. 41.

The set pulse then falls from the high level to the low level. During this voltage transition, a voltage change of the set pulse can interfere with the nodes B and C because of the coupling effect.

The gate electrode of the thin-film transistor N41 is supplied with the voltage determined by Va−Vth(N39) via the node F as illustrated in FIG. 41. For this reason, the thin-film transistor N41 remaining conductive causes the voltage at the node B to be fixed to the first high power-source voltage VDD1 as illustrated in FIG. 41. This operation is characteristic of the embodiment 9.

Even after the set pulse falls to the low level, the voltages at the nodes A, B, and F remain at the same level as when the set pulse is at the high level.

Since the voltage at the node B is maintained at the first high power-source voltage VDD1, the thin-film transistor N38 remaining conductive continuously supplies the low power-source voltage VSS to the node C as illustrated in FIG. 41.

This means that the node C is insusceptible to the interference responsive to the voltage change of the set pulse (means that the off-operation point of the thin-film transistor N32 is not shifted).

This voltage status is maintained while the node B is at the first high power-source voltage VDD1. More specifically, the node C is maintained at the low power-source voltage VSS until the reset pulse is subsequently transitioned to the high level. As a result, the leak current of the thin-film transistor N32 is minimized.

The node B biased at the first high power-source voltage VDD1 means that the thin-film transistor N51 is at the cutoff state. The node A is maintained at the floating state at a bootstrap voltage (i.e., Va) as illustrated in FIG. 41. For this reason, the first high power-source voltage VDD1 continuously appears at the output terminal OUT of the first output stage as illustrated in FIG. 41.

When the reset pulse is transitioned from the low level to the high level at the input terminal INr in FIG. 41, the thin-film transistor N35 becomes conductive. The voltage at the node C rises as illustrated in FIG. 41. The voltage at the node C is lower than the high power-source voltage VDD2 by the threshold voltage value Vth(N35) of the thin-film transistor N35. More specifically, the node C rises to VDD2−Vth(N35).

The high level (VDD2−Vth(N35)) satisfies the following three conditions:

$$VDD2-Vth(N35)-VSS>Vth(N32),$$

$$VDD2-Vth(N35)-VSS>Vth(N37), \text{ and}$$

$$VDD2-Vth(N35)-VSS>Vth(N40).$$

Generally, the pulse amplitude (VDD2−VSS) is sufficiently larger than the threshold voltage value Vth, and all the above three conditions are satisfied.

When the node C rises to the high level, the thin-film transistor N32 turns conductive, and the voltage at the output terminal OUT falls to the low power-source voltage VSS as illustrated in FIG. 41.

The reset pulse falls from the high level to the low level. During this voltage transition, a voltage change of the reset pulse interferes with the node C because of the capacitive coupling effect of the thin-film transistor N35 as illustrated in FIG. 41. Although the node C still maintains a high level, the voltage thereof falls to a voltage Vc2 as illustrated in FIG. 41.

The voltage Vc2 satisfies the following three conditions:

$$Vc2-VSS>Vth(N32),$$

$$Vc2-VSS>Vth(N37), \text{ and}$$

$$Vc2-VSS>Vth(N40).$$

As long as the three conditions are satisfied, the thin-film transistors N32, N37, and N40 remain continuously conductive.

More specifically, the thin-film transistor N32 causes the low power-source voltage VSS to be supplied continuously to the output terminal OUT.

The thin-film transistor N37 causes the low power-source voltage VSS to be supplied continuously to the node B. This arrangement prevents the voltage change of the reset pulse from interfering with the node A via the thin-film transistor N34. The thin-film transistor N31 is free from the shifting of the off-operation point.

The voltage status described above is maintained for a period throughout which the voltage at the node C is maintained at the voltage Vc2. More specifically, the voltage at the node A is maintained at the low power-source voltage VSS until the set pulse is subsequently transitioned to the high level. As a result, the leak current of the thin-film transistor N31 is minimized.

The buffer 45 of the embodiment 9 operates in the same operation as the buffer 45 of the embodiment 3 and provides the same advantages as those of the buffer 45 of the embodiment 3. The buffer 45 of the embodiment 9 operates with the front section (such as the shift register) consuming less power.

Embodiment 10

A modification of the buffer 45 of the embodiment 2 is described below as an embodiment 10 of the present invention.

Figure 42:
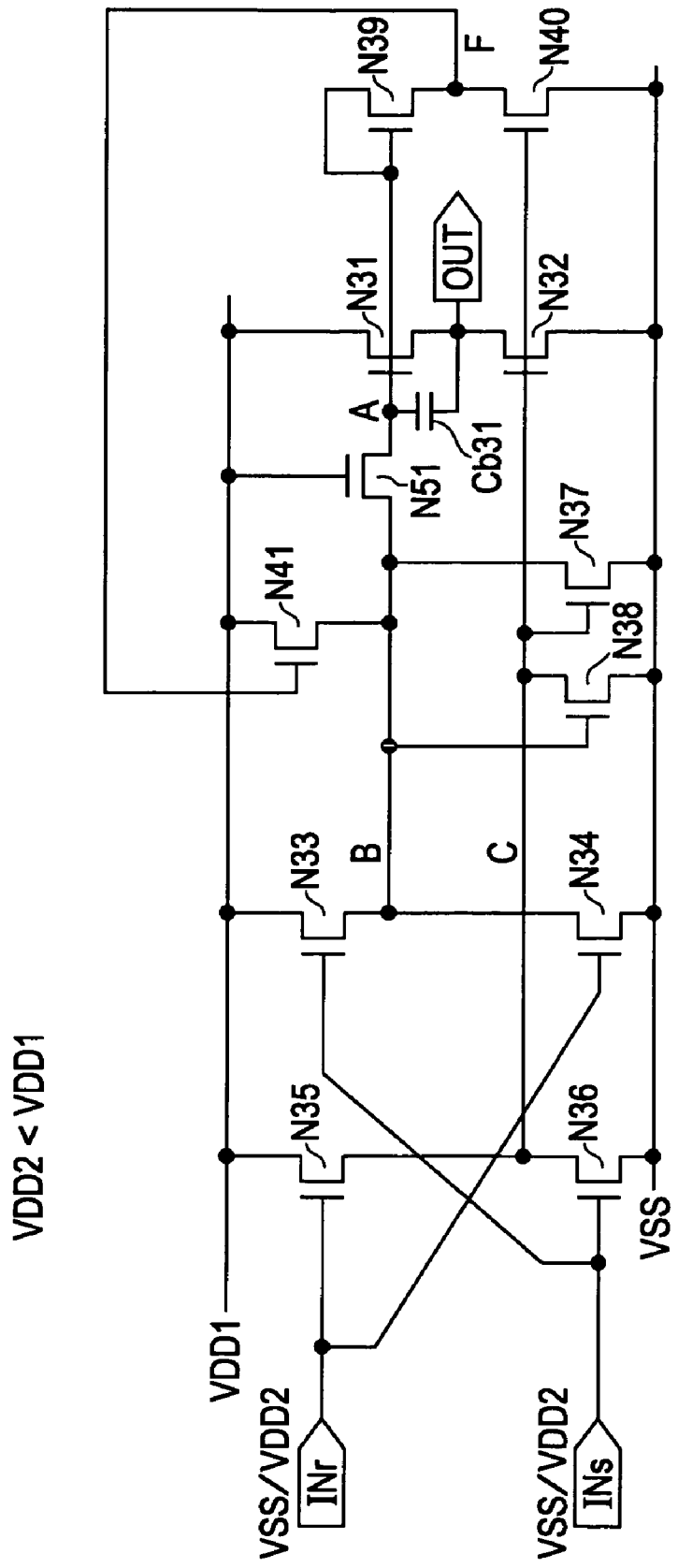
FIG. 42 is a circuit diagram of a buffer according to one embodiment of the present invention.

FIG. 42 illustrates the buffer 45 of the embodiment 10 of the present invention. In FIG. 42, elements identical to those illustrated in FIG. 30 are designated with the same reference numerals.

A comparison of FIG. 42 with FIG. 30 reveals that the buffer 45 of the embodiment 10 is generally similar in circuit structure to the buffer 45 of the embodiment 4.

The difference between the embodiments 4 and 10 is that the set pulse and the reset pulse is smaller in amplitude than the counterparts in the embodiment 4. More specifically, the set pulse and the reset pulse are driven at the two values of VSS and VDD2 (<VDD1) in the embodiment 10.

The relationship of the voltage statuses of the set pulse and the reset pulse and the voltage status of each node is described with reference to FIG. 43. The drive waveforms illustrated in FIG. 43 correspond to the respective drive waveforms illustrated in FIG. 31.

In accordance with the embodiment 10 of the present invention, each of the signal amplitude of the set pulse (input terminal INs) and the signal amplitude of the reset pulse (input terminal INr) is given between the two values VSS and VDD2 (<VDD1).

At the moment the set pulse rises to the high level, the thin-film transistors N33 and N36 turn conductive.

Figure 43:
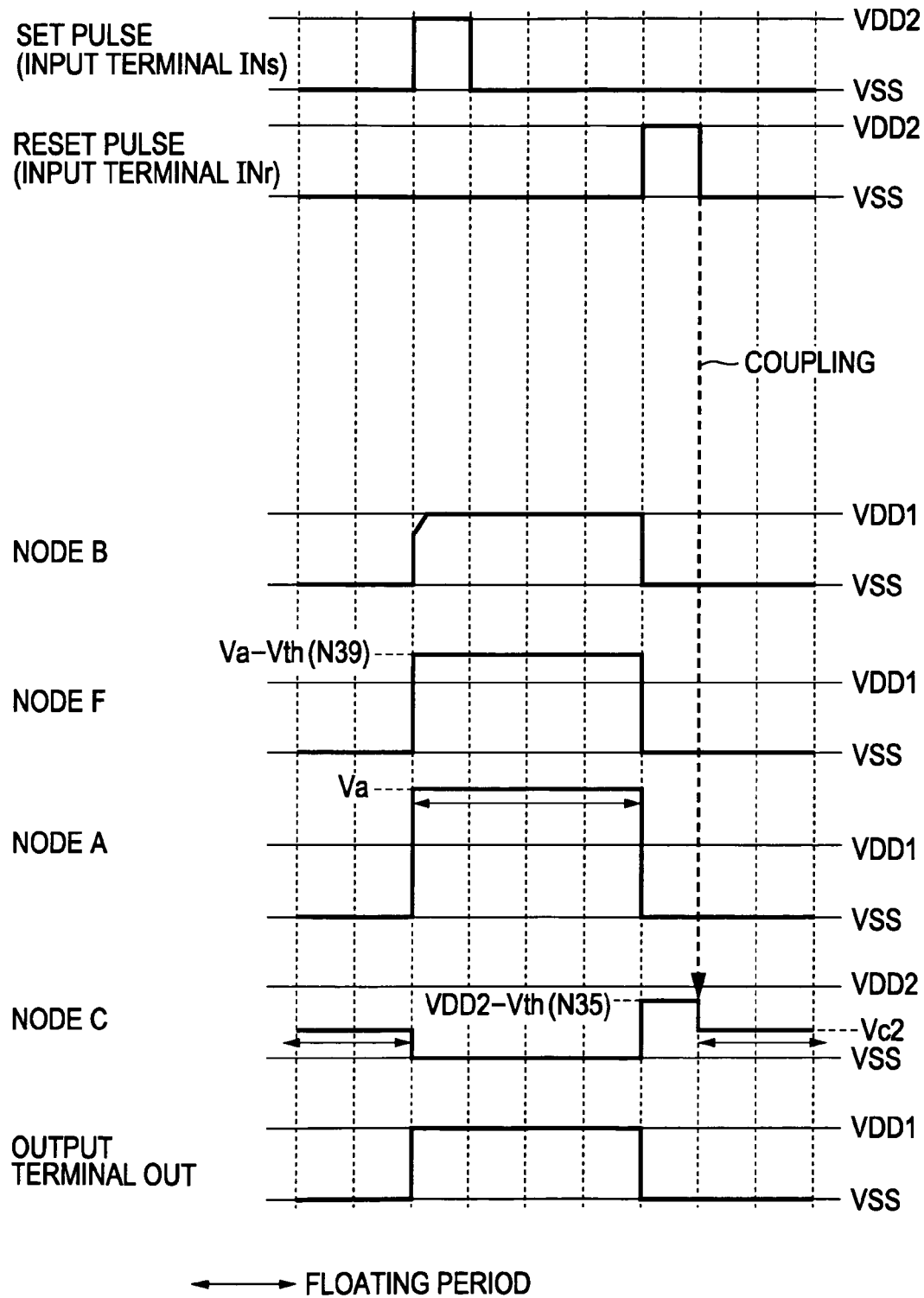
FIG. 43 illustrates drive waveforms of the buffer illustrated in FIG. 42.

In response, the voltage at the node B rises and the voltage at the node C falls to the low power-source voltage VSS as illustrated in FIG. 43.

The buffer 45 of the embodiment 10 includes no bootstrap circuit on the gate electrode side of the thin-film transistor N33. The voltage at the node B immediately subsequent to the rising edge of the set pulse to the high level rises only to a high level determined by VDD2−Vth(N33).

When the node B rises to the high level, the voltage at the output terminal OUT also rises to the high level. The voltage at the node A rises to the bootstrap voltage Va as illustrated in FIG. 43. Since the bootstrap voltage Va satisfies a condition of Va−VDD1>Vth(N31), the voltage at the output terminal OUT rises to the first high power-source voltage VDD1 as illustrated in FIG. 43.

Since the thin-film transistor N39 is diode-connected, the voltage at the node F rises to a voltage determined by Va−Vth(N39) as illustrated in FIG. 43. The voltage (Va−Vth(N39)) satisfies a condition of (Va−Vth(N39)−VDD1>Vth(N41)). The thin-film transistor N41 thus turns conductive, thereby supplying the first high power-source voltage VDD1 to the node B as illustrated in FIG. 43.

This operation is characteristic of the buffer 45 of the embodiment 10.

The thin-film transistor N36 is also conductive with the set pulse at the high level. The gate voltage of the thin-film transistor N32 forming the output stage (voltage at the node C) is thus controlled to the low power-source voltage VSS as illustrated in FIG. 43.

The set pulse then falls from the high level to the low level. During this voltage transition, a voltage change of the set pulse can interfere with the nodes B and C because of the coupling effect.

The gate electrode of the thin-film transistor N41 is supplied with the voltage determined by Va−Vth (N39) via the node F as illustrated in FIG. 43.

For this reason, the thin-film transistor N41 remaining conductive causes the voltage at the node B to be fixed to the first high power-source voltage VDD1 as illustrated in FIG. 43. This operation is characteristic of the embodiment 10.

Even after the set pulse falls to the low level, the voltages at the nodes A, B, and F remain at the same level as when the set pulse is at the high level.

Since the voltage at the node B is maintained at the first high power-source voltage VDD1, the thin-film transistor N38 remaining conductive continuously supplies the low power-source voltage VSS to the node C as illustrated in FIG. 43.

This means that the node C is insusceptible to the interference responsive to the voltage change of the set pulse (means that the off-operation point of the thin-film transistor N32 is not shifted).

This voltage status is maintained while the node B is at the first high power-source voltage VDD1. More specifically, the node C is maintained at the low power-source voltage VSS until the reset pulse is subsequently transitioned to the high level. As a result, the leak current of the thin-film transistor N32 is minimized.

The node B biased at the first high power-source voltage VDD1 means that the thin-film transistor N51 is at the cutoff state. The node A is maintained at the floating state at a bootstrap voltage (i.e., Va) as illustrated in FIG. 43. For this reason, the first high power-source voltage VDD1 continuously appears at the output terminal OUT of the first output stage as illustrated in FIG. 43.

When the reset pulse is transitioned from the low level to the high level at the input terminal INr in FIG. 43, the thin-film transistor N35 becomes conductive. The voltage at the node C rises as illustrated in FIG. 43. The voltage at the node C is lower than the high power-source voltage VDD2 by the threshold voltage value Vth(N35) of the thin-film transistor N35. More specifically, the node C rises to VDD2−Vth(N35).

The high level (VDD2−Vth(N35)) satisfies the following three conditions:

$VDD2-Vth(N35)-VSS>Vth(N32)$, $VDD2-Vth(N35)-VSS>Vth(N37)$, and $VDD2-Vth(N35)-VSS>Vth(N40)$.

Generally, the pulse amplitude (VDD2−VSS) is sufficiently larger than the threshold voltage value Vth, and all the above three conditions are satisfied.

When the node C rises to the high level, the thin-film transistor N32 turns conductive, and the voltage at the output terminal OUT falls to the low power-source voltage VSS as illustrated in FIG. 43.

The thin-film transistor N40 then turns conductive, thereby causing the voltage at the node F to fall to the low power-source voltage VSS as illustrated in FIG. 43.

The thin-film transistor N34 that has turned conductive controls the voltage at the node B to the low power-source voltage VSS as illustrated in FIG. 43. As a result, the node A is also controlled to the low power-source voltage VSS as illustrated in FIG. 43.

The reset pulse falls from the high level to the low level. During this voltage transition, a voltage change of the reset pulse interferes with the node C because of the capacitive coupling effect of the thin-film transistor N35 as illustrated in FIG. 43. Although the node C still maintains a high level, the voltage thereof falls to a voltage Vc2 as illustrated in FIG. 43.

The voltage Vc2 satisfies the following three conditions:

$Vc2-VSS>Vth(N32)$, $Vc2-VSS>Vth(N37)$, and $Vc2-VSS>Vth(N40)$.

As long as the three conditions are satisfied, the thin-film transistors N32, N37, and N40 remain continuously conductive.

More specifically, the thin-film transistor N32 causes the low power-source voltage VSS to be supplied continuously to the output terminal OUT.

The thin-film transistor N37 causes the low power-source voltage VSS to be supplied continuously to the node B. This arrangement prevents the voltage change of the reset pulse from interfering with the node A via the thin-film transistor N34. The thin-film transistor N31 is free from the shifting of the off-operation point.

The voltage status described above is maintained for a period throughout which the voltage at the node C is maintained at the voltage Vc2. More specifically, the voltage at the node A is maintained at the low power-source voltage VSS until the set pulse is subsequently transitioned to the high level. As a result, the leak current of the thin-film transistor N31 is minimized.

The buffer 45 of the embodiment 10 operates in the same operation as the buffer 45 of the embodiment 4 and provides the same advantages as those of the buffer 45 of the embodiment 4. The buffer 45 of the embodiment 10 operates with the front section (such as the shift register) consuming less power.

Embodiment 11

A modification of the buffer 45 of the embodiment 2 is described below as an embodiment 11 of the present invention.

Figure 44:
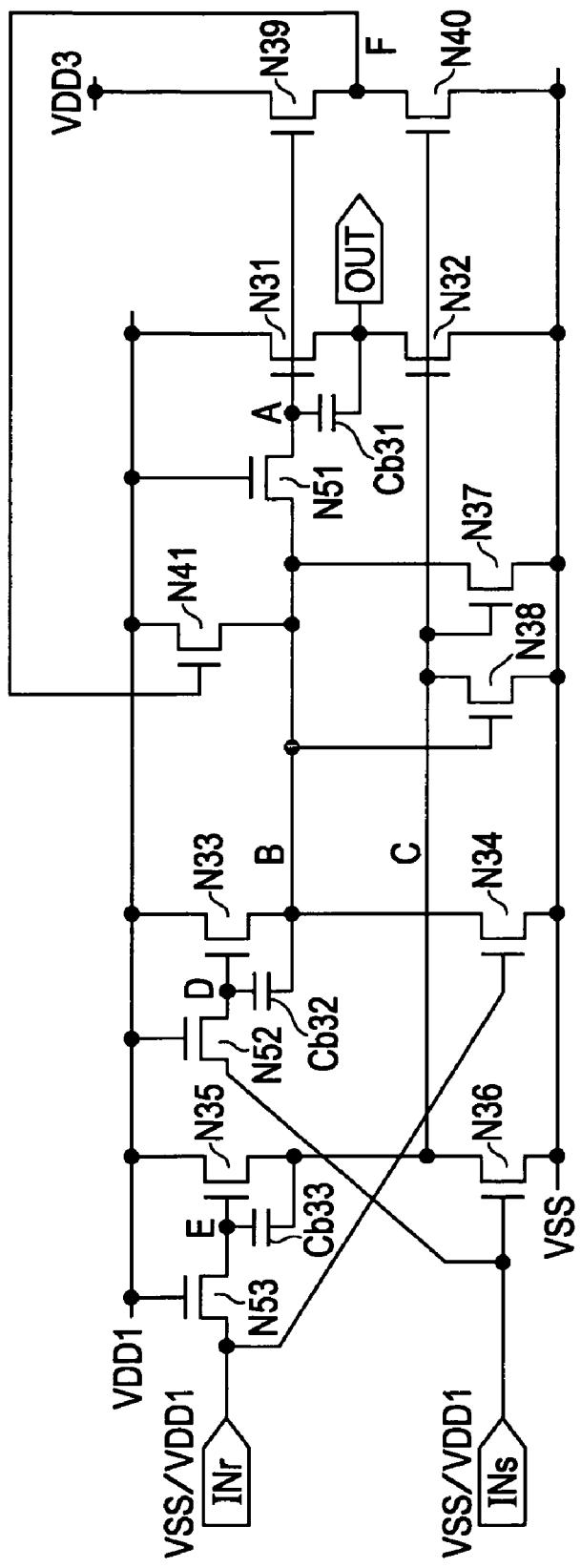
FIG. 44 is a circuit diagram of a buffer according to one embodiment of the present invention.

FIG. 44 illustrates the buffer 45 of the embodiment 11 of the present invention. In FIG. 44, elements identical to those illustrated in FIG. 26 are designated with the same reference numerals.

The buffer 45 of the embodiment 11 is generally similar in structure to the buffer 45 of the embodiment 2 except for the second output stage. More specifically, the bootstrap circuit is employed in each of the first and second input stages and the first output stage.

The difference between the buffer 45 of the embodiment 11 and the buffer 45 of the embodiment 2 lies in the connection configuration of the thin-film transistor N39 forming the second output stage. In the embodiment 11, one of the main electrodes at a high voltage source is connected to a third high power-source voltage VDD3 (>VDD1+Vth(N41)).

The relationship of the voltage statuses of the set pulse and the reset pulse and the voltage status of each node is described with reference to FIG. 45. The drive waveforms illustrated in FIG. 45 correspond to the respective drive waveforms illustrated in FIG. 27.

In accordance with the embodiment 11 of the present invention, each of the signal amplitude of the set pulse (input terminal INs) and the signal amplitude of the reset pulse (input terminal INr) is given between the two values VSS and VDD1.

At the moment the set pulse rises to the high level, the node D at the first input stage rises to the high level. The thin-film transistor N33 then turns conductive, causing the voltage at the node B to rise as illustrated in FIG. 45.

Figure 45:
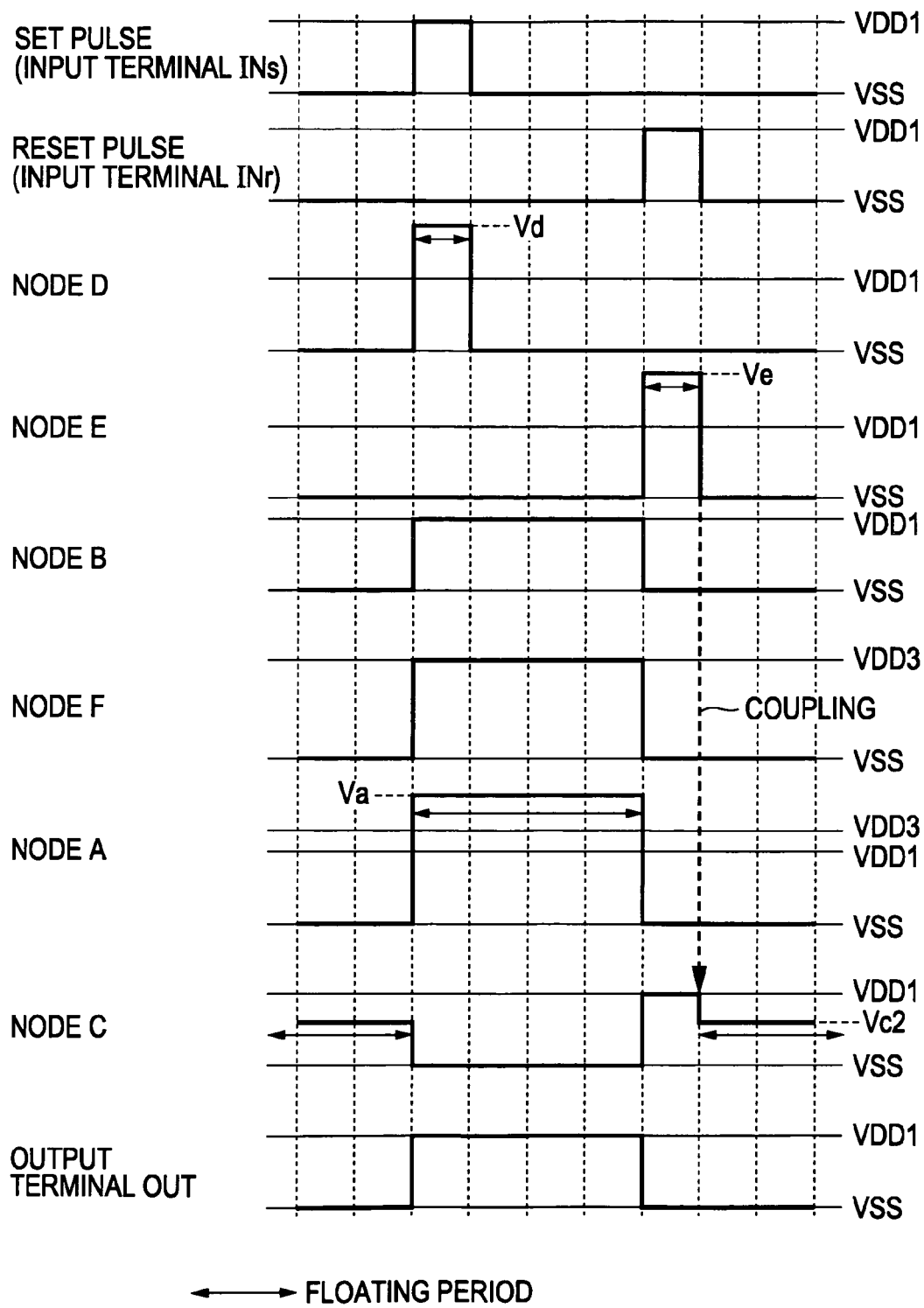
FIG. 45 illustrates drive waveforms of the buffer illustrated in FIG. 44.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 45. If the voltage Vd subsequent to the voltage rising satisfies Vd−VDD1>Vth(N33), the voltage at the node B becomes the first high power-source voltage VDD1 with the thin-film transistor N33 conductive as illustrated in FIG. 45.

When the node B rises to the first high power-source voltage VDD1 as described above, the node A also rises to a high level. The thin-film transistors N31 and N39 turn conductive, raising the voltage at the output terminal OUT and the voltage at the node F as illustrated in FIG. 45.

As the voltages at the output terminal OUT and the node F rise, the voltage at the node A rises by a voltage excursion responsive to a charge accumulated on the bootstrap auxiliary capacitance Cb31 as illustrated in FIG. 45.

If the voltage Va subsequent to the voltage rising satisfies Va−VDD1>Vth(N31), the voltage at the output terminal OUT becomes the first high power-source voltage VDD1 with the thin-film transistor N31 conductive as illustrated in FIG. 45.

If the voltage Va subsequent to the voltage rising satisfies Va−VDD3>Vth(N39), the voltage at the node F becomes a third high power-source voltage VDD3 with the thin-film transistor N39 conductive as illustrated in FIG. 45.

The third high power-source voltage VDD3 is determined to satisfy a condition of VDD3−VDD1>Vth(N41).

When the node F rises to the high level, the thin-film transistor N41 turns conductive, thereby supplying the first high power-source voltage VDD1 to the node B.

The thin-film transistor N36 is also conductive with the set pulse at the high level. The gate voltage of the thin-film transistor N32 forming the output stage (voltage at the node C) is thus controlled to the low power-source voltage VSS as illustrated in FIG. 45.

The set pulse then falls from the high level to the low level. During this voltage transition, a voltage change of the set pulse can interfere with the nodes B and C because of the coupling effect.

The gate electrode of the thin-film transistor N41 is supplied with the third high power-source voltage VDD3 via the node F as illustrated in FIG. 45. For this reason, the thin-film transistor N41 remaining conductive causes the voltage at the node B to be fixed to the first high power-source voltage VDD1 as illustrated in FIG. 45.

Even after the set pulse falls to the low level, the voltages of the nodes A, B, and F remain at the same level as when the set pulse is at the high level.

Since the voltage at the node B is maintained at the first high power-source voltage VDD1, the thin-film transistor N38 remaining conductive continuously supplies the low power-source voltage VSS to the node C as illustrated in FIG. 45.

This means that the node C is insusceptible to the interference responsive to the voltage change of the set pulse (means that the off-operation point of the thin-film transistor N32 is not shifted).

This voltage status is maintained while the node B is at the first high power-source voltage VDD1. More specifically, the node C is maintained at the low power-source voltage VSS until the reset pulse is subsequently transitioned to the high level. As a result, the leak current of the thin-film transistor N32 is minimized.

The node B biased at the first high power-source voltage VDD1 means that the thin-film transistor N51 is at the cutoff state. The node A is maintained at the floating state at a bootstrap voltage (i.e., Va) as illustrated in FIG. 45. For this reason, the first high power-source voltage VDD1 continuously appears at the output terminal OUT of the first output stage as illustrated in FIG. 45.

When the reset pulse is transitioned from the low level to the high level at the input terminal INr in FIG. 45, the thin-film transistor N35 becomes conductive. The voltage at the node C rises as illustrated in FIG. 45. As the voltage at the node C rises, the gate voltage of the thin-film transistor N35 (voltage at the node E) rises by a voltage excursion responsive to a charge accumulated on the bootstrap auxiliary capacitance Cb33 as illustrated in FIG. 45. The resulting voltage subsequent to the voltage rising is Ve. If the voltage Ve satisfies a condition of Ve−VDD1>Vth(N35), the node C reaches the first high power-source voltage VDD1 with the thin-film transistor N35 conductive as illustrated in FIG. 45.

When the node C rises to the first high power-source voltage VDD1, the thin-film transistors N32 and N40 become conductive. The voltage of the output terminal OUT and the voltage at the node F then fall to the low power-source voltage VSS as illustrated in FIG. 45.

While the reset pulse remains at the high level, the thin-film transistor N34 remains conductive. The voltage at the node B is thus controlled to the low power-source voltage VSS as illustrated in FIG. 45. The gate electrode of the thin-film transistor N31 forming the first output stage (voltage at the node A) also falls down to the low power-source voltage VSS.

The reset pulse then falls from the high level to the low level. During this voltage transition, a voltage change of the reset pulse may interfere with the node B and the node C because of the coupling effect.

Although the node C still maintains a high level, the voltage thereof falls from the first high power-source voltage VDD1 to a voltage Vc2 as illustrated in FIG. 45.

The voltage Vc2 at the node C satisfies a condition of Vc2−VSS>Vth(N32). The thin-film transistor N32 continues to be conductive, and the voltage at the output terminal OUT is maintained at the low power-source voltage VSS as illustrated in FIG. 45. The voltage Vc2 at the node C also satisfies a condition of Vc2−VSS>Vth(N40). The thin-film transistor N40 thus continues to be conductive, and the voltage at the node F is maintained at the low power-source voltage VSS as illustrated in FIG. 45.

Also, the voltage Vc2 at the node C satisfies Vc2−VSS>Vth(N37). The thin-film transistor N37 thus becomes conductive, and the low power-source voltage VSS is continuously supplied to the node B.

This means that the node B is insusceptible to the interference responsive to the voltage change of the set pulse (means that the off-operation point of the thin-film transistor N31 is not shifted) as illustrated in FIG. 45.

The above-described voltage status is maintained while the node C is at the voltage Vc2. More specifically, the node B is kept to the low power-source voltage VSS until the set pulse is subsequently transitioned to the high level. As a result, the leak current of the thin-film transistor N31 is minimized.

The buffer 45 thus constructed provides the same operation and advantages as those of the buffer 45 of the embodiment 2.

Embodiment 12

A modification of the buffer 45 of the embodiment 2 is described below as an embodiment 12 of the present invention.

Figure 46:
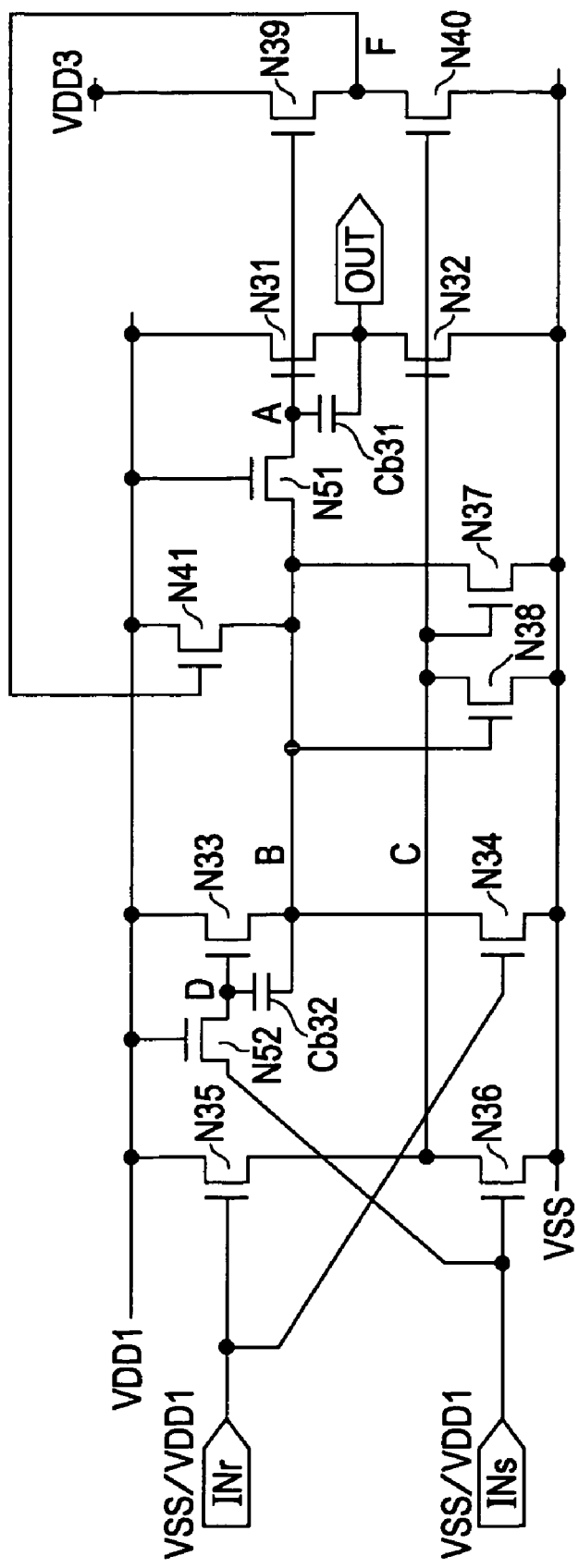
FIG. 46 is a circuit diagram of a buffer according to one embodiment of the present invention.

FIG. 46 illustrates the buffer 45 as the embodiment 12 of the present invention. In FIG. 46, elements identical to those illustrated in FIG. 28 are designated with the same reference numerals.

The buffer 45 of the embodiment 12 has the same circuit structure as the embodiment 11 but with the thin-film transistor N53 removed therefrom. More specifically, the buffer 45 of the embodiment 12 has no bootstrap circuit on the second input stage. With this arrangement, the buffer 45 has a component count smaller than that of the embodiment 11. The buffer 45 of the embodiment 12 corresponds to the buffer 45 of the embodiment 3 in drive waveform.

Figure 47:
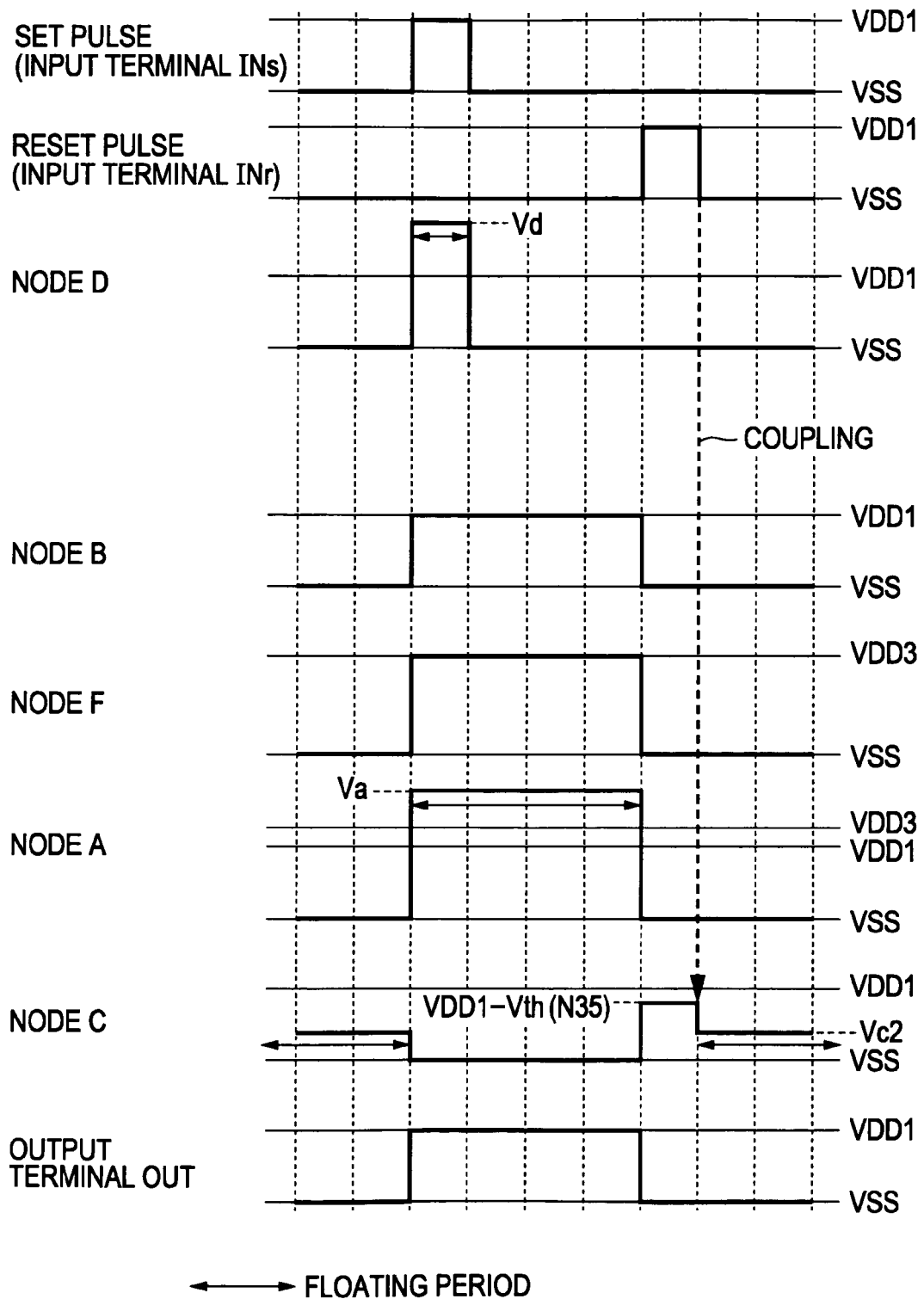
FIG. 47 illustrates drive waveforms of the buffer illustrated in FIG. 46.

FIG. 47 illustrates the relationship of the voltage statuses of the set pulse and the reset pulse and the voltage status of each node. The drive waveforms illustrated in FIG. 47 correspond to the respective drive waveforms illustrated in FIG. 29.

In accordance with the embodiment 12 of the present invention, each of the signal amplitude of the set pulse (input terminal INs) and the signal amplitude of the reset pulse (input terminal INr) is also given between the two values VSS and VDD1.

Referring to FIG. 47, the operation of the buffer 45 of the embodiment 12 remains unchanged from the operation of the buffer 45 of the embodiment 11 in the period from the rising edge of the set pulse to the high level to the rising edge of the reset pulse to the high level.

The operation of the buffer 45 of the embodiment 12 starting with the rising edge of the reset pulse is described below.

When the reset pulse rises from the low level to the high level, the thin-film transistors N34 and N35 become conductive.

In response, the node B falls to the low power-source voltage VSS, and the voltage at the node C rises as illustrated in FIG. 47. The voltage at the node C is lower than the first high power-source voltage VDD1 by a threshold voltage Vth (N35) of the thin-film transistor N35. More specifically, the voltage at the node C rises to VDD1−Vth(N35).

The high level (VDD1−Vth(N35)) satisfies the following three conditions:

$$VDD1-Vth(N35)-VSS>Vth(N32),$$

$$VDD1-Vth(N35)-VSS>Vth(N37), \text{ and}$$

$$VDD1-Vth(N35)-VSS>Vth(N40).$$

Generally, the pulse amplitude (VDD1−VSS) is sufficiently larger than the threshold voltage value Vth, and all the above three conditions are satisfied.

When the node C rises to the high level, the thin-film transistor N32 turns conductive, and the voltage at the output terminal OUT falls to the low power-source voltage VSS as illustrated in FIG. 47.

The reset pulse falls from the high level to the low level. During this voltage transition, a voltage change of the reset pulse interferes with the node C because of the capacitive coupling effect of the thin-film transistor N35 as illustrated in FIG. 47. Although the node C still maintains a high level, the voltage thereof falls to a voltage Vc2 as illustrated in FIG. 47.

The voltage Vc2 satisfies the following three conditions:

$$Vc2-VSS>Vth(N32),$$

$$Vc2-VSS>Vth(N37), \text{ and}$$

$$Vc2-VSS>Vth(N40).$$

As long as the three conditions are satisfied, the thin-film transistors N32, N37, and N40 remain continuously conductive.

More specifically, the thin-film transistor N32 causes the low power-source voltage VSS to be supplied continuously to the output terminal OUT.

The thin-film transistor N37 causes the low power-source voltage VSS to be supplied continuously to the node B. This arrangement prevents the voltage change of the reset pulse from interfering with the node A via the thin-film transistor N34. The thin-film transistor N31 is free from the shifting of the off-operation point.

The voltage status described above is maintained for a period throughout which the voltage at the node C is maintained at the voltage Vc2. More specifically, the voltage at the node A is maintained at the low power-source voltage VSS until the set pulse is subsequently transitioned to the high level. As a result, the leak current of the thin-film transistor N31 is minimized.

As described above, the buffer 45 of the embodiment 12 even with a smaller component count provides the same operation and advantages as those of the buffer 45 of the embodiment 11.

Embodiment 13

A modification of the buffer 45 of the embodiment 2 is described below as an embodiment 13 of the present invention.

Figure 48:
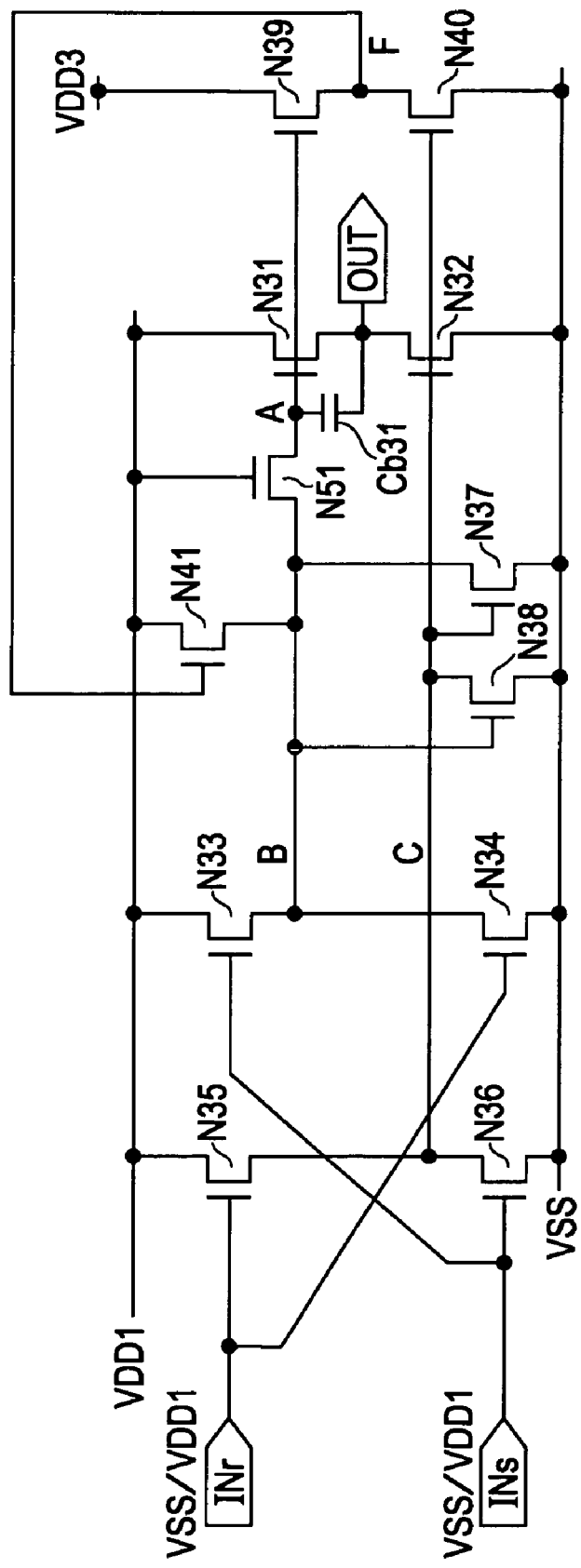
FIG. 48 is a circuit diagram of a buffer according to one embodiment of the present invention.

FIG. 48 illustrates the buffer 45 as the embodiment 13 of the present invention. In FIG. 48, elements identical to those illustrated in FIG. 30 are designated with the same reference numerals.

The buffer 45 of the embodiment 13 has the same circuit structure as the embodiment 12 but with the thin-film transistor N52 removed therefrom. More specifically, the buffer 45 of the embodiment 13 has the circuit structure of the embodiment 11 but with the bootstrap circuits removed from the first and second input stages thereof. In this way, the embodiment 13 of the present invention provides the buffer 45 having a component count smaller than that of the buffer 45 of the embodiment 12. The buffer 45 of the embodiment 13 corresponds to the buffer 45 of the embodiment 4 in waveform diagram.

Figure 49:
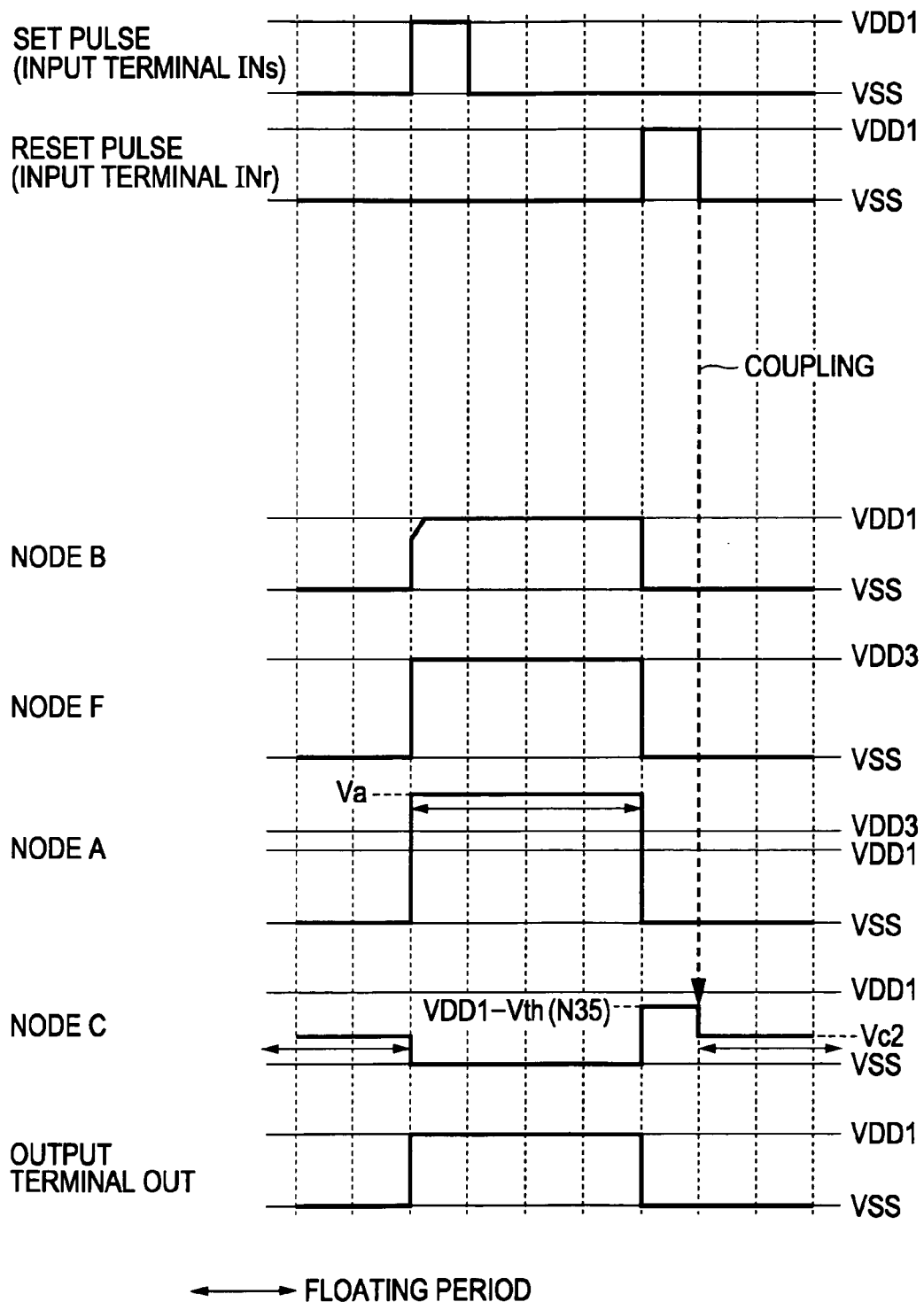
FIG. 49 illustrates drive waveforms of the buffer illustrated in FIG. 48.

FIG. 49 illustrates the relationship of the voltage statuses of the set pulse and the reset pulse and the voltage status of each node.

The drive waveforms illustrated in FIG. 49 correspond to the respective drive waveforms illustrated in FIG. 31.

In accordance with the embodiment 13 of the present invention, each of the signal amplitude of the set pulse (input terminal INs) and the signal amplitude of the reset pulse (input terminal INr) is given between the two values VSS and VDD1.

As previously discussed, the buffer 45 of the embodiment 13 is identical in structure to the buffer 45 of the embodiment 12 in that the thin-film transistor N53 is eliminated. The operation of the buffer 45 subsequent to the rising edge of the reset pulse to the high level remains thus unchanged from the operation of the buffer 45 of the embodiment 12.

The discussion that follows focuses on the operation within the period from the rising edge of the set pulse to the high level to the rising edge of the reset pulse to the high level.

When the set pulse rises to the high level, the thin-film transistors N33 and N36 turn conductive.

In response, the voltage at the node B rises and the voltage at the node C falls to the low power-source voltage VSS as illustrated in FIG. 49.

The buffer 45 of the embodiment 13 includes no bootstrap circuit on the gate electrode side of the thin-film transistor N33. The voltage at the node B immediately subsequent to the rising edge of the set pulse to the high level rises only to a high level determined by VDD1−Vth(N33).

A bootstrap operation to the node A responsive to the rising of the node B to the high level allows the voltage at the node F to rise to the third high-voltage power source VDD3.

The third high-voltage power source VDD3 satisfies VDD3−VDD1>Vth(N41) as previously discussed. The thin-film transistor N41 thus turns conductive, thereby supplying the first high power-source voltage VDD1 to the node B as illustrated in FIG. 49.

When the set pulse falls from the high level to the low level, the thin-film transistor N41 causes the node B to be maintained at the first high power-source voltage VDD1. While the node B is at the high level, the thin-film transistor N38 fixes the node C to the low power-source voltage VSS.

As described above, the buffer 45 of the embodiment 13 with a smaller component count thereof provides the same operation and advantages as those of the embodiment 12.

Embodiment 14

A modification of the buffer 45 of the embodiment 2 is described below as an embodiment 14 of the present invention.

Figure 50:
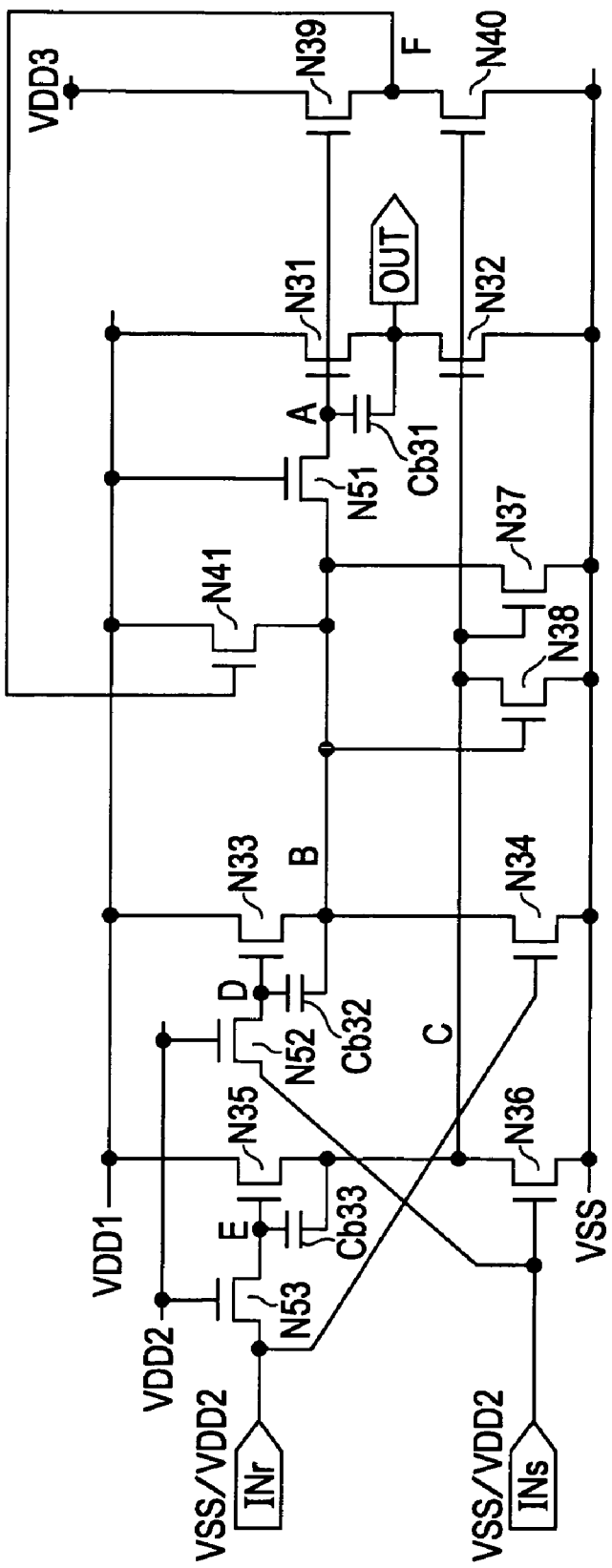
FIG. 50 is a circuit diagram of a buffer according to one embodiment of the present invention.

FIG. 50 illustrates the buffer 45 of the embodiment 14 of the present invention. In FIG. 50, elements identical to those illustrated in FIG. 44 are designated with the same reference numerals.

The buffer 45 of the embodiment 14 has the same circuit structure as the embodiment 11 but with level shifting performed at the first and second input stages.

The gate electrodes of the thin-film transistors N52 and N53 forming the bootstrap circuits of the first and second input stages are connected to the second high power-source voltage VDD2(<VDD1). With this arrangement, each of the set pulse and the reset pulse has a smaller amplitude and the power consumption of the front section is even more reduced.

The bootstrap auxiliary capacitances Cb33, Cb32, and Cb31 are respectively connected to the first and second input stages and the first output stage. If the thin-film transistors N31, N33, and N35 have sufficiently high gate capacitances, none of the bootstrap auxiliary capacitances Cb31, Cb32, and Cb33 are mounted. The buffer 45 of the embodiment 14 corresponds to the buffer 45 of the embodiment 5 in drive waveform.

The relationship of the voltage statuses of the set pulse and the reset pulse and the voltage status of each node is described with reference to FIG. 51. The drive waveforms illustrated in FIG. 51 correspond to the respective drive waveforms illustrated in FIG. 33.

In accordance with the embodiment 14 of the present invention, each of the signal amplitude of the set pulse (input terminal INs) and the signal amplitude of the reset pulse (input terminal INr) is given between the two values VSS and VDD2 (<VDD1).

At the moment the set pulse rises to the high level, the node D at the first input stage rises to the high level. The thin-film transistor N33 then turns conductive, causing the voltage at the node B to rise as illustrated in FIG. 51.

Figure 51:
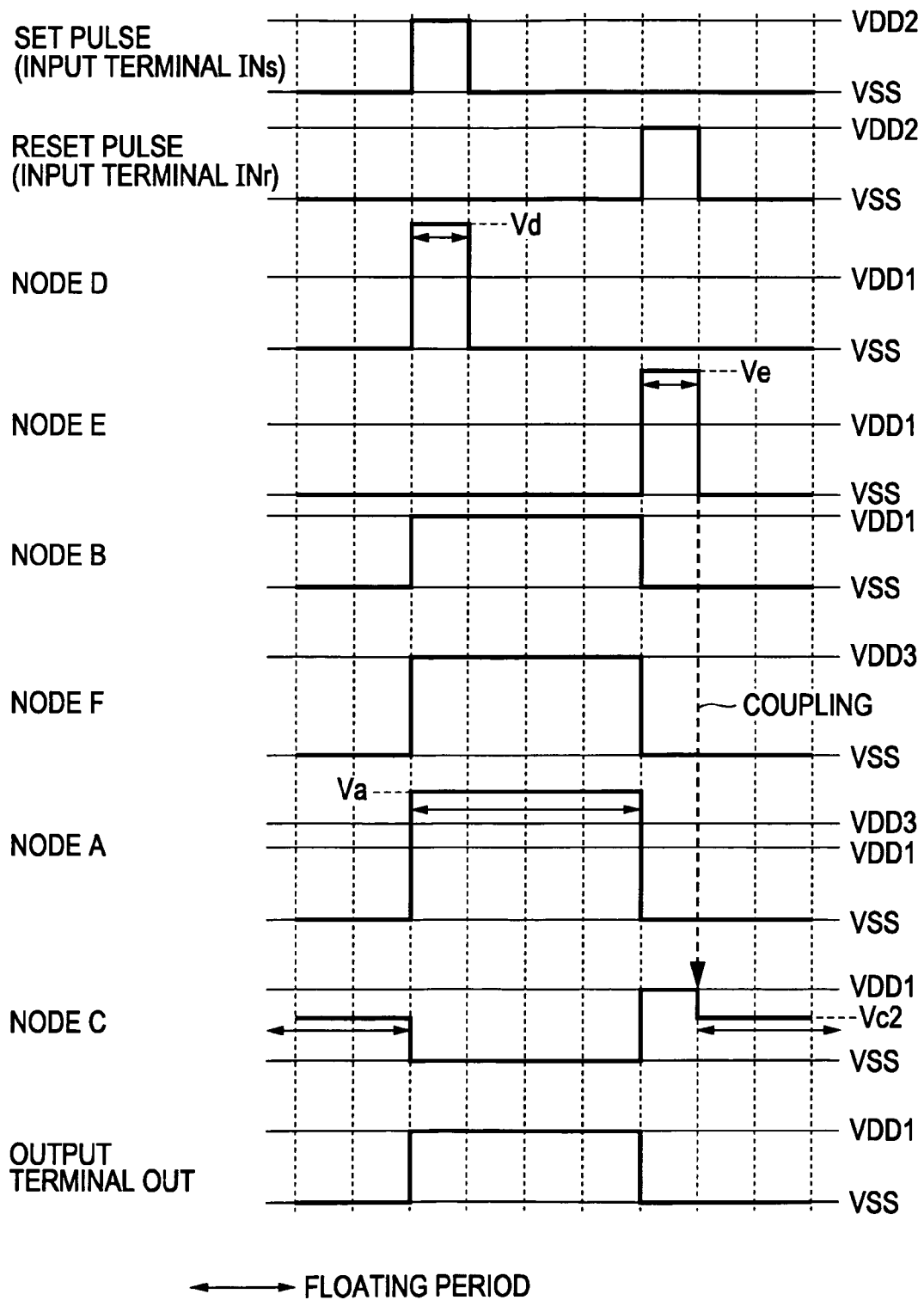
FIG. 51 illustrates drive waveforms of the buffer illustrated in FIG. 50.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 51. If the voltage Vd subsequent to the voltage rising satisfies Vd−VDD1>Vth(N33), the voltage at the node B becomes the first high power-source voltage VDD1 with the thin-film transistor N33 conductive as illustrated in FIG. 51.

When the node B rises to the first high power-source voltage VDD1 as described above, the node A also rises to a high level. The thin-film transistors N31 and N39 turn conductive, raising the voltage at the output terminal OUT and the voltage at the node F as illustrated in FIG. 51.

As the voltages at the output terminal OUT and the node F rise, the voltage at the node A rises by a voltage excursion responsive to a charge accumulated on the bootstrap auxiliary capacitance Cb31 as illustrated in FIG. 51.

If the voltage Va subsequent to the voltage rising satisfies Va−VDD1>Vth(N31), the voltage at the output terminal OUT becomes the first high power-source voltage VDD1 with the thin-film transistor N31 conductive as illustrated in FIG. 51.

The voltage Va subsequent to the voltage rising satisfies a condition of Va−VDD3>Vth(N39). The voltage at the node F with the thin-film transistor N39 conductive becomes the third high-voltage power source VDD3 as illustrated in FIG. 51.

The third high-voltage power source VDD3 satisfies VDD3−VDD1>Vth(N41) as previously discussed.

The thin-film transistor N41 thus turns conductive, thereby supplying the first high power-source voltage VDD1 to the node B.

The thin-film transistor N36 is also conductive with the set pulse at the high level. The gate voltage of the thin-film transistor N32 forming the output stage (voltage at the node C) is thus controlled to the low power-source voltage VSS as illustrated in FIG. 51.

The set pulse then falls from the high level to the low level. During this voltage transition, a voltage change of the set pulse can interfere with the nodes B and C because of the coupling effect.

The gate electrode of the thin-film transistor N41 is supplied with the third high power-source voltage VDD3 via the node F as illustrated in FIG. 51. For this reason, the thin-film transistor N41 remaining conductive causes the voltage at the node B to be fixed to the first high power-source voltage VDD1 as illustrated in FIG. 51.

Even after the set pulse falls to the low level, the voltages at the nodes A, B, and F remain at the same level as when the set pulse is at the high level.

Since the voltage at the node B is maintained at the first high power-source voltage VDD1, the thin-film transistor N38 remaining conductive continuously supplies the low power-source voltage VSS to the node C as illustrated in FIG. 51.

This means that the node C is insusceptible to the interference responsive to the voltage change of the set pulse (means that the off-operation point of the thin-film transistor N32 is not shifted).

This voltage status is maintained while the node B is at the first high power-source voltage VDD1. More specifically, the node C is maintained at the low power-source voltage VSS until the reset pulse is subsequently transitioned to the high level. As a result, the leak current of the thin-film transistor N32 is minimized.

The node B biased at the first high power-source voltage VDD1 means that the thin-film transistor N51 is at the cutoff state. The node A is maintained at the floating state at a bootstrap voltage (i.e., Va) as illustrated in FIG. 51. For this reason, the first high power-source voltage VDD1 continuously appears at the output terminal OUT of the first output stage as illustrated in FIG. 51.

When the reset pulse is transitioned from the low level to the high level at the input terminal INr in FIG. 51, the thin-film transistor N35 becomes conductive. The voltage at the node C rises as illustrated in FIG. 51. As the voltage at the node C rises, the gate voltage of the thin-film transistor N35 rises by a voltage excursion responsive to a charge accumulated on the bootstrap auxiliary capacitance Cb33 as illustrated in FIG. 51. The resulting voltage subsequent to the voltage rising is Ve. If the voltage Ve satisfies a condition of Ve−VDD1>Vth(N35), the node C reaches the first high power-source voltage VDD1 with the thin-film transistor N35 conductive as illustrated in FIG. 51.

When the node C rises to the first high power-source voltage VDD1, the thin-film transistors N32 and N40 become conductive. The voltage of the output terminal OUT and the voltage at the node F then fall to the low power-source voltage VSS as illustrated in FIG. 51.

While the reset pulse remains at the high level, the thin-film transistor N34 remains conductive. The voltage at the node B is thus controlled to the low power-source voltage VSS as illustrated in FIG. 51. The gate electrode of the thin-film transistor N31 forming the first output stage (voltage at the node A) also falls down to the low power-source voltage VSS.

The reset pulse then falls from the high level to the low level. During this voltage transition, a voltage change of the reset pulse can interfere with the node B and the node C because of the coupling effect.

Although the node C still maintains a high level, the voltage thereof falls from the first high power-source voltage VDD1 to a voltage Vc2 as illustrated in FIG. 51.

The voltage Vc2 at the node C satisfies a condition of Vc2−VSS>Vth(N32). The thin-film transistor N32 continues to be conductive, and the voltage at the output terminal OUT is maintained at the low power-source voltage VSS as illustrated in FIG. 51. The voltage Vc2 at the node C also satisfies a condition of Vc2−VSS>Vth(N40). The thin-film transistor N40 thus continues to be conductive, and the voltage at the node F is maintained at the low power-source voltage VSS as illustrated in FIG. 51.

Also, the voltage Vc2 at the node C satisfies Vc2−VSS>Vth(N37). The thin-film transistor N37 thus becomes conductive, and the low power-source voltage VSS is continuously supplied to the node B.

This means that the node B is insusceptible to the interference responsive to the voltage change of the set pulse (means that the off-operation point of the thin-film transistor N31 is not shifted) as illustrated in FIG. 51.

The above-described voltage status is maintained while the node C is at the voltage Vc2. More specifically, the node B is kept to the low power-source voltage VSS until the set pulse is subsequently transitioned to the high level next. As a result, the leak current of the thin-film transistor N31 is minimized.

The buffer 45 thus constructed provides the same operation and advantages as those of the buffer 45 of the embodiment 2.

Moreover, the buffer 45 of the embodiment 14 causes a signal amplitude of each of the set pulse and the reset pulse to be smaller than the signal amplitude of the output pulse. For this reason, the power consumption of a front section (such as the shift register) is reduced to be lower than that of the other embodiments.

Embodiment 15

A modification of the buffer 45 of the embodiment 2 is described below as an embodiment 15 of the present invention.

Figure 52:
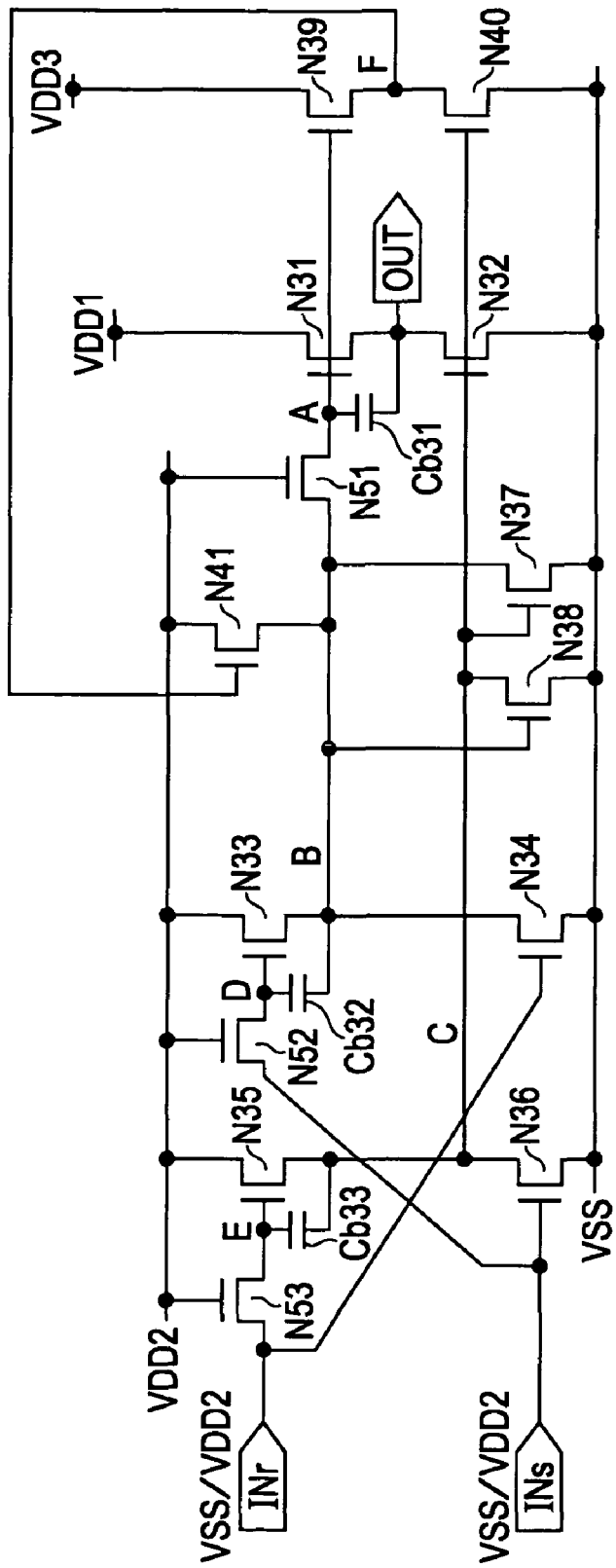
FIG. 52 is a circuit diagram of a buffer according to one embodiment of the present invention.

FIG. 52 illustrates the buffer 45 of the embodiment 15 of the present invention. In FIG. 52, elements identical to those illustrated in FIG. 44 are designated with the same reference numerals.

The buffer 45 of the embodiment 15 has the circuit structure with level shifting performed at the first output stage.

Only the thin-film transistors N31 and N32 in the final portion of the output stage are supplied with the first high power-source voltage VDD1 and the thin-film transistors arranged at the preceding stages are supplied with the second high power-source voltage VDD2 (<VDD1). With this arrangement, each of the set pulse and the reset pulse has a smaller amplitude and the power consumption of the buffer 45 is even more reduced. The buffer 45 of the embodiment 15 corresponds to the buffer 45 of the embodiment 6 in drive waveform.

The relationship of the voltage statuses of the set pulse and the reset pulse and the voltage status of each node is described with reference to FIG. 53. The drive waveforms illustrated in FIG. 53 correspond to the respective drive waveforms illustrated in FIG. 35.

Figure 53:
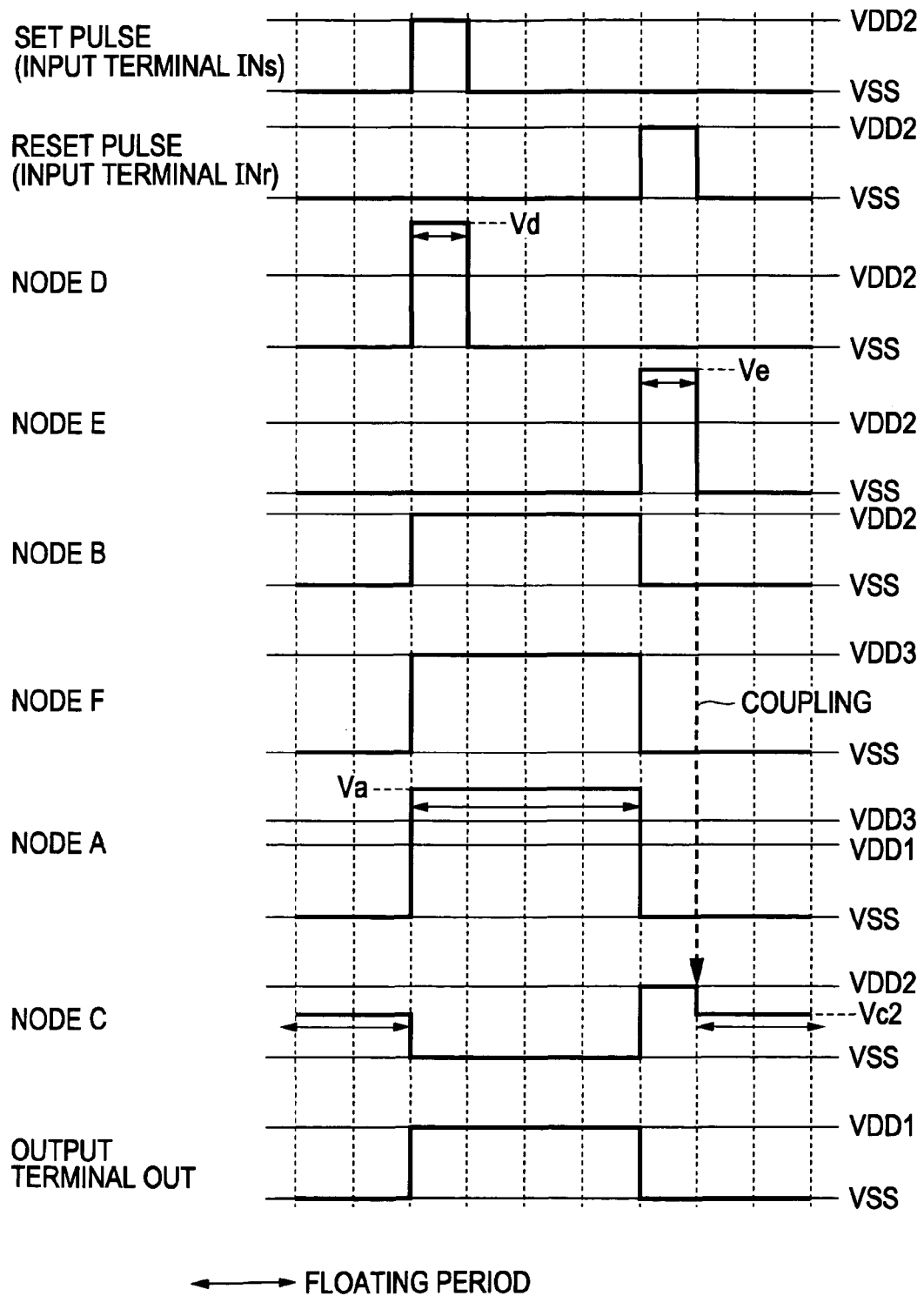
FIG. 53 illustrates drive waveforms of the buffer illustrated in FIG. 52.

In accordance with the embodiment 15 of the present invention, each of the signal amplitude of the set pulse (input terminal INs) and the signal amplitude of the reset pulse (input terminal INr) is given between the two values VSS and VDD2 (<VDD1) as illustrated in FIG. 53.

At the moment the set pulse rises to the high level, the node D at the first input stage rises to the high level. The thin-film transistor N33 then turns conductive, causing the voltage at the node B to rise as illustrated in FIG. 53.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 53. If the voltage Vd subsequent to the voltage rising satisfies Vd−VDD2>Vth(N33), the voltage at the node B becomes the second high power-source voltage VDD2 with the thin-film transistor N33 conductive as illustrated in FIG. 53.

When the node B rises to the second high power-source voltage VDD2 as described above, the node A also rises to a high level. The thin-film transistors N31 and N39 turn conductive, raising the voltage at the output terminal OUT and the voltage at the node F as illustrated in FIG. 53.

As the voltages at the output terminal OUT and the node F rise, the voltage at the node A rises by a voltage excursion responsive to a charge accumulated on the bootstrap auxiliary capacitance Cb31 as illustrated in FIG. 53.

If the voltage Va subsequent to the voltage rising satisfies Va−VDD1>Vth(N31), the voltage at the output terminal OUT becomes the first high power-source voltage VDD1 with the thin-film transistor N31 conductive as illustrated in FIG. 53. In other words, changing of the pulse amplitude is performed.

The voltage Va subsequent to the voltage rising satisfies a condition of Va−VDD3>Vth(N39). The voltage at the node F with the thin-film transistor N39 conductive becomes the third high-voltage power source VDD3 as illustrated in FIG. 53.

The third high-voltage power source VDD3 satisfies VDD3−VDD1>Vth(N41).

In accordance with the embodiment 15, a condition of VDD3−VDD2>Vth(N41) is satisfied, and the thin-film transistor N41 turns conductive. The thin-film transistor N41 thus supplies the second high power-source voltage VDD2 to the node B.

The thin-film transistor N36 is also conductive with the set pulse at the high level. The gate voltage of the thin-film transistor N32 forming the output stage (voltage at the node C) is thus controlled to the low power-source voltage VSS as illustrated in FIG. 53.

The set pulse then falls from the high level to the low level. During this voltage transition, a voltage change of the set pulse can interfere with the nodes B and C because of the coupling effect.

The gate electrode of the thin-film transistor N41 is supplied with the third high power-source voltage VDD3 via the node F as illustrated in FIG. 53. For this reason, the thin-film transistor N41 remaining conductive causes the voltage at the node B to be fixed to the second high power-source voltage VDD2 as illustrated in FIG. 53.

Even after the set pulse falls to the low level, the voltages at the nodes A, B, and F remain at the same level as when the set pulse is at the high level.

Since the voltage at the node B is maintained at the second high power-source voltage VDD2, the thin-film transistor N38 remaining conductive continuously supplies the low power-source voltage VSS to the node C as illustrated in FIG. 53.

This means that the node C is insusceptible to the interference responsive to the voltage change of the set pulse (means that the off-operation point of the thin-film transistor N32 is not shifted).

This voltage status is maintained while the node B is at the second high power-source voltage VDD2. More specifically, the node C is maintained at the low power-source voltage VSS until the reset pulse is subsequently transitioned to the high level. As a result, the leak current of the thin-film transistor N32 is minimized.

The node B biased at the second high power-source voltage VDD2 means that the thin-film transistor N51 is at the cutoff state. The node A is maintained at the floating state at a bootstrap voltage (i.e., Va) as illustrated in FIG. 53. For this reason, the first high power-source voltage VDD1 continuously appears at the output terminal OUT of the first output stage as illustrated in FIG. 53.

When the reset pulse is transitioned from the low level to the high level at the input terminal INr in FIG. 53, the thin-film transistor N35 becomes conductive. The voltage at the node C rises as illustrated in FIG. 53. As the voltage at the node C rises, the gate voltage of the thin-film transistor N35 rises by a voltage excursion responsive to a charge accumulated on the bootstrap auxiliary capacitance Cb33 as illustrated in FIG. 53. The resulting voltage subsequent to the voltage rising is Ve. If the voltage Ve satisfies a condition of Ve−VDD2>Vth(N35), the node C reaches the second high power-source voltage VDD2 with the thin-film transistor N35 conductive as illustrated in FIG. 53.

When the node C rises to the second high power-source voltage VDD2, the thin-film transistors N32 and N40 become conductive. The voltage of the output terminal OUT and the voltage at the node F then fall to the low power-source voltage VSS as illustrated in FIG. 53.

While the reset pulse remains at the high level, the thin-film transistor N34 remains conductive. The voltage at the node B is thus controlled to the low power-source voltage VSS as illustrated in FIG. 53. The gate electrode of the thin-film transistor N31 forming the first output stage (voltage at the node A) also falls down to the low power-source voltage VSS.

The reset pulse then falls from the high level to the low level. During this voltage transition, a voltage change of the reset pulse may interfere with the node B and the node C because of the coupling effect.

Although the node C still maintains a high level, the voltage thereof falls from the second high power-source voltage VDD2 to a voltage Vc2 as illustrated in FIG. 53.

The voltage Vc2 at the node C satisfies a condition of Vc2−VSS>Vth(N32). The thin-film transistor N32 continues to be conductive, and the voltage at the output terminal OUT is maintained at the low power-source voltage VSS as illustrated in FIG. 53. The voltage Vc2 at the node C also satisfies a condition of Vc2−VSS>Vth(N40). The thin-film transistor N40 thus continues to be conductive, and the voltage at the node F is maintained at the low power-source voltage VSS as illustrated in FIG. 53.

Also, the voltage Vc2 at the node C satisfies Vc2−VSS>Vth(N37). The thin-film transistor N37 thus becomes conductive, and the low power-source voltage VSS is continuously supplied to the node B.

This means that the node B is insusceptible to the interference responsive to the voltage change of the set pulse (means that the off-operation point of the thin-film transistor N31 is not shifted) as illustrated in FIG. 53.

The above-described voltage status is maintained while the node C is at the voltage Vc2. More specifically, the node B is kept to the low power-source voltage VSS until the set pulse is subsequently transitioned to the high level. As a result, the leak current of the thin-film transistor N31 is minimized.

The buffer 45 of the embodiment 15 not only reduces the signal amplitude of each of the set pulse and the reset pulse but also reduces the signal amplitudes of the signals within the remaining stages of the buffer 45 other than the final output stage. For this reason, not only power consumed by a front section (such as the shift register) but also power consumed by the buffer 45 is reduced more than in the other embodiments.

Embodiment 16

A modification of the buffer 45 of the embodiment 2 is described below as an embodiment 16 of the present invention.

Figure 54:
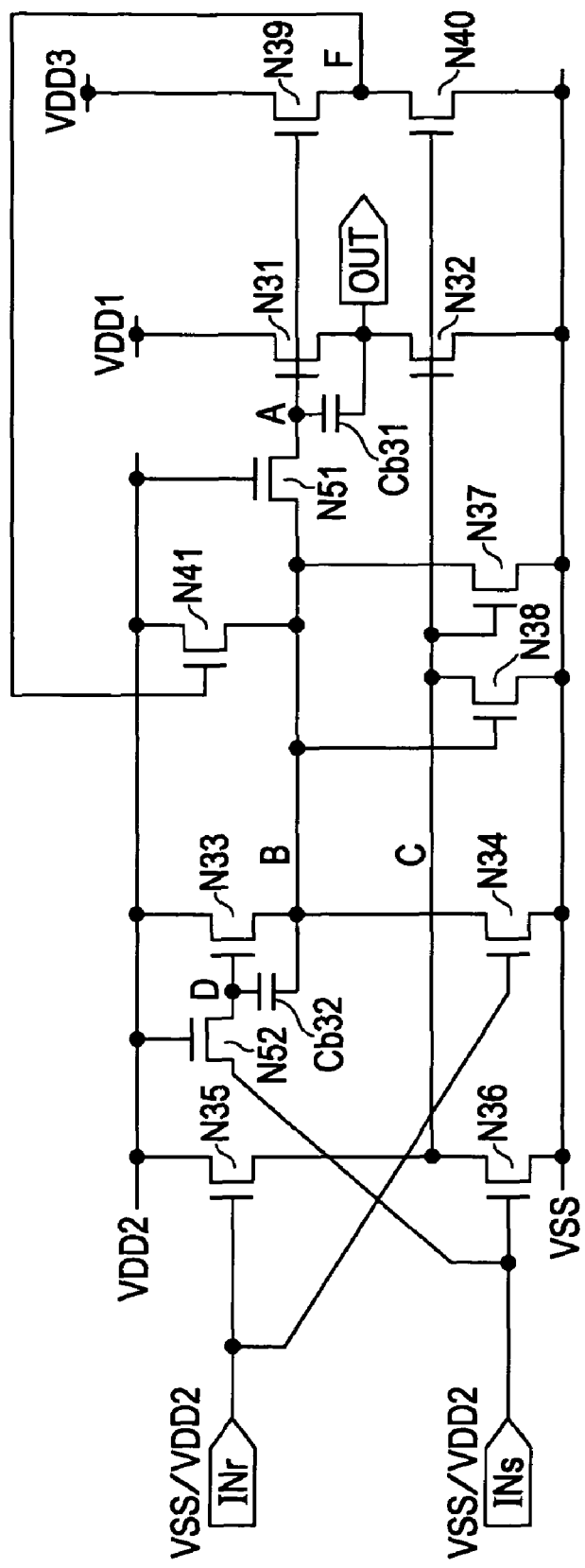
FIG. 54 is a circuit diagram of a buffer according to one embodiment of the present invention.

FIG. 54 illustrates the buffer 45 as the embodiment 16 of the present invention. In FIG. 54, elements identical to those illustrated in FIG. 44 are designated with the same reference numerals.

The buffer 45 of the embodiment 16 has the circuit structure of the embodiment 15 but with the thin-film transistor N53 removed therefrom. More specifically, the buffer 45 of the embodiment 16 has no bootstrap circuit on the second input stage. With this arrangement, the buffer 45 has a component count smaller than that of the embodiment 15. The buffer 45 of the embodiment 16 corresponds to the buffer 45 of the embodiment 7 in drive waveform.

Figure 55:
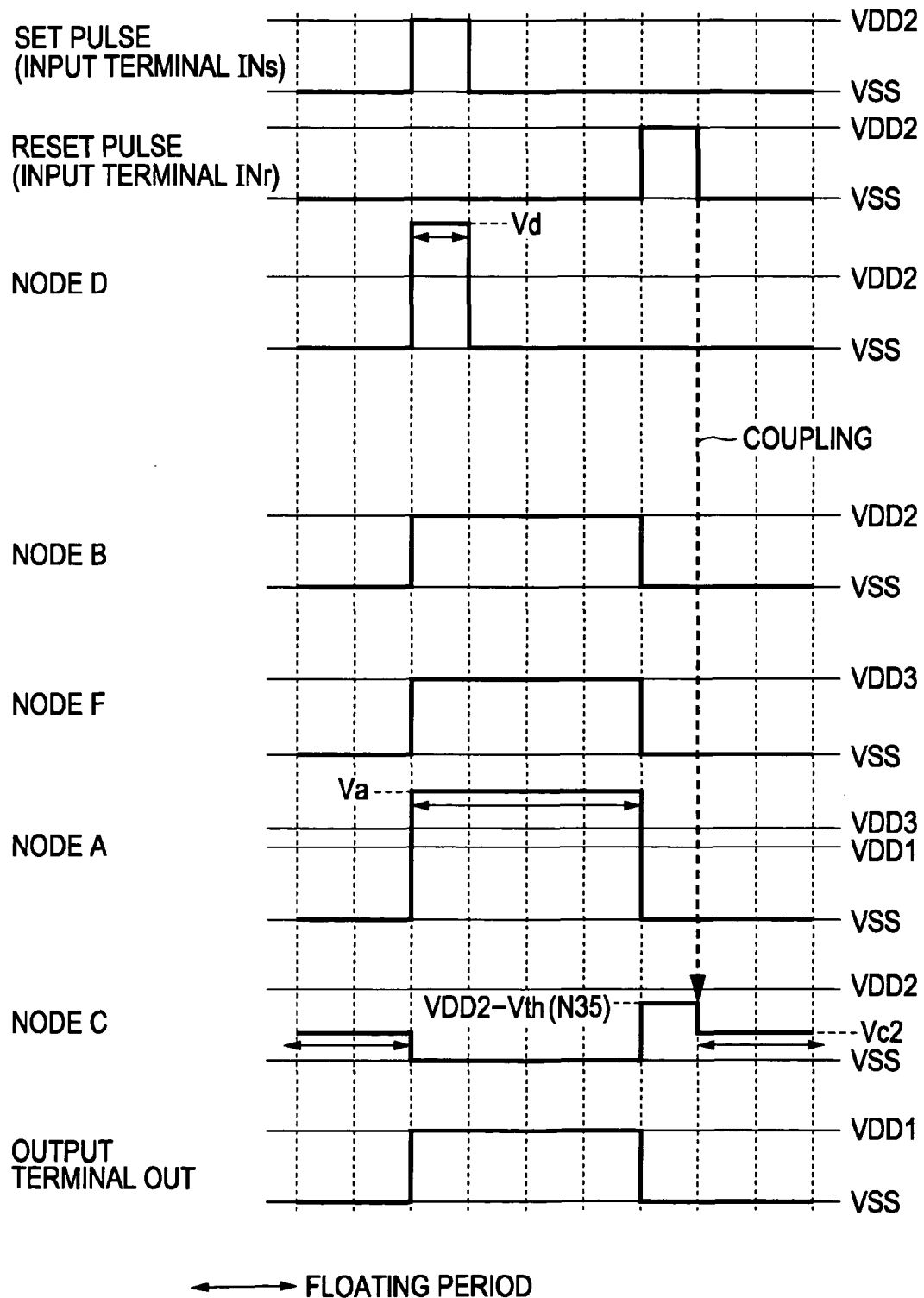
FIG. 55 illustrates drive waveforms of the buffer illustrated in FIG. 54.

FIG. 55 illustrates the relationship of the voltage statuses of the set pulse and the reset pulse and the voltage status of each node. The drive waveforms illustrated in FIG. 55 correspond to the respective drive waveforms illustrated in FIG. 37.

In accordance with the embodiment 16 of the present invention, each of the signal amplitude of the set pulse (input terminal INs) and the signal amplitude of the reset pulse (input terminal INr) is given between the two values VSS and VDD2 (<VDD1).

Referring to FIG. 55, the operation of the buffer 45 of the embodiment 16 remains unchanged from the operation of the buffer 45 of the embodiment 15 in the period from the rising edge of the set pulse to the high level to the rising edge of the reset pulse to the high level.

The operation of the buffer 45 of the embodiment 16 starting with the rising edge of the reset pulse is described below.

When the reset pulse rises from the low level to the high level, the thin-film transistors N34 and N35 become conductive.

In response, the node B falls to the low power-source voltage VSS, and the voltage at the node C rises as illustrated in FIG. 55. The voltage at the node C is lower than the second high power-source voltage VDD2 by a threshold voltage Vth (N35) of the thin-film transistor N35. More specifically, the voltage at the node C rises to VDD2−Vth(N35).

The high level (VDD2−Vth(N35)) satisfies the following three conditions:

$$VDD2-Vth(N35)-VSS>Vth(N32),$$

$$VDD2-Vth(N35)-VSS>Vth(N37), \text{ and}$$

$$VDD2-Vth(N35)-VSS>Vth(N40).$$

Generally, the pulse amplitude (VDD2−VSS) is sufficiently larger than the threshold voltage value Vth, and all the above three conditions are satisfied.

When the node C rises to the high level, the thin-film transistor N32 turns conductive, and the voltage at the output terminal OUT falls to the low power-source voltage VSS as illustrated in FIG. 55. Also, the thin-film transistor N40 turns conductive, causing the node F to fall to the low power-source voltage VSS as illustrated in FIG. 55.

The thin-film transistor N34 that has turned conductive controls the voltage at the node B to the low power-source voltage VSS as illustrated in FIG. 55. As a result, the voltage at the node A is also controlled to the low power-source voltage VSS as illustrated in FIG. 55.

The reset pulse falls from the high level to the low level. During this voltage transition, a voltage change of the reset pulse interferes with the node C because of the capacitive coupling effect of the thin-film transistor N35 as illustrated in FIG. 55. Although the node C still maintains a high level, the voltage thereof falls to a voltage Vc2 as illustrated in FIG. 55.

The voltage Vc2 satisfies the following three conditions:

$$Vc2-VSS>Vth(N32),$$

$$Vc2-VSS>Vth(N37), \text{ and}$$

$$Vc2-VSS>Vth(N40).$$

As long as the three conditions are satisfied, the thin-film transistors N32, N37, and N40 remain continuously conductive.

More specifically, the thin-film transistor N32 causes the low power-source voltage VSS to be supplied continuously to the output terminal OUT.

The thin-film transistor N37 causes the low power-source voltage VSS to be supplied continuously to the node B. This arrangement prevents the voltage change of the reset pulse from interfering with the node A via the thin-film transistor N34. The thin-film transistor N31 is free from the shifting of the off-operation point.

The voltage status described above is maintained for a period throughout which the voltage at the node C is maintained at the voltage Vc2. More specifically, the voltage at the node A is maintained at the low power-source voltage VSS until the set pulse is subsequently transitioned to the high level. As a result, the leak current of the thin-film transistor N31 is minimized.

As described above, the buffer 45 of the embodiment 16 even with a smaller component count provides the same operation and advantages as those of the buffer 45 of the embodiment 15.

Embodiment 17

A modification of the buffer 45 of the embodiment 2 is described below as an embodiment 17 of the present invention.

Figure 56:
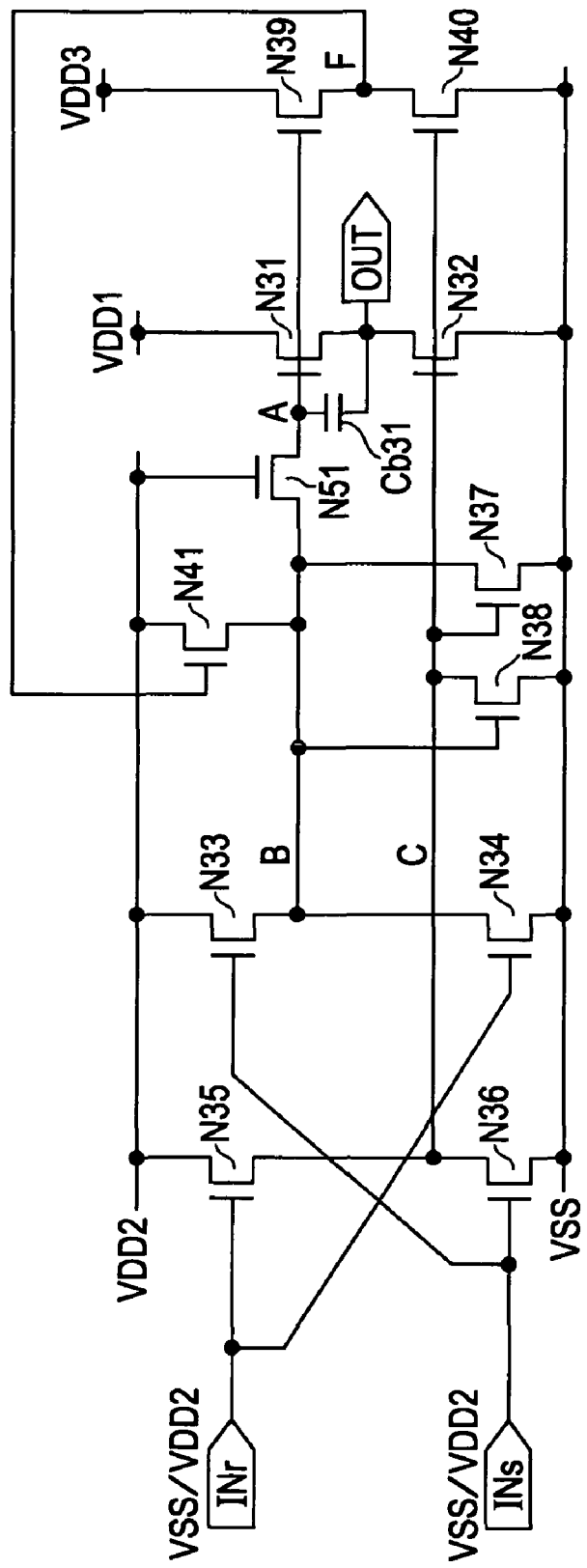
FIG. 56 is a circuit diagram of a buffer according to one embodiment of the present invention.

FIG. 56 illustrates the buffer 45 as the embodiment 17 of the present invention. In FIG. 56, elements identical to those illustrated in FIG. 52 are designated with the same reference numerals.

The buffer 45 of the embodiment 17 has the same circuit structure as the embodiment 16 but with the thin-film transistor N52 removed therefrom. More specifically, the buffer 45 of the embodiment 17 has the circuit structure of the embodiment 15 but with the bootstrap circuits removed from the first and second input stages thereof. In this way, the embodiment 17 of the present invention provides the buffer 45 having a component count smaller than that of the buffer 45 of the embodiment 16. The buffer 45 of the embodiment 17 corresponds to the buffer 45 of the embodiment 8 in drive waveform.

Figure 57:
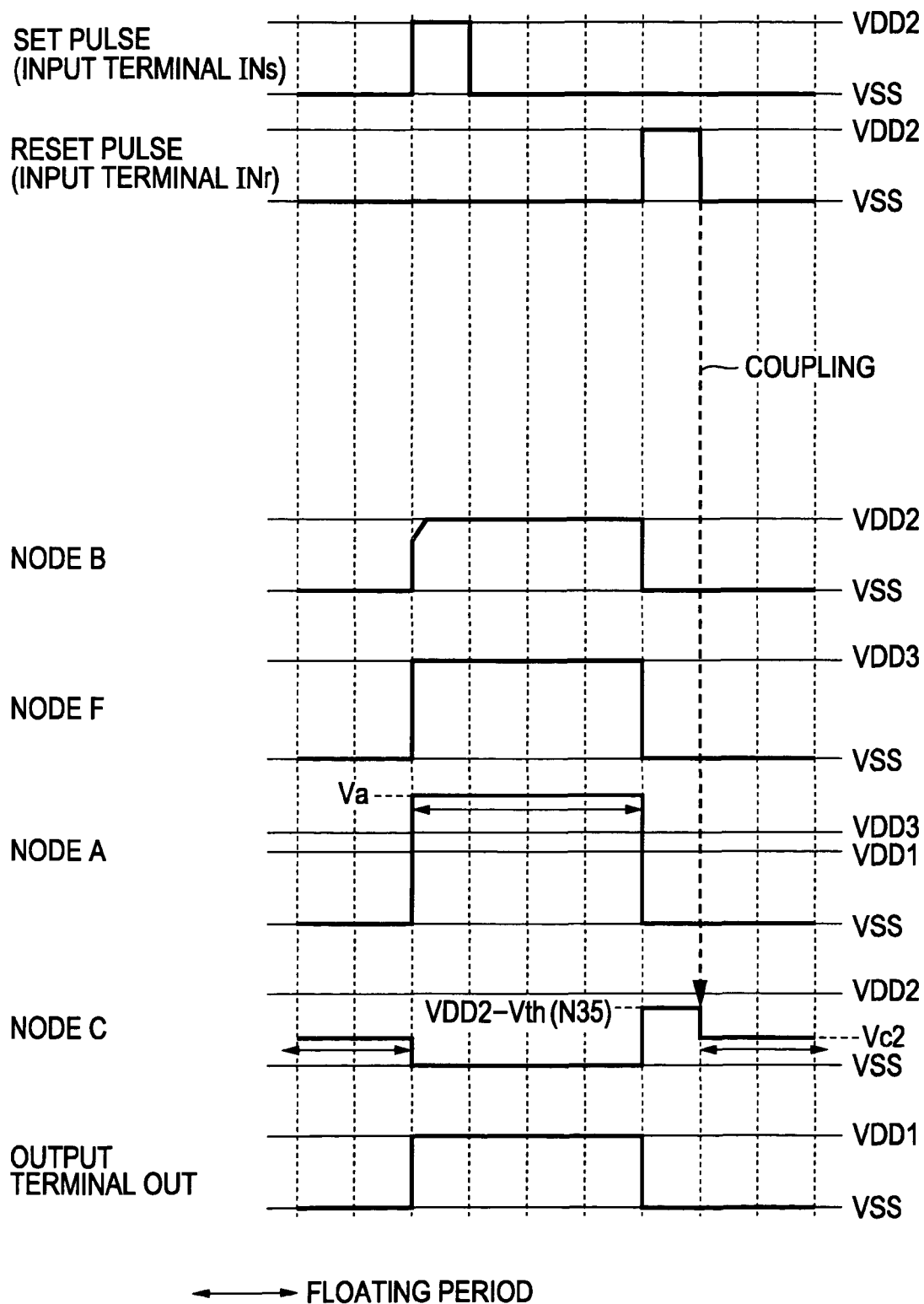
FIG. 57 illustrates drive waveforms of the buffer illustrated in FIG. 56.

FIG. 57 illustrates the relationship of the voltage statuses of the set pulse and the reset pulse and the voltage status of each node.

The drive waveforms illustrated in FIG. 57 correspond to the respective drive waveforms illustrated in FIG. 39.

In accordance with the embodiment 17 of the present invention, each of the signal amplitude of the set pulse (input terminal INs) and the signal amplitude of the reset pulse (input terminal INr) is given between the two values VSS and VDD2 (<VDD1).

As previously discussed, the buffer 45 of the embodiment 17 is identical in structure to the buffer 45 of the embodiment 16 in that the thin-film transistor N532 is eliminated. The operation of the buffer 45 subsequent to the rising edge of the reset pulse to the high level remains thus unchanged from the operation of the buffer 45 of the embodiment 16.

The discussion that follows focuses on the operation within the period from the rising edge of the set pulse to the high level to the rising edge of the reset pulse to the high level.

When the set pulse rises to the high level, the thin-film transistors N33 and N36 turn conductive.

In response, the voltage at the node B rises and the voltage at the node C falls to the low power-source voltage VSS as illustrated in FIG. 57.

The buffer 45 of the embodiment 17 includes no bootstrap circuit on the gate electrode side of the thin-film transistor N33. The voltage at the node B immediately subsequent to the rising edge of the set pulse to the high level rises only to a high level determined by VDD2−Vth(N33).

When the node B rises to the high level, the voltage at the output terminal OUT also rises to the high level. A bootstrap operation to the node A allows the voltage at the node F to rise to the third high-voltage power source VDD3.

The third high-voltage power source VDD3 subsequent to the voltage rising satisfies a condition of VDD3−VDD2>Vth (N41). The thin-film transistor N41 thus turns conductive, thereby supplying the second high power-source voltage VDD2 to the node B as illustrated in FIG. 57.

When the set pulse falls from the high level to the low level, the thin-film transistor N41 causes the node B to be maintained at the high power-source voltage VDD2. While the node B is at the high level, the thin-film transistor N38 fixes the node C to the low power-source voltage VSS.

As described above, the buffer 45 of the embodiment 17 with a smaller component count thereof provides the same operation and advantages as those of the embodiment 16.

Embodiment 18

A modification of the buffer 45 of the embodiment 2 is described below as an embodiment 18 of the present invention.

Figure 58:
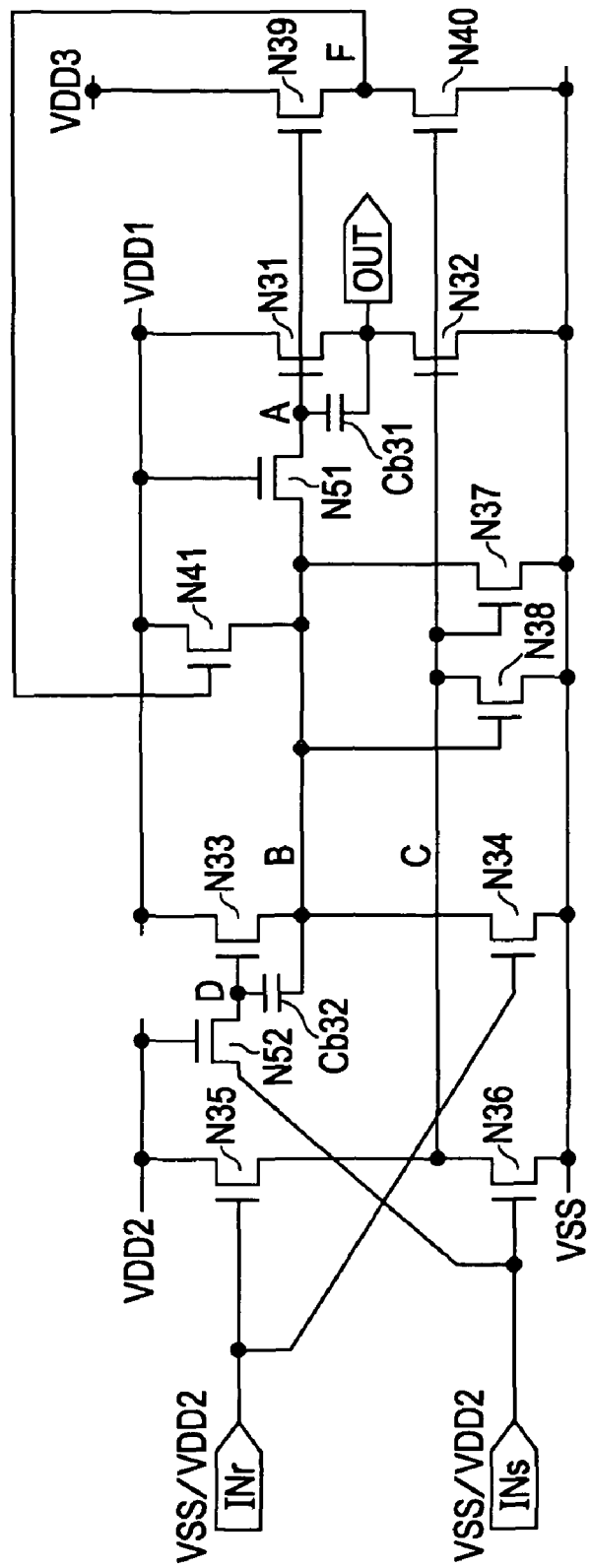
FIG. 58 is a circuit diagram of a buffer according to one embodiment of the present invention.

FIG. 58 illustrates the buffer 45 of the embodiment 18 of the present invention. In FIG. 58, elements identical to those illustrated in FIG. 46 are designated with the same reference numerals.

The buffer 45 of the embodiment 18 has the circuit structure of the embodiment 12 but with level shifting performed at the first input stage.

One of the main electrodes of the thin-film transistor N35 forming the second input stage and the gate electrode of the thin-film transistor N52 forming the first input stage are connected to the second high power-source voltage VDD2 (<VDD1). With this arrangement, each of the set pulse and the reset pulse has a smaller amplitude and the power consumption of the buffer 45 is lower than that of the embodiment 12. The buffer 45 of the embodiment 18 corresponds to the buffer 45 of the embodiment 9 in drive waveform.

Figure 59:
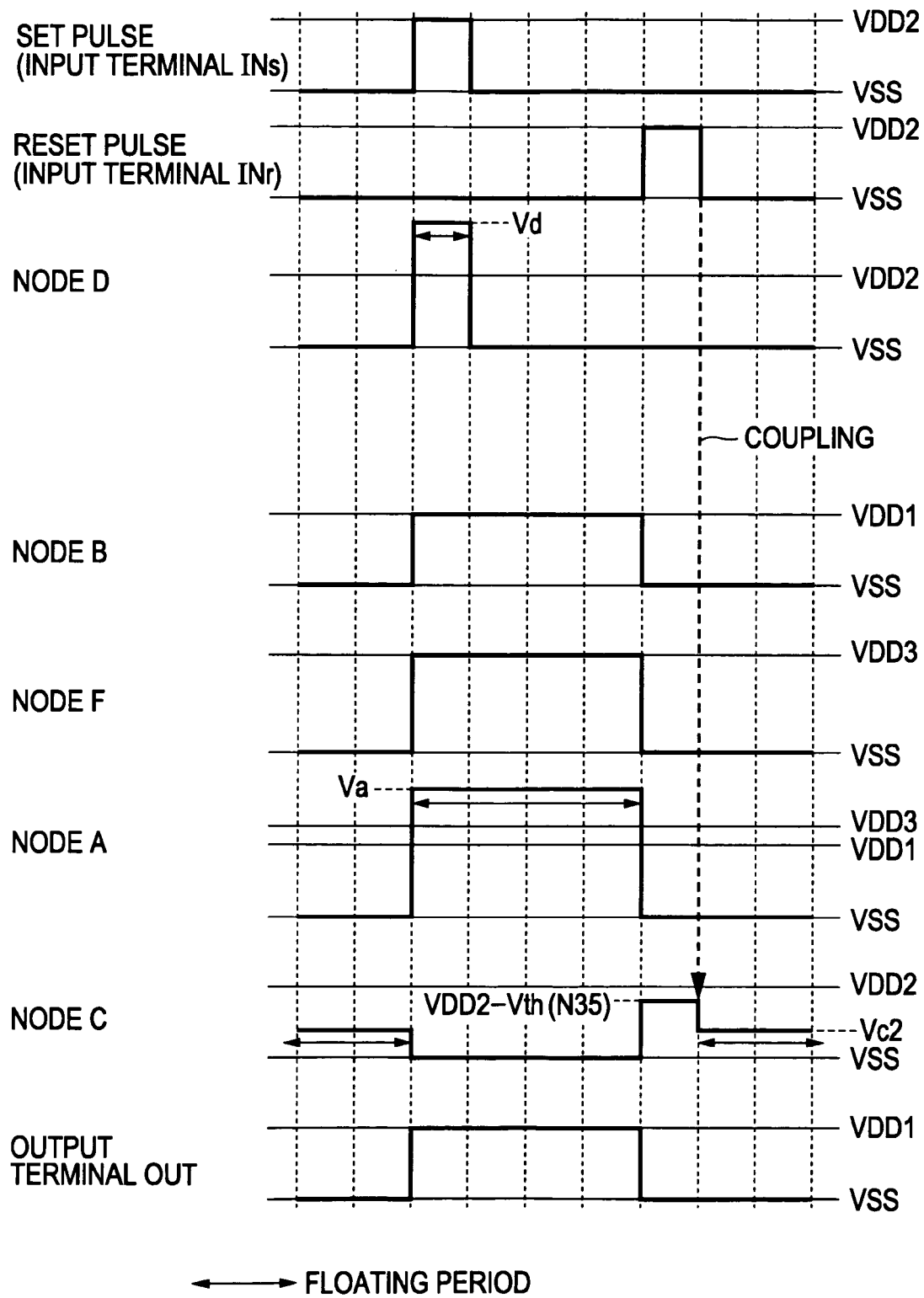
FIG. 59 illustrates drive waveforms of the buffer illustrated in FIG. 58.

FIG. 59 illustrates the relationship of the voltage statuses of the set pulse and the reset pulse and the voltage status of each node. The drive waveforms illustrated in FIG. 59 correspond to the respective drive waveforms illustrated in FIG. 41.

In accordance with the embodiment 18 of the present invention, each of the signal amplitude of the set pulse (input terminal INs) and the signal amplitude of the reset pulse (input terminal INr) is given between the two values VSS and VDD2 (<VDD1) as illustrated in FIG. 59.

At the moment the set pulse rises to the high level, the node D at the first input stage rises to the high level. The thin-film transistor N33 then turns conductive, causing the voltage at the node B to rise as illustrated in FIG. 59.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 59. If the voltage Vd subsequent to the voltage rising satisfies Vd−VDD1>Vth(N33), the voltage at the node B becomes the first high power-source voltage VDD1 with the thin-film transistor N33 conductive as illustrated in FIG. 59. In other words, changing of the pulse amplitude is performed.

When the node B rises to the first high power-source voltage VDD1 as described above, the node A also rises to a high level. The thin-film transistors N31 and N39 turn conductive, raising the voltage at the output terminal OUT and the voltage at the node F as illustrated in FIG. 59.

As the voltages at the output terminal OUT and the node F rise, the voltage at the node A rises by a voltage excursion responsive to a charge accumulated on the bootstrap auxiliary capacitance Cb31 as illustrated in FIG. 59.

If the voltage Va subsequent to the voltage rising satisfies Va−VDD1>Vth(N31), the voltage at the output terminal OUT becomes the first high power-source voltage VDD1 with the thin-film transistor N31 conductive as illustrated in FIG. 59.

The voltage Va satisfies a condition of Va−VDD3>Vth(N39), and the voltage at the node F becomes the third high power-source voltage VDD3 with the thin-film transistor N39 conductive as illustrated in FIG. 59.

The third high power-source voltage VDD3 is determined to satisfy a condition of VDD3−VDD1>Vth(N41).

The thin-film transistor N41 turns conductive, thereby supplying the first high power-source voltage VDD1 to the node B.

The thin-film transistor N36 is also conductive with the set pulse at the high level. The gate voltage of the thin-film transistor N32 forming the output stage (voltage at the node C) is thus controlled to the low power-source voltage VSS as illustrated in FIG. 59.

The set pulse then falls from the high level to the low level. During this voltage transition, a voltage change of the set pulse can interfere with the nodes B and C because of the coupling effect.

The gate electrode of the thin-film transistor N41 is supplied with the third high power-source voltage VDD3 via the node F as illustrated in FIG. 59. For this reason, the thin-film transistor N41 remaining conductive causes the voltage at the node B to be fixed to the first high power-source voltage VDD1 as illustrated in FIG. 59. This voltage status is characteristic of the embodiment 18.

Even after the set pulse falls to the low level, the voltages at the nodes A, B, and F remain at the same level as when the set pulse is at the high level.

Since the voltage at the node B is maintained at the first high power-source voltage VDD1, the thin-film transistor N38 remaining conductive continuously supplies the low power-source voltage VSS to the node C as illustrated in FIG. 59.

This means that the node C is insusceptible to the interference responsive to the voltage change of the set pulse (means that the off-operation point of the thin-film transistor N32 is not shifted).

This voltage status is maintained while the node B is at the first high power-source voltage VDD1. More specifically, the node C is maintained at the low power-source voltage VSS until the reset pulse is subsequently transitioned to the high level. As a result, the leak current of the thin-film transistor N32 is minimized.

The node B biased at the first high power-source voltage VDD1 means that the thin-film transistor N51 is at the cutoff state. The node A is maintained at the floating state at a bootstrap voltage (i.e., Va) as illustrated in FIG. 59. For this reason, the first high power-source voltage VDD1 continuously appears at the output terminal OUT of the first output stage as illustrated in FIG. 59.

When the reset pulse is transitioned from the low level to the high level at the input terminal INr in FIG. 59, the thin-film transistor N35 becomes conductive. The voltage at the node C rises as illustrated in FIG. 59. The voltage at the node C is lower than the high power-source voltage VDD2 by the threshold voltage value Vth(N35) of the thin-film transistor N35. More specifically, the node C rises to VDD2−Vth(N35).

The high level (VDD2−Vth(N35)) satisfies the following three conditions:

$$VDD2-Vth(N35)-VSS>Vth(N32),$$

$$VDD2-Vth(N35)-VSS>Vth(N37), \text{ and}$$

$$VDD2-Vth(N35)-VSS>Vth(N40).$$

Generally, the pulse amplitude (VDD2−VSS) is sufficiently larger than the threshold voltage value Vth, and all the above three conditions are satisfied.

When the node C rises to the high level, the thin-film transistor N32 turns conductive, and the voltage at the output terminal OUT falls to the low power-source voltage VSS as illustrated in FIG. 59.

The reset pulse falls from the high level to the low level. During this voltage transition, a voltage change of the reset pulse interferes with the node C because of the capacitive coupling effect of the thin-film transistor N35 as illustrated in FIG. 59. Although the node C still maintains a high level, the voltage thereof falls to a voltage Vc2 as illustrated in FIG. 59.

The voltage Vc2 satisfies the following three conditions:

$$Vc2-VSS>Vth(N32),$$

$$Vc2-VSS>Vth(N37), \text{ and}$$

$$Vc2-VSS>Vth(N40).$$

As long as the three conditions are satisfied, the thin-film transistors N32, N37, and N40 remain continuously conductive.

More specifically, the thin-film transistor N32 causes the low power-source voltage VSS to be supplied continuously to the output terminal OUT.

The thin-film transistor N37 causes the low power-source voltage VSS to be supplied continuously to the node B. This arrangement prevents the voltage change of the reset pulse from interfering with the node A via the thin-film transistor N34. The thin-film transistor N31 is free from the shifting of the off-operation point.

The voltage status described above is maintained for a period throughout which the voltage at the node C is maintained at the voltage Vc2. More specifically, the voltage at the node A is maintained at the low power-source voltage VSS until the set pulse is subsequently transitioned to the high level. As a result, the leak current of the thin-film transistor N31 is minimized.

The buffer 45 of the embodiment 18 operates in the same operation as the buffer 45 of the embodiment 12 and provides the same advantages as those of the buffer 45 of the embodiment 12. The buffer 45 of the embodiment 18 operates with the front section (such as the shift register) consuming less power.

Embodiment 19

A modification of the buffer 45 of the embodiment 2 is described below as an embodiment 19 of the present invention.

Figure 60:
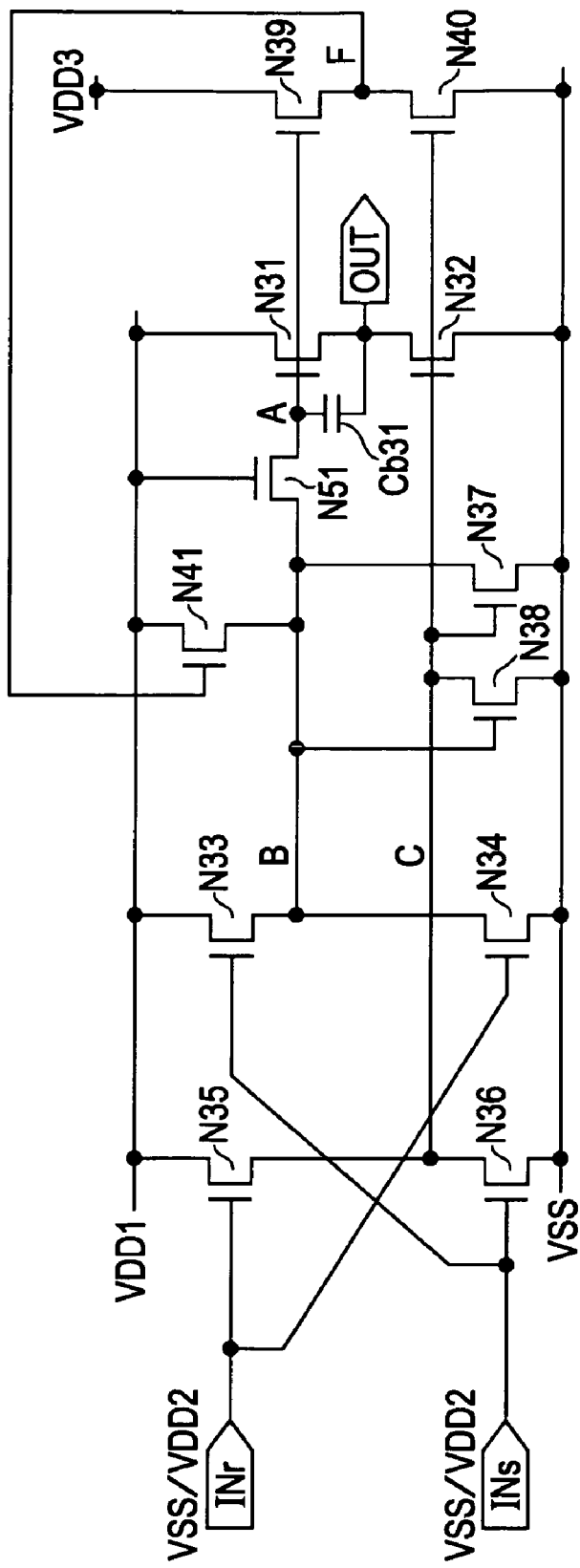
FIG. 60 is a circuit diagram of a buffer according to one embodiment of the present invention.

FIG. 60 illustrates the buffer 45 of the embodiment 19 of the present invention. In FIG. 60, elements identical to those illustrated in FIG. 48 are designated with the same reference numerals.

A comparison of FIG. 60 with FIG. 48 reveals that the buffer 45 of the embodiment 19 is generally similar in circuit structure to the buffer 45 of the embodiment 13.

The difference between the nineteenth and embodiment 13s is that the set pulse and the reset pulse are smaller in amplitude than the counterparts in the embodiment 13. More specifically, the set pulse and the reset pulse are driven at the two values of VSS and VDD2 (<VDD1) in the embodiment 19. The buffer 45 of the embodiment 19 corresponds to the buffer 45 of the embodiment 10 in drive waveform.

The relationship of the voltage statuses of the set pulse and the reset pulse and the voltage status of each node is described with reference to FIG. 61. The drive waveforms illustrated in FIG. 61 correspond to the respective drive waveforms illustrated in FIG. 43.

Figure 61:
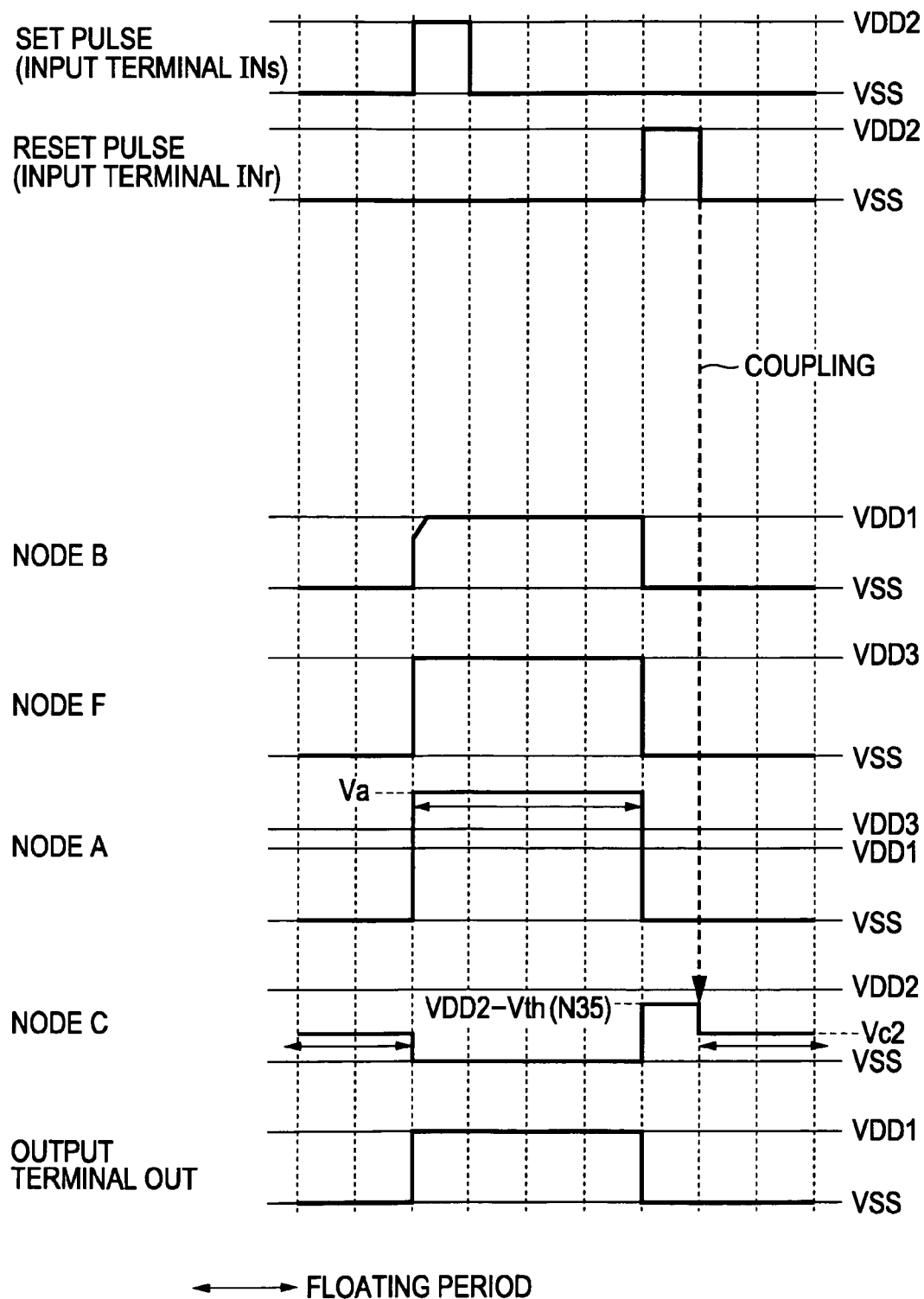
FIG. 61 illustrates drive waveforms of the buffer illustrated in FIG. 60.

In accordance with the embodiment 19 of the present invention, each of the signal amplitude of the set pulse (input terminal INs) and the signal amplitude of the reset pulse (input terminal INr) is given between the two values VSS and VDD2 (<VDD1) as illustrated in FIG. 61.

At the moment the set pulse rises to the high level, the thin-film transistors N33 and N36 turn conductive.

In response, the voltage at the node B rises and the voltage at the node C falls to the low power-source voltage VSS as illustrated in FIG. 61.

The buffer 45 of the embodiment 19 includes no bootstrap circuit on the gate electrode side of the thin-film transistor N33. The voltage at the node B immediately subsequent to the rising edge of the set pulse to the high level rises only to a high level determined by a condition of VDD2−Vth(N33).

When the node B rises to the high level, the voltage at the output terminal OUT also rises to the high level. The voltage at the node A rises to the bootstrap voltage Va as illustrated in FIG. 61. Since the bootstrap voltage Va satisfies the condition of Va−VDD1>Vth(N31), the voltage at the output terminal OUT rises to the first high power-source voltage VDD1 as illustrated in FIG. 61.

The voltage Va subsequent to the voltage rising satisfies a condition of Va−VDD3>Vth(N39), and the voltage at the node F becomes the third high power-source voltage VDD3 with the thin-film transistor N39 conductive as illustrated in FIG. 61.

The third high power-source voltage VDD3 is determined to satisfy a condition of VDD3−VDD1>Vth(N41).

The thin-film transistor N41 turns conductive, thereby supplying the first high power-source voltage VDD1 to the node B.

The thin-film transistor N36 is also conductive with the set pulse at the high level. The gate voltage of the thin-film transistor N32 forming the output stage (voltage at the node C) is thus controlled to the low power-source voltage VSS as illustrated in FIG. 61.

The set pulse then falls from the high level to the low level. During this voltage transition, a voltage change of the set pulse can interfere with the nodes B and C because of the coupling effect.

The gate electrode of the thin-film transistor N41 is supplied with the third high power-source voltage VDD3 via the node F as illustrated in FIG. 61.

For this reason, the thin-film transistor N41 remaining conductive causes the voltage at the node B to be fixed to the first high power-source voltage VDD1 as illustrated in FIG. 61. This voltage status is characteristic of the embodiment 19.

Even after the set pulse falls to the low level, the voltages at the nodes A, B, and F remain at the same level as when the set pulse is at the high level.

Since the voltage at the node B is maintained at the first high power-source voltage VDD1, the thin-film transistor N38 remaining conductive continuously supplies the low power-source voltage VSS to the node C as illustrated in FIG. 61.

This means that the node C is insusceptible to the interference responsive to the voltage change of the set pulse (means that the off-operation point of the thin-film transistor N32 is not shifted).

This voltage status is maintained while the node B is at the first high power-source voltage VDD1. More specifically, the node C is maintained at the low power-source voltage VSS until the reset pulse is subsequently transitioned to the high level. As a result, the leak current of the thin-film transistor N32 is minimized.

The node B biased at the first high power-source voltage VDD1 means that the thin-film transistor N51 is at the cutoff state. The node A is maintained at the floating state at a bootstrap voltage (i.e., Va) as illustrated in FIG. 61. For this reason, the first high power-source voltage VDD1 continuously appears at the output terminal OUT of the first output stage as illustrated in FIG. 61.

When the reset pulse is subsequently transitioned from the low level to the high level at the input terminal INr in FIG. 61, the thin-film transistor N35 becomes conductive. The voltage at the node C rises as illustrated in FIG. 61. The voltage at the node C is lower than the high power-source voltage VDD2 by the threshold voltage value Vth(N35) of the thin-film transistor N35. More specifically, the node C rises to VDD2−Vth(N35).

The high level (VDD2−Vth(N35)) satisfies the following three conditions:

$$VDD2-Vth(N35)-VSS>Vth(N32),$$

$VDD2-Vth(N35)-VSS>Vth(N37)$, and $VDD2-Vth(N35)-VSS>Vth(N40)$.

Generally, the pulse amplitude (VDD2–VSS) is sufficiently larger than the threshold voltage value Vth, and all the above three conditions are satisfied.

When the node C rises to the high level, the thin-film transistor N32 turns conductive, and the voltage at the output terminal OUT falls to the low power-source voltage VSS as illustrated in FIG. 61.

The thin-film transistor N40 then turns conductive, thereby causing the voltage at the node F to fall to the low power-source voltage VSS as illustrated in FIG. 61.

The thin-film transistor N34 that has turned conductive controls the voltage at the node B to the low power-source voltage VSS as illustrated in FIG. 61. As a result, the node A is also controlled to the low power-source voltage VSS as illustrated in FIG. 61.

The reset pulse falls from the high level to the low level. During this voltage transition, a voltage change of the reset pulse interferes with the node C because of the capacitive coupling effect of the thin-film transistor N35 as illustrated in FIG. 61. Although the node C still maintains a high level, the voltage thereof falls to a voltage Vc2 as illustrated in FIG. 61.

The voltage Vc2 satisfies the following three conditions:

$Vc2-VSS>Vth(N32)$, $Vc2-VSS>Vth(N37)$, and $Vc2-VSS>Vth(N40)$.

As long as the three conditions are satisfied, the thin-film transistors N32, N37, and N40 remain continuously conductive.

More specifically, the thin-film transistor N32 causes the low power-source voltage VSS to be supplied continuously to the output terminal OUT.

The thin-film transistor N37 causes the low power-source voltage VSS to be supplied continuously to the node B. This arrangement prevents the voltage change of the reset pulse from interfering with the node A via the thin-film transistor N34. The thin-film transistor N31 is free from the shifting of the off-operation point.

The voltage status described above is maintained for a period throughout which the voltage at the node C is maintained at the voltage Vc2. More specifically, the voltage at the node A is maintained at the low power-source voltage VSS until the set pulse is subsequently transitioned to the high level. As a result, the leak current of the thin-film transistor N31 is minimized.

The buffer 45 of the embodiment 19 operates in the same operation as the buffer 45 of the embodiment 13 and provides the same advantages as those of the buffer 45 of the embodiment 13. The buffer 45 of the embodiment 19 operates with the front section (such as the shift register) consuming less power.

Embodiment 20

In the above description, the buffer 45 receives a pair of set and reset pulses. A buffer that receives a plurality of pairs of set and reset pulses can be implemented.

A buffer receiving two pairs of set and reset pulses is considered here.

Figure 62:
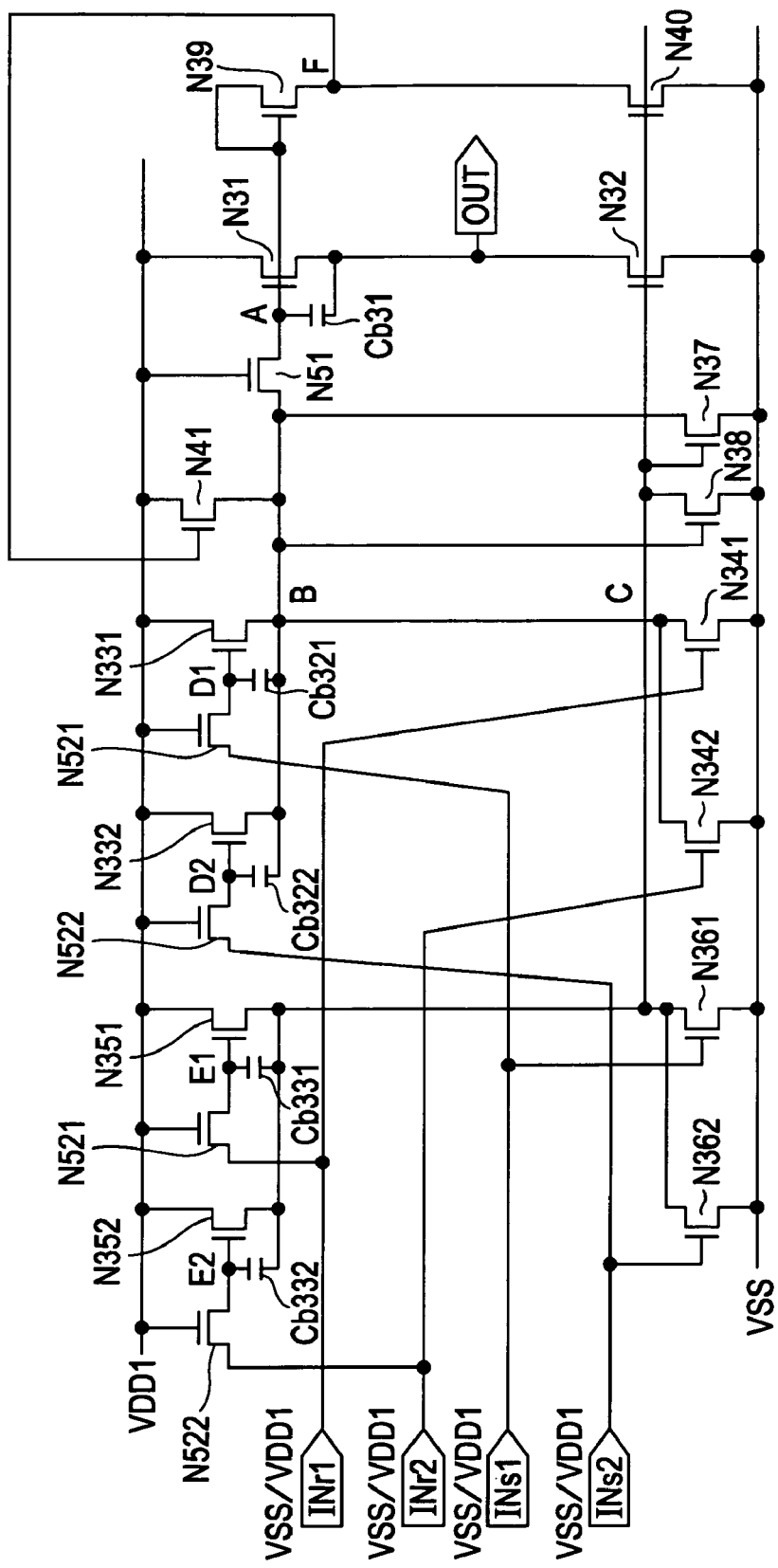
FIG. 62 is a circuit diagram of a buffer according to one embodiment of the present invention.

FIG. 62 illustrates a circuit structure in which the first input stage and the second input stage of the buffer 45 of the embodiment 2 (FIG. 26) are connected in parallel. Referring to FIG. 62, a bootstrap auxiliary capacitance Cb is connected to the output terminal of each stage.

FIG. 62 also illustrates thin-film transistors N331, N341, N351, N361, N521, and N531, respectively corresponding to thin-film transistors N33, N34, N35, N36, N52, and N53, for the first pair of set and reset pulses.

FIG. 62 illustrates thin-film transistors N332, N342, N352, N362, N522, and N532, respectively corresponding to thin-film transistors N33, N34, N35, N36, N52, and N53, for the second pair of set and reset pulses.

With the two pairs of set and reset pulses input, a resulting buffer can vary in combination the pulse width of the output pulse and the output timing of the output pulse.

The number of inputs of set and reset pulses may be determined as necessary. It is not necessary that the number of inputs of set pulses be equal to the number of inputs of reset pulses. With such a circuit structure, a multi-input buffer receiving a plurality of control signals (including set and reset pulses) results.

Referring to FIG. 62, N331 and N332, N341 and N342, N351 and N352, N361 and N362, forming the first and second input stages, are respectively connected in parallel, with respect to the output terminals. Some or all of the pairs may be connected in series between the two operating power sources (such as VDD1 and VSS).

Figure 63:
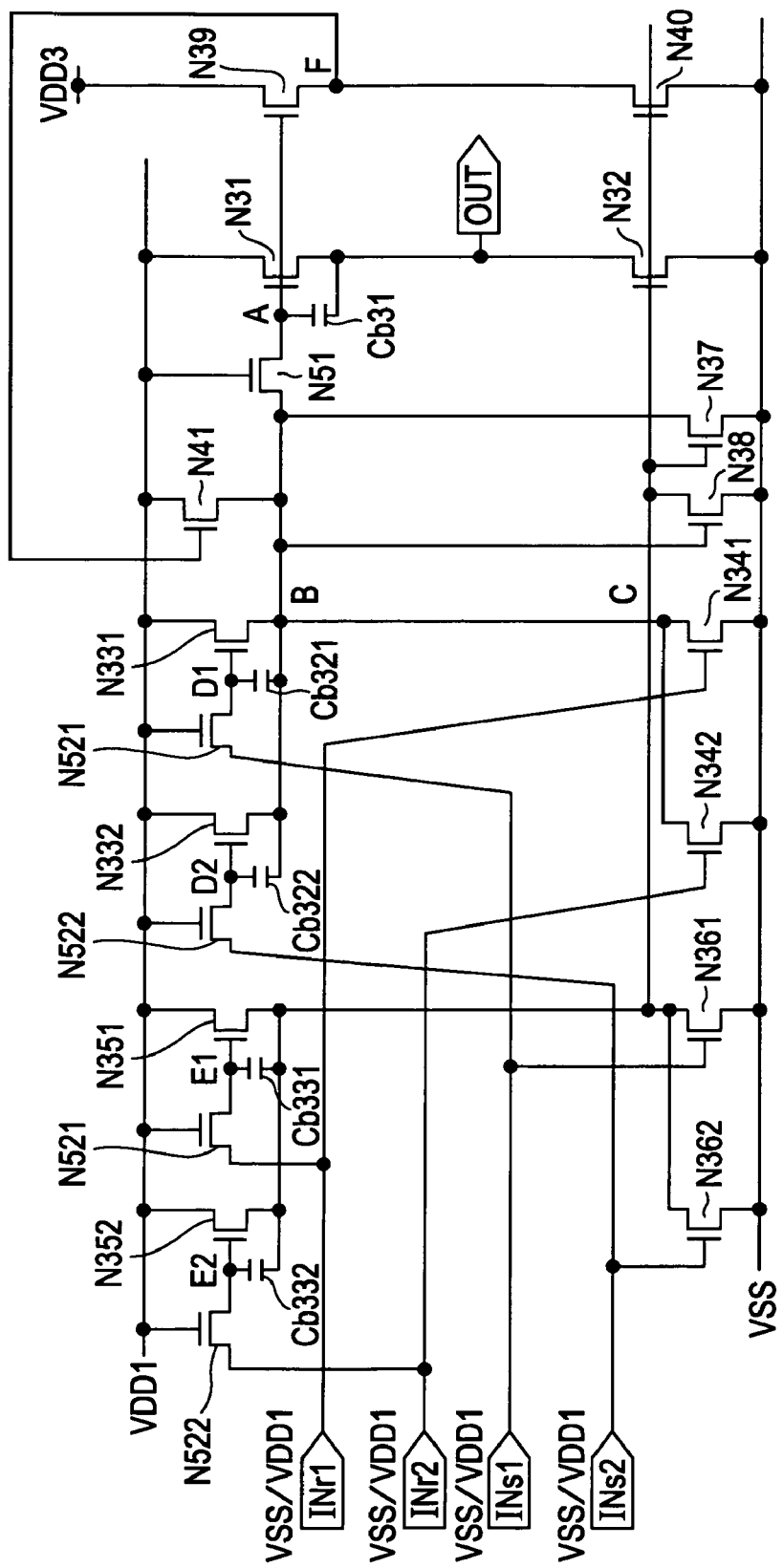
FIG. 63 is a circuit diagram of a buffer according to one embodiment of the present invention.

The circuit structure herein is applicable to any of the other embodiments. As illustrated in FIG. 63, for example, the first and second input stages of the buffer 45 of the embodiment 11 (FIG. 44) may be connected in parallel. In FIG. 63, the bootstrap auxiliary capacitance Cb is connected to the output terminal of each stage.

Referring to FIG. 63, the thin-film transistors N331, N341, N351, N361, N521, and N531, respectively correspond to the thin-film transistors N33, N34, N35, N36, N52, and N53, for the first pair of set and reset pulses.

Referring to FIG. 63, the thin-film transistors N332, N342, N352, N362, N522, and N532, respectively correspond to the thin-film transistors N33, N34, N35, N36, N52, and N53, for the second pair of set and reset pulses.

Embodiment 21

In each of the above-referenced embodiments, the one main electrode of the thin-film transistor N31 forming the first output stage is connected to the first high power-source voltage VDD1.

Instead of supplying the first high power-source voltage VDD1, a pulse signal line (a signal line providing any control pulse) may be connected.

Figure 64:
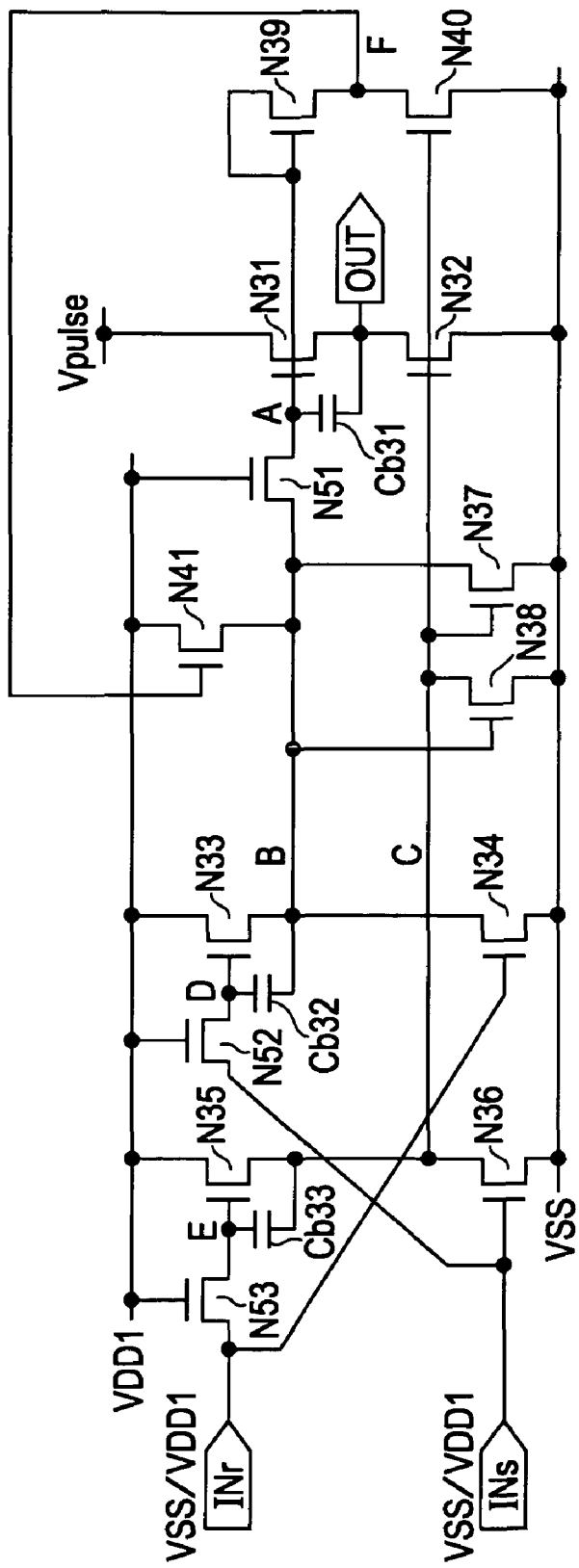
FIG. 64 is a circuit diagram of a buffer according to one embodiment of the present invention.

FIG. 64 illustrates a circuit structure in which a control pulse Vpulse is supplied to the thin-film transistor N31 forming the output stage of the embodiment 2.

Figure 65:
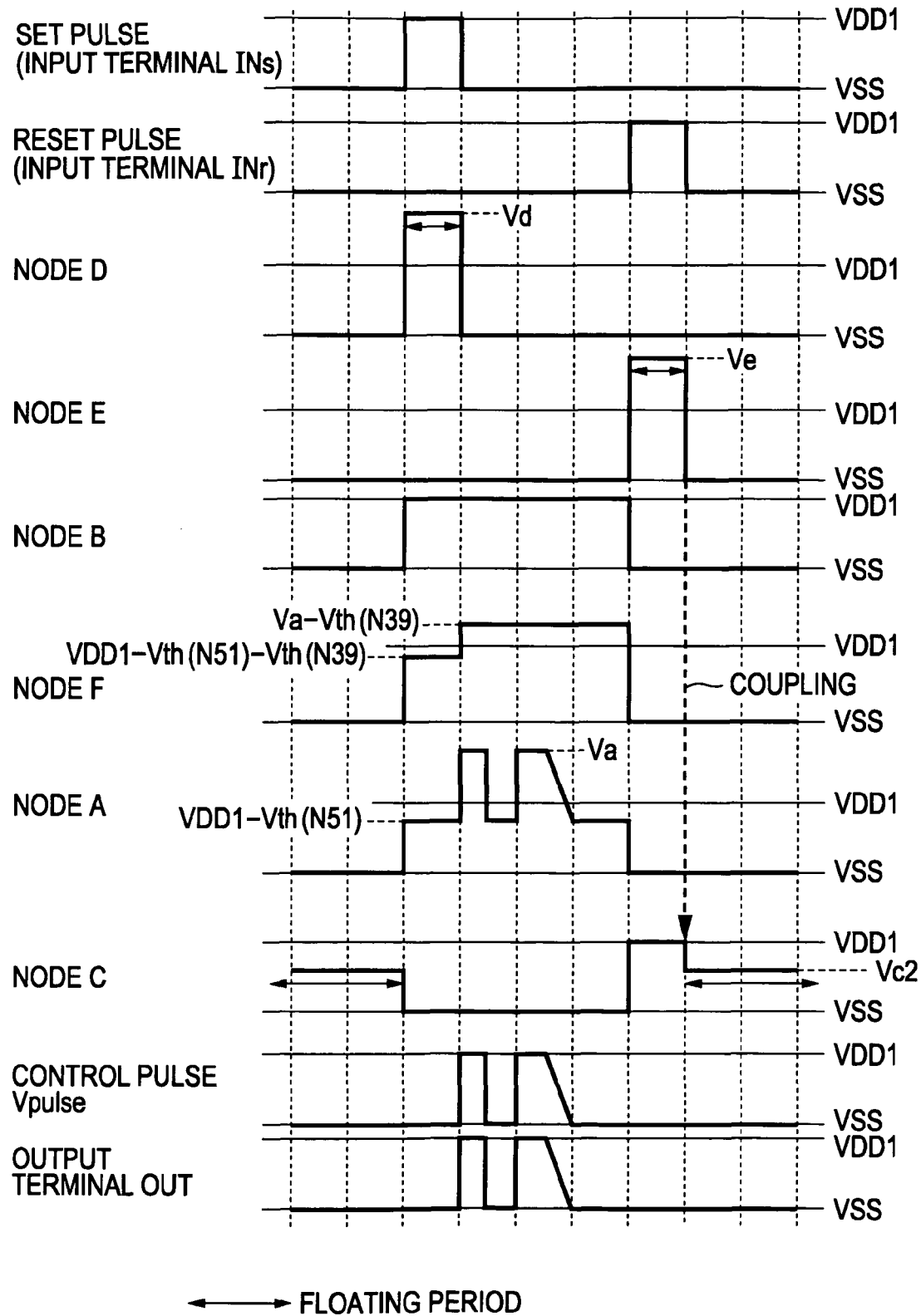
FIG. 65 illustrates drive waveforms of the buffer illustrated in FIG. 64.

FIG. 65 also illustrates the relationship of the voltage statuses of the set pulse and the reset pulse and the voltage status of each node in the circuit structure.

FIG. 65 further illustrates the voltage statuses of the set pulse at the input terminal INs, and the reset pulse at the input terminal INr.

FIG. 65 also illustrates the voltage status of the gate electrode of the thin-film transistor N33 (node D).

FIG. 65 further illustrates the voltage statuses of the gate electrode of the thin-film transistor N35 (node E), the control line connected to the output terminal of the first input stage (node B), the control line connected to the output terminal of the second output stage (node F), the gate electrode of the thin-film transistor N31 (node A), the control line connected to the output terminal of the second input stage (node C), and the output terminal OUT of the first output stage. FIG. 65 further illustrates the control pulse Vpulse supplied to a signal line.

The set pulse rises to the high level.

As the moment the set pulse rises to the high level (first high power-source voltage VDD1), the node D at the first input stage rises to the high level. The thin-film transistor N33 then turns conductive, causing the voltage at the node B to rise as illustrated in FIG. 61.

As the voltage at the node B rises, the gate voltage of the thin-film transistor N33 (voltage at the node D) rises by a voltage excursion responsive to a charge accumulated on the bootstrap auxiliary capacitance Cb32 as illustrated in FIG. 65. The voltage subsequent to the voltage rising is Vd. If the voltage Vd satisfies Vd−VDD1>Vth(N33), the voltage at the node B becomes the first high power-source voltage VDD1 with the thin-film transistor N33 conductive as illustrated in FIG. 65.

When the node B rises to the first high power-source voltage VDD1 as described above, the node A also rises to a high level determined by VDD1−Vth(N51) as illustrated in FIG. 65.

Since the voltage of the control pulse Vpulse supplied to the pulse signal line is the low power-source voltage VSS, the voltage of the output terminal OUT remains unchanged from the low power-source voltage VSS as illustrated in FIG. 65.

The voltage at the node A causes the thin-film transistor N39 to turn conductive. The voltage at the node F is then VDD1−Vth(N51)−Vth(N39).

The voltage at the node F causes the thin-film transistor N41 to turn conductive, and the first high power-source voltage VDD1 is supplied to the node B.

While the set pulse remains at the high level, the thin-film transistor N36 remains conductive. The gate voltage of the thin-film transistor N32 (voltage at the node C) is thus controlled to the low power-source voltage VSS as illustrated in FIG. 65.

The set pulse then falls from the high level to the low level. During this voltage transition, a voltage change of the set pulse interferes with the nodes B and C because of the coupling effect.

The thin-film transistor N41 remaining conductive continuously supplies the high level voltage to the node B. The effect of interference caused by the voltage change in the set pulse is thus marginal.

Since the voltage at the node B is maintained at the first high power-source voltage VDD1, the thin-film transistor N38 remaining conductive continuously fixes the node C to the low power-source voltage VSS. This means that the node C is insusceptible to the interference responsive to the voltage change of the set pulse. As a result, the off-operation point of the thin-film transistor N32 is not shifted.

This voltage status is maintained until the reset pulse is subsequently transitioned to the high level.

In accordance with the embodiment 21, the control pulse Vpulse with the high level thereof being equal to the first high power-source voltage VDD1 is input to the pulse signal line subsequent to the falling edge timing of the set pulse to the low power-source voltage VSS as illustrated in FIG. 65. The control pulse Vpulse includes two subpulses. The first subpulse has a pulse shape having a vertical rising edge followed a vertical falling edge. The second subpulse has a vertical rising edge followed by a falling slope edge.

The thin-film transistor N31 turns conductive in response to the control pulse Vpulse, thereby causing the voltage at the output terminal OUT to rise. As the voltages at the output terminal OUT rises, the gate voltage of the thin-film transistor N31 (voltage at the node A) rises by a voltage excursion responsive to a charge accumulated on the bootstrap auxiliary capacitance Cb31 as illustrated in FIG. 65. If the voltage Va subsequent to the voltage rising satisfies Va−VDD1>Vth (N31), the voltage at the output terminal OUT becomes the first high power-source voltage VDD1 with the thin-film transistor N31 conductive as illustrated in FIG. 65.

As the voltage at the node A rises, the voltage at the node F rises to Va−Vth(N39). The voltage subsequent to the voltage rising is sufficient to cause the thin-film transistor N41 to turn conductive.

When the reset pulse is transitioned from the low level to the high level at the input terminal INr in FIG. 33, the thin-film transistor N35 becomes conductive. The voltage at the node C rises as illustrated in FIG. 65. As the voltage at the node C rises, the gate voltage of the thin-film transistor N35 rises by a voltage excursion responsive to a charge accumulated on the bootstrap auxiliary capacitance Cb33 as illustrated in FIG. 65. The resulting voltage subsequent to the voltage rising is Ve. If the voltage Ve satisfies a condition of Ve−VDD1>Vth(N35), the node C reaches the first high power-source voltage VDD1 with the thin-film transistor N35 conductive as illustrated in FIG. 65.

When the node C rises to the first high power-source voltage VDD1, the thin-film transistors N32 and N40 become conductive. The voltage of the output terminal OUT and the voltage at the node F then fall to the low power-source voltage VSS as illustrated in FIG. 65.

While the reset pulse remains at the high level, the thin-film transistor N34 remains conductive. The voltage at the node B is thus controlled to the low power-source voltage VSS as illustrated in FIG. 65. The gate electrode of the thin-film transistor N31 forming the first output stage (voltage at the node A) also falls down to the low power-source voltage VSS.

The reset pulse then falls from the high level to the low level. During this voltage transition, a voltage change of the reset pulse can interfere with the node C because of the coupling effect.

Although the node C still maintains a high level, the voltage thereof falls from the first high power-source voltage VDD1 to a voltage Vc2 as illustrated in FIG. 65.

The voltage Vc2 at the node C satisfies a condition of Vc2−VSS>Vth(N32). The thin-film transistor N32 continues to be conductive, and the voltage at the output terminal OUT is maintained at the low power-source voltage VSS as illustrated in FIG. 65.

Also, the voltage Vc2 at the node C satisfies Vc2−VSS>Vth(N37). The thin-film transistor N37 thus becomes conductive, and the low power-source voltage VSS is continuously supplied to the node B.

This means that the node C is insusceptible to the interference responsive to the voltage change of the set pulse (means that the off-operation point of the thin-film transistor N31 is not shifted).

The above-described voltage status is maintained while the node C is at the Vc2. More specifically, the node B is kept to the low power-source voltage VSS until the set pulse is subsequently transitioned to the high level. As a result, the leak current of the thin-film transistor N31 is minimized.

With the above-described circuit structure, the bootstrap operation of the node A is executed in synchronization with the timing at which the control pulse Vpulse applied to the pulse signal line rises to the first high power-source voltage VDD1 as illustrated in FIG. 65. An output pulse appearing at the output terminal OUT is a voltage change extracted from the control pulse Vpulse that is input between the timing of the rising edge of the set pulse and the timing of the rising edge of the reset pulse as illustrated in FIG. 65.

The above-referenced circuit structure allows the waveform of the output pulse to be adjusted. For example, the output pulse may be split into a plurality subpulses or may be adjusted in transient characteristics (rising edge and falling characteristics).

Figure 66:
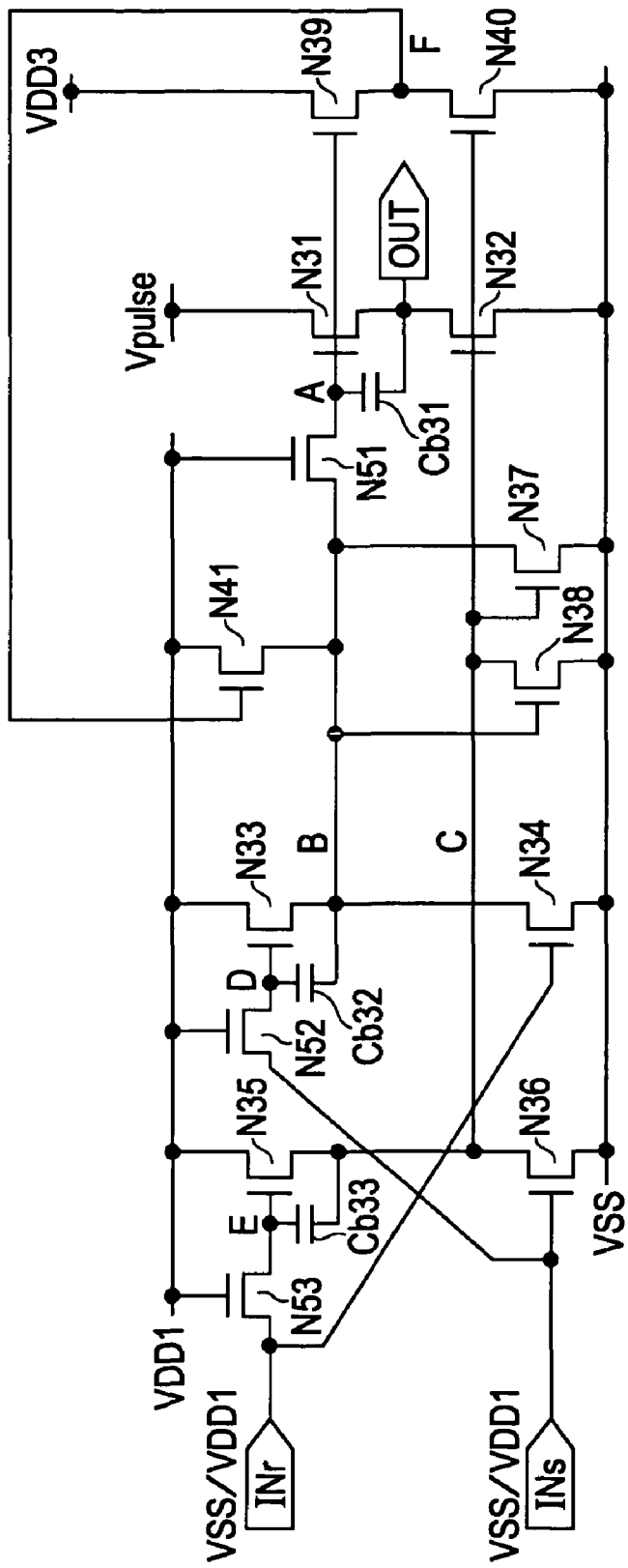
FIG. 66 is a circuit diagram of a buffer according to one embodiment of the present invention.

FIG. 66 illustrates a circuit structure in which a control pulse Vpulse is supplied to the thin-film transistor N31 forming the output stage of the embodiment 11.

Figure 67:
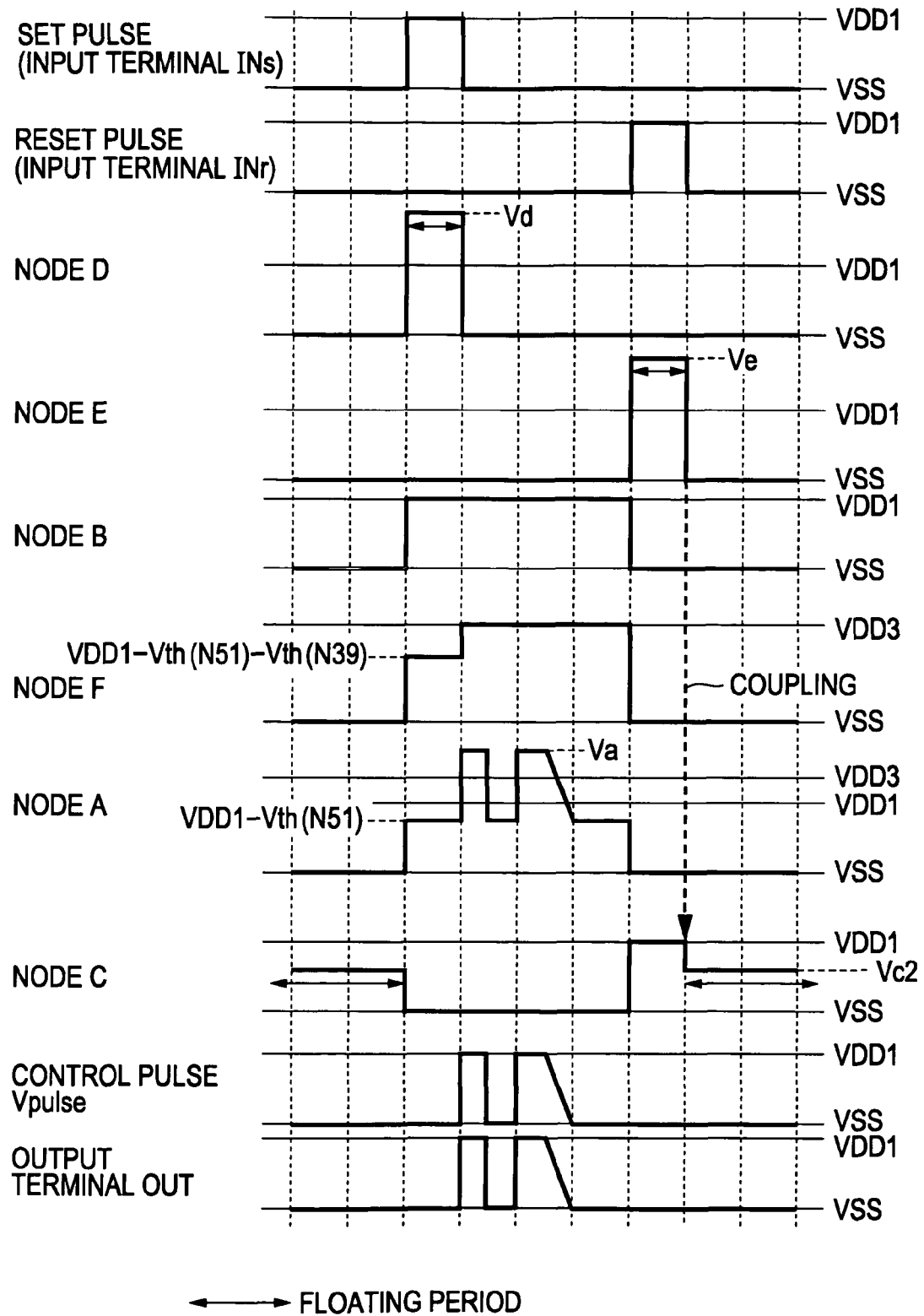
FIG. 67 illustrates drive waveforms of the buffer illustrated in FIG. 66.

FIG. 67 illustrates the relationship of the voltage statuses of the set pulse and the reset pulse and the voltage status of each node in the circuit structure.

The drive waveforms illustrated in FIG. 67 correspond to the respective drive waveforms illustrated in FIG. 65.

A comparison of FIG. 67 with FIG. 65 reveals that the two circuit structures are generally similar to each other. The difference between the two circuit structures lies in the voltage at the node F within the period from the falling edge of the set pulse to the rising edge of the reset pulse. The discussion that follows focuses on the difference.

The set pulse then falls from the high level to the low level. During this voltage transition, a voltage change of the set pulse can interfere with the nodes B and C because of the coupling effect.

In this circuit structure, the thin-film transistor N41 remaining conductive continuously supplies the high level voltage to the node B. The effect of interference caused by the voltage change in the set pulse is also marginal.

In this condition, the control pulse Vpulse with the high level thereof being equal to the first high power-source voltage VDD1 is input to the pulse signal line as illustrated in FIG. 67. The thin-film transistor N31 turns conductive in response to the control pulse Vpulse, thereby causing the voltage at the output terminal OUT to rise. As the voltages at the output terminal OUT rises, the gate voltage of the thin-film transistor N31 (voltage at the node A) rises by a voltage excursion responsive to a charge accumulated on the bootstrap auxiliary capacitance Cb31 as illustrated in FIG. 67. If the voltage Va subsequent to the voltage rising satisfies Va−VDD1>Vth (N31), the voltage at the output terminal OUT becomes the first high power-source voltage VDD1 with the thin-film transistor N31 conductive as illustrated in FIG. 67.

As the voltage at the node A rises, a condition of Va−VDD3>Vth(N39) becomes satisfied. The voltage at the node F rises to the third high-voltage power source VDD3.

The voltage subsequent to the voltage rising is sufficient to cause the thin-film transistor N41 to turn conductive. The node B is thus continuously supplied with the first high power-source voltage VDD1. The node B biased at the high level causes the thin-film transistor N38 to turn conductive, thereby fixing the voltage at the node C to the low power-source voltage VSS.

The rest of the operation of this circuit structure is identical to the preceding circuit structure illustrated in FIG. 64.

A circuit example of one of a pixel array and a control line driver including PMOS transistors only is described.

Figure 68:
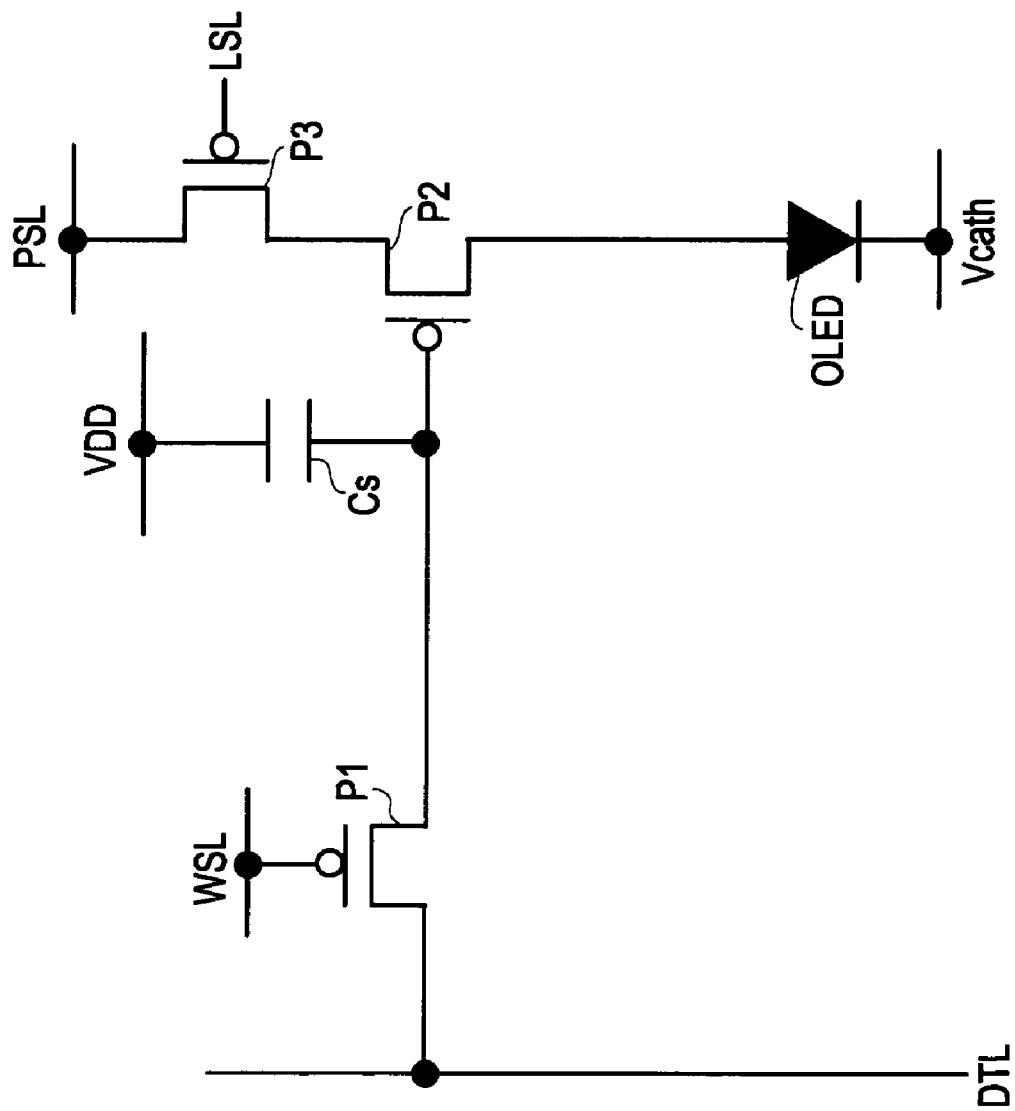
FIG. 68 is an equivalent circuit diagram of a PMOS sub pixel.
Figure 69:
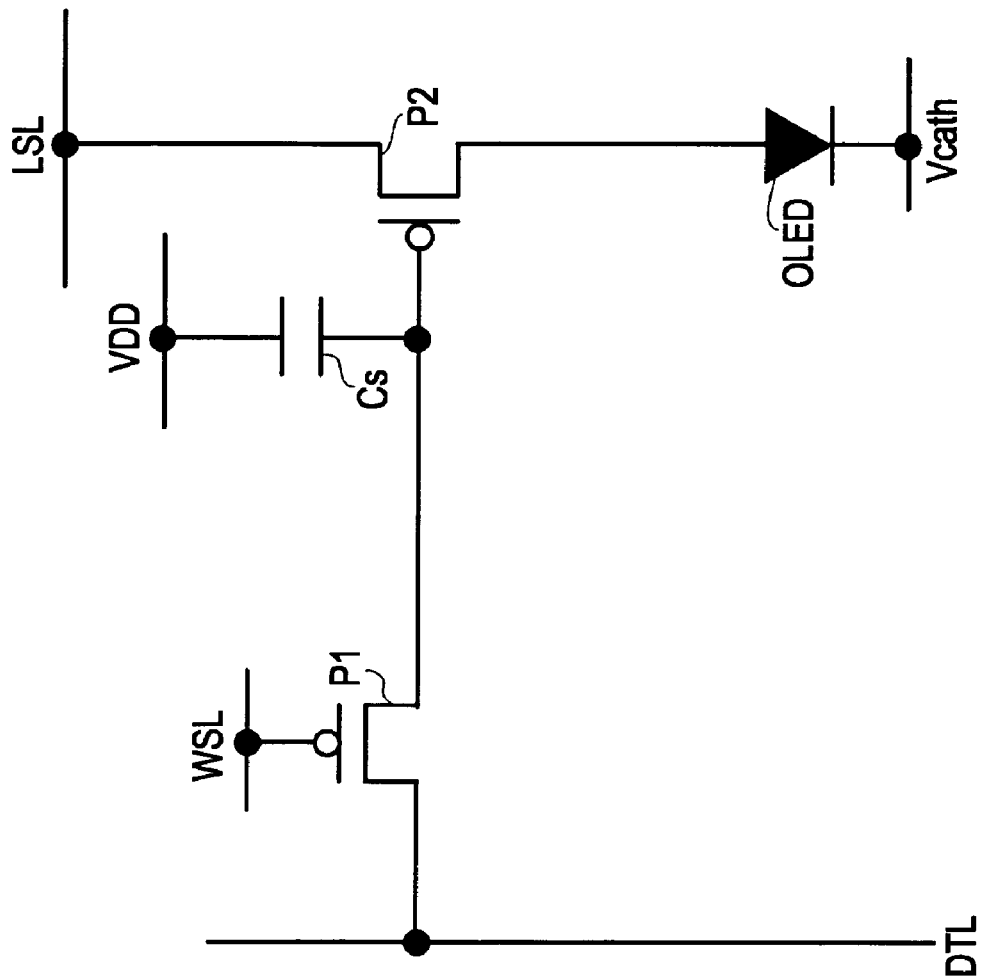
FIG. 69 is an equivalent circuit diagram of a PMOS sub pixel.

FIGS. 68 and 69 are equivalent circuit diagrams of the sub pixel 11 in a pixel array having a PMOS thin-film transistor structure.

Figure 4:
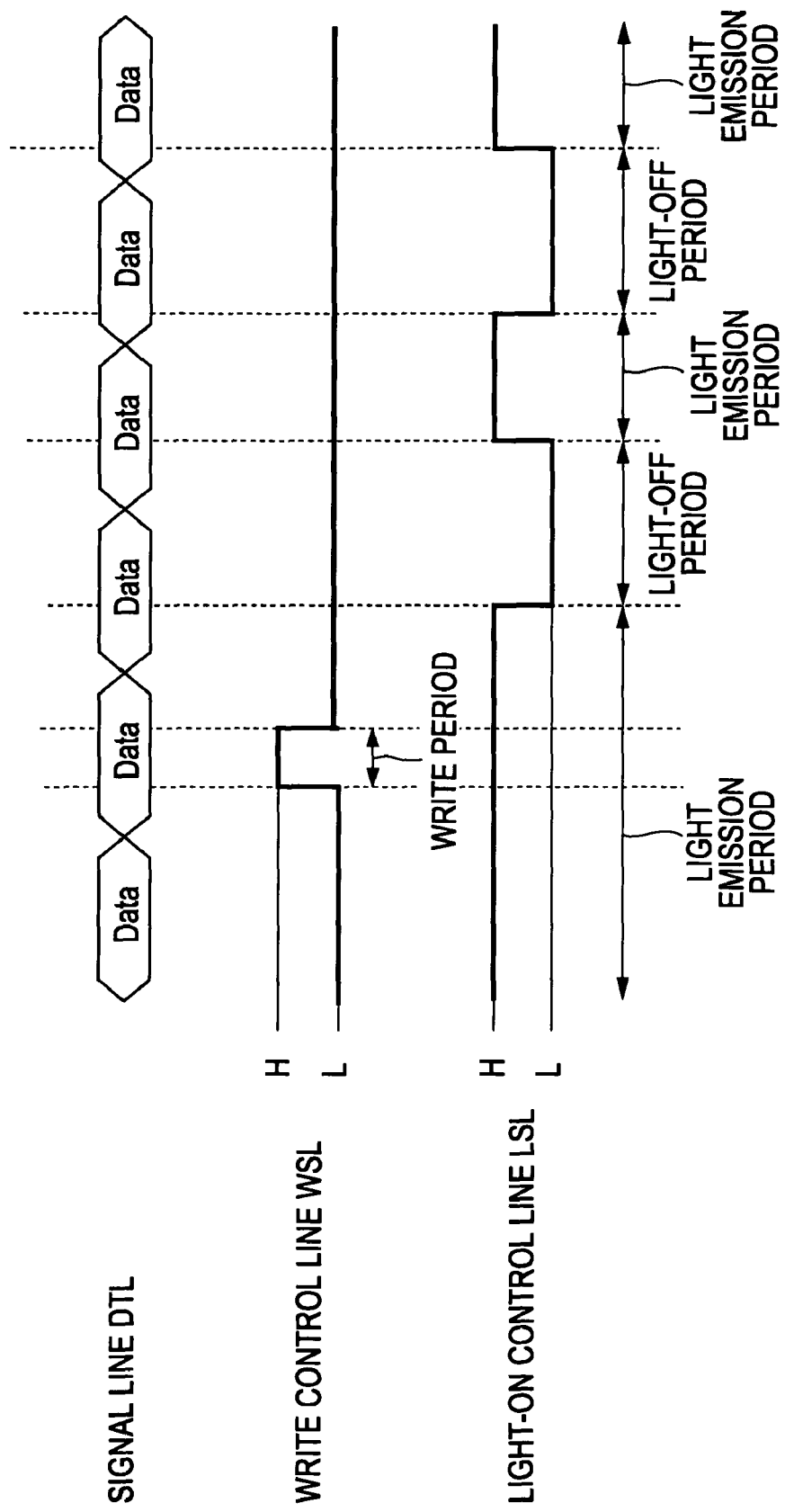
FIG. 4 illustrates a drive timing of the sub pixel.
Figure 5:
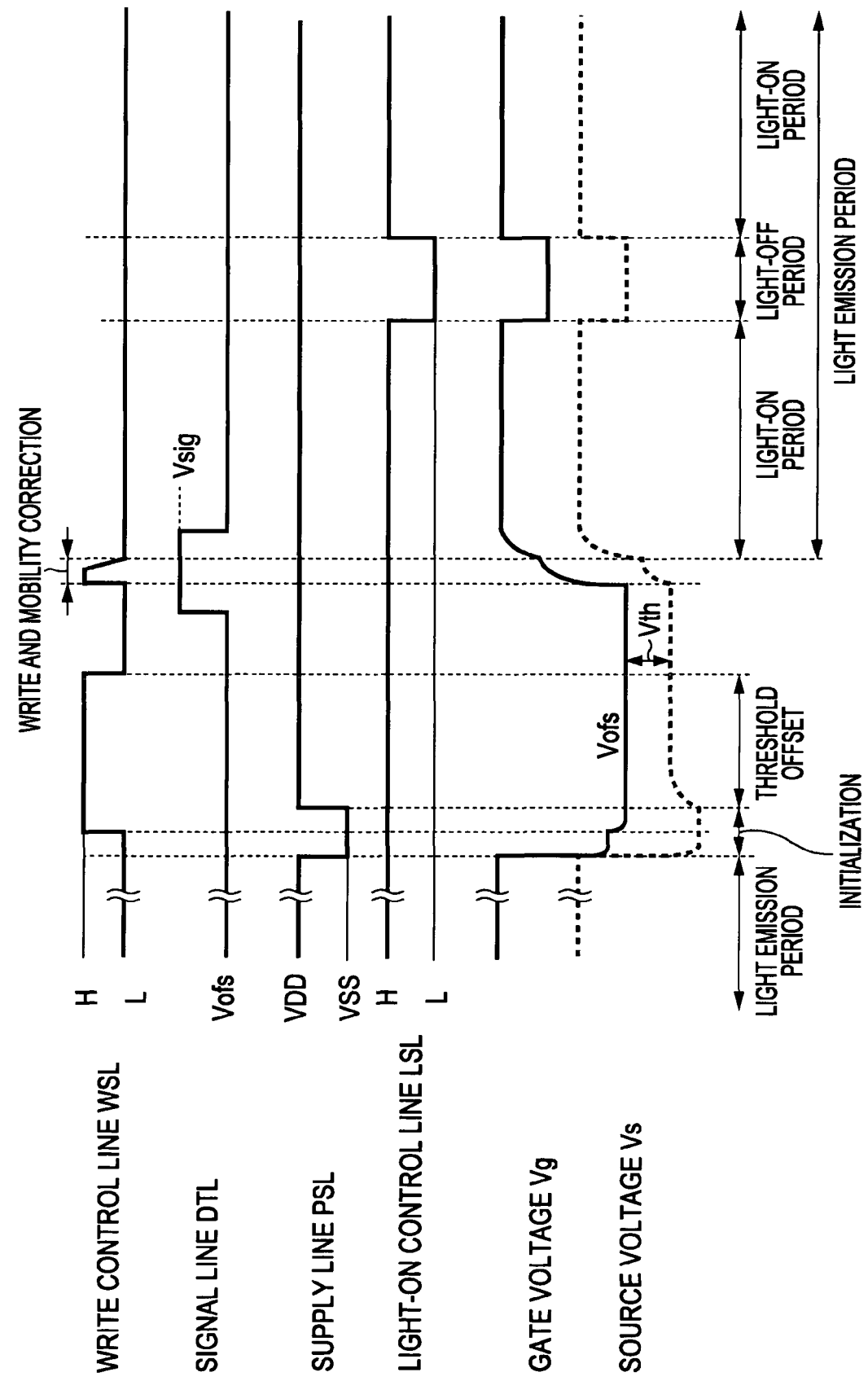
FIG. 5 illustrates drive waveforms for the sub pixel illustrated in FIG. 2.
Figure 6:
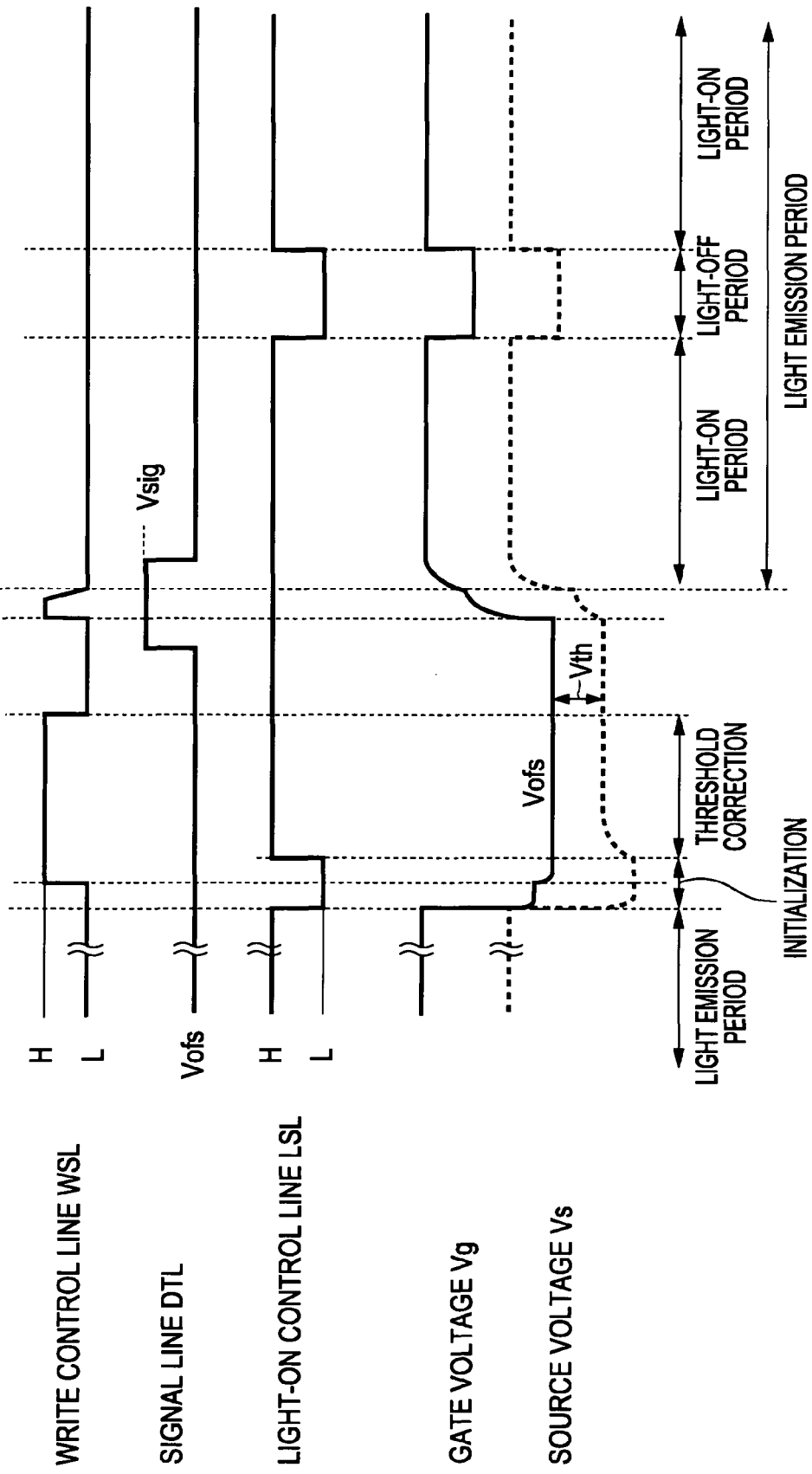
FIG. 6 illustrates drive waveforms for the sub pixel illustrated in FIG. 3.
Figure 7:
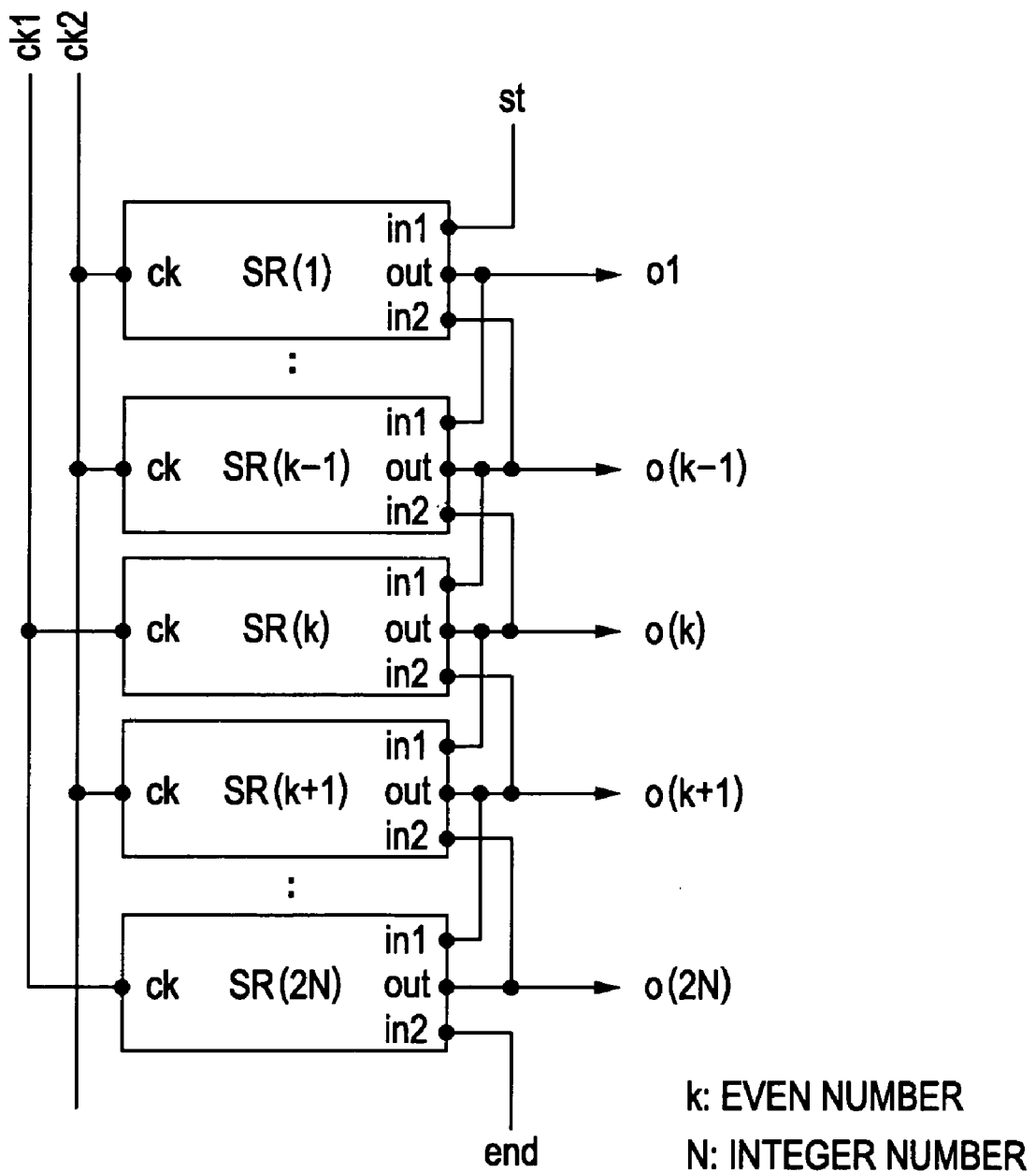
FIG. 7 illustrates a circuit example of a shift register (scanner)
Figure 8:
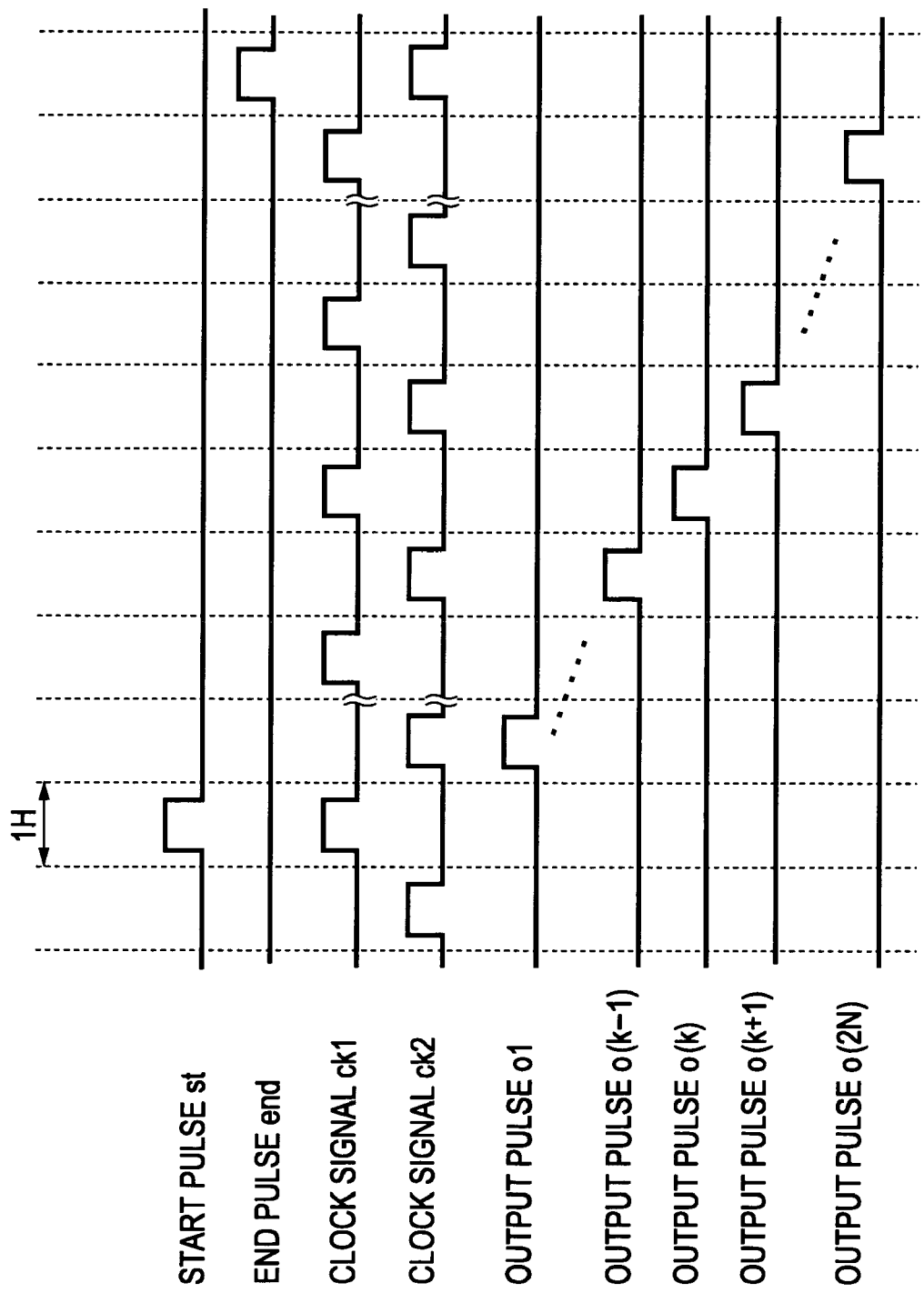
FIG. 8 illustrates drive waveforms for an NMOS shift register (scanner)
Figure 9:
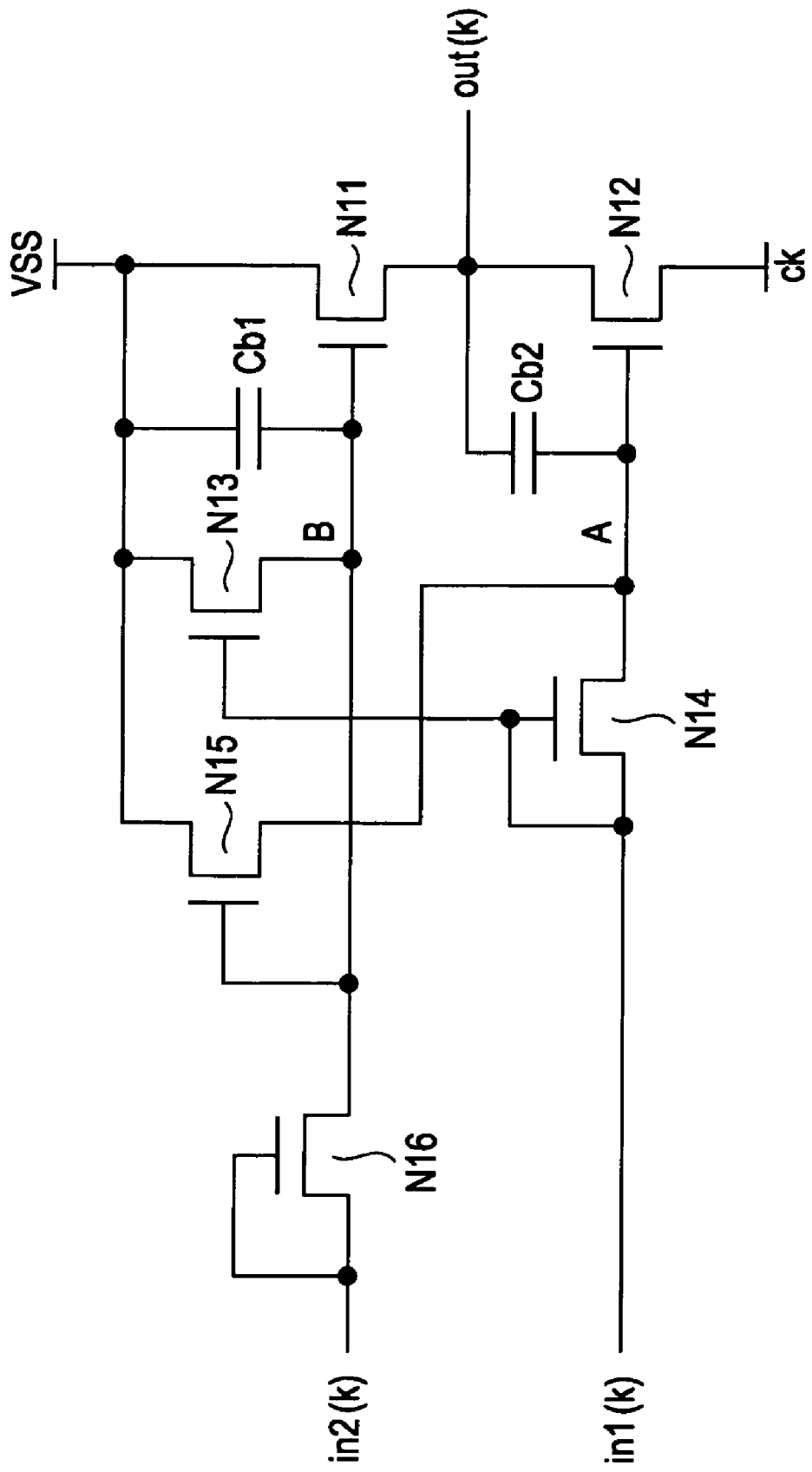
FIG. 9 illustrates an internal structure of a shift stage having a bootstrap function.
Figure 10:
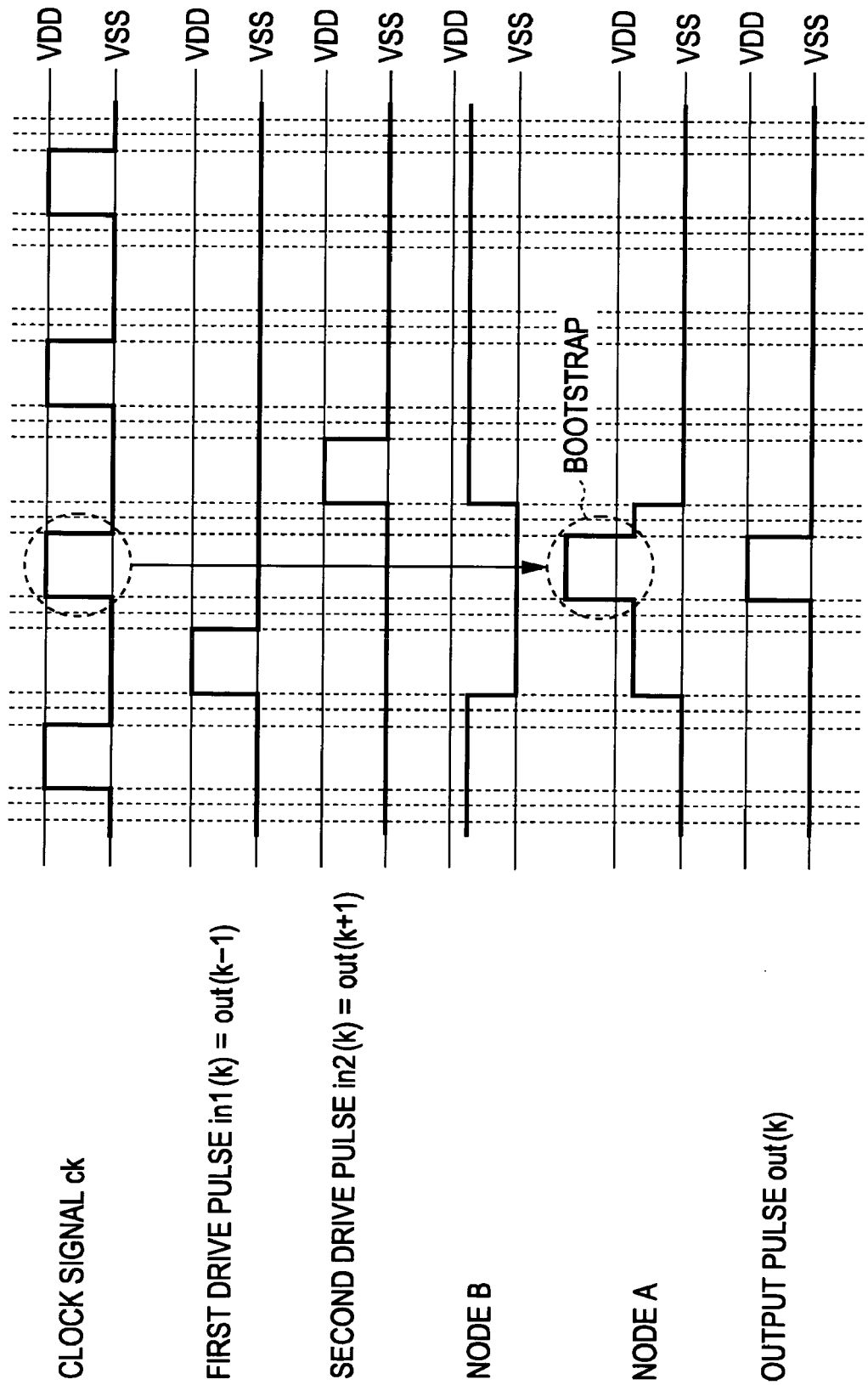
FIG. 10 illustrates an input-output operation of the shift stage performed on the basis of the bootstrap function.
Figure 11:
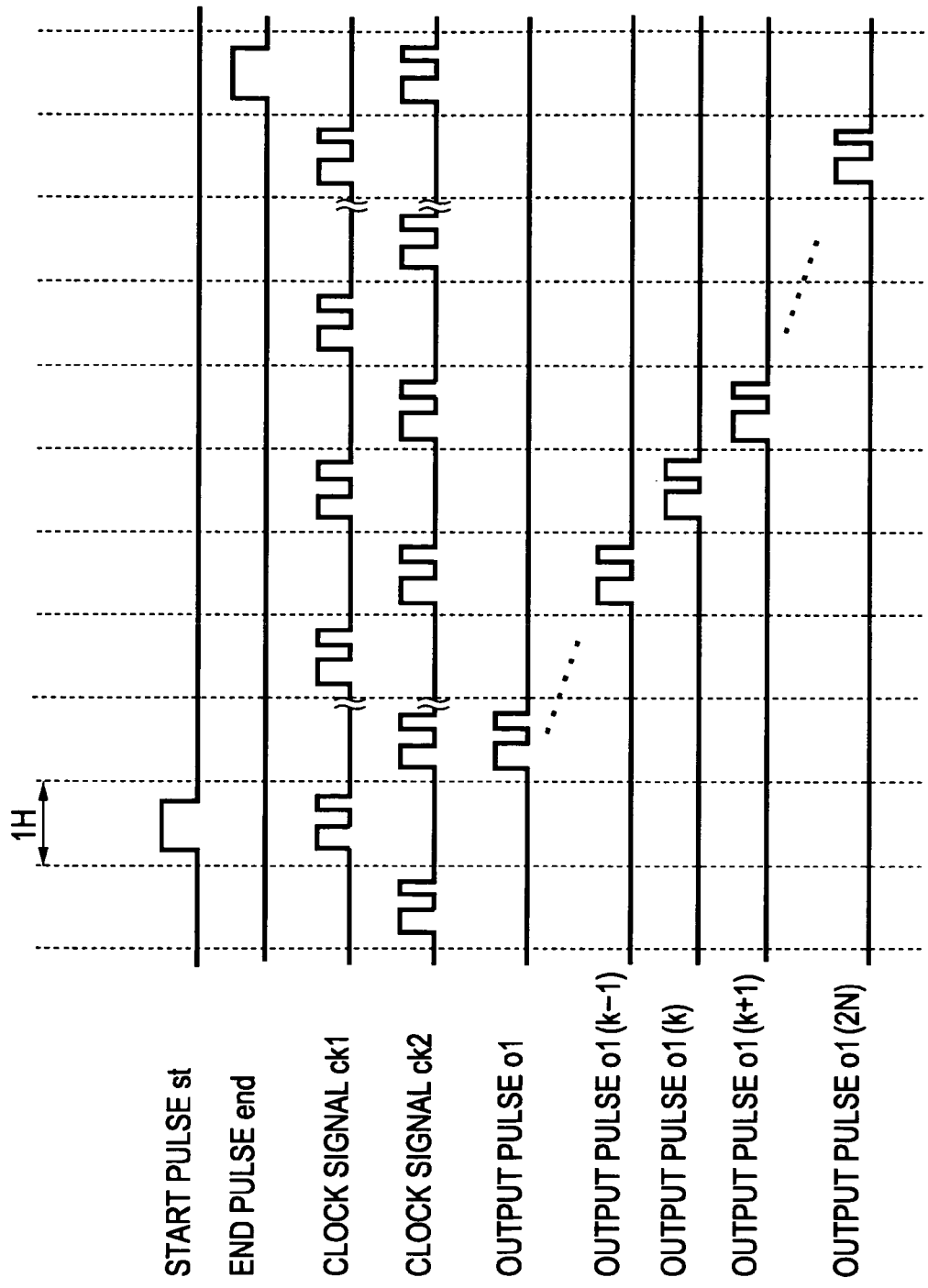
FIG. 11 illustrates the relationship between a pulse shape of an input clock and a transfer operation of the shift register.
Figure 12:
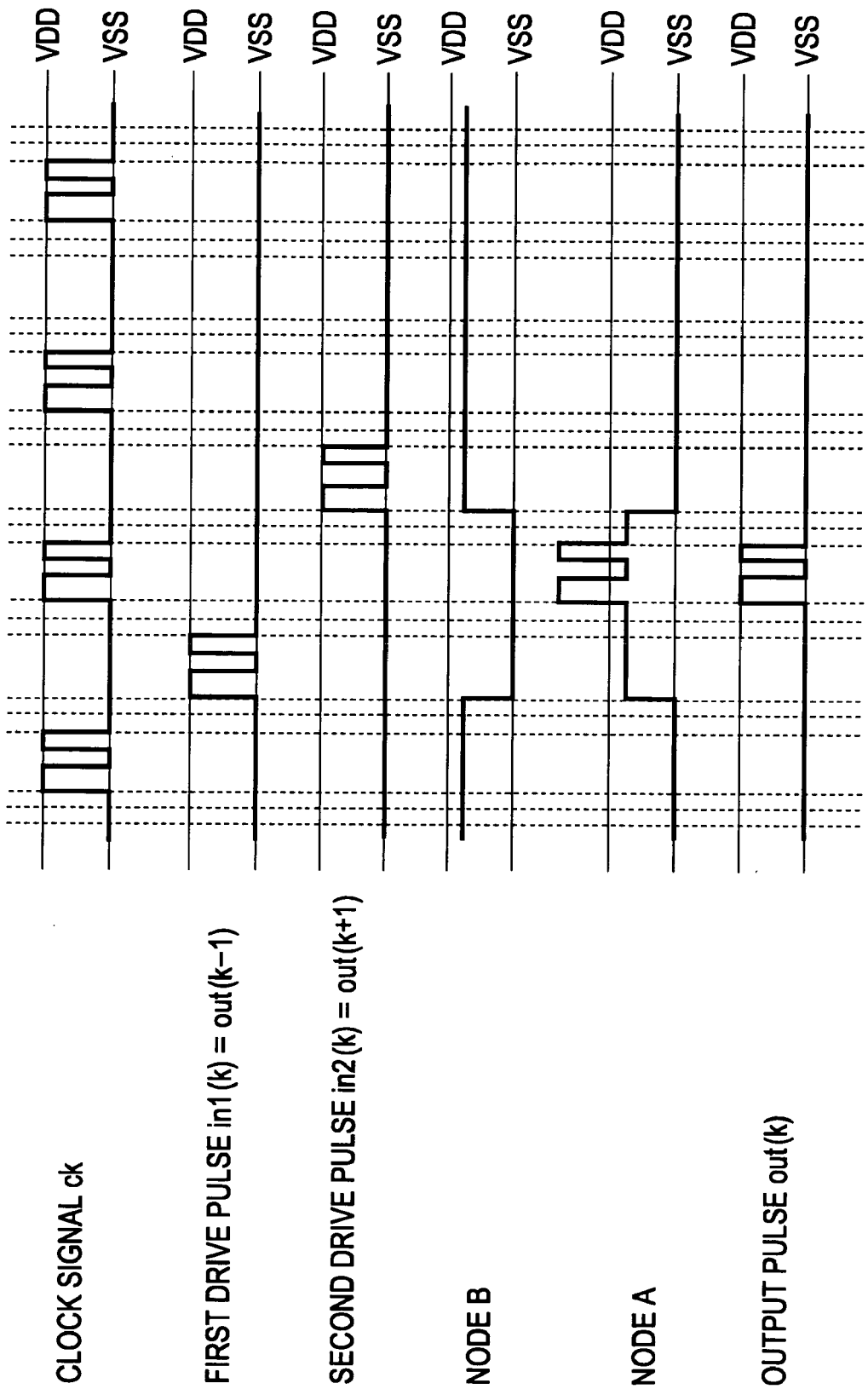
FIG. 12 illustrates an input-output operation of the shift stage performed on the basis of the bootstrap function.
Figure 13:
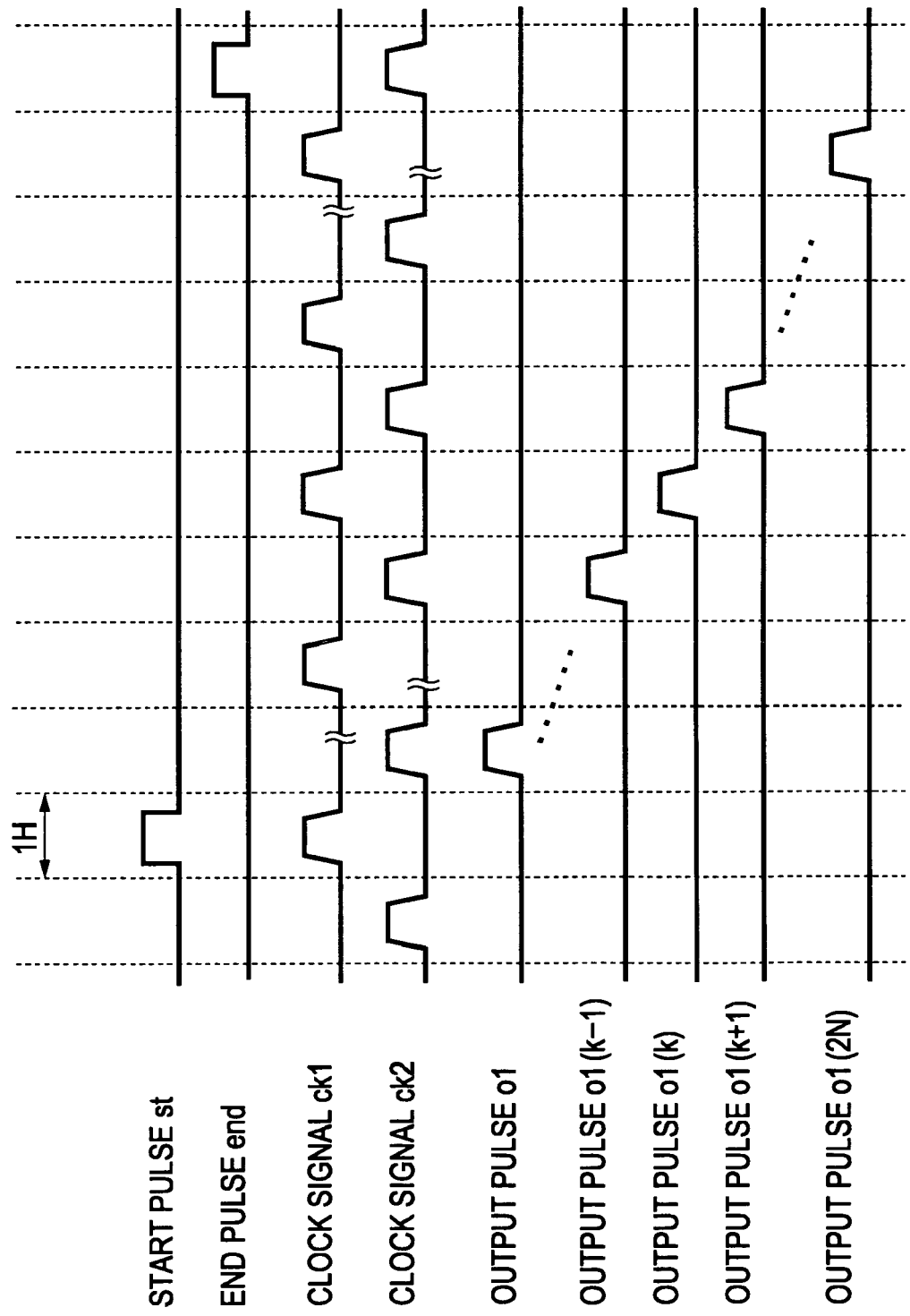
FIG. 13 illustrates the relationship between a pulse shape of an input clock and a transfer operation of the shift register.
Figure 14:
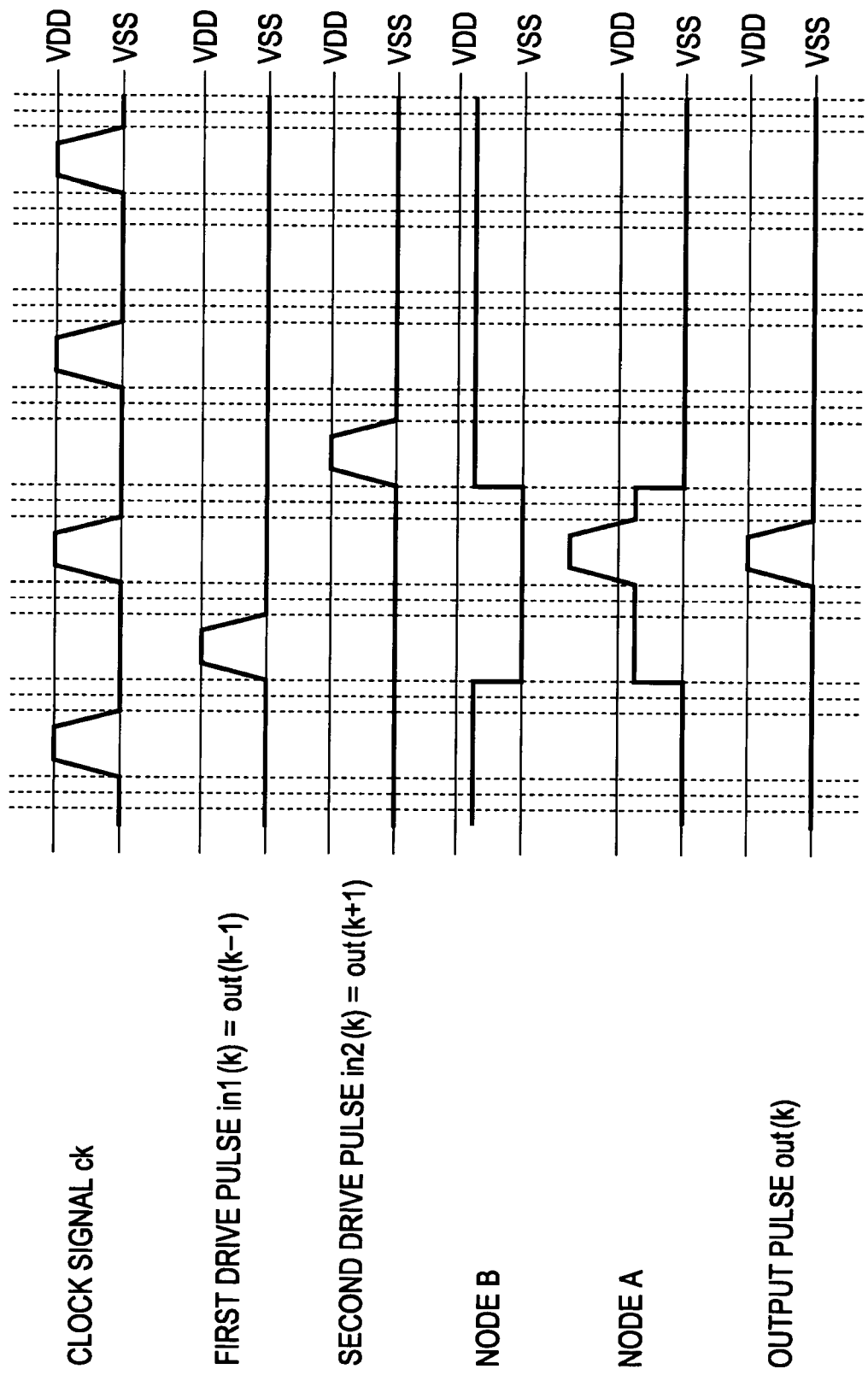
FIG. 14 illustrates an input-output operation of the shift stage performed on the basis of the bootstrap function.
Figure 15:
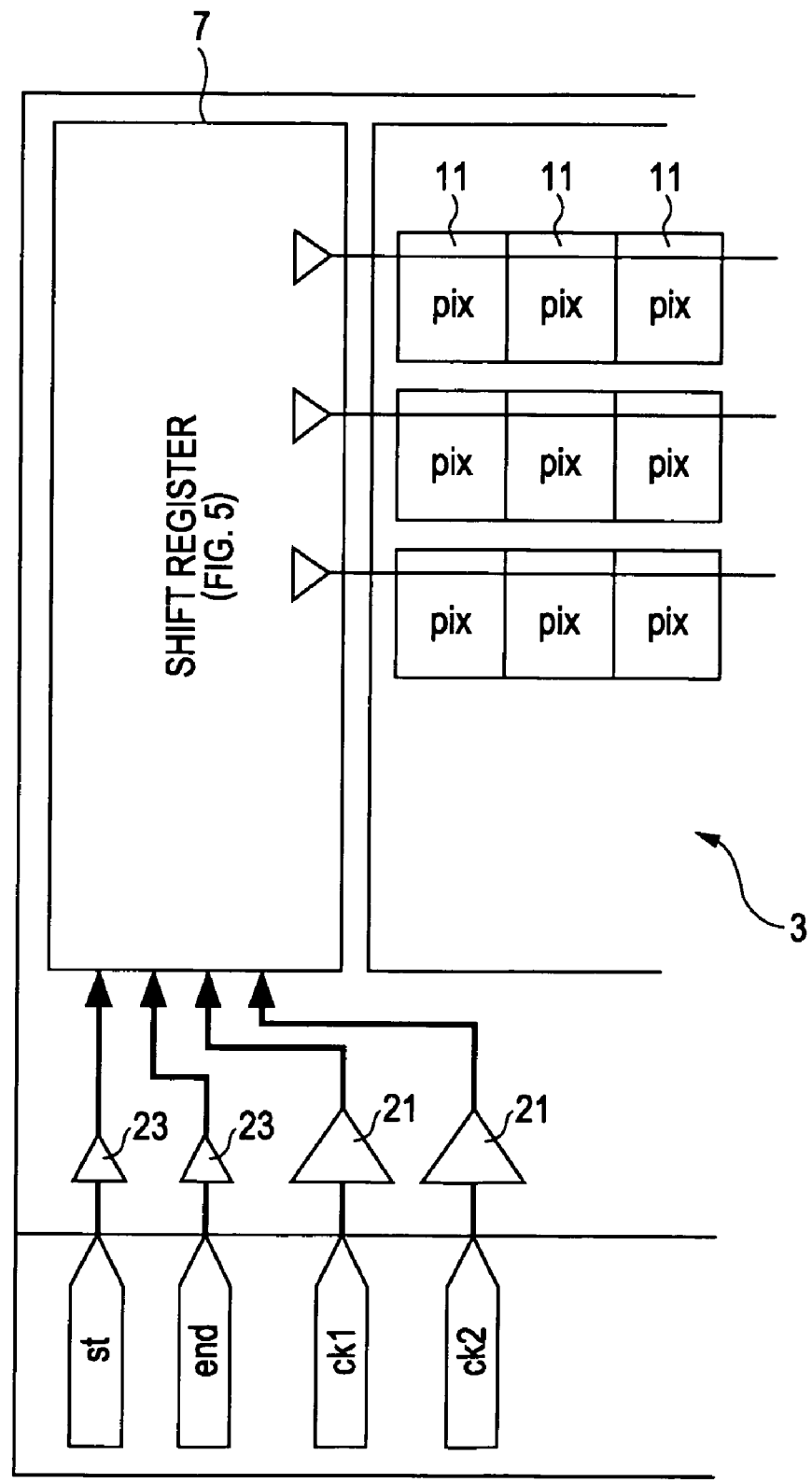
FIG. 15 illustrates a panel structure used in a driver in the related art.

The sub pixel 11 illustrated in FIG. 68 is generally similar in structure to the sub pixel 11 illustrated in FIG. 2. The difference is that the thin-film transistors are PMOS type rather than NMOS type. As illustrated in the drive waveforms in FIG. 70, the high level and the low level are reversed in each of the write control line WSL and the light-on control line LSL in FIG. 4.

Figure 70:
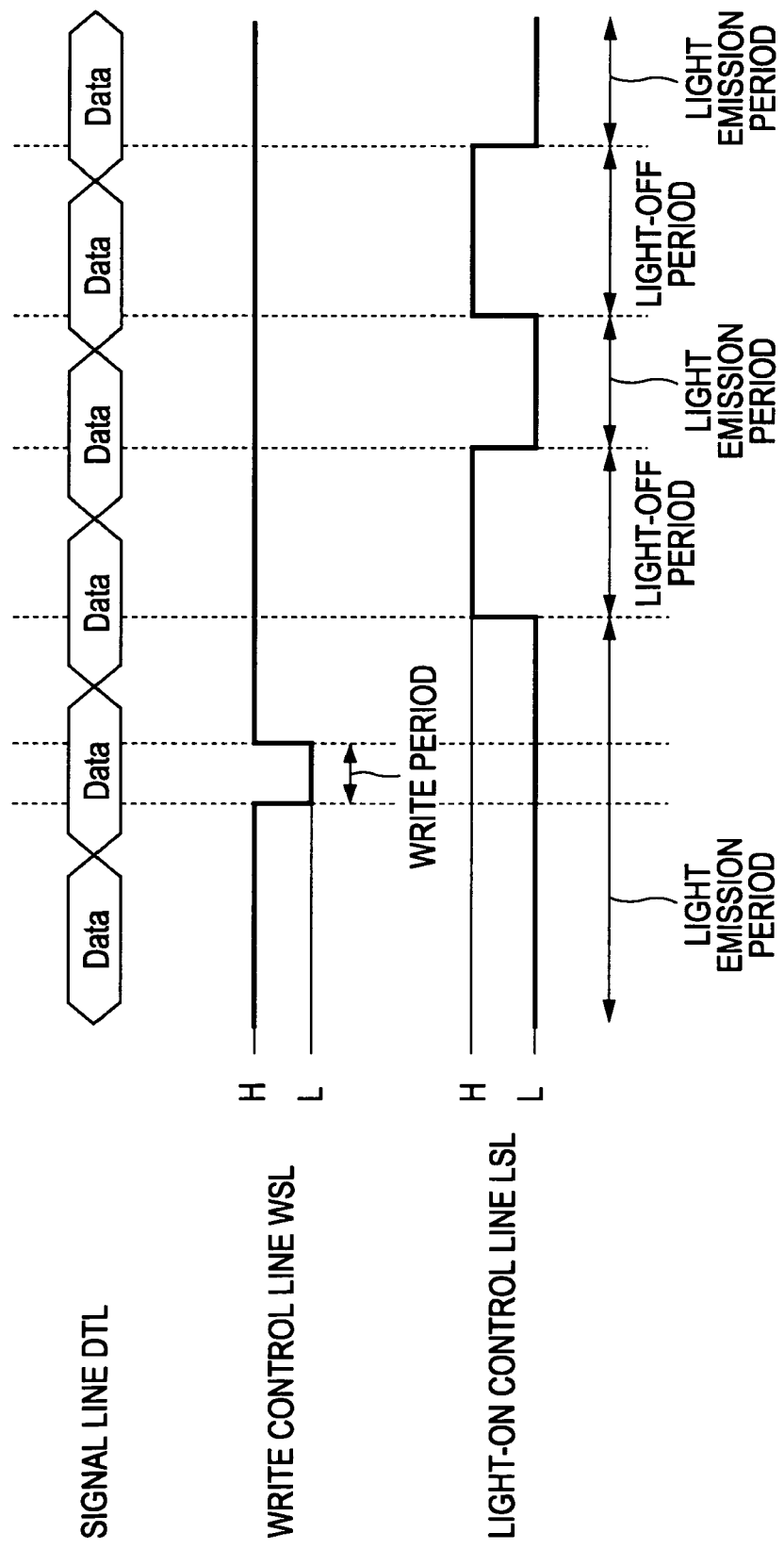
FIG. 70 illustrates drive timings of the sub pixel.

The sub pixel 11 illustrated in FIG. 69 is generally similar in structure to the sub pixel 11 illustrated in FIG. 3. The difference is that the thin-film transistors are PMOS type rather than NMOS type. A PMOS thin-film transistor turns conductive at the low level. In comparison with the drive waveforms illustrated heretofore, the high level and the low level are reversed in each of the write control line WSL and the light-on control line LSL in FIG. 4. The light emission period of the light-on control line LSL is a period throughout which the OLED is forward-biased. The drive timing of the drive waveforms illustrated in FIG. 70 is identical to the drive timing illustrated in FIG. 4.

The sub pixel 11 illustrated in FIG. 68 has a circuit structure in which a light-on operation and a light-off operation of an organic EL element OLED are controlled in response to on-off control of the light-on control transistor P3. On the other hand, the sub pixel 11 illustrated in FIG. 69 has a circuit structure in which the light-on operation and the light-off operation of the organic EL element OLED are controlled in response to a voltage change of the light-on control line LSL. It is noted that the light-on control line LSL also serves as a current supply line.

Figure 71:
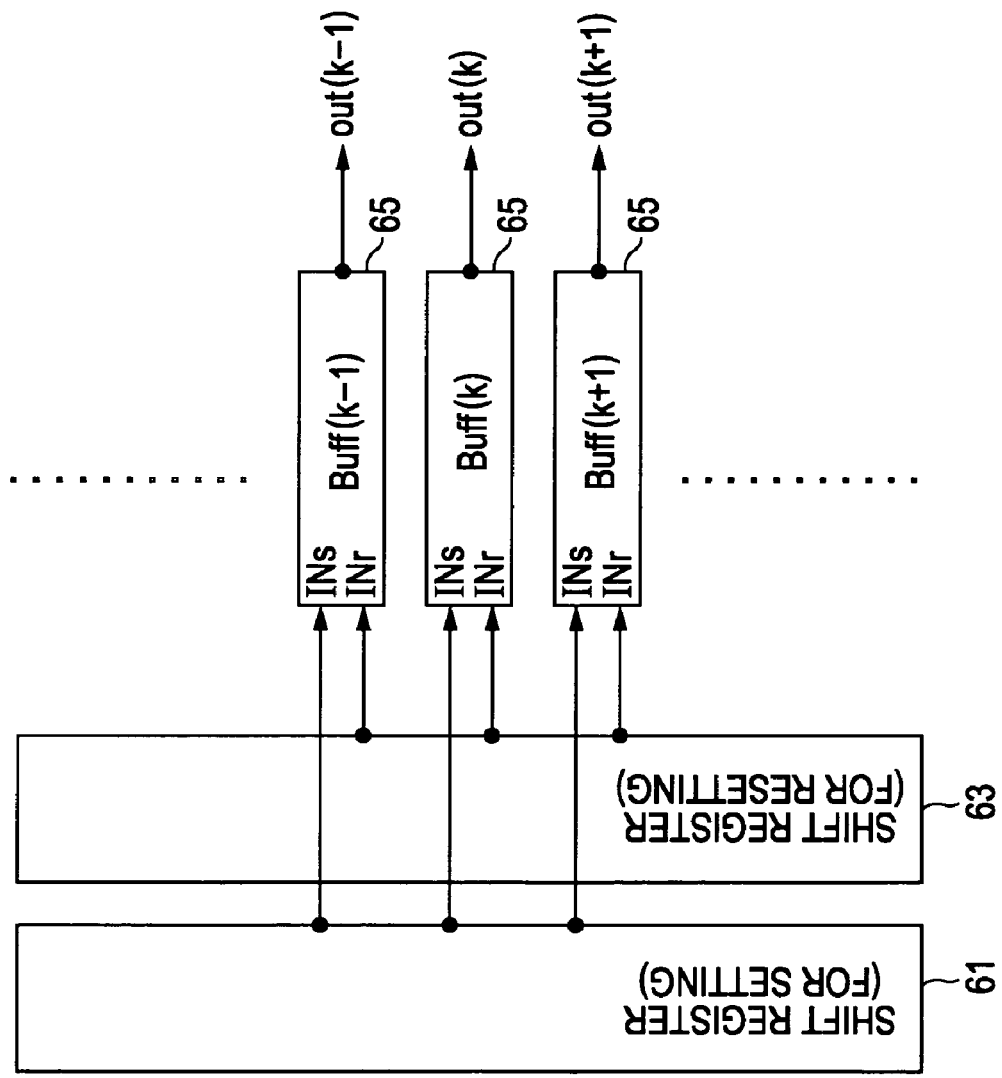
FIG. 71 illustrates a circuit structure of a control line driver.

FIG. 71 illustrates a control line driver composed of PMOS thin-film transistors only.

The control line driver illustrated in FIG. 71 includes a shift register 61 for transferring the set pulse, a shift register 63 for transferring the reset pulse, and buffers 65 performing a complementary operation in response to the set pulse and the reset pulse output from each shift stage.

The buffer 65 outputs a low-level voltage in response to the inputting of the set pulse and a high-level voltage in response to the inputting of the reset pulse.

Figure 72:
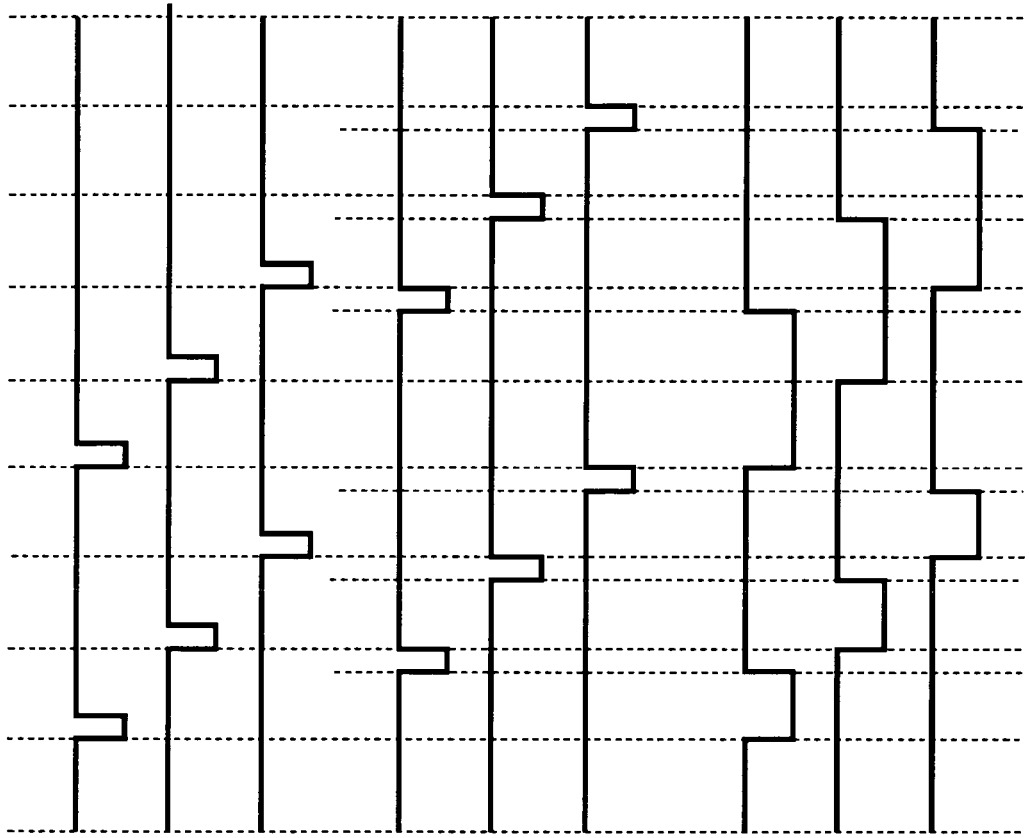
FIG. 72 illustrates drive waveforms of a PMOS control line driver according to one embodiment of the present invention.

FIG. 72 illustrates drive pulse waveforms of the control line driver, namely, outputs pulses scan1 of the shift register 61 for transferring the set signal. FIG. 72 also illustrates output pulses scan2 of the shift register 63 for transferring the reset signal. FIG. 72 also illustrates output pulses out of the buffer 65.

The pulsewidth of the output pulse out of the buffer 65 equals a time difference between the input timings of the set pulse and the reset pulse input to the buffer 65. By controlling a transfer interval between the set pulse and the reset pulse, the pulsewidth of the output pulse out of the buffer 65 can be freely set.

Embodiments of the buffer 65 are described below.

Embodiment 22

Figure 73:
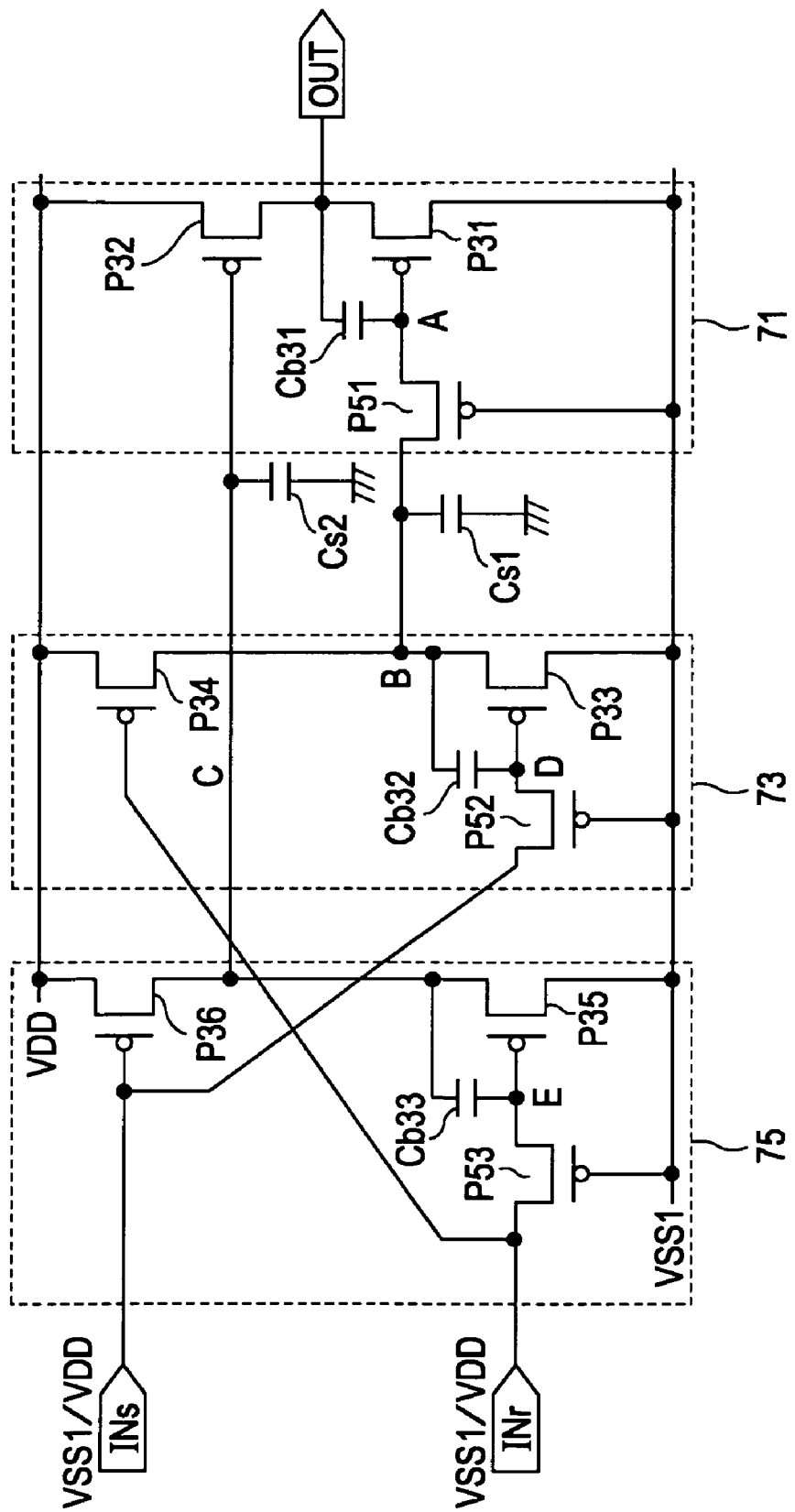
FIG. 73 illustrates a buffer according to one embodiment of the present invention.
Figure 74:
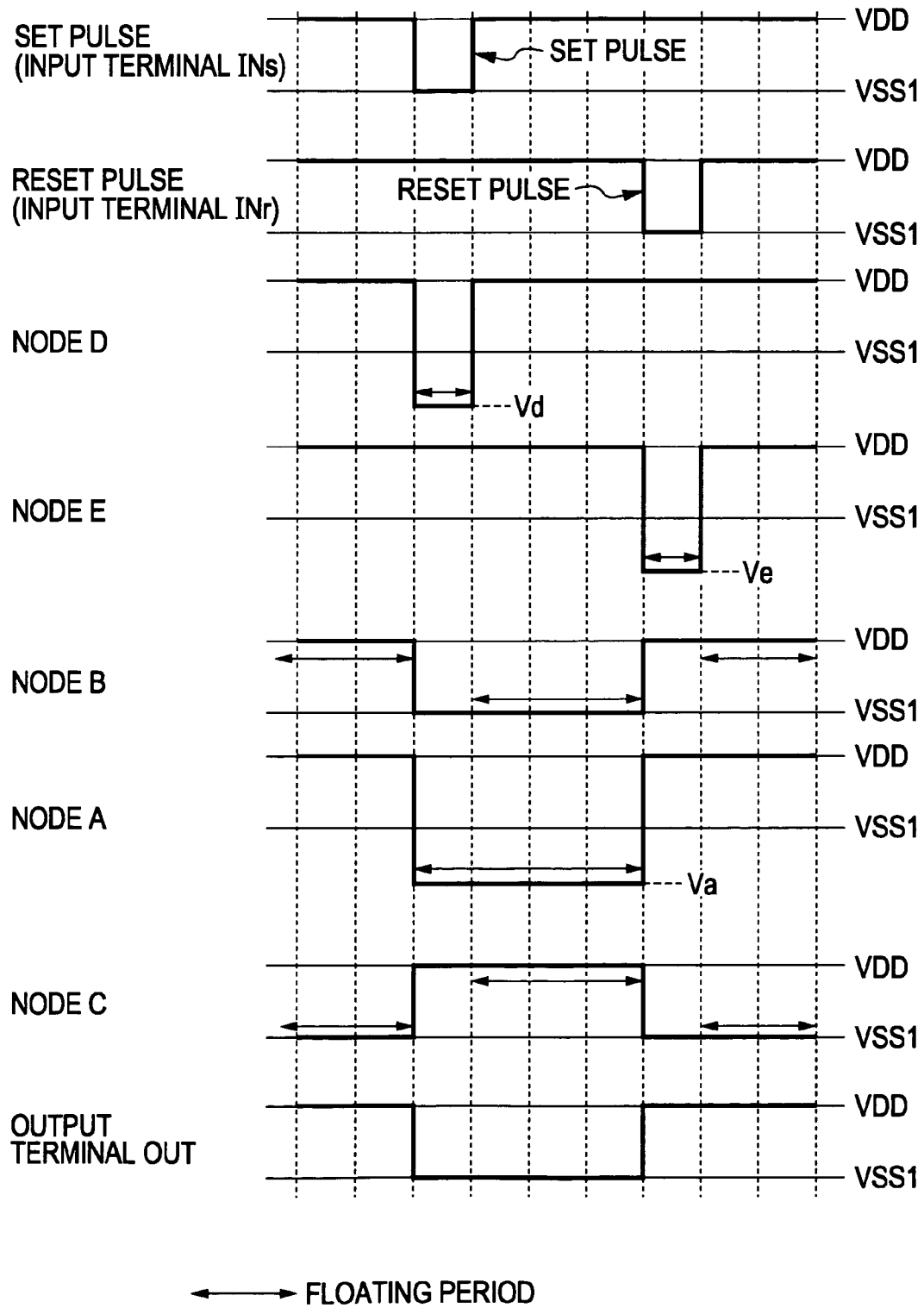
FIG. 74 illustrates drive waveforms of the buffer illustrated in FIG. 73.

FIG. 73 illustrates the buffer 65 of an embodiment 22 of the present invention, and FIG. 74 illustrates drive waveforms of the buffer 65.

The buffer 65 illustrated in FIG. 73 includes an output stage 71, a first input stage 73, and a second input stage 75.

The output stage 71 includes PMOS thin-film transistors P31 and P32 connected in series between a high power-source voltage VDD and a low power-source voltage VSS1. The thin-film transistor P31 is connected to the low power-source voltage VSS1. The thin-film transistor P32 is connected to the high power-source voltage VDD. The intermediate junction point between the thin-film transistors P31 and P32 serves as an output terminal OUT of the buffer 65.

In this embodiment, a bootstrap auxiliary capacitance Cb31 is connected between the gate electrode of the thin-film transistor P31 and the output terminal. If the gate capacitance of the thin-film transistor P31 is sufficiently high, the bootstrap auxiliary capacitance Cb31 is not necessary.

The output stage 71 includes a thin-film transistor P51 that absorbs a voltage difference between a gate voltage Vg at the bootstrap operation of the thin-film transistor P31 and an output voltage of the first input stage 73. The PMOS thin-film transistor P51 has one main electrode connected to a gate electrode (node A as a control line) of the thin-film transistor P31 and the other main electrode connected to a node B serving as a control line. The gate electrode of the thin-film transistor P51 is connected the low power-source voltage VSS1.

The node B connects to a capacitance Cs1 for holding a voltage (hereinafter referred to as "hold capacitance"). Similarly, the gate electrode of the thin-film transistor P32 (node C as a control line) connects to a hold capacitance Cs2. If the nodes B and C have small wiring capacitance values, the hold capacitances serve as a supplement. These auxiliary capacitances reduce variations in the node voltage. Such variations may cause erratic operations including an off-leak current in the thin-film transistor and an interference signal incoming via a wiring capacitance.

Each of the first input stage 73 and the second input stage 75 is generally identical in circuit structure to the output stage 71.

The circuit structure of the first input stage 73 is described below. The first input stage 73 includes the PMOS thin-film transistors P33 and N34 connected in series between the low power-source voltage VSS1 and the high power-source voltage VDD. The thin-film transistor P33 is connected to the low power-source voltage VSS1 and the thin-film transistor N34 is connected the high power-source voltage VDD. An intermediate junction point between the PMOS thin-film transistors P33 and N34 serves as an output terminal and is connected to the node B.

A bootstrap auxiliary capacitance Cb32 is connected between the gate electrode and the output terminal of the thin-film transistor P33. If the gate capacitance of the thin-film transistor P33 is sufficiently high, the bootstrap auxiliary capacitance Cb32 is not necessary.

The output stage 73 includes a thin-film transistor N52 that absorbs a voltage difference between a gate voltage Vg at the bootstrap operation of the thin-film transistor P33 and a voltage appearing at the input terminal INs of the set pulse. The PMOS thin-film transistor N52 has one main electrode connected to a gate electrode (node D as a control line) of the thin-film transistor P33 and the other main electrode connected to the input terminal INs of the set pulse. The gate electrode of the thin-film transistor N52 is connected to the low power-source voltage VSS1.

The gate electrode of the thin-film transistor P34 is connected to an input terminal INr for the reset pulse. The first input stage 73 is thus controlled by the set pulse and the reset pulse.

The circuit structure of the second input stage 75 is described below. The second input stage 75 includes PMOS thin-film transistors P35 and P36 connected in series between the low power-source voltage VSS1 and the high power-source voltage VDD. The thin-film transistor P35 is connected to the low power-source voltage VSS1 and the thin-film transistor P36 is connected to the high power-source voltage VDD. An intermediate junction point between PMOS thin-film transistors P35 and P36 serves as an output terminal and is connected the node C.

A bootstrap auxiliary capacitance Cb33 is connected between the gate electrode and the output terminal of the thin-film transistor P35. If the gate capacitance of the thin-film transistor P35 is sufficiently high, the bootstrap auxiliary capacitance Cb33 is not necessary.

The output stage 75 includes a thin-film transistor P53 that absorbs a voltage difference between a gate voltage Vg at the bootstrap operation of the thin-film transistor P35 and a voltage appearing at the input terminal INr of the reset pulse.

The PMOS thin-film transistor P53 has one main electrode connected to the gate electrode (node E as a control line) of the thin-film transistor P35 and the other main electrode connected to the input terminal INr of the reset pulse. The gate electrode of the thin-film transistor P53 is connected to the low power-source voltage VSS1.

The gate electrode of the thin-film transistor P36 is connected to the input terminal INs of the set pulse. A connection relation of the second input stage 75 to the set pulse and the reset pulse is reversal to the connection relation of the first input stage 73 to the set pulse and the reset pulse.

A boot gain gb of each of the thin-film transistors P31, P33, and P35 is calculated in accordance with the following equation:

$$gb=(Cg+Cb)/(Cg+Cb+Cp)$$

where Cg represents the gate capacitance of each thin-film transistor, Cb represents the bootstrap auxiliary capacitance connected to the gate electrode of each thin-film transistor, and Cp represents the parasitic capacitance (wiring capacitance excluding Cg and Cb) of at each of the nodes A, D, and E.

The presence of the parasitic capacitance Cp is a cause of degradation of the bootstrap gain. As previously discussed, increasing the bootstrap gain by using the bootstrap auxiliary capacitance is useful in order to assure a reliable on operation of each thin-film transistor.

The relationship of a voltage status of each of the set pulse and the reset pulse to a voltage status at each node is described below with reference to FIG. 74.

FIG. 74 illustrates the voltage statuses of the set pulse at the input terminal INs and the reset pulse at the input terminal INr.

FIG. 74 also illustrates the voltage status of the gate electrode (node D) of the thin-film transistor P33.

FIG. 74 further illustrates the voltage statuses of the gate electrode of the thin-film transistor P35 (node E), the control line (node B) connected to the output terminal of the first input stage 73, and the gate electrode of the thin-film transistor P31 (node A). FIG. 74 further illustrates the voltage statuses of the control line (node C) connected to the output terminal of the second input stage 75, and the output terminal OUT of the output stage 71.

Referring to FIG. 74, a signal amplitude of the set pulse (input terminal INs) is given between the two values VSS1 and VDD. A signal amplitude of the reset pulse (input terminal INr) is given between the two values VSS1 and VDD. The pulse signals supplied from the shift registers 61 and 63 have the same levels as the two power source voltages supplied to the buffer 65.

In accordance with the present embodiment, the timing of the falling edge of the set pulse falling to a low level is defined as a timing that matches the timing of the falling edge of the output pulse appearing at the output terminal of the output stage 71. On the other hand, the timing of the falling edge of the reset pulse falling to a low level is defined as a timing that matches the timing of the rising edge of the output pulse appearing at the output terminal of the output stage 71. Referring to FIG. 74, the set pulse falls to a low level first, then followed by the falling of the reset pulse to a low level with a delay.

The node D of the first input stage 73 falls at the timing the set pulse falls to a low level. In this way, the thin-film transistor P33 becomes conductive, causing the voltage at the node B to fall as illustrated in FIG. 74.

As the voltage at the node B falls, the gate voltage of the thin-film transistor P33 (voltage at the node D) falls by a voltage excursion responsive to a charge accumulated on the bootstrap auxiliary capacitance Cb32. The resulting voltage subsequent to the voltage rising becomes Vd. With the voltage Vd satisfying Vd−VSS1<Vth (P33), the voltage at the node B becomes the low power-source voltage VSS1 with the thin-film transistor P33 being conductive as illustrated in FIG. 74.

If the node B falls to the low power-source voltage VSS1 as previously discussed, the node A also falls to a low level. The thin-film transistor P31 becomes conductive, thereby causing the voltage at the output terminal OUT to fall as illustrated in FIG. 74.

As the voltage of the output terminal OUT falls, the gate voltage of the thin-film transistor P31 (voltage at the node A) falls by a voltage excursion responsive to a charge accumulated on the bootstrap auxiliary capacitance Cb31 as illustrated in FIG. 74. The resulting voltage subsequent to the voltage rising becomes Va. With the voltage Va satisfying Va−VSS1<Vth(P31), the voltage at the output terminal OUT becomes the low power-source voltage VSS1 with the thin-film transistor P31 being conductive as illustrated in FIG. 74.

During the low level period of the set pulse, the thin-film transistor P36 also remains conductive. For this reason, the gate voltage of the thin-film transistor P32 (voltage at the node C) forming the output stage 71 is controlled to the high power-source voltage VDD as illustrated in FIG. 74.

The set pulse then is transitioned from the low level to the high level. The hold capacitances Cs1 and Cs2 are respectively connected to the nodes B and C, and the voltage with the set pulse at the low level is thus maintained. This voltage status is maintained until the reset pulse is subsequently transitioned from the high level to the low level.

With the reset pulse transitioned to the low level (at the input terminal INr in FIG. 74), the thin-film transistor P35 becomes conductive, causing the voltage at the node C to fall as illustrated in FIG. 74. As the voltage at the node C falls, the gate voltage of the thin-film transistor P35 (voltage at the node E) falls by a voltage excursion responsive to a charge accumulated on the bootstrap auxiliary capacitance Cb33 (voltage the node E illustrated in FIG. 74). The resulting voltage subsequent to the voltage falling becomes Ve. With the voltage Ve satisfying Ve−VSS1>Vth(P35), the voltage at the node C becomes the low power-source voltage VSS1 with the thin-film transistor P35 being conductive as illustrated in FIG. 74.

If the node C falls to the low power-source voltage VSS1 as previously discussed, the thin-film transistor P32 becomes conductive, raising the voltage at the output terminal OUT to the high power-source voltage VDD as illustrated in FIG. 74.

During the low level period of the reset pulse, the thin-film transistor P34 also remains conductive. For this reason, the gate voltage at the node B is controlled to the high power-source voltage VDD as illustrated in FIG. 74. Along with the operation, the gate voltage of the thin-film transistor P31 forming the output stage 71 (voltage at the node A) is also transitioned to the high power-source voltage VDD.

The reset pulse is then transitioned from the low level to the high level. The hold capacitances Cs1 and Cs2 are respectively connected to the nodes B and C, and the voltage with the reset pulse at the low level is thus maintained. This voltage status is maintained until the set pulse is subsequently transitioned from the high level to the low level.

In the buffer 65, the output pulse falls to the low level at the timing the set pulse falls to the low level and then rises at the timing the reset pulse falls to the low level.

As described above, the use of the buffer 65 thus constructed limits the load to be driven by the set pulse and the reset pulse to the gate capacitances of the thin-film transistors P33, P36, P34 and P35. A lower drive power of the source of the set pulse and the reset pulse works. The power consumption of the source of the drive pulses is thus reduced.

With the first and second input stages, the control lines (nodes A and C) of the thin-film transistors P31 and P32 forming the output stage 71 are continuously supplied with the voltages for a duration of time throughout which the set pulse and the reset pulse remain at the high level. The voltage of the output pulse is thus maintained even with the current load connected to the output stage 71.

The buffer 65 of the present embodiment can thus be incorporated in the second control line driver 35 driving the current supply line PSL of the sub pixel 11 illustrated in FIG. 68 and the second control line driver 35 driving the light-on control line LSL of the sub pixel 11 illustrated in FIG. 69. The buffer 65 may also be incorporated in a control driver driving another control line. For example, the buffer 65 may be incorporated in the first control line driver 33 controlling the gate voltage of a thin-film transistor in the sub pixel 11.

The voltages at the nodes A and C illustrated in FIG. 74 show that both the thin-film transistors P31 and P32 are not turned on together at any given moment. More specifically, the thin-film transistors P31 and P32 operate in a complementary fashion. This arrangement prevents the through current from flowing through the output stage 71. The buffer 65 thus becomes a single-channel type buffer that operates in the same low-power-consumption mode as a CMOS type output buffer.

Embodiment 23

The buffer 65 of the embodiment 22 is a low-power-consumption device that basically prevents a through current from flowing therethrough. In the buffer 65 of the embodiment 22, however, the thin-film transistors P33 and P35 having a high gate capacitance value and the bootstrap auxiliary capacitances Cb32 and Cb33 having a high capacitance values are employed to increase the bootstrap gain.

A high capacitance value means that a voltage change in the set pulse and the reset pulse easily interferes with the output terminals of each input stage (nodes B and C). More specifically, the voltage at the output terminals (nodes B and C) drops from the intended voltage in response to the voltage change in the transition of each of the set pulse and the reset pulse from the low level to the high level. In such a case, a gate diffusion capacitance and the bootstrap auxiliary capacitances Cb32 and Cb33 function as a coupling capacitance. The gate diffusion capacitance refers to a parasitic capacitance between the gate and source of a thin-film transistor (or between the gate and drain). The gate capacitance refers to a capacitance caused between the channel and the gate when the thin-film transistor is conductive.

Figure 75:
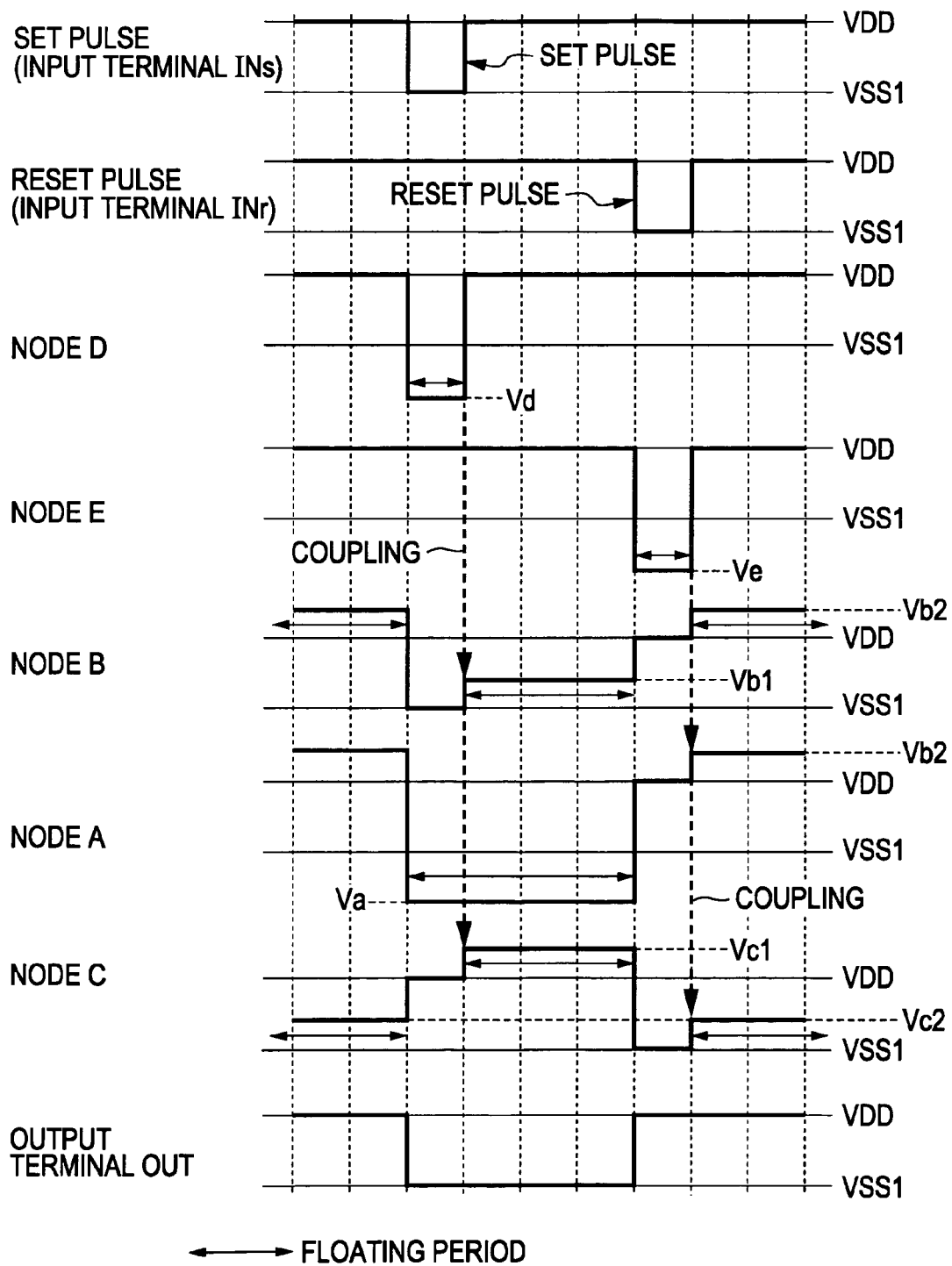
FIG. 75 illustrates drive waveforms of the buffer illustrated in FIG. 73 with the coupling effect taken into consideration.

FIG. 75 is a timing diagram that takes into consideration a pulse interference generated by the gate diffusion capacitance and the bootstrap auxiliary capacitances Cb32 and Cb33.

At the node B (FIG. 75), the voltage, which is otherwise at the low power-source voltage VSS1, rises to Vb1, and the voltage, which is otherwise at the high power-source voltage VDD, rises to Vb2. At the node C (FIG. 75), the voltage, which is otherwise at the low power-source voltage VSS1, rises to Vc2, and the voltage, which is otherwise at the high power-source voltage VDD, rises to Vc1.

While both of the set pulse and the reset pulse are at the high level, the node B and the node C stay at a floating state as illustrated in FIG. 75. As long as the circuit structure illustrated in FIG. 73 is used, a voltage drop due to the pulse interference is unavoidable. If an amount of pulse interference is small, no operational problem is created in the buffer 65. If conditions of VSS1−Vb1>Vth(P51) and Vc2−VDD<Vth(P32) are satisfied, no operational problem is created.

If the condition of VSS1−Vb1<Vth(P51) is satisfied, the thin-film transistor P51 is prevented from being conductive during the floating period of the node A, and the node A is maintained at the bootstrap voltage Va. The low power-source voltage VSS is thus output as a low level output pulse.

If the condition of Vc2−VDD<Vth(P32) is satisfied, the thin-film transistor P32 is enabled to be conductive, and the output pulse is reliably transitioned to the high power-source voltage VDD.

From the power saving standpoint, however, the problem is that the voltage at the nodes B and C rises above the high power-source voltage VDD due to the pulse interference.

Figure 76:
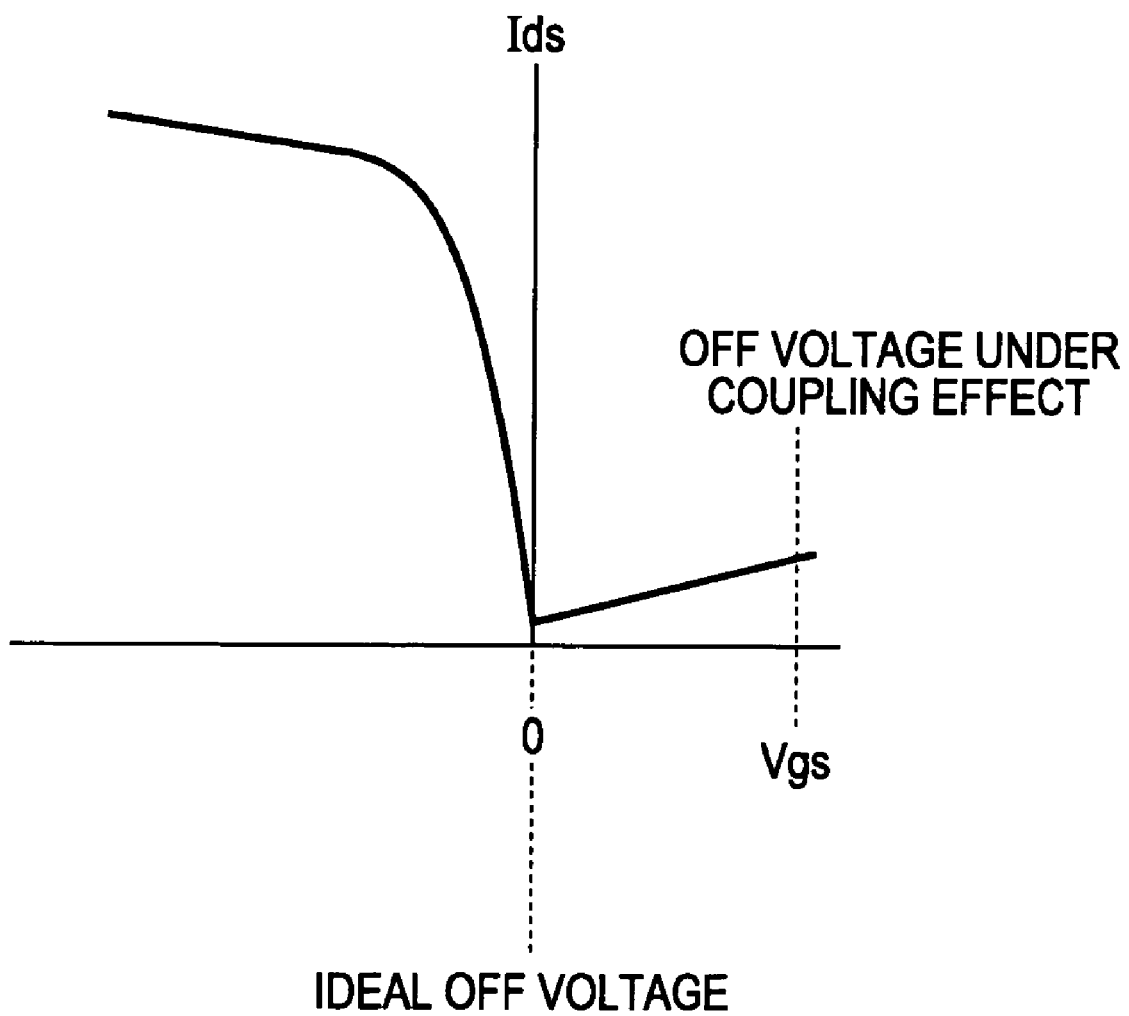
FIG. 76 illustrates Ids-Vgs characteristics of a PMOS transistor.
Figure 77:
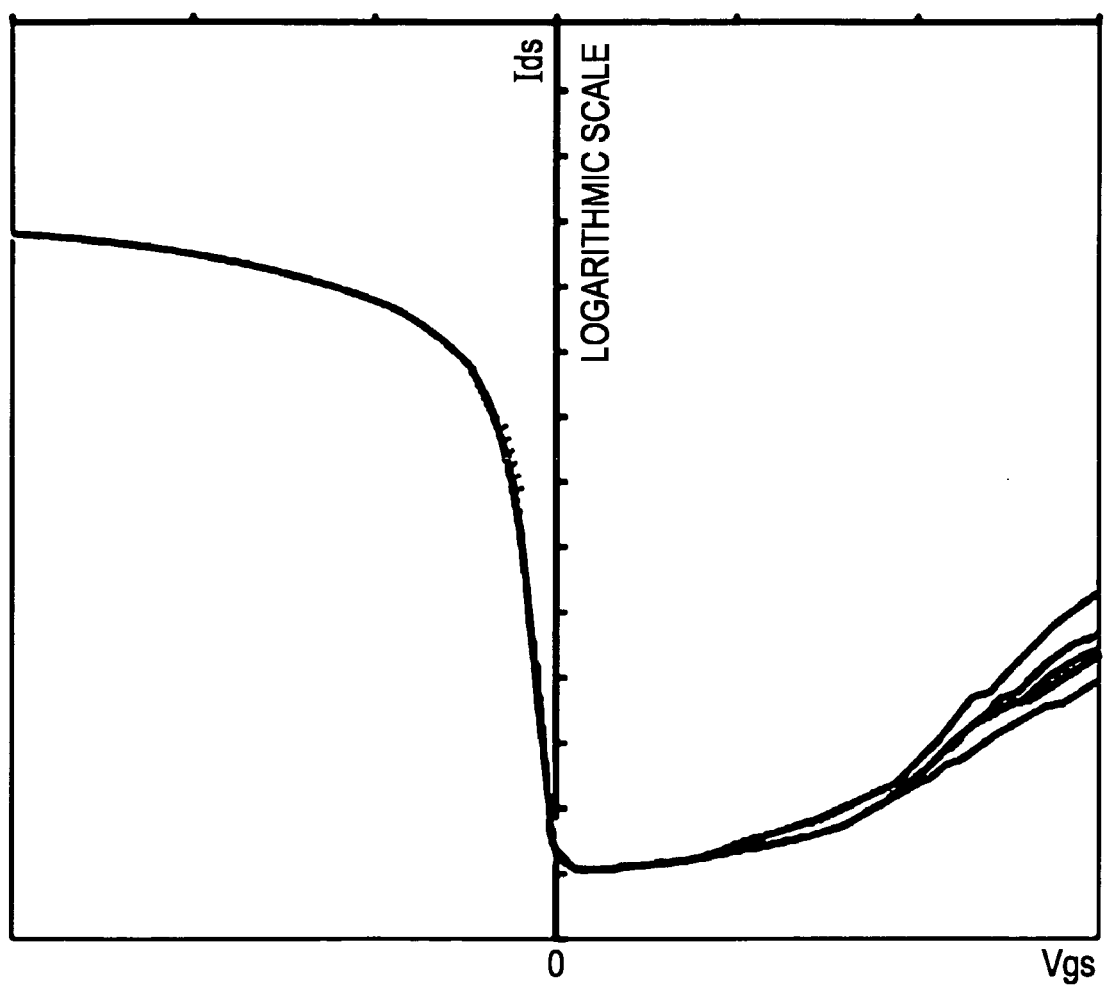
FIG. 77 illustrates measurement results of the Ids-Vgs characteristics of the PMOS transistor.

FIG. 76 illustrates Ids-Vgs characteristics of a PMOS thin-film transistor. As illustrated in FIG. 76, a current Ids tends to increase in a positive region of the gate-source Vgs (0<) in a PMOS thin-film transistor having a typical structure. This phenomenon is here referred to as Iback ramp. FIG. 77 illustrates measurement results of the Ids−Vgs characteristics of the PMOS thin-film transistor.

FIG. 77 shows that the Iback ramp is created and that there are variations in the Iback ramp.

From the power saving standpoint (from the standpoint of minimizing the through current), the gage-source voltage Vgs of each of the thin-film transistors P31 and P32 in an off operation is desirably at or close to Vgs=0 where Ids is minimized.

If the voltage at each of the nodes B (A) and C becomes higher than the high power-source voltage VDD (=0V) due to the pulse interference as previously discussed, the operational point of each of the thin-film transistors P31 and P32 shifts into the region of the Iback ramp. As illustrated in FIG. 77, the leak current Ids in this region is subject to characteristic variations of thin-film transistors.

No operational problem is created if an off current is sufficiently smaller than an on current in the complementary circuit. A difference in the leak current Ids affects the waveform of the output pulse in view of the output pulse rising and falling characteristics (transient characteristics).

Moreover, an amount of pulse interference can be increased more than expected. For example, an amount of coupling from the node D to the node B increases above an expected level, and the voltage Vb1 at the node B can rise above the cutoff voltage of the thin-film transistor P51. In such a case, the condition of VSS1−Vb1<Vth(P51) holds, causing the thin-film transistor P51 to be conductive.

Figure 78:
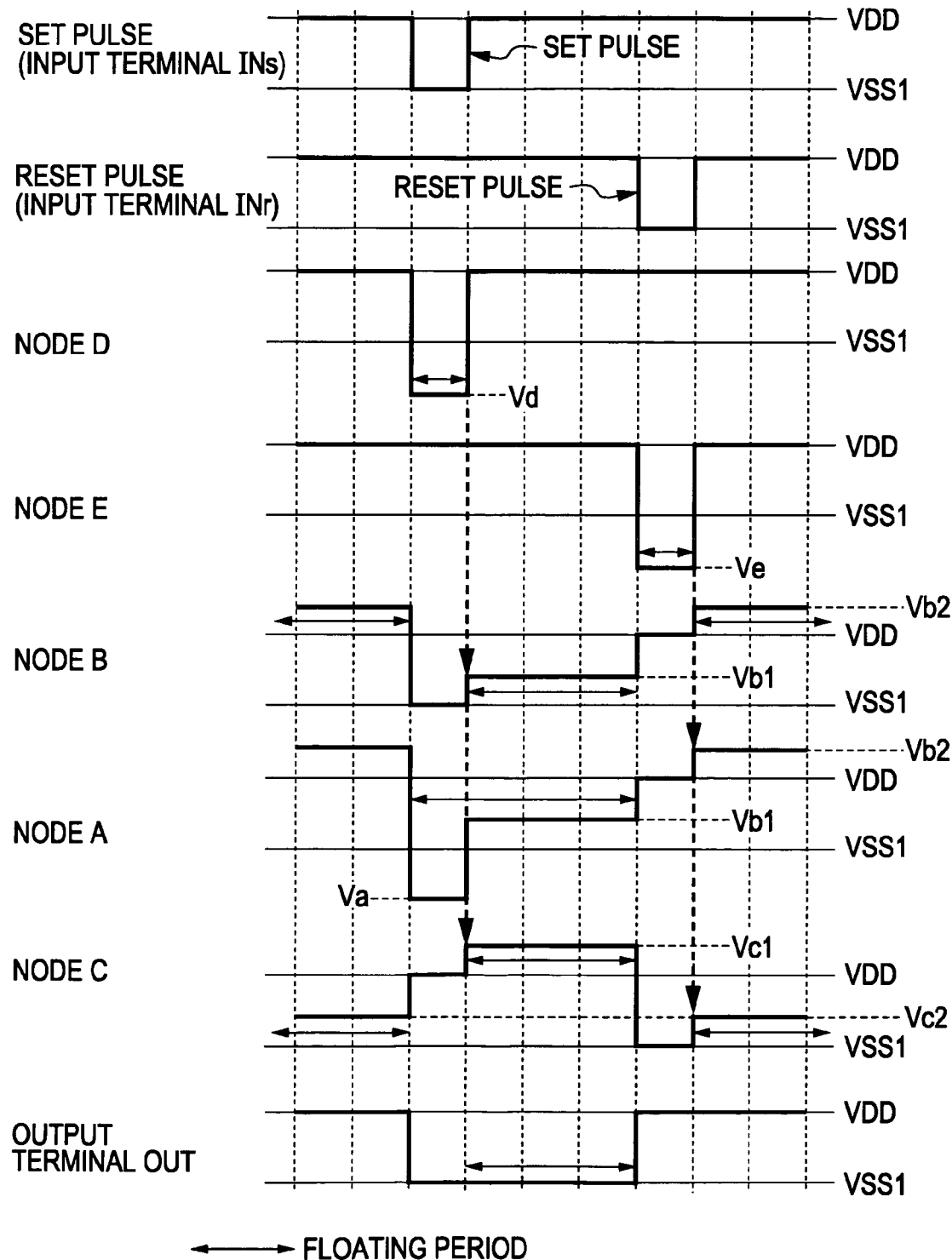
FIG. 78 illustrates drive waveforms of the buffer illustrated in FIG. 73 with the coupling effect being predominant.

FIG. 78 is a timing diagram with an amount of coupling from the node D to the node B increased. The drive waveforms illustrated in FIG. 78 correspond to the respective drive waveforms illustrated in FIG. 75.

The voltage at the node A and the voltage at the node B are the same level after the set pulse is transitioned from the low level to the high level. With reference to the voltage at the node A in FIG. 78, the node A rises to Vb1. The voltage Vb1 does not cause the thin-film transistor P31 to be conductive. In other words, the thin-film transistor P31 remains in an off state. As a result, the output terminal OUT remains floating as represented by the voltage at the output terminal OUT in FIG. 78.

The output terminal OUT at a floating state is susceptible to leak and interference. The voltage of the output terminal OUT varies due to leak and interference, possibly causing a subsequent stage to malfunction. If the buffer 65 illustrated in FIG. 73 is used to drive the light-on control line LSL of the sub pixel 11 illustrated in FIG. 69, a leak current lowers the voltage at the output terminal OUT and a drive current may not be continuously supplied.

An embodiment 23 of the present invention described here provides a circuit structure in which the thin-film transistors P31 and P32 are operated at an off-operation point where the leak current is low and variations in the leak current are small. More specifically, the circuit structure is free from a floating state during the high level period of the node B and the node C. In other words, the high level of the node B and the node C is fixed to the high power-source voltage VDD.

The embodiment 23 of the present invention also provides the circuit structure in which the bootstrap operation of the thin-film transistor P31 is assured during the output period of the output pulse. The circuit structure thus assures the on operation of the thin-film transistor P31 during the output period of the output pulse. More specifically, the floating state is disabled with the node B fixed to the low level during the low level period of the node B.

Figure 79:
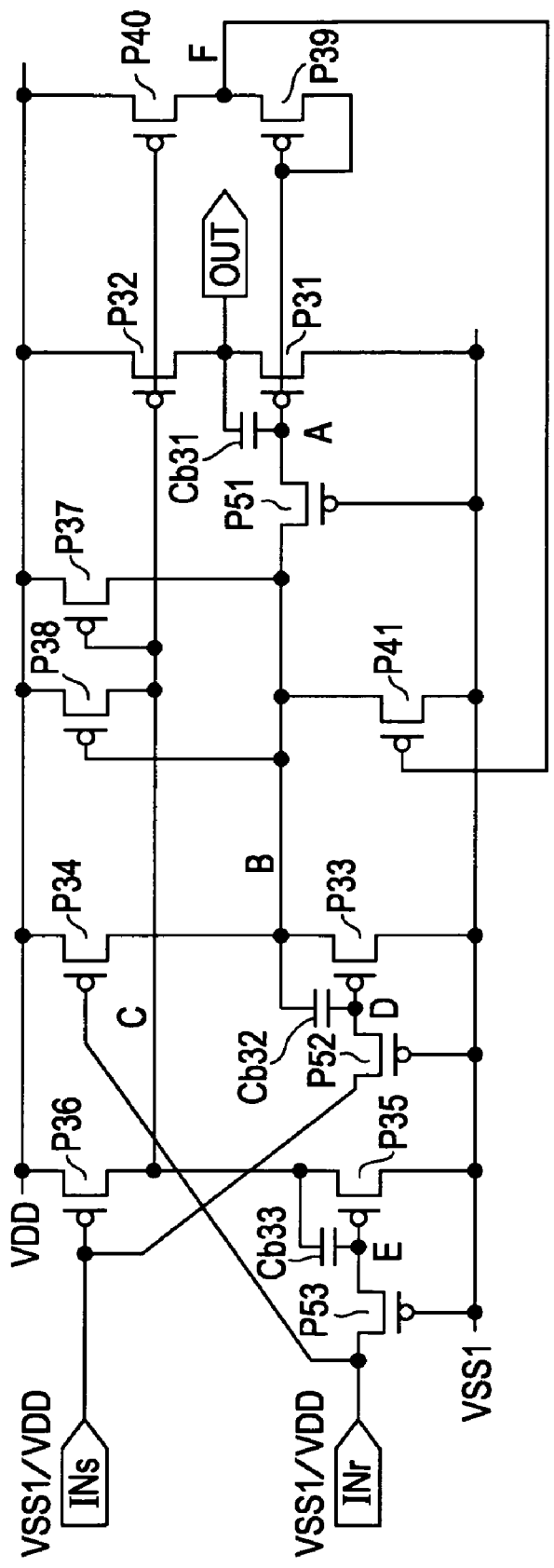
FIG. 79 is a circuit diagram of a buffer according to one embodiment of the present invention.

FIG. 79 illustrates the buffer 65 as the embodiment 23 of the present invention. Referring to FIG. 79, elements identical to those described with reference to FIG. 73 are designated with the same reference numerals.

The basic circuit structure of the buffer 65 of the embodiment 23 of the present invention is generally similar in structure to the buffer 65 of the embodiment 22. The buffer 65 of the embodiment 23 also includes a first output stage (thin-film transistors P31, P32, and P51), a first input stage (thin-film transistors P33, P34, and P52), and a second input stage (thin-film transistors P35, P36, and P53).

The buffer 65 of the embodiment 23 is different in the following four points from the buffer 65 of the embodiment 22.

The first difference is that a thin-film transistor P37 supplying the high power-source voltage VDD to the node B during the low level period of the node C is employed.

The second difference is that a thin-film transistor P38 supplying the high power-source voltage VDD to the node C during the low level period of the node B is employed.

The third different is that a second output stage is connected in parallel with the first output stage. The fourth difference is that a thin-film transistor P41 supplying a low level voltage to the node B during the output period of the output pulse from the first output stage is employed. The hold capacitance Cs2 of the node C is employed as necessary. Since the node B is free from the floating state, the hold capacitance Cs1 is not necessary.

The thin-film transistor P37 has one main electrode connected to the node B, the other main electrode connected to the low power-source voltage VSS, and a gate electrode connected to the node C.

The thin-film transistor P38 has one main electrode connected to the node C, the other main electrode connected to the low power-source voltage VSS, and a gate electrode connected to the node B.

With this circuit structure, the thin-film transistor P38 fixes the voltage at the node C to the high level during the low level period of the node B. On the other hand, the thin-film transistor P37 fixes the voltage at the node B to the high level during the low level period of the node C.

The second output stage includes thin-film transistors P39 and P40 connected in series. The thin-film transistor P39 is connected to the low-level side (the side of the power source supplying the low-level voltage) and the thin-film transistor P40 is connected to the high-level side (the side of the power source supplying the high-level voltage).

In accordance with the embodiment 23, the gate electrode and the one main electrode of the thin-film transistor P39 are connected to the node A. In other words, the thin-film transistor P39 is diode-connected.

The other main electrode of the thin-film transistor P39 is connected to an output terminal of the second output stage (node F as a control line). The output terminal here is an intermediate junction point between the thin-film transistors P39 and P40.

The thin-film transistor P40 has a gate electrode connected to the node C, one main electrode connected to the output terminal of the second output stage (node F as the control line), and the other main electrode connected to the high power-source voltage VDD.

The output terminal of the second output stage connected to the control line (the node F) is connected the gate electrode of the thin-film transistor P41.

The thin-film transistor P41 has one main electrode connected to the low power-source voltage VSS1, and the other main electrode connected to the node B. This circuit structure enables the low power-source voltage VSS1 to be continuously supplied to the node B with the thin-film transistor P41 in the on operation. With the low power-source voltage VSS1 supplied to the node B, the buffer 65 prevents the node B from being in the floating state while a low-level voltage (low power-source voltage VSS1) appears at the output terminal OUT of the first output stage (thin-film transistors P31, P32, and P51).

The relationship of the voltage status of each of the set pulse and the reset pulse and the voltage status of each node is described below with reference to FIG. 80.

Figure 80:
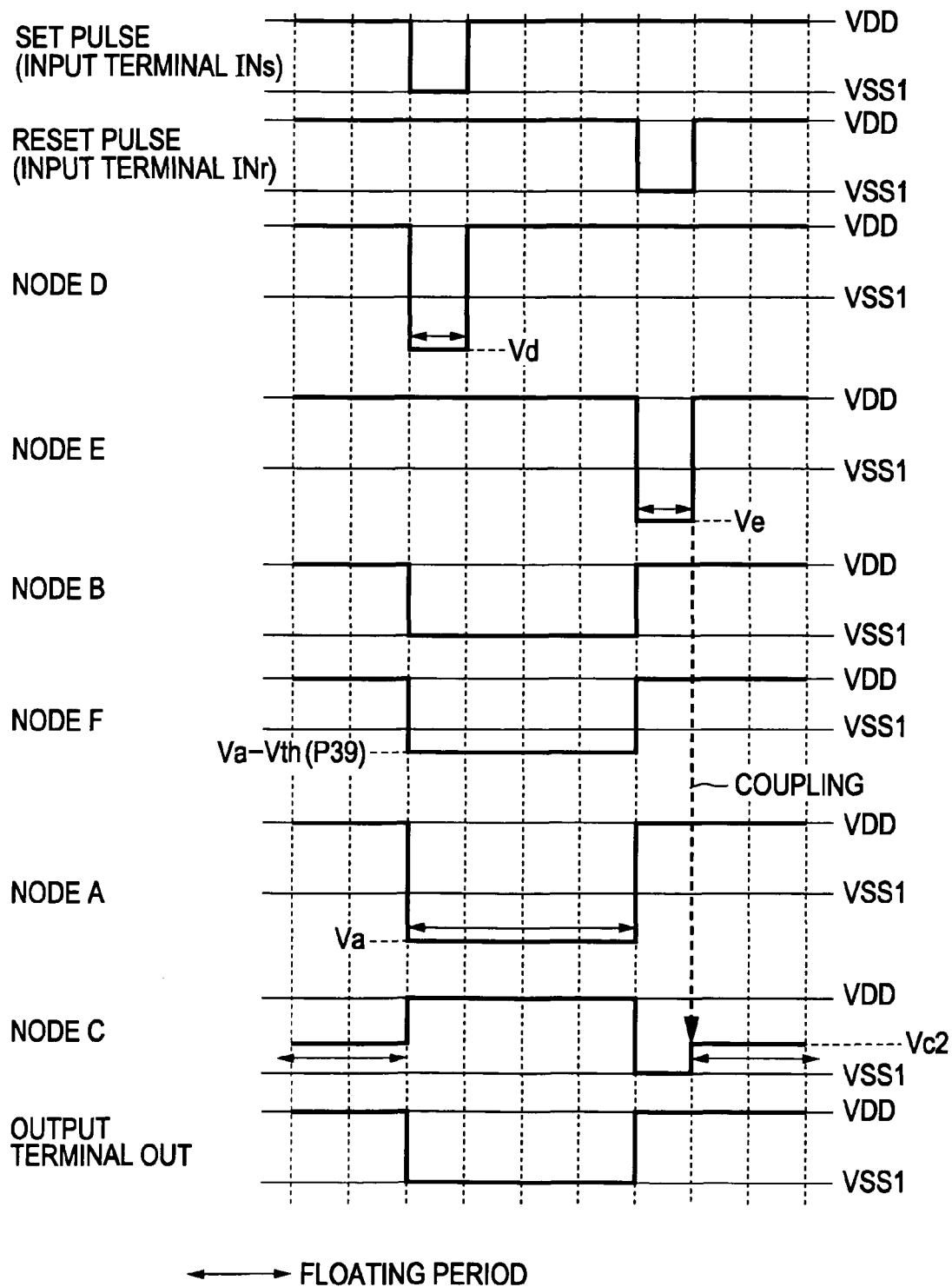
FIG. 80 illustrates drive waveforms of the buffer illustrated in FIG. 79.

FIG. 80 illustrates the voltage statuses of the set pulse at the input terminal INs, the reset pulse at the input terminal INr, and the gate electrode of the thin-film transistor P33 (node D).

FIG. 80 also illustrates the voltage statuses of the gate electrode of the thin-film transistor P35 (node E), the control line (node B) connected to the output terminal of the first input stage, the control line (node F) connected to the output terminal of the second output stage, the gate electrode of the thin-film transistor P31 (node A), the control line connected to the output terminal of the second input stage (node C), and the output terminal OUT of the first output stage.

In accordance with the embodiment 23 of the present invention, each of the signal amplitude of the set pulse (input terminal INs) and the signal amplitude of the reset pulse (input terminal INr) is given between the two values VDD and VSS1.

The node D of the first input stage falls to a low level at the timing the set pulse falls to the low level as illustrated in FIG. 80. The thin-film transistor P33 becomes conductive, causing the voltage at the node B to fall as illustrated in FIG. 80.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 80. If the voltage Vd subsequent to the voltage falling satisfies the condition of Vd−VSS1<Vth(P33), the withdrawal the node B becomes the low power-source voltage VSS1 with the thin-film transistor P33 conductive as illustrated in FIG. 80.

If the node B falls to the low power-source voltage VSS1, the voltage at the node A falls to a low level. The thin-film transistors P31 and P39 become conductive, thereby causing the voltages at the output terminal OUT and the node F to fall as illustrated in FIG. 80.

As the voltages of the output terminal OUT and the node F fall, the voltage at the node A falls by a voltage excursion responsive to a charge accumulated on the bootstrap auxiliary capacitance Cb31 as illustrated in FIG. 80.

If the voltage Va subsequent to the voltage falling satisfies a condition of Va−VSS1<Vth(P31), the voltage at the output terminal OUT becomes the low power-source voltage VSS1 with the thin-film transistor P31 conductive as illustrated in FIG. 80.

The voltage at the node F falls to a voltage determined by Va−Vth(P39) as illustrated in FIG. 80. This is because the thin-film transistor P39 is diode-connected.

In accordance with the embodiment 23, the thin-film transistor P41 becomes conductive if a condition Va−Vth(P39)−VSS1<Tth(P41) is satisfied. The node B is supplied with the low power-source voltage VSS1.

The thin-film transistor P36 is also conductive during the low level period of the set pulse. For this reason, the gate voltage of the thin-film transistor P32 forming the output stage (voltage at the node C) is thus controlled to the high power-source voltage VDD as illustrated in FIG. 80.

The set pulse then rises from the low level to the high level. During this voltage transition, a voltage change of the set pulse can interfere with the node B and the node C because of the coupling effect.

As previously discussed, however, the gate electrode of the thin-film transistor P41 is supplied with the voltage determined by Va−Vth(P39) via the node F as illustrated in FIG. 80. For this reason, the node B is fixed to the low power-source voltage VSS1 by the thin-film transistor P41 remaining conductive as illustrated in FIG. 80. This voltage status is characteristic of the embodiment 23 of the present invention.

Even after the set pulse rises to the high level, the nodes A, B, and F are maintained at the same levels thereof as when the set pulse is at the low level.

With the node B remaining at the low power-source voltage VSS1, the node C is supplied with the high power-source voltage VDD via the conductive thin-film transistor P38 as illustrated in FIG. 80.

This means that the node C is insusceptible to the interference responsive to the voltage change of the set pulse (means that the off-operation point of the thin-film transistor P32 is not shifted).

The above-described voltage status is maintained while the node B is at the low power-source voltage VSS1. More specifically, the node C is kept to the high power-source voltage VDD until the reset pulse is subsequently transitioned to the low level. As a result, the leak current of the thin-film transistor P32 is minimized.

The node B biased at the low power-source voltage VSS1 means that the thin-film transistor P51 is at the cutoff state. The node A is maintained at the floating state at a bootstrap voltage (i.e., Va) as illustrated in FIG. 80. For this reason, the low power-source voltage VSS1 continuously appears at the output terminal OUT of the first output stage as illustrated in FIG. 80.

When the reset pulse is transitioned from the high level to the low level at the input terminal INr in FIG. 80, the thin-film transistor P35 becomes conductive. The voltage at the node C falls as illustrated in FIG. 80. As the voltage at the node C falls, the gate voltage of the thin-film transistor P35 (voltage at the node E) falls by a voltage excursion responsive to a charge accumulated on the bootstrap auxiliary capacitance Cb33 as illustrated in FIG. 80. The resulting voltage subsequent to the voltage falling is Ve. If the voltage Ve satisfies a condition of Ve−VSS1<Vth(P35), the node C reaches the low power-source voltage VSS1 with the thin-film transistor P35 conductive as illustrated in FIG. 80.

When the node C falls to the low power-source voltage VSS1, the thin-film transistors P32 and P40 become conductive. The voltage of the output terminal OUT and the voltage at the node F then rise to the high power-source voltage VDD as illustrated in FIG. 80.

While the reset pulse remains at the low level, the thin-film transistor P34 remains conductive. The voltage at the node B is thus controlled to the high power-source voltage VDD as illustrated in FIG. 80. The gate electrode of the thin-film transistor P31 forming the first output stage (voltage at the node A) also rises to the high power-source voltage VDD.

The reset pulse then rises from the low level to the high level. During this voltage transition, a voltage change of the reset pulse can interfere with the node B and the node C because of the coupling effect.

Although the node C still maintains a low level, the voltage thereof rises from the low power-source voltage VSS1 to a voltage Vc2 as illustrated in FIG. 80.

The voltage Vc2 at the node C satisfies a condition of Vc2−VDD<Vth(P32). The thin-film transistor P32 continues to be conductive, and the voltage at the output terminal OUT is maintained at the high power-source voltage VDD as illustrated in FIG. 80. The voltage Vc2 at the node C also satisfies a condition of Vc2−VDD<Vth(P40). The thin-film transistor P40 thus continues to be conductive, and the voltage at the node F is maintained at the high power-source voltage VDD as illustrated in FIG. 80.

Also, the voltage Vc2 at the node C satisfies Vc2−VDD<Vth(P37). The thin-film transistor P37 thus becomes conductive, and the high power-source voltage VDD is continuously supplied to the node B.

This means that the node B is insusceptible to the interference responsive to the voltage change of the set pulse (means that the off-operation point of the thin-film transistor P31 is not shifted).

The above-described voltage status is maintained while the node C is at the voltage Vc2. More specifically, the node B is kept to the high power-source voltage VDD until the set pulse is subsequently transitioned to the low level. As a result, the leak current of the thin-film transistor P31 is minimized.

The buffer 65 thus constructed provides the same operation and advantages as those of the buffer 65 of the embodiment 22.

With the above-described circuit structure, one of the nodes B and C is at the low level while the voltage of the other of the nodes B and C is fixed to the high power-source voltage VDD. This arrangement prevents the off-operation point of each of the thin-film transistors P31 and P32 from being shifted. More specifically, the buffer 65 becomes insusceptible to the pulse interference and suffers less from the leak current.

The buffer 65 thus constructed can continuously supply the low level voltage to the node B throughout a period from the falling edge of the set pulse to the low level to the falling edge of the reset pulse to the low level (a period throughout which a low level output pulse appears at the output terminal OUT).

The voltage change of the set pulse is thus reliably prevented from interfering with the node B. More specifically, the voltage at the node A is reliably maintained at the bootstrap voltage Va. The first high power-source voltage VDD1 is continuously supplied to the output terminal OUT. The buffer 65, with a current load connected thereto, maintains the voltage of the output terminal OUT. The drive current is continuously supplied to the current load.

Embodiment 24

A modification of the buffer 65 of the embodiment 23 is described below as an embodiment 24 of the present invention.

Figure 81:
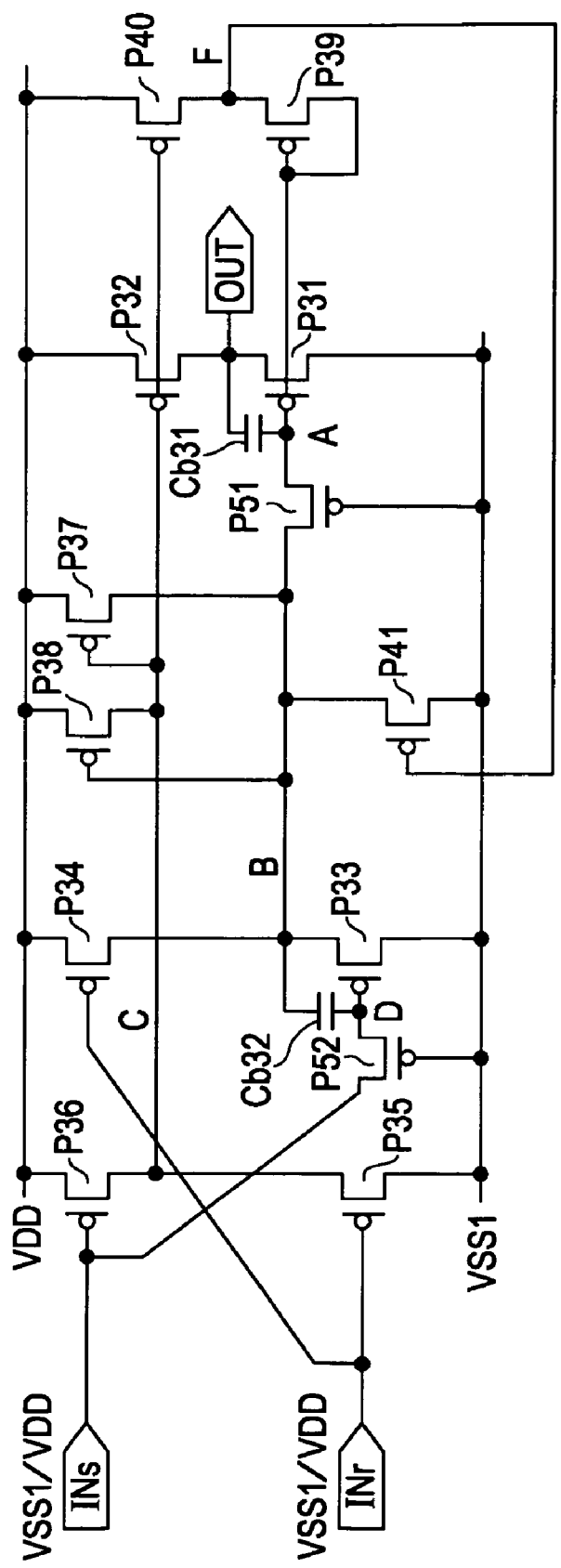
FIG. 81 is a circuit diagram of a buffer according to one embodiment of the present invention.

FIG. 81 illustrates the buffer 65 as the embodiment 24 of the present invention. In FIG. 81, elements identical to those illustrated in FIG. 79 are designated with the same reference numerals.

The buffer 65 is generally similar in structure to the buffer 65 of the embodiment 23 but with the thin-film transistor P53 removed. More specifically, the buffer 65 of the embodiment 24 is generally similar in structure to the circuit structure of the embodiment 23 but with the bootstrap circuit at the second input stage removed therefrom. With such a circuit structure, the buffer 65 has a component count smaller than that of the embodiment 23.

Figure 82:
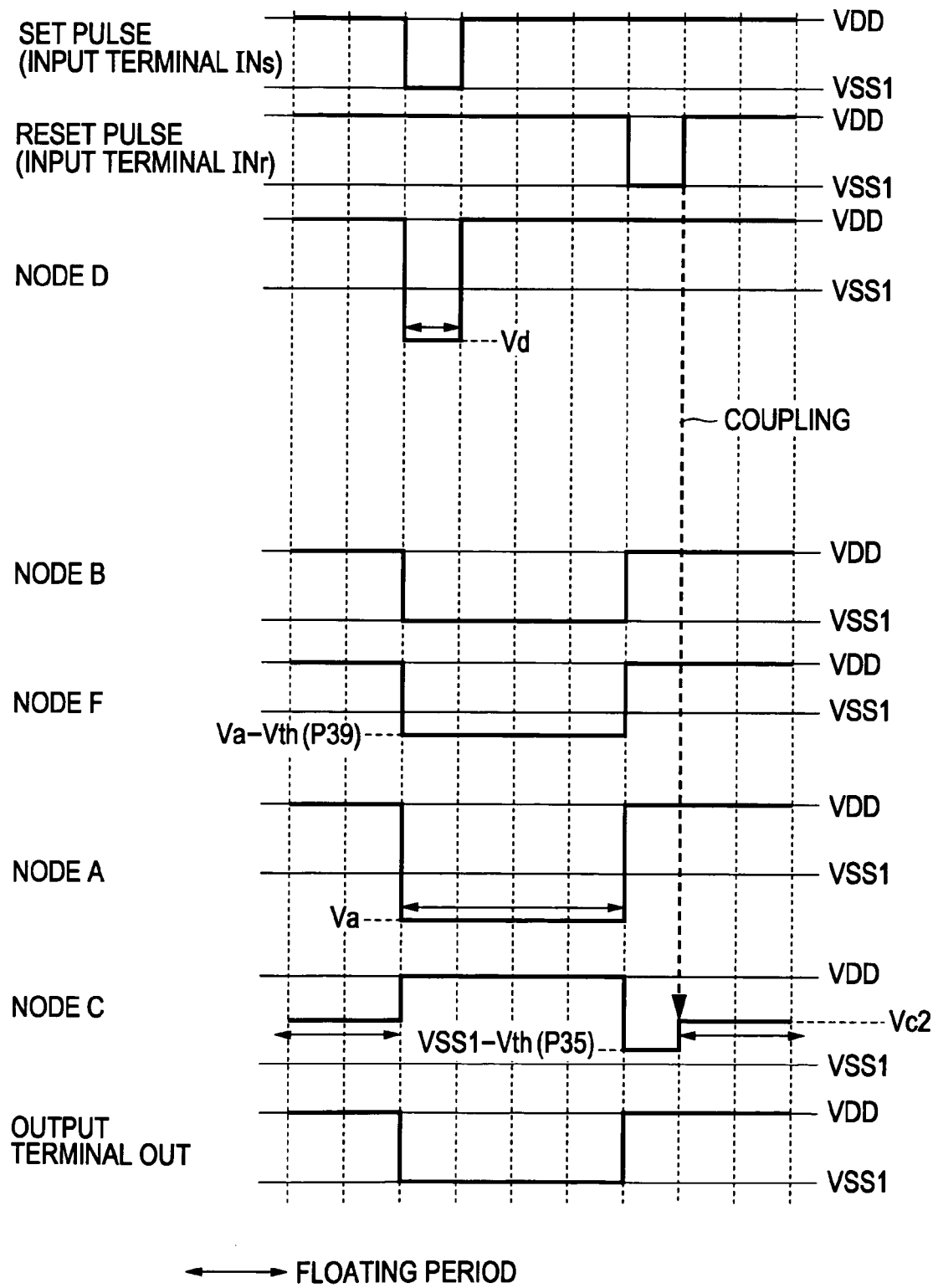
FIG. 82 illustrates drive waveforms of the buffer illustrated in FIG. 81.

FIG. 82 illustrates the relationship of the voltage statuses of the set pulse and the reset pulse and the voltage status of each node.

FIG. 82 illustrates the voltage statuses of the set pulse at the input terminal INs, and the reset pulse at the input terminal INr.

FIG. 82 also illustrates the voltage status of the gate electrode of the thin-film transistor P33 (node D).

FIG. 82 further illustrates the voltage statuses of the control line connected to the output terminal of the first input stage (node B), the control line connected to the output terminal of the second output stage (node F), the gate electrode of the thin-film transistor P31 (node A), the control line connected to the output terminal of the second input stage (node C), and the output terminal OUT of the first output stage.

In accordance with the embodiment 24 of the present invention, each of the signal amplitude of the set pulse (input terminal INs) and the signal amplitude of the reset pulse (input terminal INr) is given between the two values VDD and VSS1.

Referring to FIG. 82, the operation of the buffer 65 of the embodiment 24 remains unchanged from the operation of the buffer 65 of the embodiment 23 in the period from the falling edge of the set pulse to the low level to the falling edge of the reset pulse to the low level.

The operation of the buffer 65 of the embodiment 24 starting with the falling edge of the reset pulse is described below.

When the reset pulse falls from the high level to the low level, the thin-film transistors P34 and P35 become conductive.

In response, the node B rises to the high power-source voltage VDD, and the voltage at the node C falls as illustrated in FIG. 82. The voltage at the node C is higher than the low power-source voltage VSS1 by a threshold voltage Vth(P35) of the thin-film transistor P35. More specifically, the voltage at the node C falls to the voltage VSS1−Vth(P35).

The low level (VSS1−Vth(P35)) satisfies the following three conditions:

$VSS1-Vth(P35)-VDD<Vth(P32)$, $VSS1-Vth(P35)-VDD<Vth(P37)$, and $VSS1-Vth(P35)-VDD<Vth(P40)$.

Generally, the pulse amplitude (VSS1−VDD) is sufficiently larger than the threshold voltage value Vth, and all the above three conditions are satisfied.

When the node C falls to the low level, the thin-film transistor P32 turns conductive, and the voltage at the output terminal OUT rises to the high power-source voltage VDD as illustrated in FIG. 82.

The reset pulse rises from the low level to the high level. During this voltage transition, a voltage change of the reset pulse interferes with the node C because of the capacitive coupling effect of the thin-film transistor P35 as illustrated in FIG. 82. Although the node C still maintains a low level, the voltage thereof rises to a voltage Vc2 as illustrated in FIG. 82.

The voltage Vc2 satisfies the following three conditions:

$Vc2-VDD<Vth(P32)$, $Vc2-VDD<Vth(P37)$, and $Vc2-VDD<Vth(P40)$.

As long as the three conditions are satisfied, the thin-film transistors P32, P37, and P40 remain continuously conductive.

More specifically, the thin-film transistor P32 causes the high power-source voltage VDD to be supplied continuously to the output terminal OUT.

The thin-film transistor P37 causes the high power-source voltage VDD to be supplied continuously to the node B. This arrangement prevents the voltage change of the reset pulse from interfering with the node A via the thin-film transistor P34. The thin-film transistor P31 is free from the shifting of the off-operation point.

The voltage status described above is maintained for a period throughout which the voltage at the node C is maintained at the voltage Vc2. More specifically, the voltage at the node A is maintained at the high power-source voltage VDD until the set pulse is subsequently transitioned to the low level. As a result, the leak current of the thin-film transistor P31 is minimized.

As described above, the buffer 65 of the embodiment 24 even with a smaller component count provides the same operation and advantages as those of the buffer 65 of the embodiment 23.

Embodiment 25

A modification of the buffer 65 of the embodiment 23 is described below as an embodiment 25 of the present invention.

Figure 83:
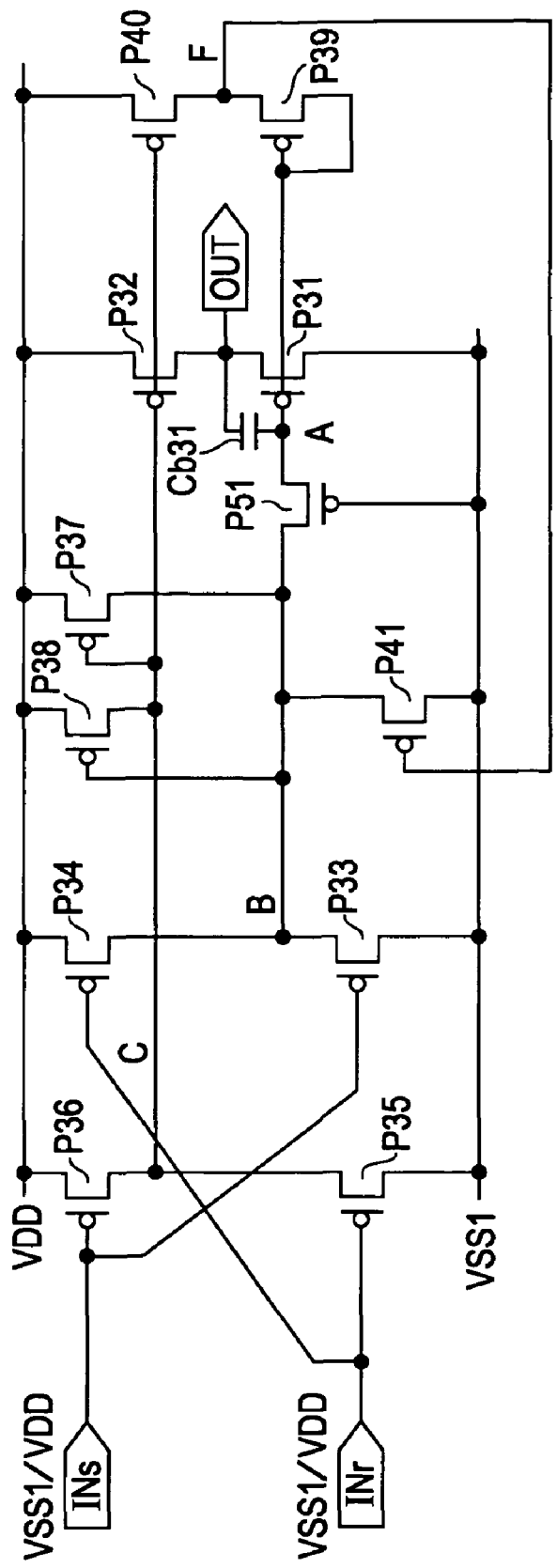
FIG. 83 is a circuit diagram of a buffer according to one embodiment of the present invention.

FIG. 83 illustrates the buffer 65 as the embodiment 25 of the present invention. In FIG. 83, elements identical to those illustrated in FIG. 81 are designated with the same reference numerals.

The buffer 65 of the embodiment 25 has the same circuit structure as the embodiment 24 but with the thin-film transistor P52 removed therefrom. More specifically, the buffer 65 of the embodiment 25 has the circuit structure of the embodiment 23 with the bootstrap circuits removed from the first and second input stages thereof. In this way, the buffer 65 of the embodiment 25 of the present invention has a component count even smaller than the component count of the embodiment 24.

Figure 84:
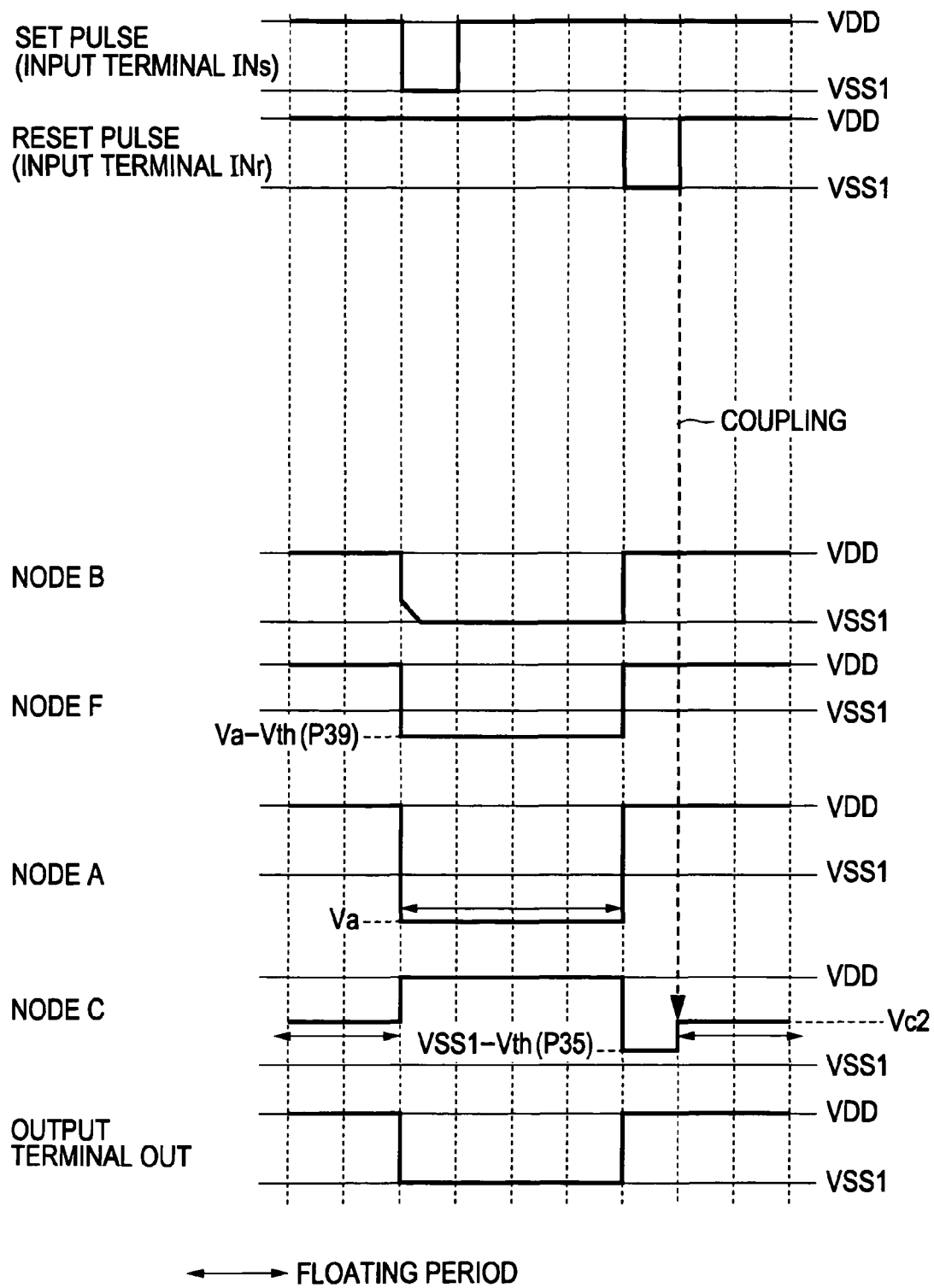
FIG. 84 illustrates drive waveforms of the buffer illustrated in FIG. 83.

FIG. 84 illustrates the relationship of the voltage statuses of the set pulse and the reset pulse and the voltage status of each node.

FIG. 84 also illustrates the voltage statuses of the set pulse at the input terminal INs, and the reset pulse at the input terminal INr.

FIG. 84 also illustrates the voltage status of a control line connected to the output terminal of the first input stage (node B).

FIG. 84 further illustrates the control line connected to the output terminal of the second output stage (node F), the gate electrode of the thin-film transistor P31 (node A), the control line connected to the output terminal of the second input stage (node C), and the output terminal OUT of the first output stage.

In accordance with the embodiment 25 of the present invention, each of the signal amplitude of the set pulse (input terminal INs) and the signal amplitude of the reset pulse (input terminal INr) is given between the two values VDD and VSS1.

As previously discussed, the buffer 65 of the embodiment 25 is identical in structure to the buffer 65 of the embodiment 24 in that the thin-film transistor P53 is eliminated. The operation of the buffer 65 subsequent to the falling edge of the reset pulse to the low level remains thus unchanged from the operation of the buffer 65 of the embodiment 24.

The discussion that follows focuses on the operation within the period from the falling edge of the set pulse to the low level to the falling edge of the reset pulse to the low level.

When the set pulse falls to the low level, the thin-film transistors P33 and P36 turn conductive.

In response, the voltage at the node B falls and the voltage at the node C rises to the high power-source voltage VDD as illustrated in FIG. 84.

The buffer 65 of the embodiment 25 includes no bootstrap circuit on the gate electrode side of the thin-film transistor P33. The voltage at the node B immediately subsequent to the falling edge of the set pulse to the low level falls only to a low level determined by VSS1−Vth(P33).

A bootstrap operation to the node A responsive to the falling of the node B to the low level allows the voltage at the node F to fall to Va−Vth(P39).

The voltage (Va−Vth(P39)) subsequent to the voltage falling satisfies a condition of (Va−Vth(P39)−VSS1<Vth(P41)) The thin-film transistor P41 thus turns conductive, thereby supplying the first low power-source voltage VSS1 to the node B as illustrated in FIG. 84.

This operation is characteristic of the buffer 65 of the embodiment 25.

When the set pulse rises from the low level to the high level, the thin-film transistor P41 causes the node B to be maintained at the low power-source voltage VSS1. While the node B is at the low level, the thin-film transistor P38 fixes the node C to the high power-source voltage VDD.

As described above, the buffer 65 of the embodiment 25 with a smaller component count thereof provides the same operation and advantages as those of the embodiment 23.

Embodiment 26

A modification of the buffer 65 of the embodiment 23 is described below as an embodiment 26 of the present invention.

Figure 85:
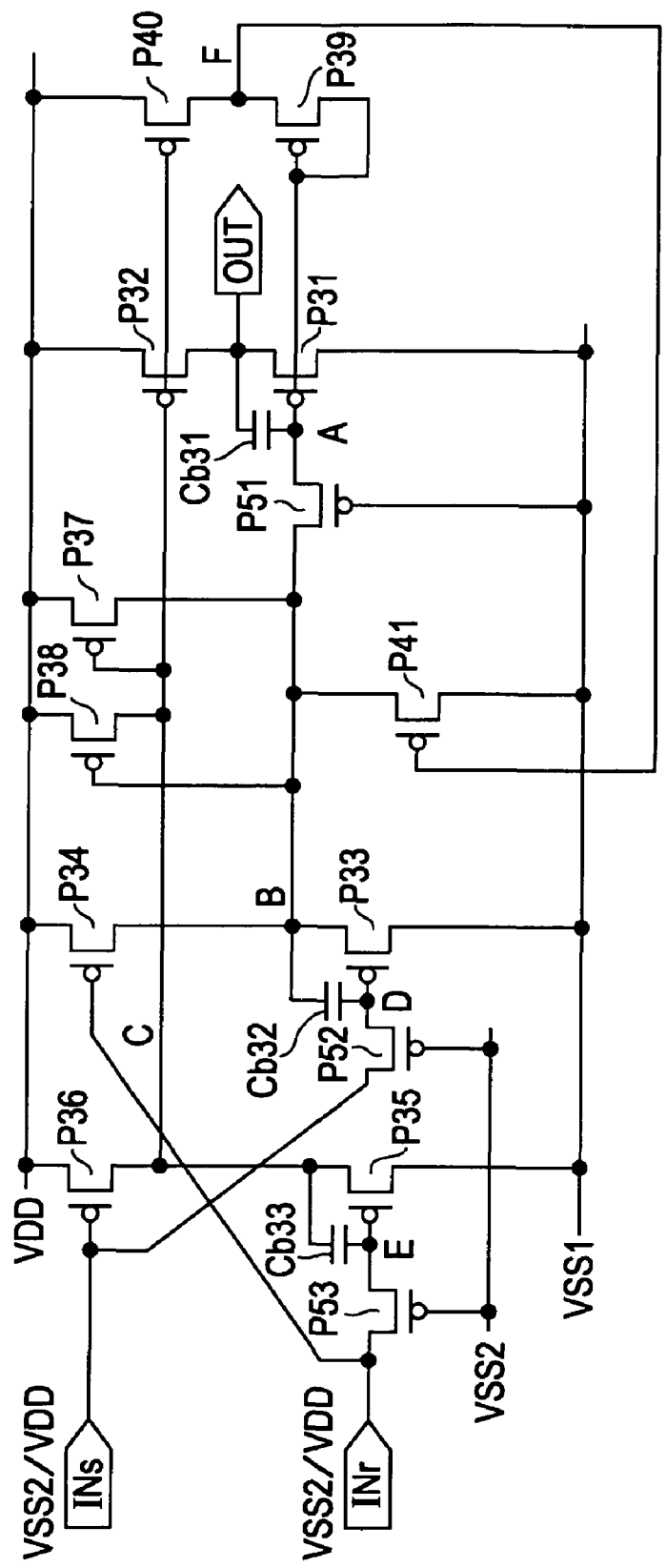
FIG. 85 is a circuit diagram of a buffer according to one embodiment of the present invention.

FIG. 85 illustrates the buffer 65 of the embodiment 26 of the present invention. In FIG. 85, elements identical to those illustrated in FIG. 79 are designated with the same reference numerals.

The buffer 65 of the embodiment 26 has the circuit structure of the embodiment 23 but with level shifting performed at the first and second input stages.

The thin-film transistors P52 and P53 forming bootstrap circuits for the first and second input stages are respectively connected to a second low power-source voltage VSS2 (>VSS1). With this arrangement, each of the set pulse and the reset pulse has a smaller amplitude and the power consumption of the front section is even more reduced.

Bootstrap auxiliary capacitances Cb31, Cb32, and Cb33 are respectively connected to the output terminals of the first and second input stages and the first output stage as illustrated in FIG. 85.

If the gate capacitances of the thin-film transistors P31, P33, and P35 are sufficiently high, the bootstrap auxiliary capacitances Cb31, Cb32, and Cb33 are not necessary.

The relationship of the voltage statuses of the set pulse and the reset pulse and the voltage status of each node is described with reference to FIG. 86. The drive waveforms illustrated in FIG. 86 correspond to the respective drive waveforms illustrated in FIG. 80.

In accordance with the embodiment 26 of the present invention, each of the signal amplitude of the set pulse (input terminal INs) and the signal amplitude of the reset pulse (input terminal INr) is given between the two values VSS and VSS2 (>VSS1).

At the moment the set pulse falls to the low level, the node D at the first input stage falls to a low level. The thin-film transistor P33 then turns conductive, causing the voltage at the node B to fall as illustrated in FIG. 86.

Figure 86:
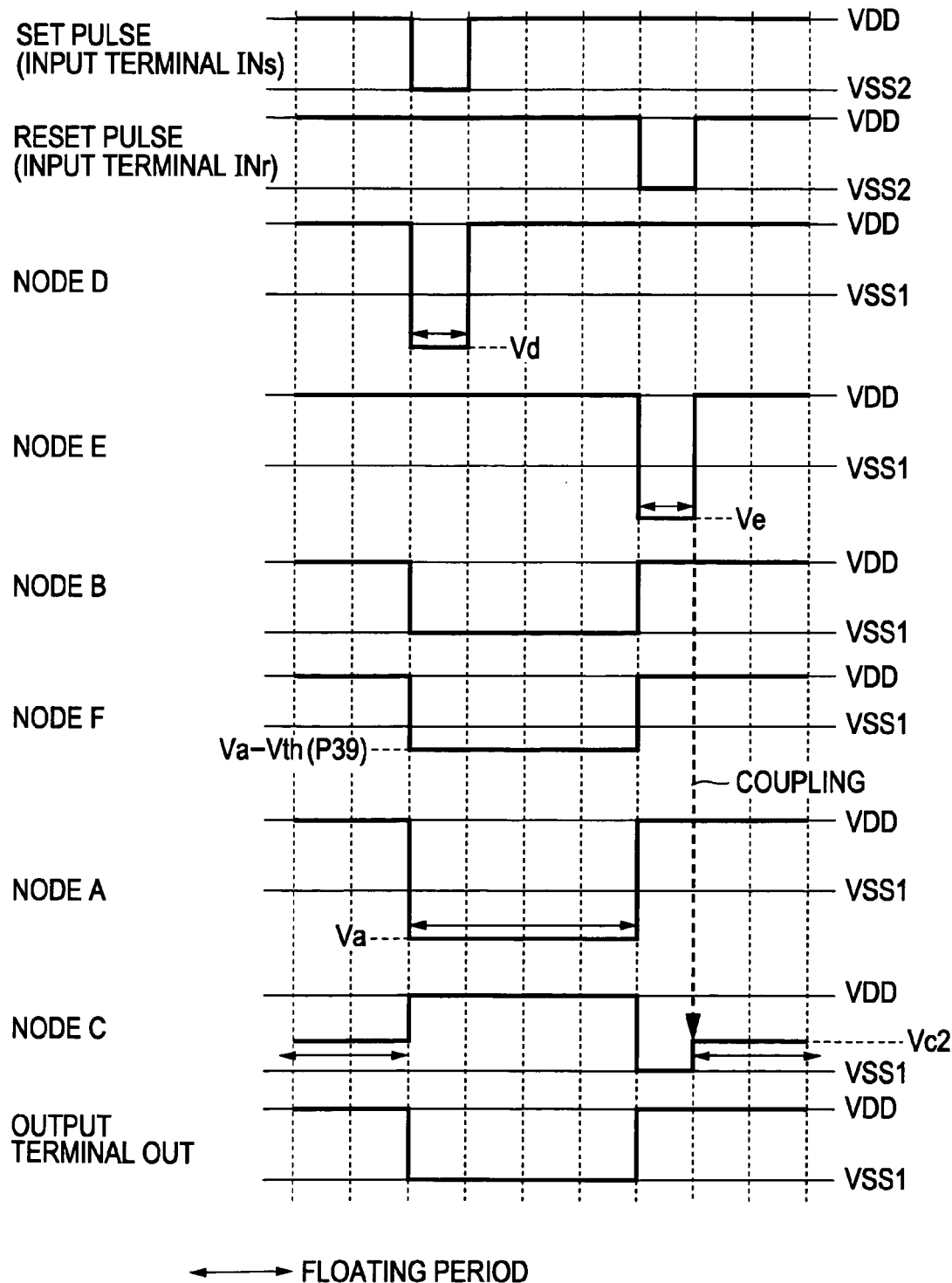
FIG. 86 illustrates drive waveforms of the buffer illustrated in FIG. 85.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 86. If the voltage Vd subsequent to the voltage falling satisfies Vd−VSS1<Vth(P33), the voltage at the node B becomes the low power-source voltage VSS1 with the thin-film transistor P33 conductive as illustrated in FIG. 86.

When the node B falls to the low power-source voltage VSS1 as described above, the node A also falls to a low level. The thin-film transistors P31 and P39 turn conductive, causing the voltage at the output terminal OUT and the voltage at the node F to fall as illustrated in FIG. 86.

As the voltages at the output terminal OUT and the node F fall, the voltage at the node A falls by a voltage excursion responsive to a charge accumulated on the bootstrap auxiliary capacitance Cb31 as illustrated in FIG. 86.

If the voltage Va subsequent to the voltage falling satisfies Va−VSS1<Vth(P31), the voltage at the output terminal OUT becomes the low power-source voltage VSS1 with the thin-film transistor P31 conductive as illustrated in FIG. 86.

The node F falls to a voltage determined by Va−Vth(P39) as illustrated in FIG. 86 because the thin-film transistor P39 is diode-connected.

If a condition of (Va−Vth(P39)−VSS1)<Vth(P41) is satisfied in accordance with the embodiment 26, the thin-film transistor P41 turns conductive, thereby supplying the low power-source voltage VSS1 to the node B.

The thin-film transistor P36 is also conductive with the set pulse at the low level. The gate voltage of the thin-film transistor P32 forming the output stage (voltage at the node C) is thus controlled to the high power-source voltage VDD as illustrated in FIG. 86.

The set pulse then rises from the low level to the high level. During this voltage transition, a voltage change of the set pulse can interfere with the nodes B and C because of the coupling effect.

The gate electrode of the thin-film transistor P41 is supplied with the voltage determined by Va−Vth (P39) via the node F as illustrated in FIG. 86. For this reason, the thin-film transistor P41 remaining conductive causes the voltage at the node B to be fixed to the low power-source voltage VSS1 as illustrated in FIG. 86.

Even after the set pulse rises to the high level, the voltages at the nodes A, B, and F remain at the same level as when the set pulse is at the low level.

Since the voltage at the node B is maintained at the low power-source voltage VSS1, the thin-film transistor P38 remaining conductive continuously supplies the high power-source voltage VDD to the node C as illustrated in FIG. 86.

This means that the node C is insusceptible to the interference responsive to the voltage change of the set pulse (means that the off-operation point of the thin-film transistor P32 is not shifted).

This voltage status is maintained while the node B is at the low power-source voltage VSS1. More specifically, the node C is maintained at the high power-source voltage VDD until the reset pulse is subsequently transitioned to the low level. As a result, the leak current of the thin-film transistor P32 is minimized.

The node B biased at the low power-source voltage VSS1 means that the thin-film transistor P51 is at the cutoff state. The node A is maintained at the floating state at a bootstrap voltage (i.e., Va) as illustrated in FIG. 86. For this reason, the low power-source voltage VSS1 continuously appears at the output terminal OUT of the first output stage as illustrated in FIG. 86.

When the reset pulse is transitioned from the high level to the low level at the input terminal INr in FIG. 86, the thin-film transistor P35 becomes conductive. The voltage at the node C falls as illustrated in FIG. 86. As the voltage at the node C falls, the gate voltage of the thin-film transistor P35 (voltage at the node E) falls by a voltage excursion responsive to a charge accumulated on the bootstrap auxiliary capacitance Cb33 as illustrated in FIG. 86. The resulting voltage subsequent to the voltage falling is Ve. If the voltage Ve satisfies a condition of Ve−VSS1<Vth(P35), the node C reaches the low power-source voltage VSS1 with the thin-film transistor P35 conductive as illustrated in FIG. 86.

When the node C falls to the low power-source voltage VSS1, the thin-film transistors P32 and P40 become conductive. The voltage of the output terminal OUT and the voltage at the node F then rise to the high power-source voltage VDD as illustrated in FIG. 86.

While the reset pulse is at the low level, the thin-film transistor P34 remains conductive. The voltage at the node B is controlled to the high power-source voltage VDD as illustrated in FIG. 86. The gate voltage of the thin-film transistor P31 (voltage at the node A) forming the first output stage also rises to the high power-source voltage VDD.

The reset pulse then rises from the low level to the high level. During this voltage transition, a voltage change of the reset pulse may interfere with the node B and the node C because of the coupling effect.

Although the node C still maintains a low level, the voltage thereof rises from the low power-source voltage VSS1 to a voltage Vc2 as illustrated in FIG. 86.

The voltage Vc2 at the node C satisfies a condition of Vc2−VDD<Vth(P32). The thin-film transistor P32 continues to be conductive, and the voltage at the output terminal OUT is maintained at the high power-source voltage VDD as illustrated in FIG. 86. The voltage Vc2 at the node C also satisfies a condition of Vc2−VDD<Vth(P40). The thin-film transistor P40 thus continues to be conductive, and the voltage at the node F is maintained at the high power-source voltage VDD as illustrated in FIG. 86.

Also, the voltage Vc2 at the node C satisfies Vc2−VDD<Vth(P37). The thin-film transistor P37 thus becomes conductive, and the high power-source voltage VDD is continuously supplied to the node B.

This means that the node B is insusceptible to the interference responsive to the voltage change of the set pulse (means that the off-operation point of the thin-film transistor P31 is not shifted).

The above-described voltage status is maintained while the node C is at the voltage Vc2. More specifically, the node B is kept to the high power-source voltage VDD until the set pulse is subsequently transitioned to the low level. As a result, the leak current of the thin-film transistor P31 is minimized.

The buffer 65 thus constructed provides the same operation and advantages as those of the buffer 65 of the embodiment 23.

Moreover, the buffer 65 of the embodiment 26 causes a signal amplitude of each of the set pulse and the reset pulse to be smaller than the signal amplitude of the output pulse. For this reason, the power consumption of a front section (such as the shift register) is reduced to be lower than that of the other embodiments.

Embodiment 27

A modification of the buffer 65 of the embodiment 23 is described below as an embodiment 27 of the present invention.

Figure 87:
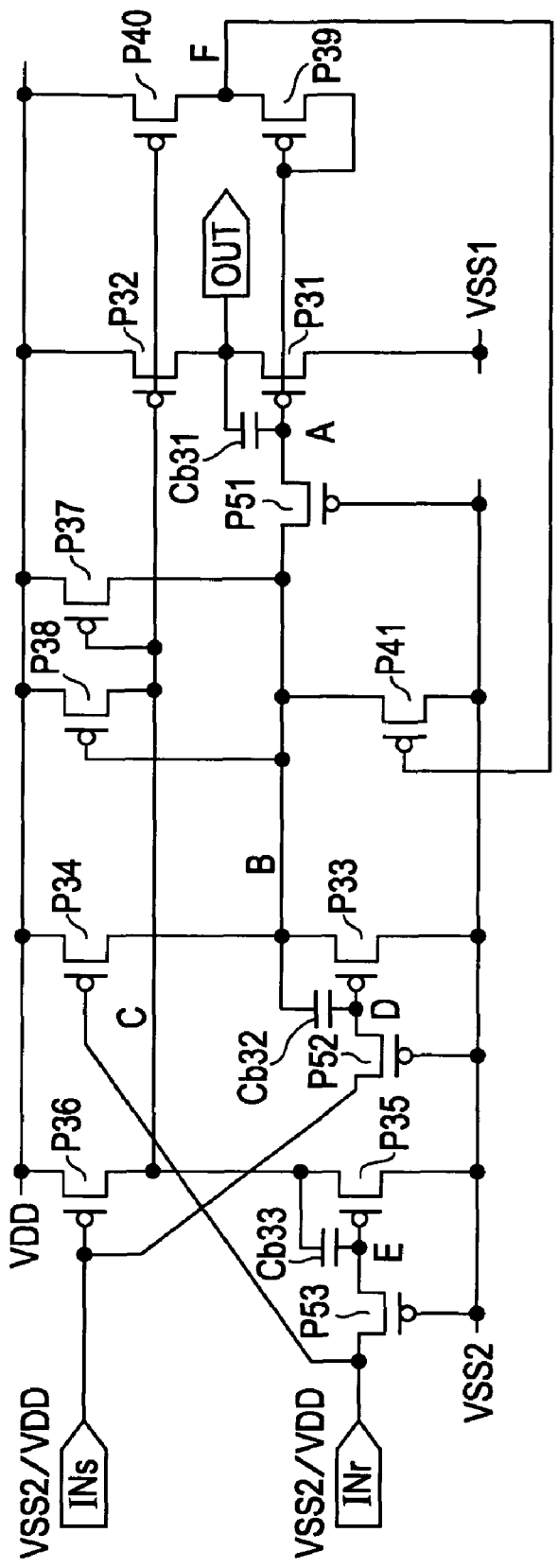
FIG. 87 is a circuit diagram of a buffer according to one embodiment of the present invention.

FIG. 87 illustrates the buffer 65 of the embodiment 27 of the present invention. In FIG. 87, elements identical to those illustrated in FIG. 85 are designated with the same reference numerals.

In the buffer 65 of the embodiment 27, level shifting is performed at the first output stage.

The low power-source voltage VSS1 is supplied to only the thin-film transistors P31 and P32 at the final portion of the first output stage and the second low power-source voltage VSS2 (>VSS1) is supplied to thin-film transistors placed prior to the final portion of the first output stage. This arrangement not only reduces the amplitude of each of the set pulse and the reset pulse but also reduces the power consumed by the buffer 65.

The relationship of the voltage statuses of the set pulse and the reset pulse and the voltage status of each node is described below with reference to FIG. 88. The drive waveforms illustrated in FIG. 88 correspond to the respective drive waveforms illustrated in FIG. 80.

In accordance with the embodiment 27 of the present invention, each of the signal amplitude of the set pulse (input terminal INs) and the signal amplitude of the reset pulse (input terminal INr) is given between the two values VDD and VSS2 (>VSS1).

At the moment the set pulse falls to the low level, the node D at the first input stage falls to the low level. The thin-film transistor P33 then turns conductive, causing the voltage at the node B to fall as illustrated in FIG. 86.

Figure 88:
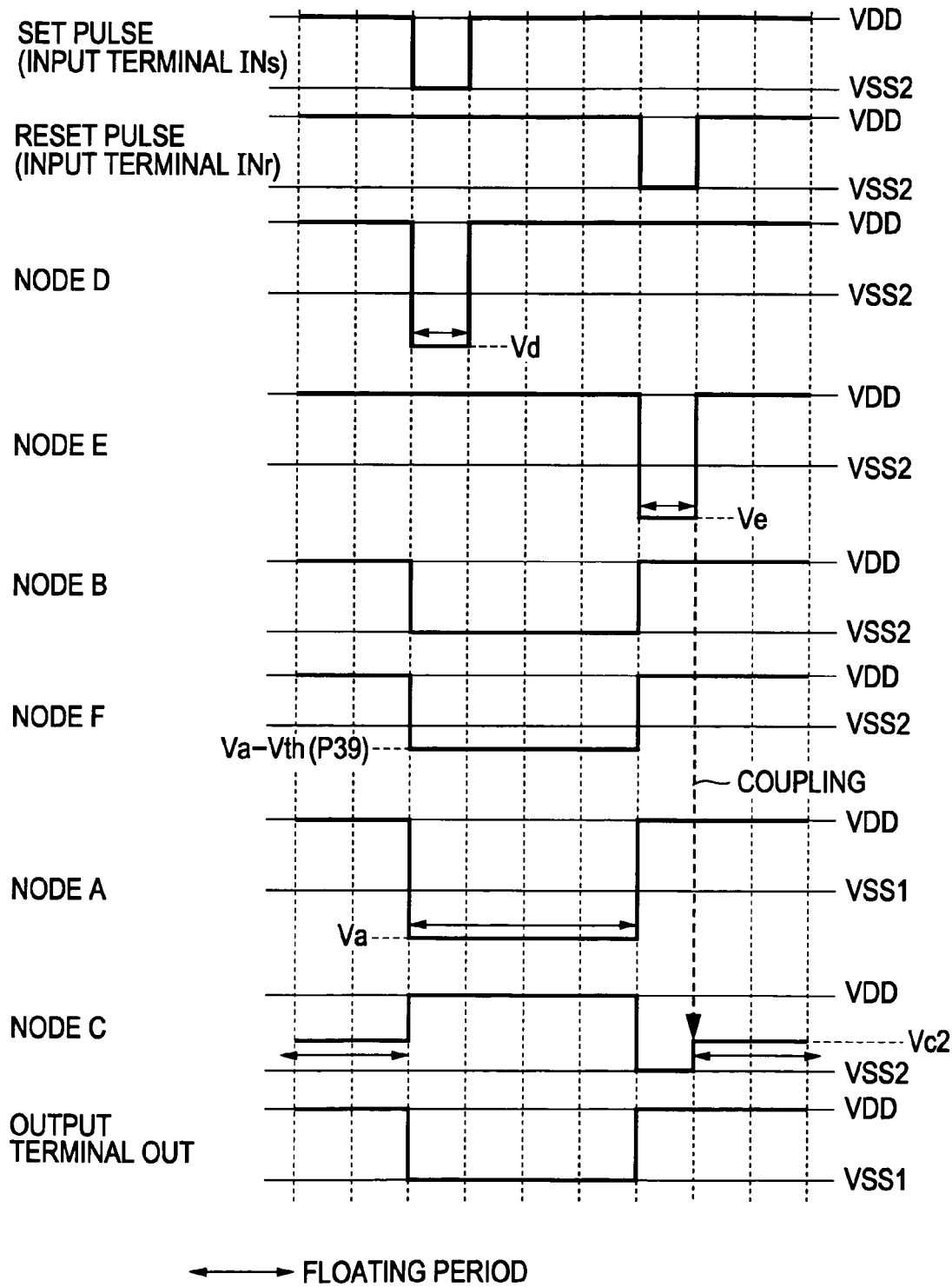
FIG. 88 illustrates drive waveforms of the buffer illustrated in FIG. 87.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 88. If the voltage Vd subsequent to the voltage falling satisfies Vd−VSS2<Vth(P33), the voltage at the node B becomes the second low power-source voltage VSS2 with the thin-film transistor P33 conductive as illustrated in FIG. 88.

When the node B falls to the second low power-source voltage VSS2 as described above, the node A also falls to a low level. The thin-film transistors P31 and P39 turn conductive, causing the voltage at the output terminal OUT and the voltage at the node F to fall as illustrated in FIG. 88.

As the voltages at the output terminal OUT and the node F fall, the voltage at the node A falls by a voltage excursion responsive to a charge accumulated on the bootstrap auxiliary capacitance Cb31 as illustrated in FIG. 88.

If the voltage Va subsequent to the voltage falling satisfies Va−VSS1<Vth(P31), the voltage at the output terminal OUT becomes the low power-source voltage VSS1 with the thin-film transistor P31 conductive as illustrated in FIG. 88. Changing of the pulse amplitude is thus performed.

The node F falls to a voltage determined by Va−Vth(P39) as illustrated in FIG. 86 because the thin-film transistor P39 is diode-connected.

If a condition of (Va−Vth(P39)−VSS2)>Vth(P41) is satisfied in accordance with the embodiment 27, the thin-film transistor P41 turns conductive, thereby supplying the second low power-source voltage VSS2 to the node B.

The thin-film transistor P36 is also conductive during the low level period of the set pulse. For this reason, the gate voltage of the thin-film transistor P32 forming the output stage (voltage at the node C) is thus controlled to the high power-source voltage VDD as illustrated in FIG. 88.

The set pulse then rises from the low level to the high level. During this voltage transition, a voltage change of the set pulse can interfere with the node B and the node C because of the coupling effect.

As previously discussed, however, the gate electrode of the thin-film transistor P41 is supplied with the voltage determined by a voltage determined by Va−Vth(P39) via the node F as illustrated in FIG. 88. For this reason, the node B is fixed to the second low power-source voltage VSS2 by the thin-film transistor P41 remaining conductive as illustrated in FIG. 88.

Even after the set pulse rises to the high level, the nodes A, B, and F are maintained at the same levels thereof as when the set pulse is at the low level.

With the node B remaining at the second low power-source voltage VSS2, the node C is supplied with the high power-source voltage VDD via the conductive thin-film transistor P38 as illustrated in FIG. 88.

This means that the node C is insusceptible to the interference responsive to the voltage change of the set pulse (means that the off-operation point of the thin-film transistor P32 is not shifted).

The above-described voltage status is maintained while the node B is at the second low power-source voltage VSS2. More specifically, the node C is kept to the high power-source voltage VDD until the reset pulse is subsequently transitioned to the low level. As a result, the leak current of the thin-film transistor P32 is minimized.

The node B biased at the second low power-source voltage VSS2 means that the thin-film transistor P51 is at the cutoff state. The node A is maintained at the floating state at a bootstrap voltage (i.e., Va) as illustrated in FIG. 88. For this reason, the low power-source voltage VSS1 continuously appears at the output terminal OUT of the first output stage as illustrated in FIG. 88.

When the reset pulse is transitioned from the high level to the low level at the input terminal INr in FIG. 88, the thin-film transistor P35 becomes conductive. The voltage at the node C falls as illustrated in FIG. 88. As the voltage at the node C falls, the gate voltage of the thin-film transistor P35 (voltage at the node E) falls by a voltage excursion responsive to a charge accumulated on the bootstrap auxiliary capacitance Cb33 as illustrated in FIG. 88. The resulting voltage subsequent to the voltage falling is Ve. If the voltage Ve satisfies a condition of Ve−VSS2<Vth(P35), the node C reaches the second low power-source voltage VSS2 with the thin-film transistor P35 conductive as illustrated in FIG. 88.

When the node C falls to the second low power-source voltage VSS2, the thin-film transistors P32 and P40 become conductive. The voltage of the output terminal OUT and the voltage at the node F then rise to the high power-source voltage VDD as illustrated in FIG. 88.

While the reset pulse remains at the low level, the thin-film transistor P34 remains conductive. The voltage at the node B is thus controlled to the high power-source voltage VDD as illustrated in FIG. 88. The gate electrode of the thin-film transistor P31 forming the first output stage (voltage at the node A) also rises to the high power-source voltage VDD.

The reset pulse then rises from the low level to the high level. During this voltage transition, a voltage change of the reset pulse can interfere with the node B and the node C because of the coupling effect.

Although the node C still maintains a low level, the voltage thereof rises from the second high power-source voltage VDD2 to a voltage Vc2 as illustrated in FIG. 88.

The voltage Vc2 at the node C satisfies a condition of Vc2−VDD<Vth(P32). The thin-film transistor P32 continues to be conductive, and the voltage at the output terminal OUT is maintained at the high power-source voltage VDD as illustrated in FIG. 88. The voltage at the node C also satisfies a condition of Vc2−VDD<Vth(P40). The thin-film transistor P40 thus continues to be conductive, and the voltage at the node F is maintained at the high power-source voltage VDD as illustrated in FIG. 88.

Also, the voltage Vc2 at the node C satisfies Vc2−VDD<Vth(P37). The thin-film transistor P37 thus becomes conductive, and the high power-source voltage VDD is continuously supplied to the node B.

This means that the node B is insusceptible to the interference responsive to the voltage change of the set pulse (means that the off-operation point of the thin-film transistor P31 is not shifted).

The above-described voltage status is maintained while the node C is at the voltage Vc2. More specifically, the node B is kept to the high power-source voltage VDD until the set pulse is subsequently transitioned to the low level. As a result, the leak current of the thin-film transistor P31 is minimized.

The buffer 65 of the embodiment 27 not only reduces the signal amplitude of each of the set pulse and the reset pulse but also reduces the signal amplitudes of the signals within the remaining stages of the buffer 65 other than the final output stage. For this reason, not only power consumed by a front section (such as the shift register) but also power consumed by the buffer 65 is reduced more than in the other embodiments.

Embodiment 28

A modification of the buffer 65 of the embodiment 23 is described below as an embodiment 28 of the present invention.

Figure 89:
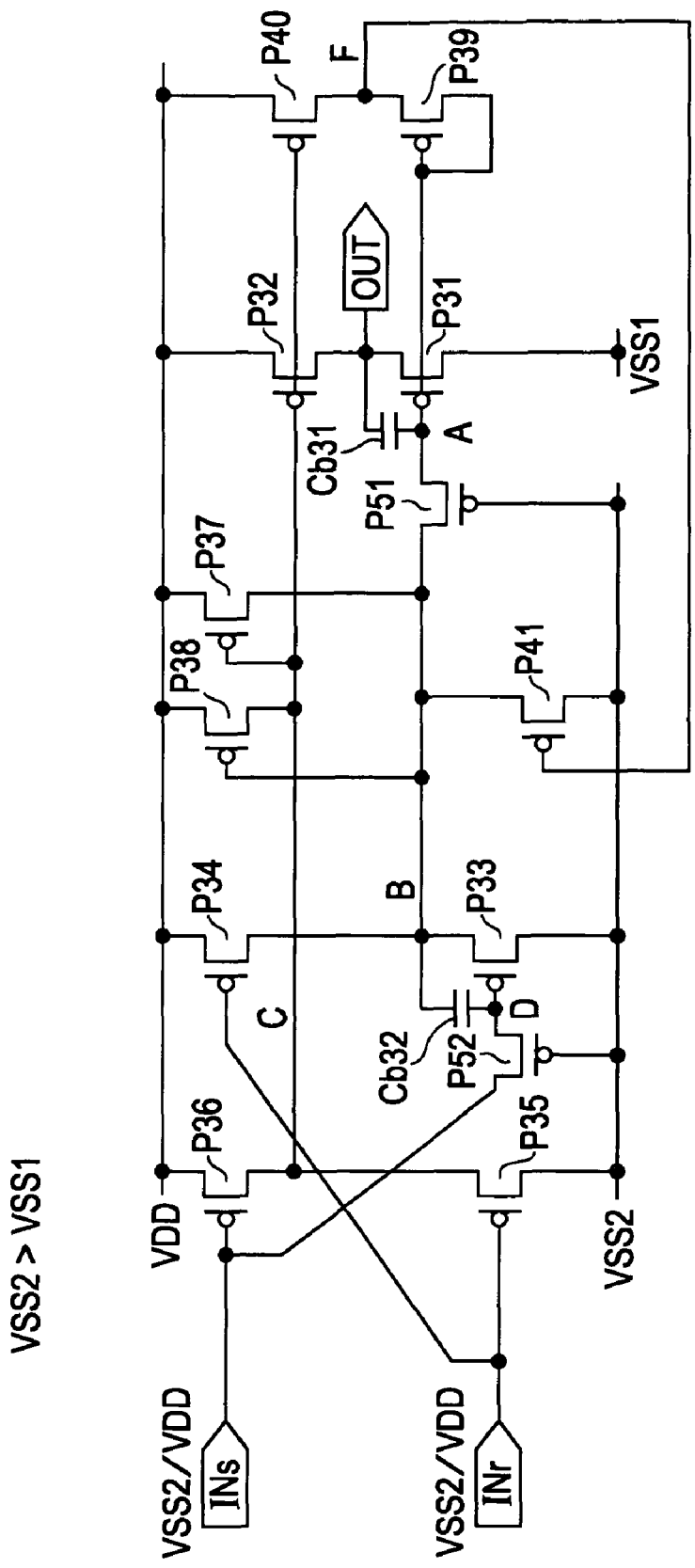
FIG. 89 is a circuit diagram of a buffer according to one embodiment of the present invention.

FIG. 89 illustrates the buffer 65 as the embodiment 28 of the present invention. In FIG. 89, elements identical to those illustrated in FIG. 87 are designated with the same reference numerals.

The buffer 65 of the embodiment 28 has the circuit structure of the embodiment 27 but with the thin-film transistor P53 removed therefrom. More specifically, the buffer 65 of the embodiment 28 has no bootstrap circuit on the second input stage. With this arrangement, the buffer 65 has a component count smaller than that of the embodiment 27.

The relationship of the voltage statuses of the set pulse and the reset pulse and the voltage status of each node is described with reference to FIG. 90.

Figure 90:
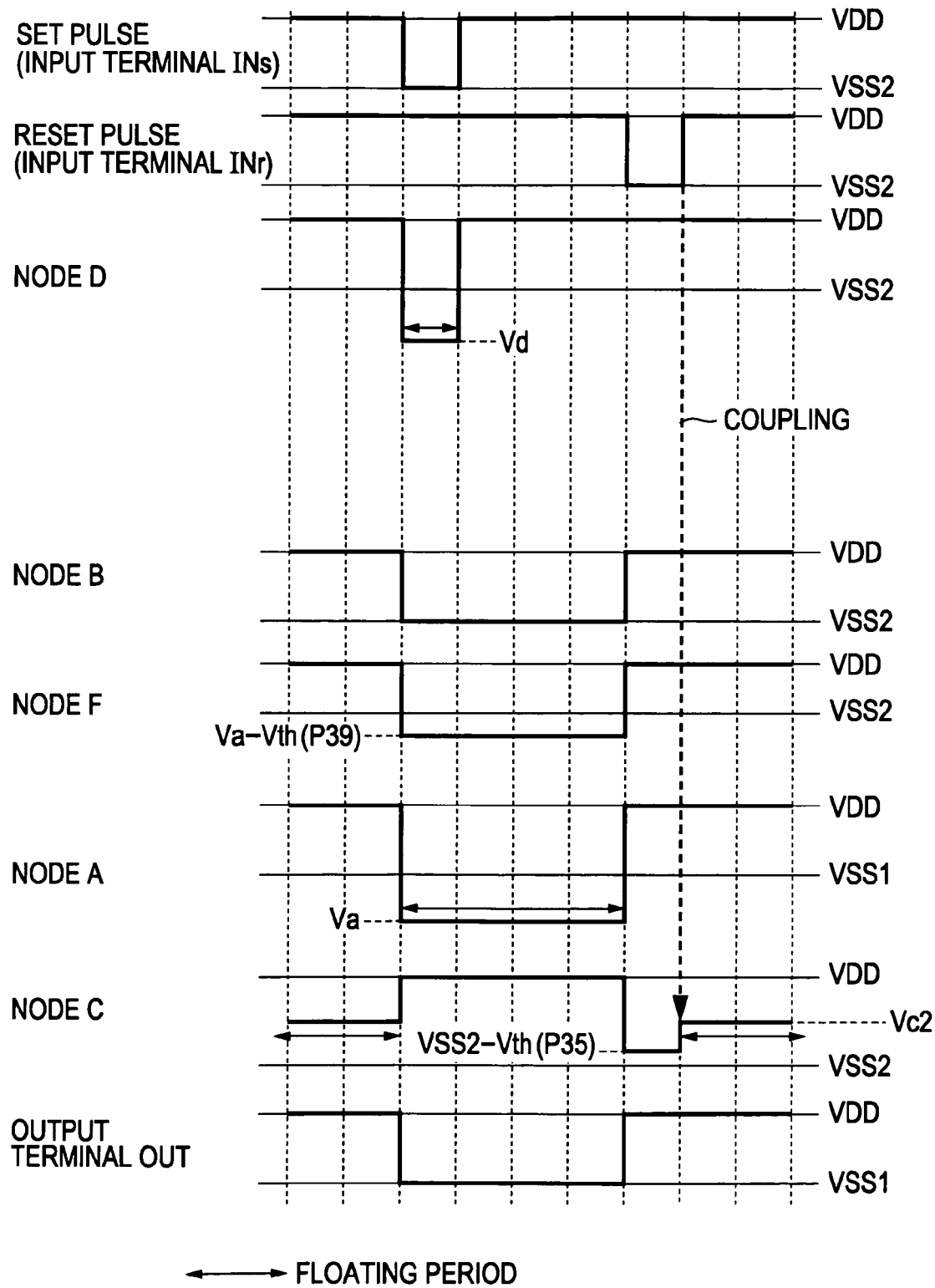
FIG. 90 illustrates drive waveforms of the buffer illustrated in FIG. 89.

FIG. 90 illustrates the voltage statuses of the set pulse at the input terminal INs, and the reset pulse at the input terminal INr.

FIG. 90 also illustrates the voltage status of the gate electrode of the thin-film transistor P33 (node D).

FIG. 90 further illustrates the voltage statuses of the control line connected to the output terminal of the first input stage (node B), the control line connected to the output terminal of the second output stage (node F), the gate electrode of the thin-film transistor P31 (node A), the control line connected to the output terminal of the second input stage (node C), and the output terminal OUT of the first output stage.

In accordance with the embodiment 28 of the present invention, each of the signal amplitude of the set pulse (input terminal INs) and the signal amplitude of the reset pulse (input terminal INr) is given between the two values VDD and VSS2 (>VSS1).

Referring to FIG. 90, the operation of the buffer 65 of the embodiment 28 remains unchanged from the operation of the buffer 65 of the embodiment 27 in the period from the falling edge of the set pulse to the low level to the falling edge of the reset pulse to the low level.

The operation of the buffer 65 of the embodiment 28 starting with the falling edge of the reset pulse is described below.

When the reset pulse falls from the high level to the low level, the thin-film transistors P34 and P35 become conductive.

In response, the node B rises to the high power-source voltage VDD, and the voltage at the node C falls as illustrated in FIG. 90. The voltage at the node C is a voltage higher than the second low power-source voltage VSS2 by a threshold voltage Vth(P35) of the thin-film transistor P35. More specifically, the voltage at the node C is at VSS2−Vth(P35).

The low level (VSS2−Vth(P35)) satisfies the following three conditions:

$VSS2-Vth(P35)-VDD<Vth(P32),$ $VSS2-Vth(P35)-VDD<Vth(P37),$ and $VSS2-Vth(P35)-VDD<Vth(P40).$ Generally, the pulse amplitude (VSS2−VSS) is sufficiently larger than the threshold voltage value Vth, and all the above three conditions are satisfied.

When the node C falls to the low level, the thin-film transistor P32 turns conductive, and the voltage at the output terminal OUT rises to the high power-source voltage VDD as illustrated in FIG. 90. Also, the thin-film transistor P40 turns conductive, causing the node F to rise to the high power-source voltage VDD as illustrated in FIG. 90.

The thin-film transistor P34 that has turned conductive controls the voltage at the node B to the high power-source voltage VDD as illustrated in FIG. 90. As a result, the voltage at the node A is also controlled to the high power-source voltage VDD.

The reset pulse rises from the low level to the high level. During this voltage transition, a voltage change of the reset pulse interferes with the node C because of the capacitive coupling effect of the thin-film transistor P35 as illustrated in FIG. 90. Although the node C still maintains a low level, the voltage thereof rises to a voltage Vc2 as illustrated in FIG. 90.

The voltage Vc2 satisfies the following three conditions:

$Vc2-VDD<Vth(P32),$ $Vc2-VDD<Vth(P37)$, and $Vc2-VDD<Vth(P40)$.

As long as the three conditions are satisfied, the thin-film transistors P32, P37, and P40 remain continuously conductive.

More specifically, the thin-film transistor P32 causes the high power-source voltage VDD to be supplied continuously to the output terminal OUT.

The thin-film transistor P37 causes the high power-source voltage VDD to be supplied continuously to the node B. This arrangement prevents the voltage change of the reset pulse from interfering with the node A via the thin-film transistor P34. The thin-film transistor P31 is free from the shifting of the off-operation point.

The voltage status described above is maintained for a period throughout which the voltage at the node C is maintained at the voltage Vc2. More specifically, the voltage at the node A is maintained at the high power-source voltage VDD until the set pulse is subsequently transitioned to the low level. As a result, the leak current of the thin-film transistor P31 is minimized.

As described above, the buffer 65 of the embodiment 28 even with a smaller component count provides the same operation and advantages as those of the buffer 65 of the embodiment 27.

Embodiment 29

A modification of the buffer 65 of the embodiment 23 is described below as an embodiment 29 of the present invention.

Figure 91:
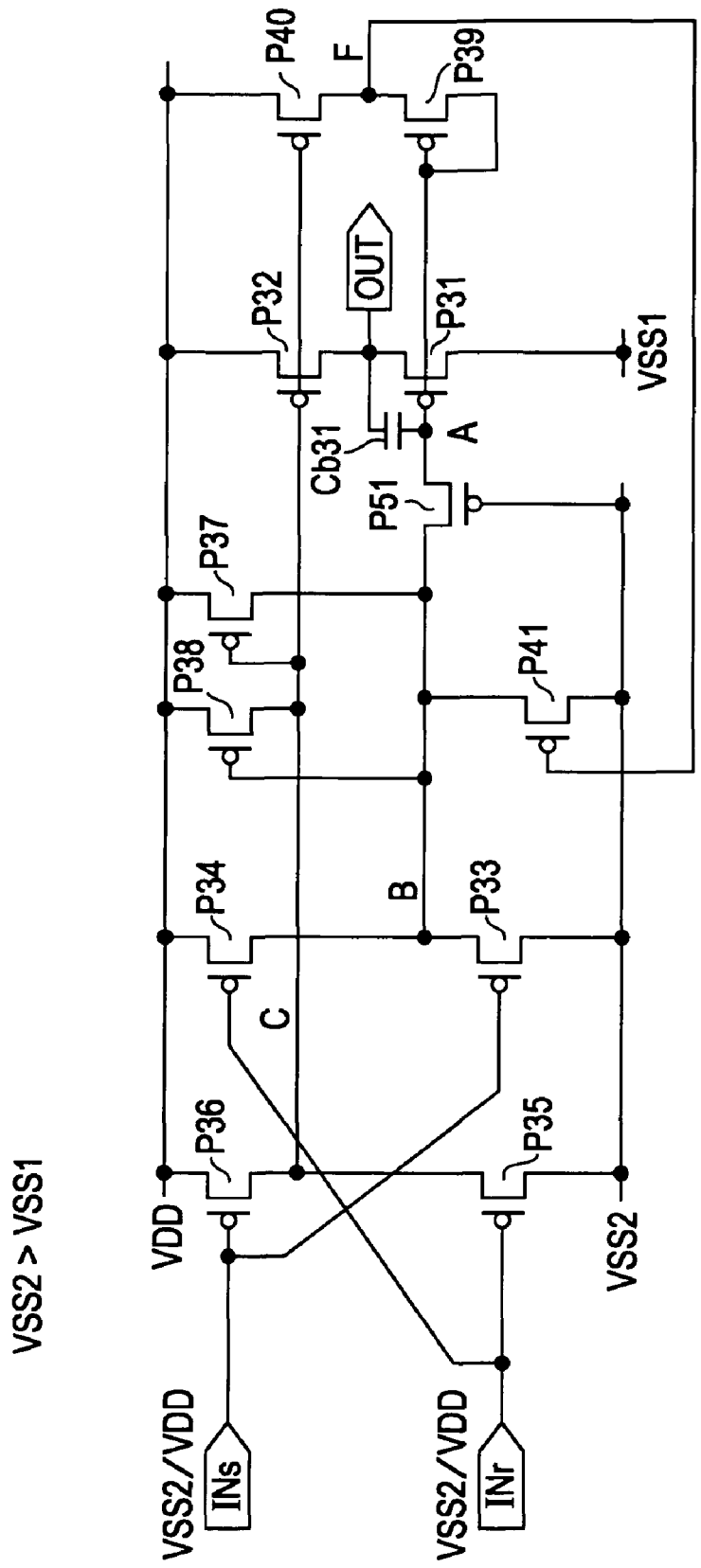
FIG. 91 is a circuit diagram of a buffer according to one embodiment of the present invention.

FIG. 91 illustrates the buffer 65 as the embodiment 29 of the present invention. In FIG. 91, elements identical to those illustrated in FIG. 89 are designated with the same reference numerals.

The buffer 65 of the embodiment 29 has the same circuit structure as the embodiment 28 but with the thin-film transistor P52 removed therefrom. More specifically, the buffer 65 of the embodiment 29 has the circuit structure of the embodiment 27 but with the bootstrap circuits removed from the first and second input stages thereof. In this way, the embodiment 29 of the present invention provides the buffer 65 having a component count smaller than that of the buffer 65 of the embodiment 28.

Figure 92:
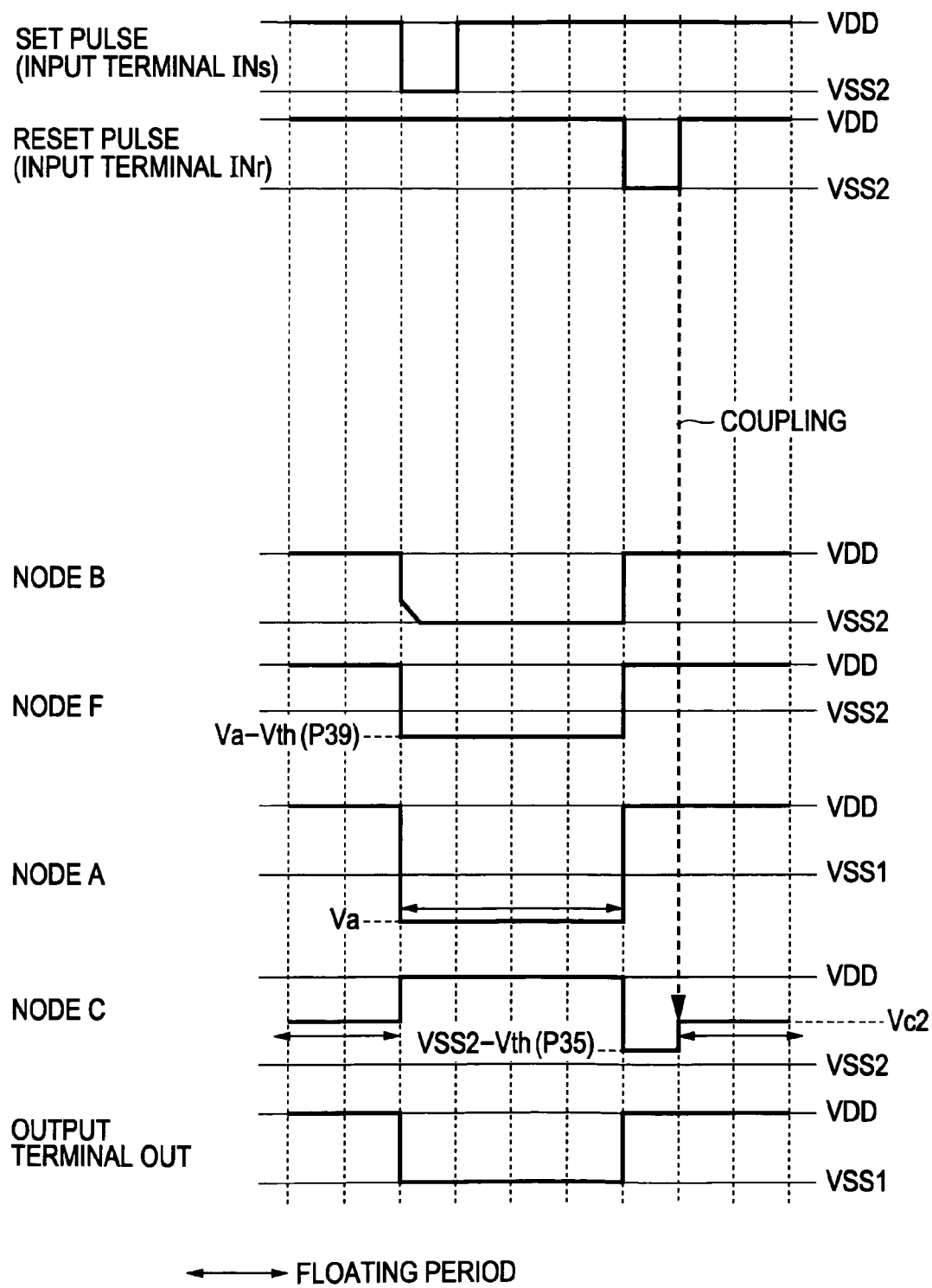
FIG. 92 illustrates drive waveforms of the buffer illustrated in FIG. 91.

FIG. 92 illustrates the relationship of the voltage statuses of the set pulse and the reset pulse and the voltage status of each node.

FIG. 92 also illustrates the voltage statuses of the set pulse at the input terminal INs, and the reset pulse at the input terminal INr.

FIG. 92 also illustrates the voltage status of a control line connected to an output terminal of the first input stage (node B).

FIG. 92 further illustrates the control line connected to the output terminal of the second output stage (node F), the gate electrode of the thin-film transistor P31 (node A), the control line connected to the output terminal of the second input stage (node C), and the output terminal OUT of the first output stage.

In accordance with the embodiment 29 of the present invention, each of the signal amplitude of the set pulse (input terminal INs) and the signal amplitude of the reset pulse (input terminal INr) is given between the two values VDD and VSS2 (>VSS1).

As previously discussed, the buffer 65 of the embodiment 29 is identical in structure to the buffer 65 of the embodiment 28 in that the thin-film transistor P53 is eliminated. The operation of the buffer 65 subsequent to the rising edge of the reset pulse to the high level remains thus unchanged from the operation of the buffer 65 of the embodiment 28.

The discussion that follows focuses on the operation within the period from the falling edge of the set pulse to the low level to the falling edge of the reset pulse to the low level.

When the set pulse falls to the low level, the thin-film transistors P33 and P36 turn conductive.

In response, the voltage at the node B falls and the voltage at the node C rises to the high power-source voltage VDD as illustrated in FIG. 92.

The buffer 65 of the embodiment 29 includes no bootstrap circuit on the gate electrode side of the thin-film transistor P33. The voltage at the node B immediately subsequent to the falling edge of the set pulse to the low level falls only to a low level determined by $VSS2-Vth(P33)$.

When the node B falls to the low level, the voltage at the output terminal OUT also falls to the low level. A bootstrap operation to the node A responsive to the voltage falling of the node B to the low level allows the voltage at the node F to fall to a voltage $Va-Vth(P39)$.

The voltage $(Va-Vth(P39))$ subsequent to the voltage falling satisfies a condition of $(Va-Vth(P39)-VSS2)>Vth(P41)$. The thin-film transistor P41 thus turns conductive, thereby supplying the second low power-source voltage VSS2 to the node B as illustrated in FIG. 92.

This operation is characteristic of the buffer 65 of the embodiment 29.

When the set pulse rises from the low level to the high level, the thin-film transistor P41 causes the node B to be maintained at the second low power-source voltage VSS2. While the node B is at the low level, the thin-film transistor P38 fixes the node C to the high power-source voltage VDD.

As described above, the buffer 65 of the embodiment 29 with an even smaller component count thereof provides the same operation and advantages as those of the embodiment 28.

Embodiment 30

A modification of the buffer 65 of the embodiment 23 is described below as an embodiment 30 of the present invention.

Figure 93:
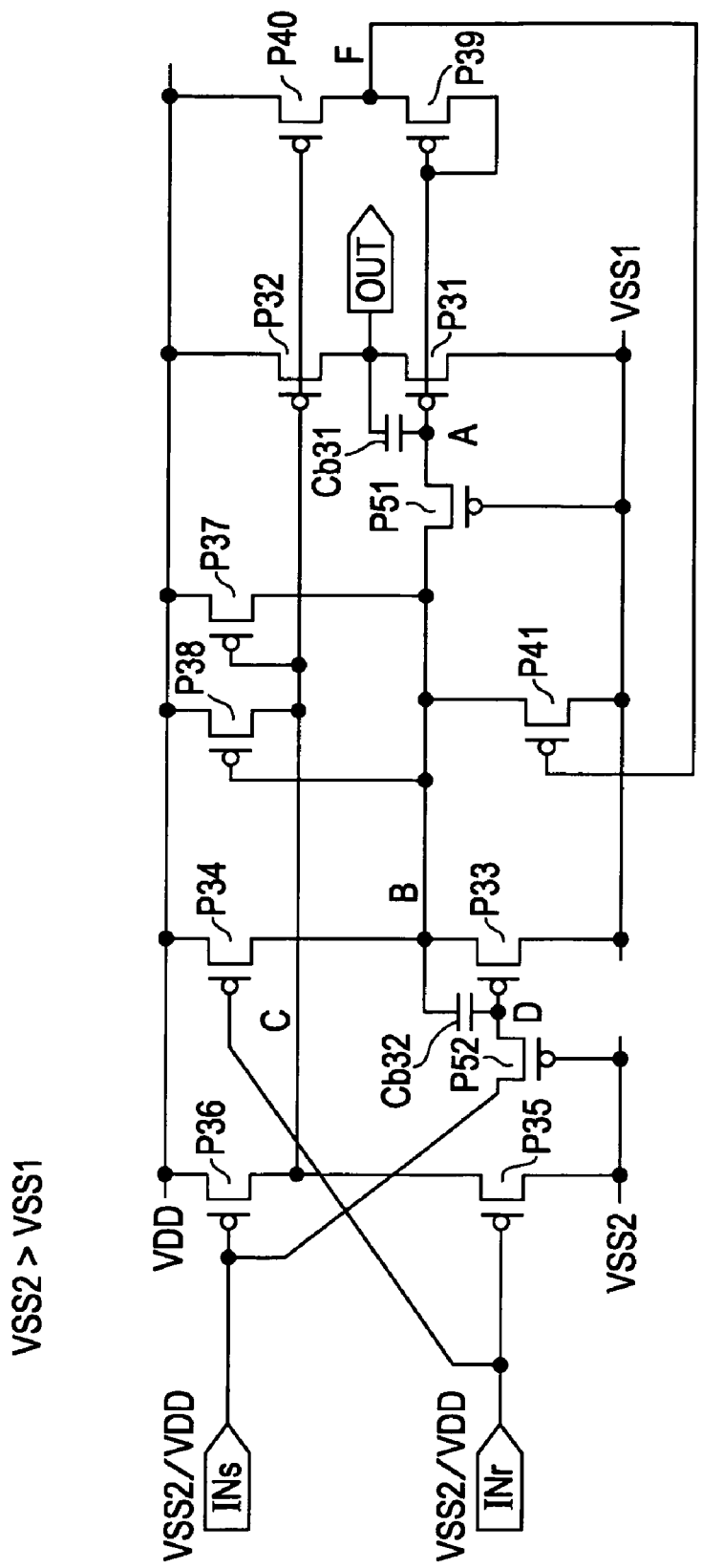
FIG. 93 is a circuit diagram of a buffer according to one embodiment of the present invention.

FIG. 93 illustrates the buffer 65 of the embodiment 30 of the present invention. In FIG. 93, elements identical to those illustrated in FIG. 81 are designated with the same reference numerals.

The buffer 65 of the embodiment 30 has the circuit structure of the embodiment 24 but with level shifting performed at the first input stage.

One of the main electrodes of the thin-film transistor P35 forming the second input stage and the gate electrode of the thin-film transistor P52 forming the first input stage are connected to the second low power-source voltage VSS2 (>VSS1). The buffer 45 thus constructed reduces the amplitude of each of the set pulse and the reset pulse and consumes less power than the buffer 45 of the embodiment 24.

Figure 94:
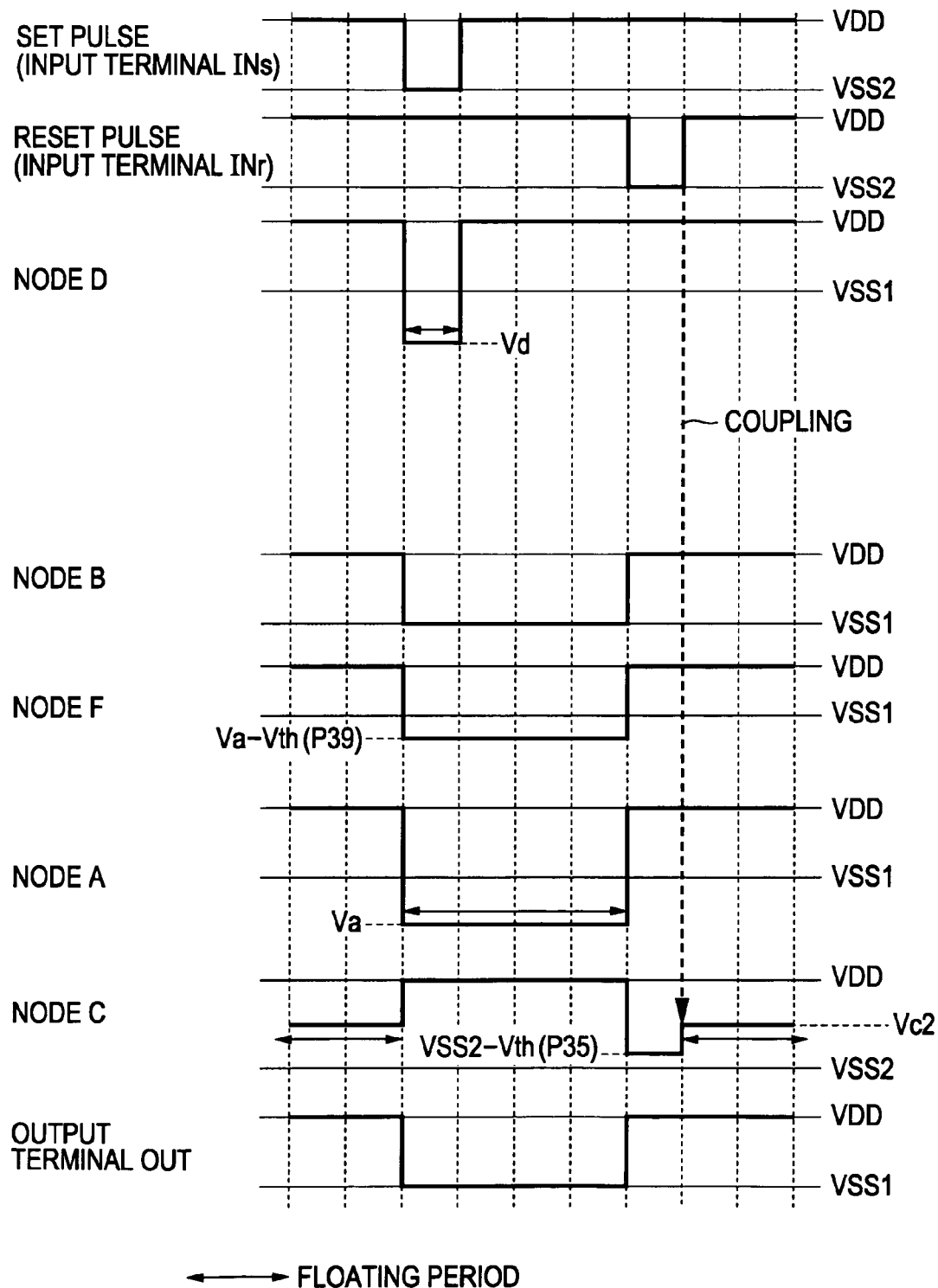
FIG. 94 illustrates drive waveforms of the buffer illustrated in FIG. 93.

FIG. 94 illustrates the relationship of the voltage statuses of the set pulse and the reset pulse and the voltage status of each node. The drive waveforms illustrated in FIG. 94 correspond to the respective drive waveforms illustrated in FIG. 82.

In accordance with the embodiment 30 of the present invention, each of the signal amplitude of the set pulse (input terminal INs) and the signal amplitude of the reset pulse (input terminal INr) is given between the two values VDD and VSS2 (>VSS1).

At the moment the set pulse falls to the low level, the node D at the first input stage falls to the low level. The thin-film transistor P33 then turns conductive, causing the voltage at the node B to fall as illustrated in FIG. 94.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 94. If the voltage Vd subsequent to the voltage falling satisfies Vd−VSS1<Vth(P33), the voltage at the node B becomes the low power-source voltage VSS1 with the thin-film transistor P33 conductive as illustrated in FIG. 94. In other words, changing of the pulse amplitude is performed.

When the node B falls to the low power-source voltage VSS1 as described above, the node A also falls to a low level. The thin-film transistors P31 and P39 turn conductive, causing the voltage at the output terminal OUT and the voltage at the node F to fall as illustrated in FIG. 94.

As the voltages at the output terminal OUT and the node F fall, the voltage at the node A falls by a voltage excursion responsive to a charge accumulated on the bootstrap auxiliary capacitance Cb31 as illustrated in FIG. 94.

If the voltage Va subsequent to the voltage falling satisfies Va−VSS1<Vth(P31), the voltage at the output terminal OUT becomes the first low power-source voltage VSS1 with the thin-film transistor P31 conductive as illustrated in FIG. 94.

The node F falls to a voltage determined by Va−Vth(P39) as illustrated in FIG. 94 because the thin-film transistor P39 is diode-connected.

If a condition of (Va−Vth(P39)−VSS11)<Vth(P41) is satisfied in accordance with the embodiment 30, the thin-film transistor P41 turns conductive, thereby supplying the low power-source voltage VSS1 to the node B.

The thin-film transistor P36 is also conductive with the set pulse at the low level. The gate voltage of the thin-film transistor P32 forming the output stage (voltage at the node C) is thus controlled to the high power-source voltage VDD as illustrated in FIG. 94.

The set pulse then rises from the low level to the high level. During this voltage transition, a voltage change of the set pulse can interfere with the nodes B and C because of the coupling effect.

The gate electrode of the thin-film transistor P41 is supplied with the voltage determined by Va−Vth (P39) via the node F as illustrated in FIG. 94. For this reason, the thin-film transistor P41 remaining conductive causes the voltage at the node B to be fixed to the low power-source voltage VSS1 as illustrated in FIG. 94. This operation is characteristic of the embodiment 30.

Even after the set pulse rises to the high level, the voltages at the nodes A, B, and F remain at the same level as when the set pulse is at the low level.

Since the voltage at the node B is maintained at the low power-source voltage VSS1, the thin-film transistor P38 remaining conductive continuously supplies the high power-source voltage VDD to the node C as illustrated in FIG. 94.

This means that the node C is insusceptible to the interference responsive to the voltage change of the set pulse (means that the off-operation point of the thin-film transistor P32 is not shifted).

This voltage status is maintained while the node B is at the low power-source voltage VSS1. More specifically, the node C is maintained at the high power-source voltage VDD until the reset pulse is subsequently transitioned to the low level. As a result, the leak current of the thin-film transistor P32 is minimized.

The node B biased at the low power-source voltage VSS1 means that the thin-film transistor P51 is at the cutoff state. The node A is maintained at the floating state at a bootstrap voltage (i.e., Va) as illustrated in FIG. 94. For this reason, the low power-source voltage VSS1 continuously appears at the output terminal OUT of the first output stage as illustrated in FIG. 94.

When the reset pulse is transitioned from the high level to the low level at the input terminal INr in FIG. 94, the thin-film transistor P35 becomes conductive. The voltage at the node C falls as illustrated in FIG. 94. The voltage at the node C is a voltage higher than the second low power-source voltage VSS2 by the threshold voltage value Vth(P35) of the thin-film transistor P35. More specifically, the node C falls to VSS2−Vth(P35).

The low level (VSS2−Vth(P35)) satisfies the following three conditions:

$VSS2-Vth(P35)-VDD<Vth(P32)$, $VSS2-Vth(P35)-VDD<Vth(P37)$, and $VSS2-Vth(P35)-VDD<Vth(P40)$.

Generally, the pulse amplitude (VSS2−VDD) is sufficiently larger than the threshold voltage value Vth, and all the above three conditions are satisfied.

When the node C falls to the low level, the thin-film transistor P32 turns conductive, and the voltage at the output terminal OUT rises to the high power-source voltage VDD as illustrated in FIG. 94.

The reset pulse rises from the low level to the high level. During this voltage transition, a voltage change of the reset pulse interferes with the node C because of the capacitive coupling effect of the thin-film transistor P35 as illustrated in FIG. 94. Although the node C still maintains a low level, the voltage thereof rises to a voltage Vc2 as illustrated in FIG. 94.

The voltage Vc2 satisfies the following three conditions:

$Vc2-VDD<Vth(P32)$, $Vc2-VDD<Vth(P37)$, and $Vc2-VDD<Vth(P40)$.

As long as the three conditions are satisfied, the thin-film transistors P32, P37, and P40 remain continuously conductive.

More specifically, the thin-film transistor P32 causes the high power-source voltage VDD to be supplied continuously to the output terminal OUT.

The thin-film transistor P37 causes the high power-source voltage VDD to be supplied continuously to the node B. This arrangement prevents the voltage change of the reset pulse from interfering with the node A via the thin-film transistor P34. The thin-film transistor P31 is free from the shifting of the off-operation point.

The voltage status described above is maintained for a period throughout which the voltage at the node C is maintained at the voltage Vc2. More specifically, the voltage at the node A is maintained at the high power-source voltage VDD until the set pulse is subsequently transitioned to the low level. As a result, the leak current of the thin-film transistor P31 is minimized.

The buffer 65 of the embodiment 30 operates in the same operation as the buffer 65 of the embodiment 24 and provides the same advantages as those of the buffer 65 of the embodiment 24. The buffer 65 of the embodiment 30 operates with the front section (such as the shift register) consuming less power.

Embodiment 31

A modification of the buffer 65 of the embodiment 23 is described below as an embodiment 31 of the present invention.

Figure 95:
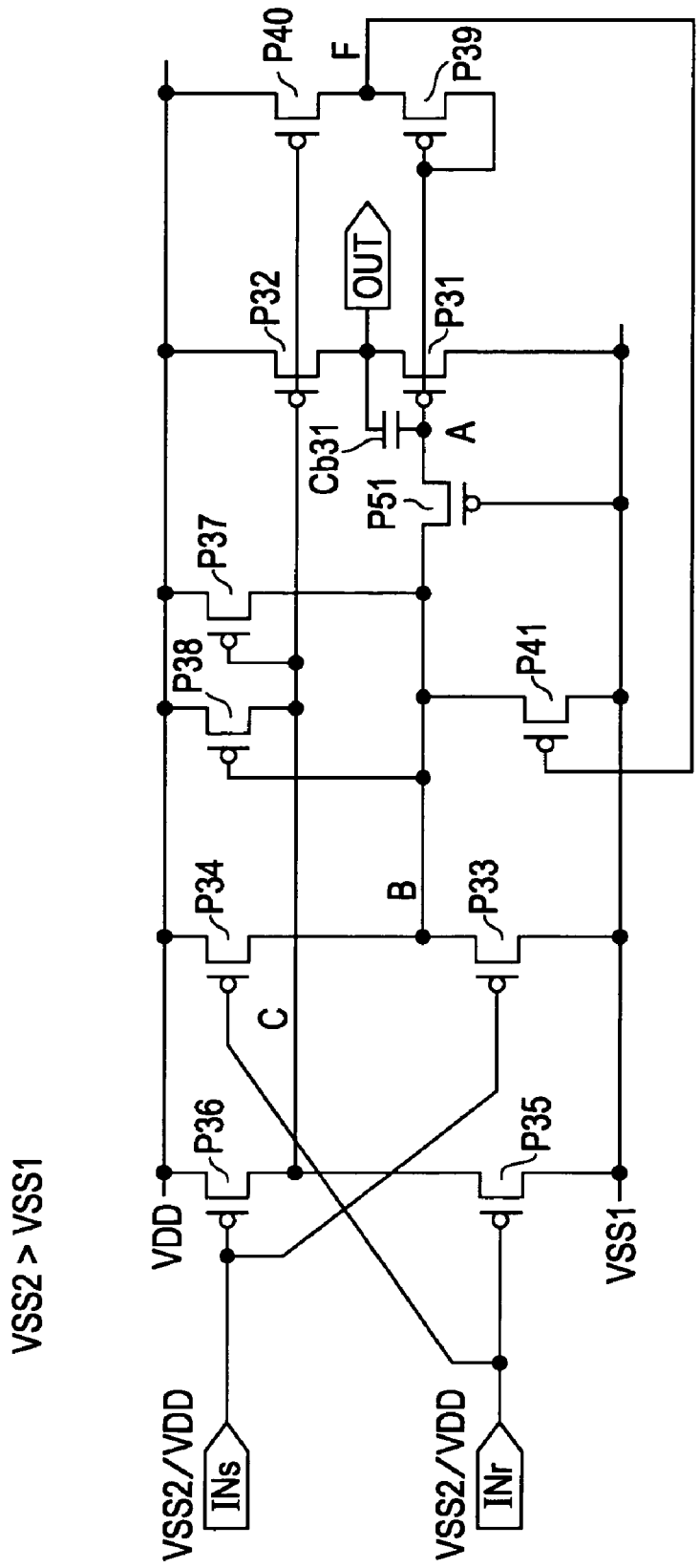
FIG. 95 is a circuit diagram of a buffer according to one embodiment of the present invention.

FIG. 95 illustrates the buffer 65 of the embodiment 31 of the present invention. In FIG. 95, elements identical to those illustrated in FIG. 83 are designated with the same reference numerals.

A comparison of FIG. 95 with FIG. 83 reveals that the buffer 65 of the embodiment 31 is generally similar in circuit structure to the buffer 65 of the embodiment 25.

The difference between the embodiments 31 and 25 is that the set pulse and the reset pulse are smaller in amplitude than the counterparts in the embodiment 25. More specifically, the set pulse and the reset pulse are driven between the two values of VDD and VSS2 (>VSS1) in the embodiment 31.

The relationship of the voltage statuses of the set pulse and the reset pulse and the voltage status of each node is described with reference to FIG. 96. The drive waveforms illustrated in FIG. 96 correspond to the respective drive waveforms illustrated in FIG. 84.

In accordance with the embodiment 31 of the present invention, each of the signal amplitude of the set pulse (input terminal INs) and the signal amplitude of the reset pulse (input terminal INr) is given between the two values VDD and VSS2 (>VSS1).

At the moment the set pulse falls to the low level, the thin-film transistors P33 and P36 turn conductive.

Figure 96:
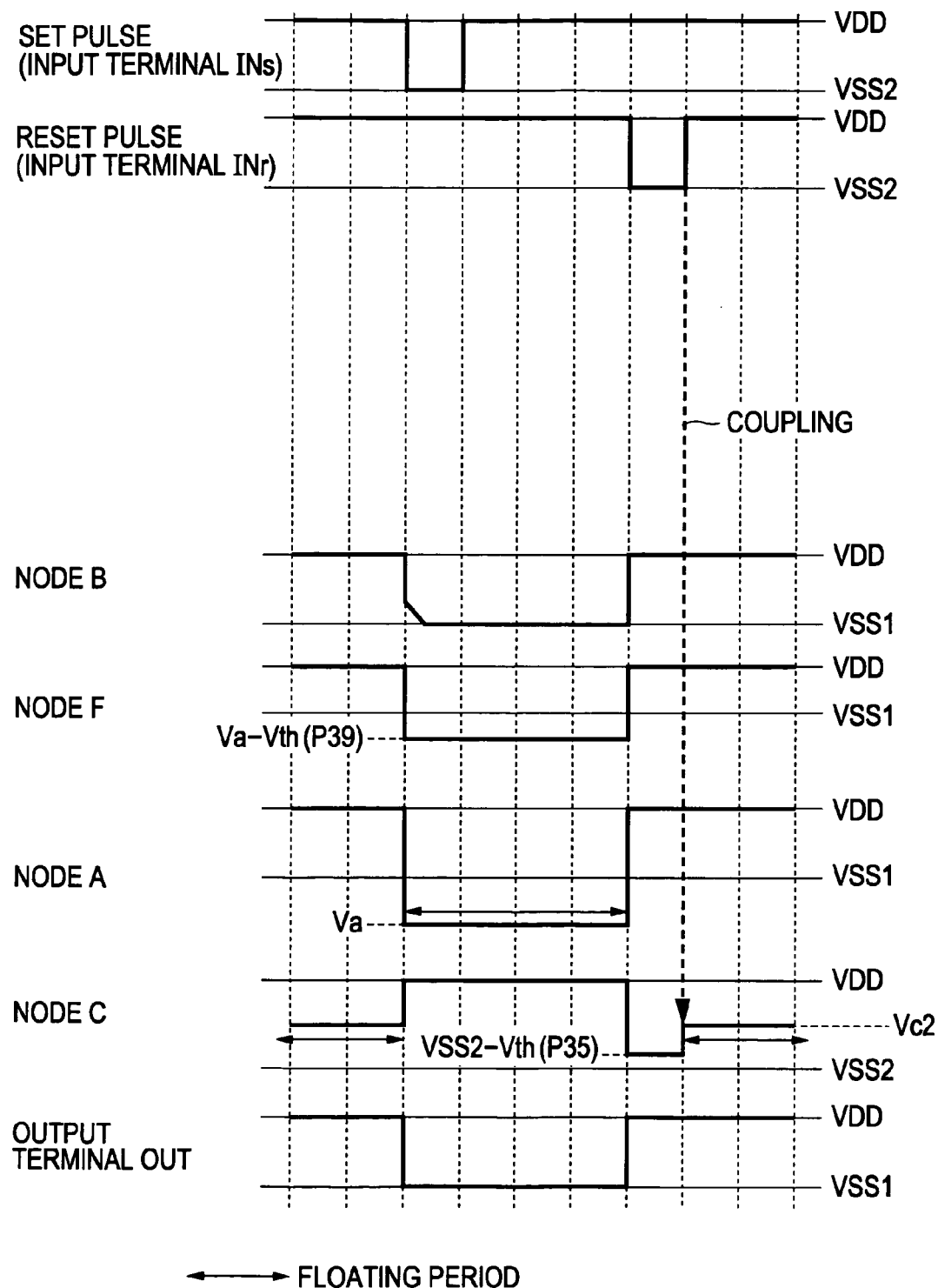
FIG. 96 illustrates drive waveforms of the buffer illustrated in FIG. 95.

In response, the voltage at the node B falls and the voltage at the node C rises to the high power-source voltage VDD as illustrated in FIG. 96.

The buffer 65 of the embodiment 31 includes no bootstrap circuit on the gate electrode side of the thin-film transistor P33. The voltage at the node B immediately subsequent to the falling edge of the set pulse to the low level falls only to a low level determined by VSS2-Vth(P33).

When the node B falls to the low level, the voltage at the output terminal OUT also falls to the low level. The voltage at the node A falls to the bootstrap voltage Va as illustrated in FIG. 96. Since the bootstrap voltage Va satisfies a condition of Va-VSS1>Vth(P31), the voltage at the output terminal OUT falls to the low power-source voltage VSS1 as illustrated in FIG. 96.

Since the thin-film transistor P39 is diode-connected, the voltage at the node F falls to a voltage determined by (Va-Vth(P39)) as illustrated in FIG. 96. The voltage (Va-Vth (P39)) satisfies a condition of (Va-Vth(P39)-VSS1)<Vth (P41). The thin-film transistor P41 thus turns conductive, thereby supplying the low power-source voltage VSS1 to the node B as illustrated in FIG. 96.

This operation is characteristic of the buffer 65 of the embodiment 31.

The thin-film transistor P36 is also conductive with the set pulse at the low level. The gate voltage of the thin-film transistor P32 forming the output stage (voltage at the node C) is thus controlled to the high power-source voltage VDD as illustrated in FIG. 96.

The set pulse then rises from the low level to the high level. During this voltage transition, a voltage change of the set pulse can interfere with the nodes B and C because of the coupling effect.

The gate electrode of the thin-film transistor P41 is supplied with the voltage determined by Va-Vth (P39) via the node F as illustrated in FIG. 96.

For this reason, the thin-film transistor P41 remaining conductive causes the voltage at the node B to be fixed to the low power-source voltage VSS1 as illustrated in FIG. 96. This operation is characteristic of the embodiment 31.

Even after the set pulse rises to the high level, the voltages at the nodes A, B, and F remain at the same level as when the set pulse is at the low level.

Since the voltage at the node B is maintained at the low power-source voltage VSS1, the thin-film transistor P38 remaining conductive continuously supplies the high power-source voltage VDD to the node C as illustrated in FIG. 96.

This means that the node C is insusceptible to the interference responsive to the voltage change of the set pulse (means that the off-operation point of the thin-film transistor P32 is not shifted).

This voltage status is maintained while the node B is at the low power-source voltage VSS1. More specifically, the node C is maintained at the high power-source voltage VDD until the reset pulse is subsequently transitioned to the low level. As a result, the leak current of the thin-film transistor P32 is minimized.

The node B biased at the low power-source voltage VSS1 means that the thin-film transistor P51 is at the cutoff state. The node A is maintained at the floating state at a bootstrap voltage (i.e., Va) as illustrated in FIG. 96. For this reason, the low power-source voltage VSS1 continuously appears at the output terminal OUT of the first output stage as illustrated in FIG. 96.

When the reset pulse is transitioned from the high level to the low level at the input terminal INr in FIG. 96, the thin-film transistor P35 becomes conductive. The voltage at the node C falls as illustrated in FIG. 96. The voltage at the node C is a voltage higher than the second low power-source voltage VSS2 by the threshold voltage value Vth(P35) of the thin-film transistor P35. More specifically, the node C falls to VSS2-Vth(P35).

The low level (VSS2-Vth(P35)) satisfies the following three conditions:

$$VSS2-Vth(P35)-VDD<Vth(P32),$$

$$VSS2-Vth(P35)-VDD<Vth(P37), \text{ and}$$

$$VSS2-Vth(P35)-VDD<Vth(P40).$$

Generally, the pulse amplitude (VSS2-VDD) is sufficiently larger than the threshold voltage value Vth, and all the above three conditions are satisfied.

When the node C falls to the low level, the thin-film transistor P32 turns conductive, and the voltage at the output terminal OUT rises to the high power-source voltage VDD as illustrated in FIG. 96.

The thin-film transistor P40 then turns conductive, thereby causing the voltage at the node F to rise to the high power-source voltage VDD as illustrated in FIG. 96.

The thin-film transistor P34 that has turned conductive controls the voltage at the node B to the high power-source voltage VDD as illustrated in FIG. 96. As a result, the node A is also controlled to the high power-source voltage VDD as illustrated in FIG. 96.

The reset pulse rises from the low level to the high level. During this voltage transition, a voltage change of the reset pulse interferes with the node C because of the capacitive coupling effect of the thin-film transistor P35 as illustrated in FIG. 96. Although the node C still maintains a low level, the voltage thereof rises to a voltage Vc2 as illustrated in FIG. 96.

The voltage Vc2 satisfies the following three conditions:

$$Vc2-VDD<Vth(P32),$$

$$Vc2-VDD<Vth(P37), \text{ and}$$

$$Vc2-VDD<Vth(P40).$$

As long as the three conditions are satisfied, the thin-film transistors P32, P37, and P40 remain continuously conductive.

More specifically, the thin-film transistor P32 causes the high power-source voltage VDD to be supplied continuously to the output terminal OUT.

The thin-film transistor P37 causes the high power-source voltage VDD to be supplied continuously to the node B. This arrangement prevents the voltage change of the reset pulse from interfering with the node A via the thin-film transistor P34. The thin-film transistor P31 is free from the shifting of the off-operation point.

The voltage status described above is maintained for a period throughout which the voltage at the node C is maintained at the voltage Vc2. More specifically, the voltage at the node A is maintained at the high power-source voltage VDD until the set pulse is subsequently transitioned to the low level. As a result, the leak current of the thin-film transistor P31 is minimized.

The buffer 65 of the embodiment 31 operates in the same operation as the buffer 65 of the embodiment 25 and provides the same advantages as those of the buffer 65 of the embodiment 25. The buffer 65 of the embodiment 31 operates with the front section (such as the shift register) consuming less power.

Embodiment 32

A modification of the buffer 65 of the embodiment 23 is described below as an embodiment 32 of the present invention.

Figure 97:
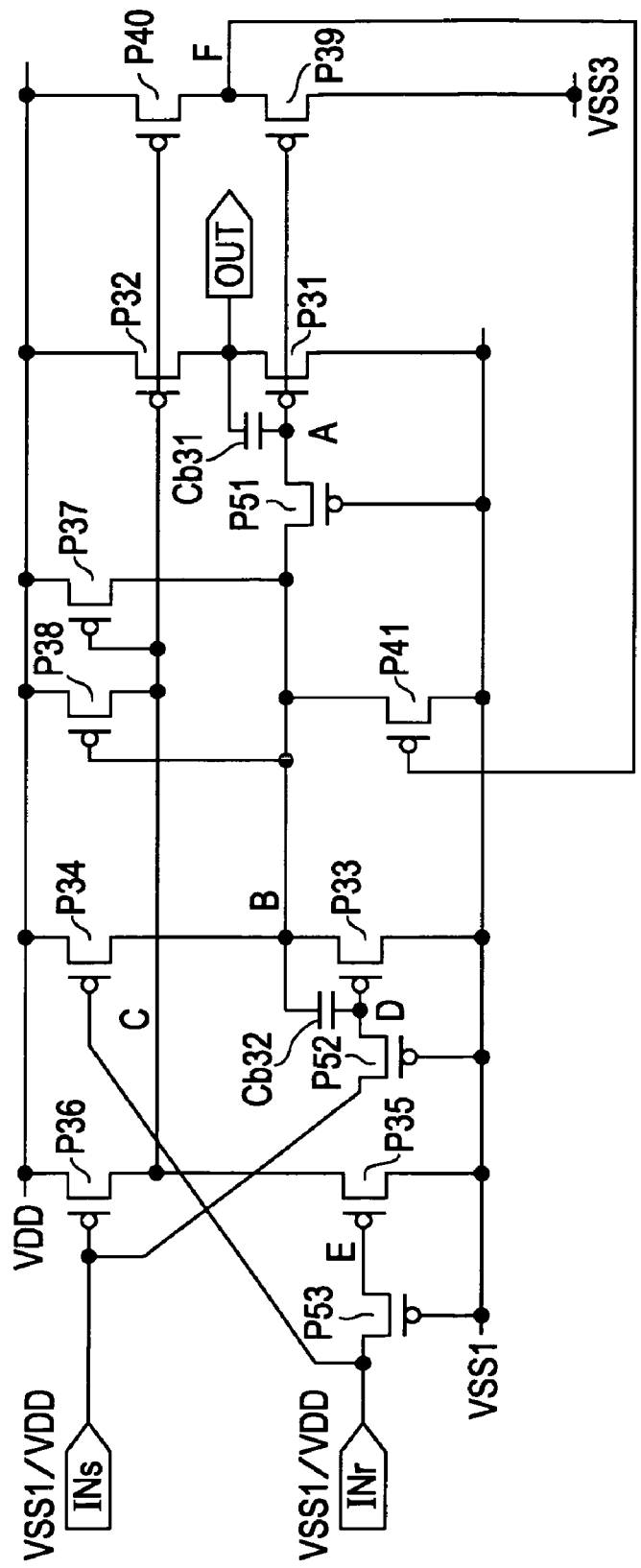
FIG. 97 is a circuit diagram of a buffer according to one embodiment of the present invention.

FIG. 97 illustrates the buffer 65 of the embodiment 32 of the present invention. In FIG. 97, elements identical to those illustrated in FIG. 79 are designated with the same reference numerals.

The buffer 65 of the embodiment 32 is generally similar in structure in structure to the buffer 65 of the embodiment 23 except for the second output stage. More specifically, the bootstrap circuit is employed in each of the first and second input stages and the first output stage.

The difference between the buffer 65 of the embodiment 32 and the buffer 65 of the embodiment 23 lies in the connection configuration of the thin-film transistor P39 forming the second output stage. In the embodiment 32, one of the main electrodes at a low voltage source is connected to a third low power-source voltage VSS3 (<VSS1+Vth(P41)).

The relationship of the voltage statuses of the set pulse and the reset pulse and the voltage status of each node is described with reference to FIG. 98. The drive waveforms illustrated in FIG. 98 correspond to the respective drive waveforms illustrated in FIG. 80.

In accordance with the embodiment 32 of the present invention, each of the signal amplitude of the set pulse (input terminal INs) and the signal amplitude of the reset pulse (input terminal INr) is given between the two values VDD and VSS1.

At the moment the set pulse falls to the low level, the node D at the first input stage falls to the low level. The thin-film transistor P33 then turns conductive, causing the voltage at the node B to fall as illustrated in FIG. 98.

Figure 98:
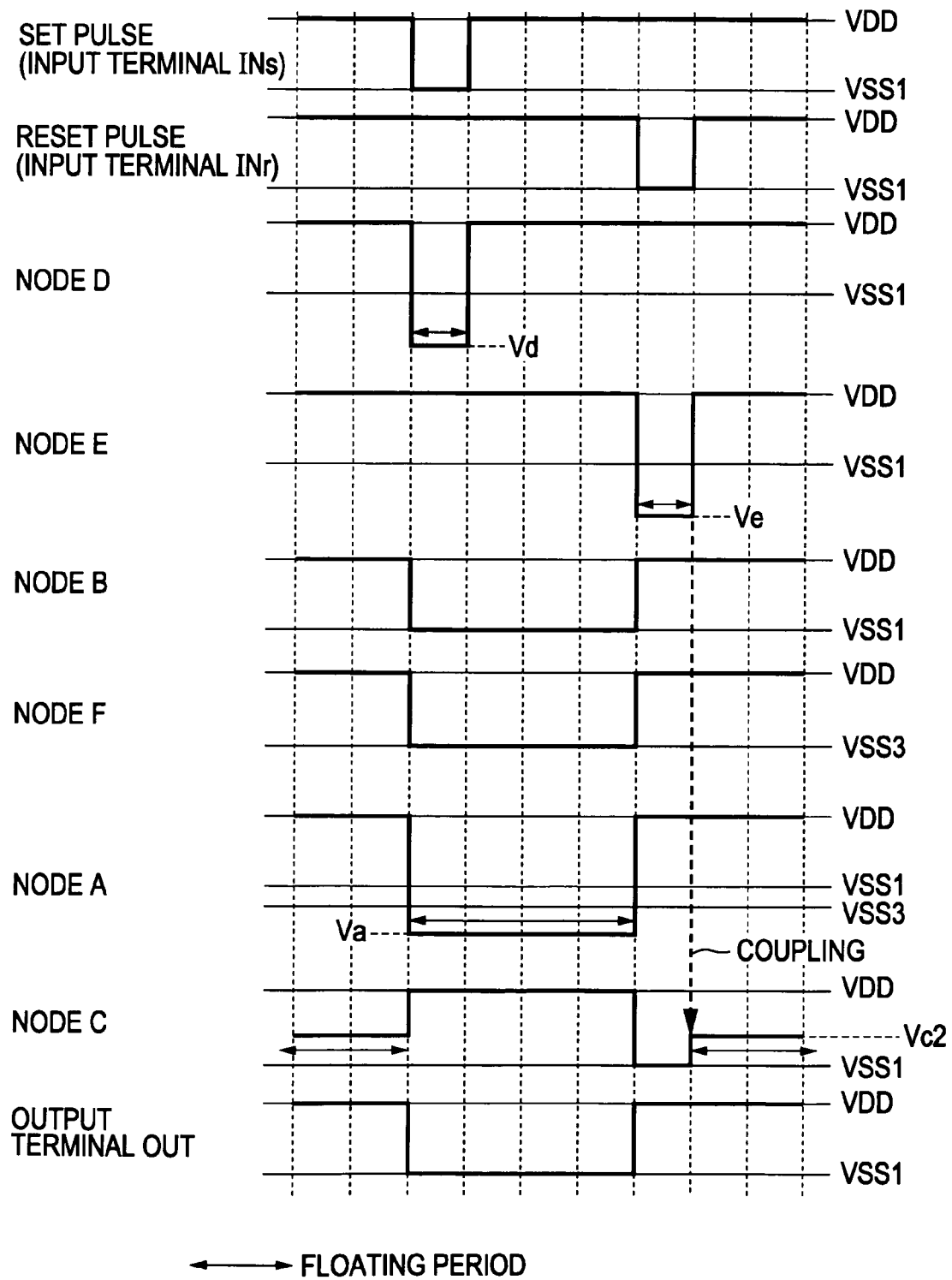
FIG. 98 illustrates drive waveforms of the buffer illustrated in FIG. 97.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 98. If the voltage Vd subsequent to the voltage falling satisfies Vd–VSS1<Vth(P33), the voltage at the node B becomes the low power-source voltage VSS1 with the thin-film transistor P33 conductive as illustrated in FIG. 98.

When the node B falls to the low power-source voltage VSS1 as described above, the node A also falls to a low level. The thin-film transistors P31 and P39 turn conductive, causing the voltage at the output terminal OUT and the voltage at the node F to fall as illustrated in FIG. 98.

As the voltages at the output terminal OUT and the node F fall, the voltage at the node A falls by a voltage excursion responsive to a charge accumulated on the bootstrap auxiliary capacitance Cb31 as illustrated in FIG. 98.

If the voltage Va subsequent to the voltage falling satisfies Va–VSS1<Vth(P31), the voltage at the output terminal OUT becomes the low power-source voltage VSS1 with the thin-film transistor P31 conductive as illustrated in FIG. 98.

If the voltage Va subsequent to the voltage falling satisfies Va–VSS3<Vth(P39), the voltage at the node F becomes the third low power-source voltage VSS3 with the thin-film transistor P39 conductive as illustrated in FIG. 98.

The third low power-source voltage VSS3 is determined to satisfy a condition of VSS3–VSS1<Vth(P41).

When the node F falls to the low level, the thin-film transistor P41 turns conductive, thereby supplying the low power-source voltage VSS1 to the node B.

The thin-film transistor P36 is also conductive with the set pulse at the low level. The gate voltage of the thin-film transistor P32 forming the output stage (voltage at the node C) is thus controlled to the high power-source voltage VDD as illustrated in FIG. 98.

The set pulse then rises from the low level to the high level. During this voltage transition, a voltage change of the set pulse can interfere with the nodes B and C because of the coupling effect.

The gate electrode of the thin-film transistor P41 is supplied with the third low power-source voltage VSS3 via the node F as illustrated in FIG. 98. For this reason, the thin-film transistor P41 remaining conductive causes the voltage at the node B to be fixed to the low power-source voltage VSS1 as illustrated in FIG. 98.

Even after the set pulse rises to the high level, the voltages at the nodes A, B, and F remain at the same level as when the set pulse is at the low level.

Since the voltage at the node B is maintained at the low power-source voltage VSS1, the thin-film transistor P38 remaining conductive continuously supplies the high power-source voltage VDD to the node C as illustrated in FIG. 98.

This means that the node C is insusceptible to the interference responsive to the voltage change of the set pulse (means that the off-operation point of the thin-film transistor P32 is not shifted).

This voltage status is maintained while the node B is at the low power-source voltage VSS1. More specifically, the node C is maintained at the high power-source voltage VDD until the reset pulse is subsequently transitioned to the low level. As a result, the leak current of the thin-film transistor P32 is minimized.

The node B biased at the low power-source voltage VSS1 means that the thin-film transistor P51 is at the cutoff state. The node A is maintained at the floating state at a bootstrap voltage (i.e., Va) as illustrated in FIG. 98. For this reason, the low power-source voltage VSS1 continuously appears at the output terminal OUT of the first output stage as illustrated in FIG. 98.

When the reset pulse is transitioned from the high level to the low level at the input terminal INr in FIG. 98, the thin-film transistor P35 becomes conductive. The voltage at the node C falls as illustrated in FIG. 98. As the voltage at the node C falls, the gate voltage of the thin-film transistor P35 (voltage at the node E) falls by a voltage excursion responsive to a charge accumulated on the gate capacitance of the thin-film transistor P35 as illustrated in FIG. 98. The resulting voltage subsequent to the voltage falling is Ve. If the voltage Ve satisfies a condition of Ve−VSS1<Vth(P35), the node C reaches the first low power-source voltage VSS1 with the thin-film transistor P35 conductive as illustrated in FIG. 98.

When the node C falls to the low power-source voltage VSS1, the thin-film transistors P32 and P40 become conductive. The voltage of the output terminal OUT and the voltage at the node F then rise to the high power-source voltage VDD as illustrated in FIG. 98.

While the reset pulse remains at the low level, the thin-film transistor P34 remains conductive. The voltage at the node B is thus controlled to the high power-source voltage VDD as illustrated in FIG. 98. The gate electrode of the thin-film transistor P31 forming the first output stage (voltage at the node A) also rises to the high power-source voltage VDD.

The reset pulse then rises from the low level to the high level. During this voltage transition, a voltage change of the reset pulse may interfere with the node B and the node C because of the coupling effect.

Although the node C still maintains a low level, the voltage thereof rises from the low power-source voltage VSS1 to a voltage Vc2 as illustrated in FIG. 98.

The voltage Vc2 at the node C satisfies a condition of Vc2−VDD<Vth(P32). The thin-film transistor P32 continues to be conductive, and the voltage at the output terminal OUT is maintained at the high power-source voltage VDD as illustrated in FIG. 98. The voltage Vc2 at the node C also satisfies a condition of Vc2−VDD<Vth(P40). The thin-film transistor P40 thus continues to be conductive, and the voltage at the node F is maintained at the high power-source voltage VDD as illustrated in FIG. 98.

Also, the voltage Vc2 at the node C satisfies Vc2−VDD<Vth(P37). The thin-film transistor P37 thus becomes conductive, and the high power-source voltage VDD is continuously supplied to the node B.

This means that the node B is insusceptible to the interference responsive to the voltage change of the set pulse (means that the off-operation point of the thin-film transistor P31 is not shifted) as illustrated in FIG. 98.

The above-described voltage status is maintained while the node C is at the voltage Vc2. More specifically, the node B is kept to the high power-source voltage VDD until the set pulse is subsequently transitioned to the low level. As a result, the leak current of the thin-film transistor P31 is minimized.

The buffer 65 thus constructed provides the same operation and advantages as those of the buffer 65 of the embodiment 23.

Embodiment 33

A modification of the buffer 65 of the embodiment 23 is described below as an embodiment 33 of the present invention.

Figure 99:
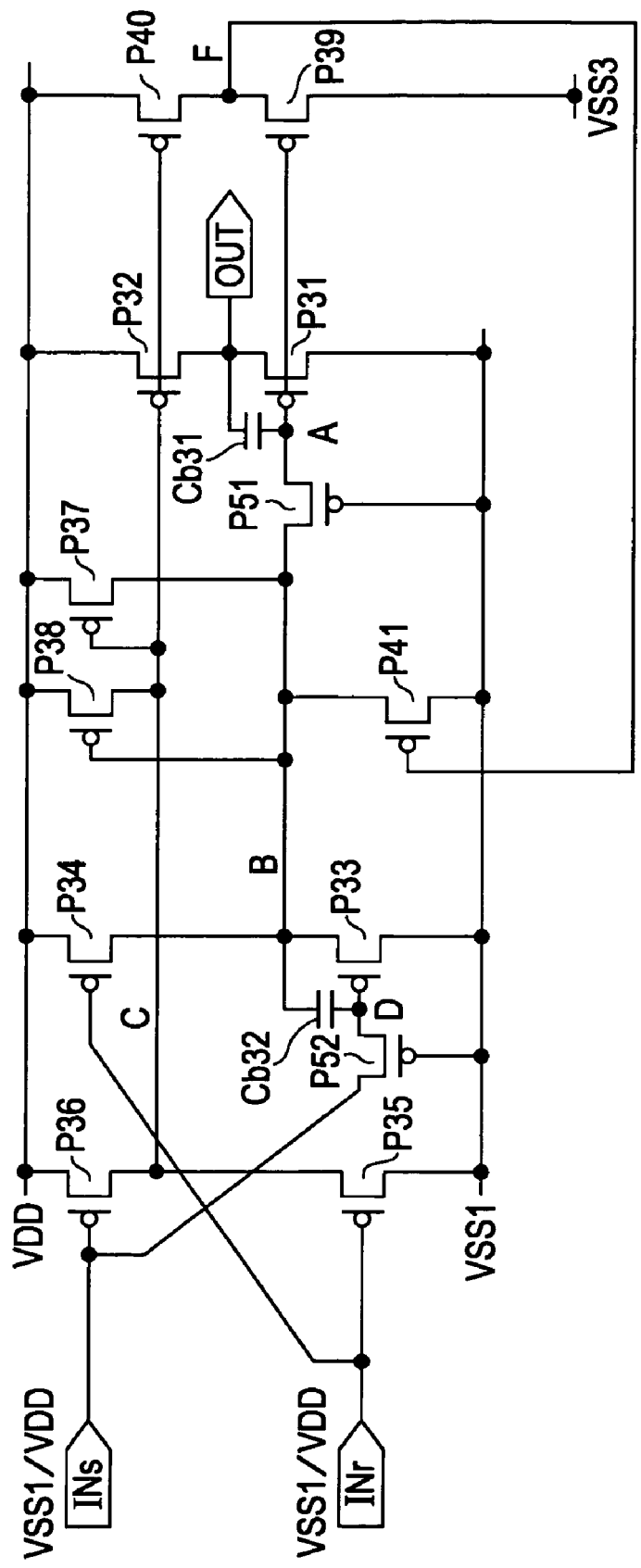
FIG. 99 is a circuit diagram of a buffer according to one embodiment of the present invention.

FIG. 99 illustrates the buffer 65 as the embodiment 33 of the present invention. In FIG. 99, elements identical to those illustrated in FIG. 81 are designated with the same reference numerals.

The buffer 65 of the embodiment 33 has the circuit structure of the embodiment 32 but with the thin-film transistor P53 removed therefrom. More specifically, the buffer 65 of the embodiment 33 has no bootstrap circuit on the second input stage. With this arrangement, the buffer 65 has a component count smaller than that of the embodiment 32. The buffer 65 of the embodiment 33 also corresponds to the buffer 65 of the embodiment 24 in drive waveform.

Figure 100:
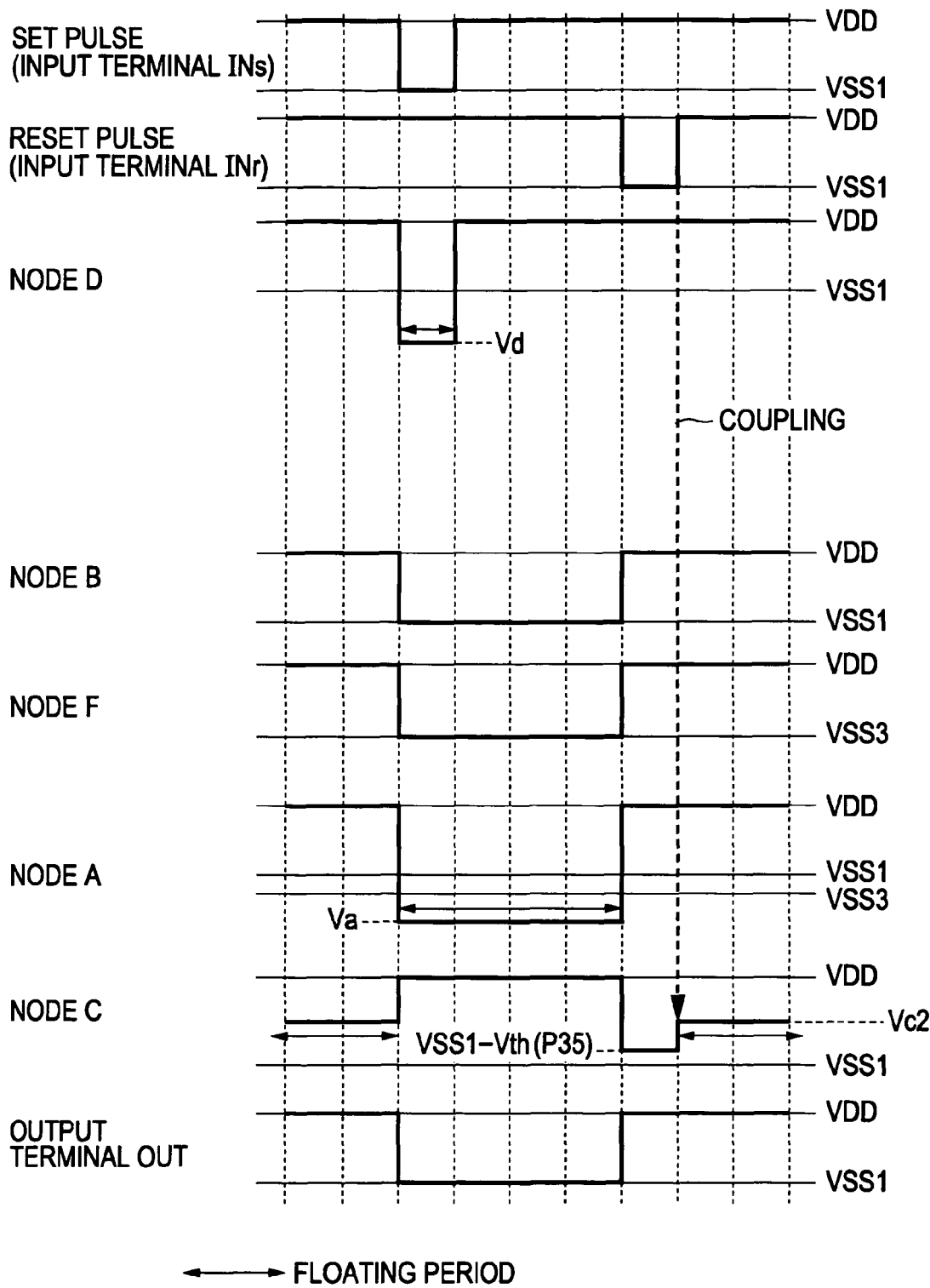
FIG. 100 illustrates drive waveforms of the buffer illustrated in FIG. 99.

FIG. 100 illustrates the relationship of the voltage statuses of the set pulse and the reset pulse and the voltage status of each node. The drive waveforms illustrated in FIG. 100 correspond to the respective drive waveforms illustrated in FIG. 82.

In accordance with the embodiment 33 of the present invention, each of the signal amplitude of the set pulse (input terminal INs) and the signal amplitude of the reset pulse (input terminal INr) is also given between the two values VDD and VSS1.

Referring to FIG. 100, the operation of the buffer 65 of the embodiment 33 remains unchanged from the operation of the buffer 65 of the embodiment 32 in the period from the falling edge of the set pulse to the low level to the falling edge of the reset pulse to the low level.

The operation of the buffer 65 of the embodiment 33 starting with the falling edge of the reset pulse is described below.

When the reset pulse falls from the high level to the low level, the thin-film transistors P34 and P35 become conductive.

In response, the node B rises to the high power-source voltage VDD, and the voltage at the node C falls as illustrated in FIG. 100. The voltage at the node C is a voltage higher than the low power-source voltage VSS1 by a threshold voltage Vth(P35) of the thin-film transistor P35. More specifically, the voltage at the node C is at VSS1−Vth(P35).

The low level (VSS11−Vth(P35)) satisfies the following three conditions:

$VSS1 - Vth(P35) - VDD < Vth(P32),$ $VSS1 - Vth(P35) - VDD < Vth(P37),$ and $VSS1 - Vth(P35) - VDD < Vth(P40).$ Generally, the pulse amplitude (VSS1−VDD) is sufficiently larger than the threshold voltage value Vth, and all the above three conditions are satisfied.

When the node C falls to the low level, the thin-film transistor P32 turns conductive, and the voltage at the output terminal OUT rises to the high power-source voltage VDD as illustrated in FIG. 100.

The reset pulse rises from the low level to the high level. During this voltage transition, a voltage change of the reset pulse interferes with the node C because of the capacitive coupling effect of the thin-film transistor P35 as illustrated in FIG. 100. Although the node C still maintains a low level, the voltage thereof rises to a voltage Vc2 as illustrated in FIG. 100.

The voltage Vc2 satisfies the following three conditions:

$Vc2 - VDD < Vth(P32),$ $Vc2 - VDD < Vth(P37),$ and $Vc2 - VDD < Vth(P40).$

As long as the three conditions are satisfied, the thin-film transistors P32, P37, and P40 remain continuously conductive.

More specifically, the thin-film transistor P32 causes the high power-source voltage VDD to be supplied continuously to the output terminal OUT.

The thin-film transistor P37 causes the high power-source voltage VDD to be supplied continuously to the node B. This arrangement prevents the voltage change of the reset pulse from interfering with the node A via the thin-film transistor P34. The thin-film transistor P31 is free from the shifting of the off-operation point.

The voltage status described above is maintained for a period throughout which the voltage at the node C is maintained at the voltage Vc2. More specifically, the voltage at the node A is maintained at the high power-source voltage VDD until the set pulse is subsequently transitioned to the low level. As a result, the leak current of the thin-film transistor P31 is minimized.

As described above, the buffer 65 of the embodiment 33 even with a smaller component count provides the same operation and advantages as those of the buffer 65 of the embodiment 32.

Embodiment 34

A modification of the buffer 65 of the embodiment 23 is described below as an embodiment 34 of the present invention.

Figure 101:
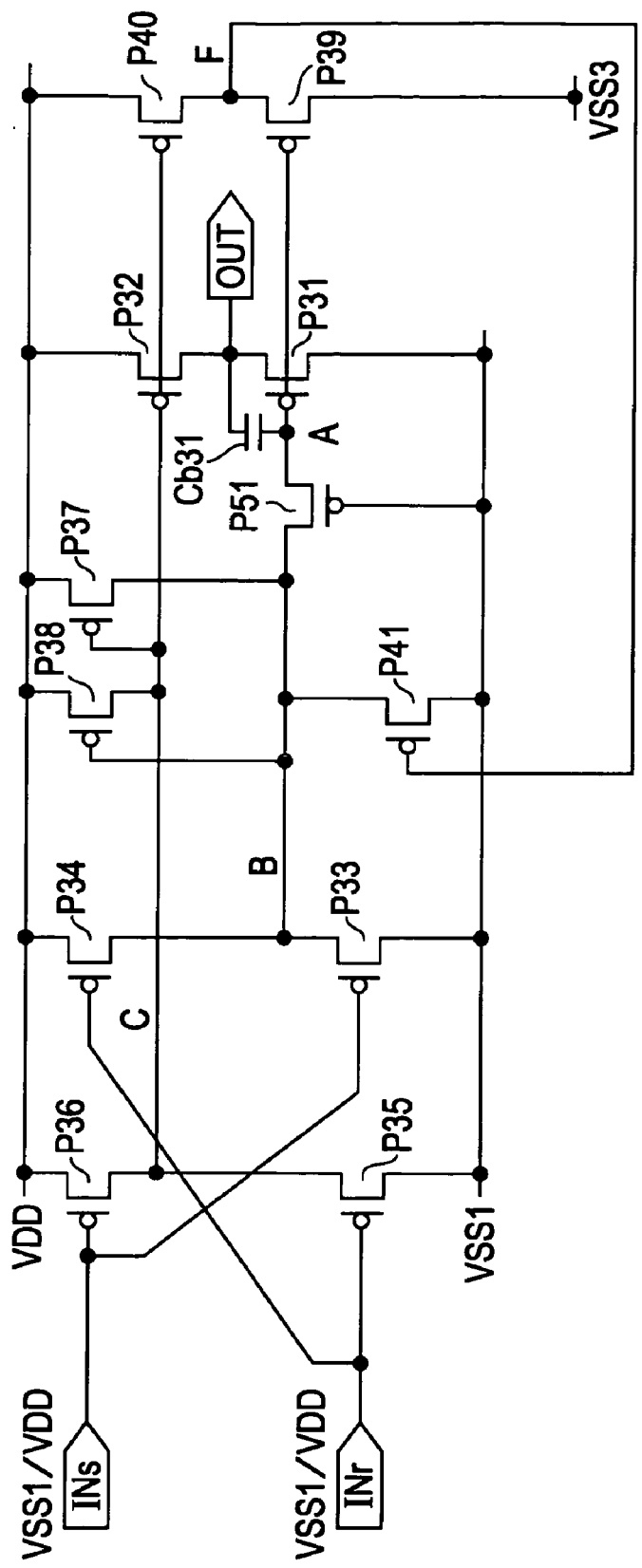
FIG. 101 is a circuit diagram of a buffer according to one embodiment of the present invention.

FIG. 101 illustrates the buffer 65 as the embodiment 34 of the present invention. In FIG. 101, elements identical to those illustrated in FIG. 83 are designated with the same reference numerals.

The buffer 65 of the embodiment 34 has the same circuit structure as the embodiment 33 but with the thin-film transistor P52 removed therefrom. More specifically, the buffer 65 of the embodiment 34 has the circuit structure of the embodiment 32 but with the bootstrap circuits removed from the first and second input stages thereof. In this way, the embodiment 34 of the present invention provides the buffer 65 having a component count smaller than that of the buffer 65 of the embodiment 33. The buffer 65 of the embodiment 34 corresponds to the buffer 65 of the embodiment 25 in drive waveform.

Figure 102:
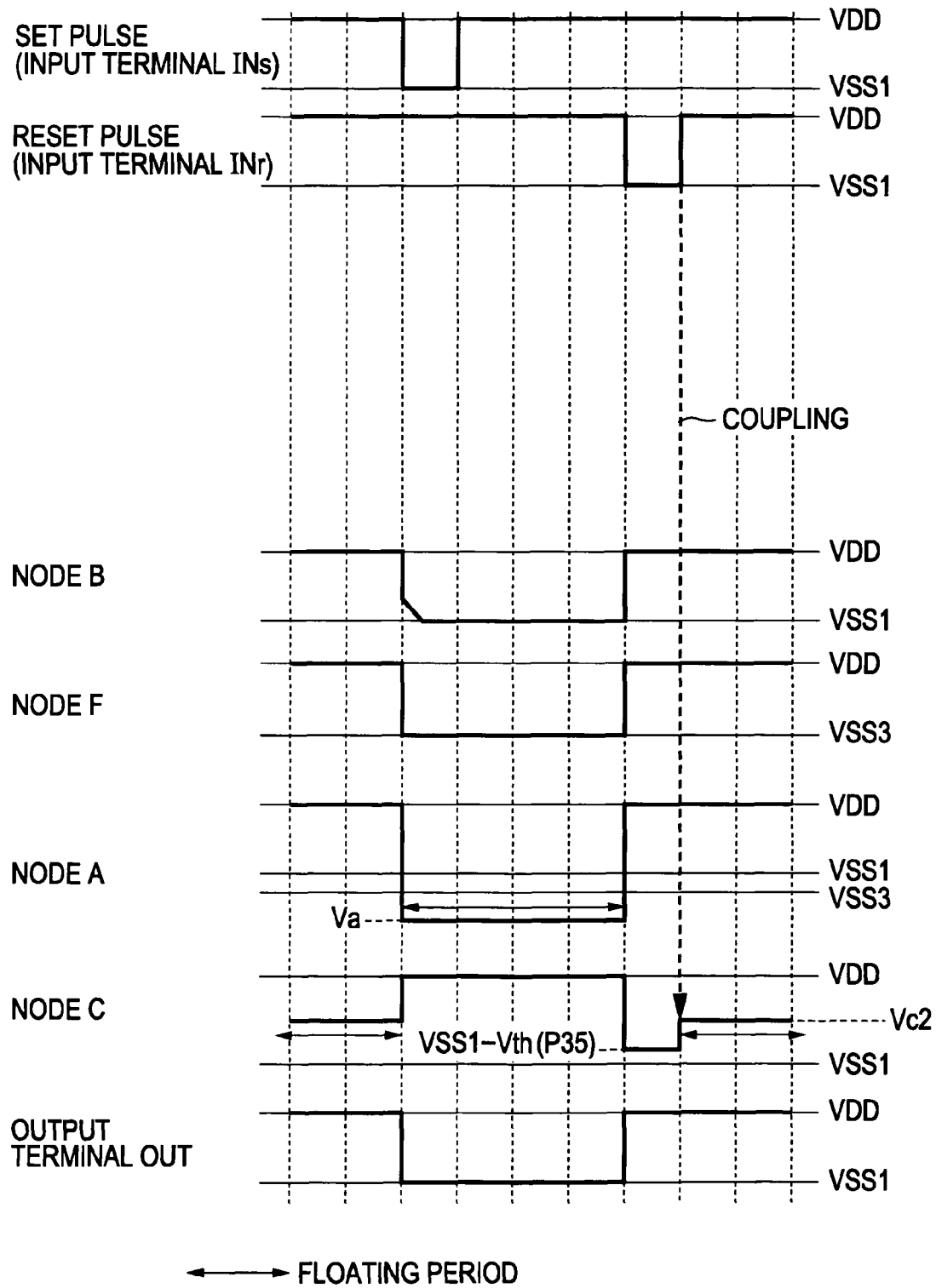
FIG. 102 illustrates drive waveforms of the buffer illustrated in FIG. 101.

FIG. 102 illustrates the relationship of the voltage statuses of the set pulse and the reset pulse and the voltage status of each node. The drive waveforms illustrated in FIG. 102 correspond to the respective drive waveforms illustrated in FIG. 84.

In accordance with the embodiment 34 of the present invention, each of the signal amplitude of the set pulse (input terminal INs) and the signal amplitude of the reset pulse (input terminal INr) is also given between the two values VDD and VSS1.

As previously discussed, the buffer 65 of the embodiment 34 is identical in structure to the buffer 65 of the embodiment 33 in that the thin-film transistor P53 is eliminated. The operation of the buffer 65 subsequent to the falling edge of the reset pulse to the low level remains thus unchanged from the operation of the buffer 65 of the embodiment 33.

The discussion that follows focuses on the operation within the period from the falling edge of the set pulse to the low level to the falling edge of the reset pulse to the low level.

When the set pulse falls to the low level, the thin-film transistors P33 and P36 turn conductive.

In response, the voltage at the node B falls and the voltage at the node C rises to the high power-source voltage VDD as illustrated in FIG. 102.

The buffer 65 of the embodiment 34 includes no bootstrap circuit on the gate electrode side of the thin-film transistor P33. The voltage at the node B immediately subsequent to the falling edge of the set pulse to the low level falls only to a low level determined by VSS1−Vth(P33).

A bootstrap operation to the node A responsive to the voltage falling of the node B to the low level allows the voltage at the node F to fall to the third low power-source voltage VSS3.

The third low power-source voltage VSS3 satisfies VSS3−VSS1<Vth(P41). The thin-film transistor P41 thus turns conductive, thereby supplying the first low power-source voltage VSS1 to the node B as illustrated in FIG. 102.

When the set pulse rises from the low level to the high level, the thin-film transistor P41 causes the node B to be maintained at the low power-source voltage VSS1. While the node B is at the low level, the thin-film transistor P38 fixes the node C to the high power-source voltage VDD.

As described above, the buffer 65 of the embodiment 34 with a smaller component count thereof provides the same operation and advantages as those of the embodiment 33.

Embodiment 35

A modification of the buffer 65 of the embodiment 23 is described below as an embodiment 35 of the present invention.

Figure 103:
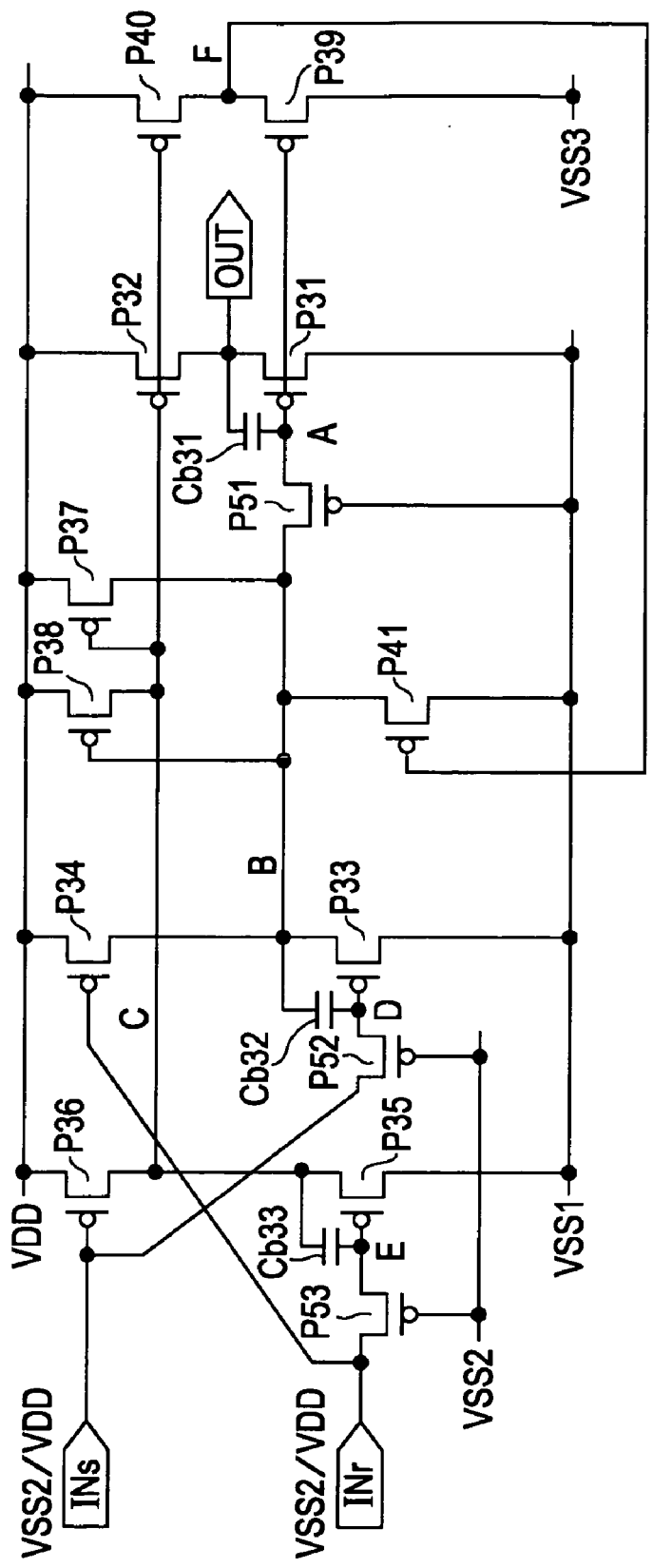
FIG. 103 is a circuit diagram of a buffer according to one embodiment of the present invention.

FIG. 103 illustrates the buffer 65 of the embodiment 35 of the present invention. In FIG. 103, elements identical to those illustrated in FIG. 85 are designated with the same reference numerals.

The buffer 65 of the embodiment 35 has the same circuit structure as the embodiment 32 but with level shifting performed at the first and second input stages.

The gate electrodes of the thin-film transistors P52 and P53 forming the bootstrap circuits of the first and second input stages are connected to the second low power-source voltage VSS2 (>VSS1). With this arrangement, each of the set pulse and the reset pulse has a smaller amplitude and the power consumption of the front section is even more reduced.

The bootstrap auxiliary capacitances Cb33, Cb32, and Cb31 are respectively connected to the first and second input stages and the first output stage. If the thin-film transistors P31, P33, and P35 have sufficiently high gate capacitances, none of the bootstrap auxiliary capacitances Cb31, Cb32, and Cb33 are mounted. The buffer 65 of the embodiment 35 corresponds to the buffer 65 of the embodiment 26 in drive waveform.

The relationship of the voltage statuses of the set pulse and the reset pulse and the voltage status of each node is described with reference to FIG. 104. The drive waveforms illustrated in FIG. 104 correspond to the respective drive waveforms illustrated in FIG. 86.

In accordance with the embodiment 35 of the present invention, each of the signal amplitude of the set pulse (input terminal INs) and the signal amplitude of the reset pulse (input terminal INr) is also given between the two values VDD and VSS2 (>VSS1).

At the moment the set pulse falls to the low level, the node D at the first input stage falls to the low level. The thin-film transistor P33 then turns conductive, causing the voltage at the node B to fall as illustrated in FIG. 104.

Figure 104:
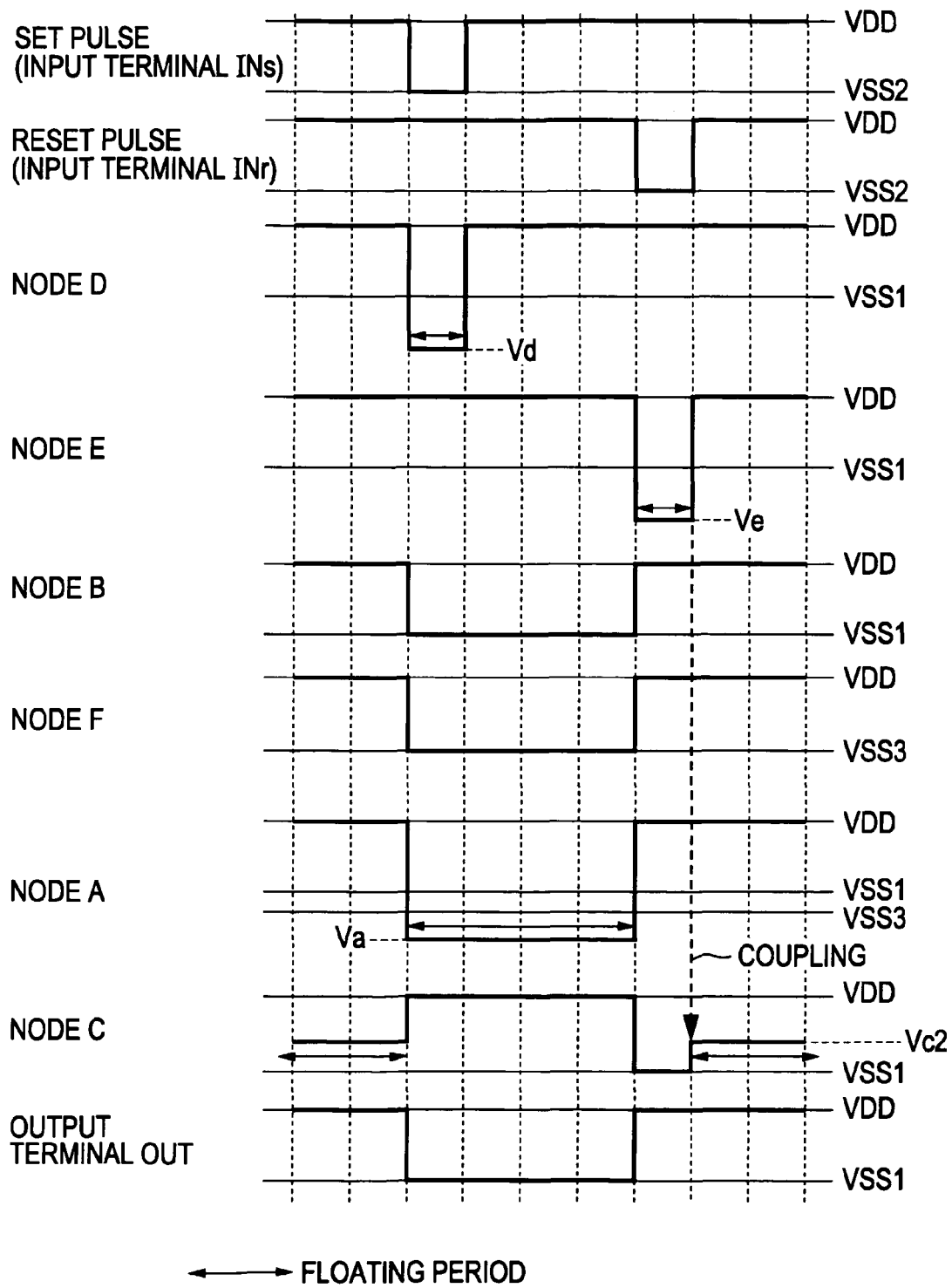
FIG. 104 illustrates drive waveforms of the buffer illustrated in FIG. 103.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 104. If the voltage Vd subsequent to the voltage falling satisfies Vd−VSS1<Vth(P33), the voltage at the node B becomes the low power-source voltage VSS1 with the thin-film transistor P33 conductive as illustrated in FIG. 104.

When the node B falls to the low power-source voltage VSS1 as described above, the node A also falls to a low level. The thin-film transistors P31 and P39 turn conductive, causing the voltage at the output terminal OUT and the voltage at the node F to fall as illustrated in FIG. 104.

As the voltages at the output terminal OUT and the node F fall, the voltage at the node A falls by a voltage excursion responsive to a charge accumulated on the bootstrap auxiliary capacitance Cb31 as illustrated in FIG. 104.

If the voltage Va subsequent to the voltage falling satisfies Va−VSS1<Vth(P31), the voltage at the output terminal OUT becomes the low power-source voltage VSS1 with the thin-film transistor P31 conductive as illustrated in FIG. 104.

The voltage Va subsequent to the voltage falling satisfies a condition of Va−VSS3<Vth(P39). The voltage at the node F with the thin-film transistor P39 conductive becomes the third low power-source voltage VSS3.

The third low power-source voltage VSS3 satisfies VSS3−VSS1<Vth(P41).

The thin-film transistor P41 thus turns conductive, thereby supplying the low power-source voltage VSS1 to the node B.

The thin-film transistor P36 is also conductive with the set pulse at the low level. The gate voltage of the thin-film transistor P32 forming the output stage (voltage at the node C) is thus controlled to the high power-source voltage VDD as illustrated in FIG. 104.

The set pulse then rises from the low level to the high level. During this voltage transition, a voltage change of the set pulse can interfere with the nodes B and C because of the coupling effect.

The gate electrode of the thin-film transistor P41 is supplied with the third low power-source voltage VSS3 via the node F as illustrated in FIG. 104. For this reason, the thin-film transistor P41 remaining conductive causes the voltage at the node B to be fixed to the low power-source voltage VSS1 as illustrated in FIG. 104.

Even after the set pulse rises to the high level, the voltages at the nodes A, B, and F remain at the same level as when the set pulse is at the low level.

Since the voltage at the node B is maintained at the low power-source voltage VSS1, the thin-film transistor P38 remaining conductive continuously supplies the high power-source voltage VDD to the node C as illustrated in FIG. 104.

This means that the node C is insusceptible to the interference responsive to the voltage change of the set pulse (means that the off-operation point of the thin-film transistor P32 is not shifted).

This voltage status is maintained while the node B is at the low power-source voltage VSS1. More specifically, the node C is maintained at the high power-source voltage VDD until the reset pulse is subsequently transitioned to the low level. As a result, the leak current of the thin-film transistor P32 is minimized.

The node B biased at the low power-source voltage VSS1 means that the thin-film transistor P51 is at the cutoff state. The node A is maintained at the floating state at a bootstrap voltage (i.e., Va) as illustrated in FIG. 104. For this reason, the low power-source voltage VSS1 continuously appears at the output terminal OUT of the first output stage as illustrated in FIG. 104.

When the reset pulse is transitioned from the high level to the low level at the input terminal INr in FIG. 104, the thin-film transistor P35 becomes conductive. The voltage at the node C falls as illustrated in FIG. 104. As the voltage at the node C falls, the gate voltage of the thin-film transistor P35 (voltage at the node E) falls by a voltage excursion responsive to a charge accumulated on the bootstrap auxiliary capacitance Cb33 as illustrated in FIG. 104. The resulting voltage subsequent to the voltage falling is Ve. If the voltage Ve satisfies a condition of Ve−VSS1<Vth(P35), the node C reaches the low power-source voltage VSS1 with the thin-film transistor P35 conductive as illustrated in FIG. 104.

When the node C falls to the low power-source voltage VSS1, the thin-film transistors P32 and P40 become conductive. The voltage of the output terminal OUT and the voltage at the node F then rise to the high power-source voltage VDD as illustrated in FIG. 104.

While the reset pulse remains at the low level, the thin-film transistor P34 remains conductive. The voltage at the node B is thus controlled to the high power-source voltage VDD as illustrated in FIG. 104. The gate electrode of the thin-film transistor P31 forming the first output stage (voltage at the node A) also rises to the high power-source voltage VDD.

The reset pulse then rises from the low level to the high level. During this voltage transition, a voltage change of the reset pulse may interfere with the node B and the node C because of the coupling effect.

Although the node C still maintains a low level, the voltage thereof rises from the low power-source voltage VSS1 to a voltage Vc2 as illustrated in FIG. 104.

The voltage Vc2 at the node C satisfies a condition of Vc2−VDD<Vth(P32). The thin-film transistor P32 continues to be conductive, and the voltage at the output terminal OUT is maintained at the high power-source voltage VDD as illustrated in FIG. 104. The voltage Vc2 at the node C also satisfies a condition of Vc2−VDD<Vth(P40). The thin-film transistor P40 thus continues to be conductive, and the voltage at the node F is maintained at the high power-source voltage VDD as illustrated in FIG. 104.

Also, the voltage Vc2 at the node C satisfies Vc2−VSS>Vth(P37). The thin-film transistor P37 thus becomes conductive, and the high power-source voltage VDD is continuously supplied to the node B.

This means that the node B is insusceptible to the interference responsive to the voltage change of the set pulse (means that the off-operation point of the thin-film transistor P31 is not shifted) as illustrated in FIG. 104.

The above-described voltage status is maintained while the node C is at the voltage Vc2. More specifically, the node B is kept to the high power-source voltage VDD until the set pulse is subsequently transitioned to the low level. As a result, the leak current of the thin-film transistor P31 is minimized.

The buffer 65 thus constructed provides the same operation and advantages as those of the buffer 65 of the embodiment 23.

Moreover, the buffer 65 of the embodiment 35 causes a signal amplitude of each of the set pulse and the reset pulse to be smaller than the signal amplitude of the output pulse. For this reason, the power consumption of the front section (such as the shift register) is reduced to be lower than that of the other embodiments.

Embodiment 36

A modification of the buffer 65 of the embodiment 23 is described below as an embodiment 36 of the present invention.

Figure 105:
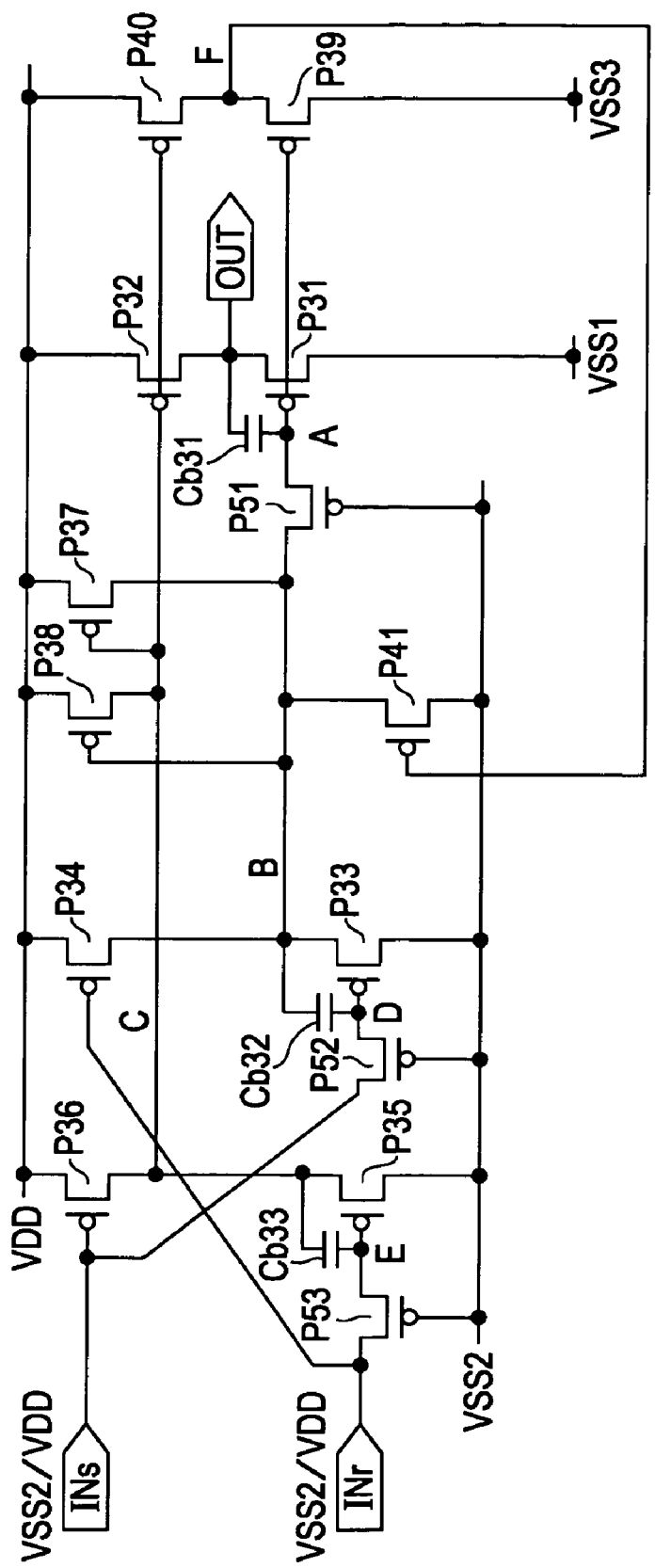
FIG. 105 is a circuit diagram of a buffer according to one embodiment of the present invention.

FIG. 105 illustrates the buffer 65 of the embodiment 36 of the present invention. In FIG. 105, elements identical to those illustrated in FIG. 97 are designated with the same reference numerals.

The buffer 65 of the embodiment 36 has the circuit structure with level shifting performed at the first output stage.

Only the thin-film transistors P31 and P32 in the final portion of the output stage are supplied with the low power-source voltage VSS1 and the thin-film transistors arranged at the front section are supplied with the second low power-source voltage VSS2 (>VSS11). With this arrangement, each of the set pulse and the reset pulse has a smaller amplitude and the power consumption of the buffer 65 is even more reduced. The buffer 65 of the embodiment 36 corresponds to the buffer 65 of the embodiment 27 in drive waveform.

The relationship of the voltage statuses of the set pulse and the reset pulse and the voltage status of each node is described with reference to FIG. 106. The drive waveforms illustrated in FIG. 106 correspond to the respective drive waveforms illustrated in FIG. 88.

Figure 106:
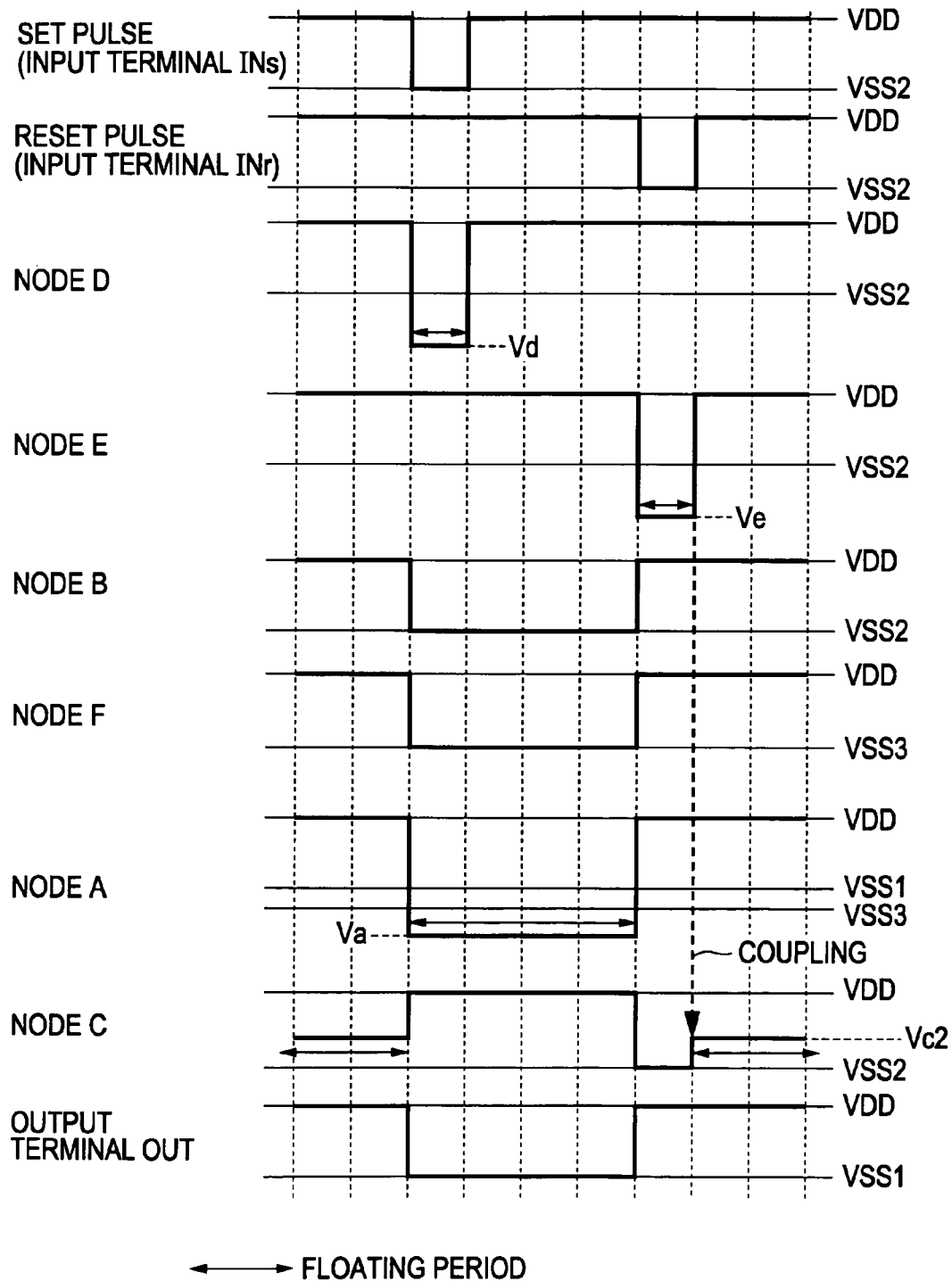
FIG. 106 illustrates drive waveforms of the buffer illustrated in FIG. 105.

In accordance with the embodiment 36 of the present invention, each of the signal amplitude of the set pulse (input terminal INs) and the signal amplitude of the reset pulse (input terminal INr) is given between the two values VDD and VSS2 (>VSS1) as illustrated in FIG. 106.

At the moment the set pulse falls to the low level, the node D at the first input stage falls to the low level. The thin-film transistor P33 then turns conductive, causing the voltage at the node B to fall as illustrated in FIG. 106.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 106. If the voltage Vd subsequent to the voltage falling satisfies Vd−VSS2<Vth(P33), the voltage at the node B becomes the second low power-source voltage VSS2 with the thin-film transistor P33 conductive as illustrated in FIG. 106.

When the node B falls to the second low power-source voltage VSS2 as described above, the node A also falls to a low level. The thin-film transistors P31 and P39 turn conductive, causing the voltage at the output terminal OUT and the voltage at the node F to fall as illustrated in FIG. 106.

As the voltages at the output terminal OUT and the node F fall, the voltage at the node A falls by a voltage excursion responsive to a charge accumulated on the bootstrap auxiliary capacitance Cb31 as illustrated in FIG. 106.

If the voltage Va subsequent to the voltage falling satisfies Va−VSS1<Vth(P31), the voltage at the output terminal OUT becomes the low power-source voltage VSS1 with the thin-film transistor P31 conductive as illustrated in FIG. 106. In other words, changing of the pulse amplitude is performed.

The voltage Va subsequent to the voltage falling satisfies a condition of Va−VSS3<Vth(P39). The voltage at the node F with the thin-film transistor P39 conductive becomes the third low power-source voltage VSS3 as illustrated in FIG. 106.

The third low power-source voltage VSS3 satisfies VSS3−VSS1<Vth(P41).

In accordance with the embodiment 36, a condition of VSS3−VSS2<Vth(P41) is satisfied, and the thin-film transistor P41 turns conductive. The thin-film transistor P41 thus supplies the second low power-source voltage VSS2 to the node B.

The thin-film transistor P36 is also conductive with the set pulse at the low level. The gate voltage of the thin-film transistor P32 forming the output stage (voltage at the node C) is thus controlled to the high power-source voltage VDD as illustrated in FIG. 106.

The set pulse then rises from the low level to the high level. During this voltage transition, a voltage change of the set pulse can interfere with the nodes B and C because of the coupling effect.

The gate electrode of the thin-film transistor P41 is supplied with the third low power-source voltage VSS3 via the node F as illustrated in FIG. 106. For this reason, the thin-film transistor P41 remaining conductive causes the voltage at the node B to be fixed to the second low power-source voltage VSS2 as illustrated in FIG. 106.

Even after the set pulse rises to the high level, the voltages at the nodes A, B, and F remain at the same level as when the set pulse is at the low level.

Since the voltage at the node B is maintained at the second low power-source voltage VSS2, the thin-film transistor P38 remaining conductive continuously supplies the high power-source voltage VDD to the node C as illustrated in FIG. 106.

This means that the node C is insusceptible to the interference responsive to the voltage change of the set pulse (means that the off-operation point of the thin-film transistor P32 is not shifted).

This voltage status is maintained while the node B is at the second low power-source voltage VSS2. More specifically, the node C is maintained at the high power-source voltage VDD until the reset pulse is subsequently transitioned to the low level. As a result, the leak current of the thin-film transistor P32 is minimized.

The node B biased at the second low power-source voltage VSS2 means that the thin-film transistor P51 is at the cutoff state. The node A is maintained at the floating state at a bootstrap voltage (i.e., Va) as illustrated in FIG. 106. For this reason, the low power-source voltage VSS1 continuously appears at the output terminal OUT of the first output stage as illustrated in FIG. 106.

When the reset pulse is transitioned from the high level to the low level at the input terminal INr in FIG. 106, the thin-film transistor P35 becomes conductive. The voltage at the node C falls as illustrated in FIG. 106. As the voltage at the node C falls, the gate voltage of the thin-film transistor P35 (voltage at the node E) falls by a voltage excursion responsive to a charge accumulated on the bootstrap auxiliary capacitance Cb33 as illustrated in FIG. 106. The resulting voltage subsequent to the voltage falling is Ve. If the voltage Ve satisfies a condition of Ve−VSS2<Vth(P35), the node C reaches the second low power-source voltage VSS2 with the thin-film transistor P35 conductive as illustrated in FIG. 106.

When the node C falls to the second low power-source voltage VSS2, the thin-film transistors P32 and P40 become conductive. The voltage of the output terminal OUT and the voltage at the node F then rise to the high power-source voltage VDD as illustrated in FIG. 106.

While the reset pulse remains at the low level, the thin-film transistor P34 remains conductive. The voltage at the node B is thus controlled to the high power-source voltage VDD as illustrated in FIG. 106. The gate electrode of the thin-film transistor P31 forming the first output stage (voltage at the node A) also rises to the high power-source voltage VDD.

The reset pulse then rises from the low level to the high level. During this voltage transition, a voltage change of the reset pulse may interfere with the node B and the node C because of the coupling effect.

Although the node C still maintains a low level, the voltage thereof rises from the second low power-source voltage VSS2 to a voltage Vc2 as illustrated in FIG. 106.

The voltage Vc2 at the node C satisfies a condition of Vc2−VDD<Vth(P32). The thin-film transistor P32 continues to be conductive, and the voltage at the output terminal OUT is maintained at the high power-source voltage VDD as illustrated in FIG. 106. The voltage Vc2 at the node C also satisfies a condition of Vc2−VDD<Vth(P40). The thin-film transistor P40 thus continues to be conductive, and the voltage at the node F is maintained at the high power-source voltage VDD as illustrated in FIG. 106.

Also, the voltage Vc2 at the node C satisfies Vc2−VDD<Vth(P37). The thin-film transistor P37 thus becomes conductive, and the high power-source voltage VDD is continuously supplied to the node B.

This means that the node B is insusceptible to the interference responsive to the voltage change of the set pulse (means that the off-operation point of the thin-film transistor P31 is not shifted) as illustrated in FIG. 106.

The above-described voltage status is maintained while the node C is at the voltage Vc2. More specifically, the node B is kept to the high power-source voltage VDD until the set pulse is subsequently transitioned to the low level. As a result, the leak current of the thin-film transistor P31 is minimized.

The buffer 65 of the embodiment 27 not only reduces the signal amplitude of each of the set pulse and the reset pulse but also reduces the signal amplitudes of the signals within the remaining stages of the buffer 65 other than the final output stage. For this reason, not only power consumed by a front section (such as the shift register) but also power consumed by the buffer 65 is reduced more than in the other embodiments.

Embodiment 37

A modification of the buffer 65 of the embodiment 23 is described below as an embodiment 37 of the present invention.

Figure 107:
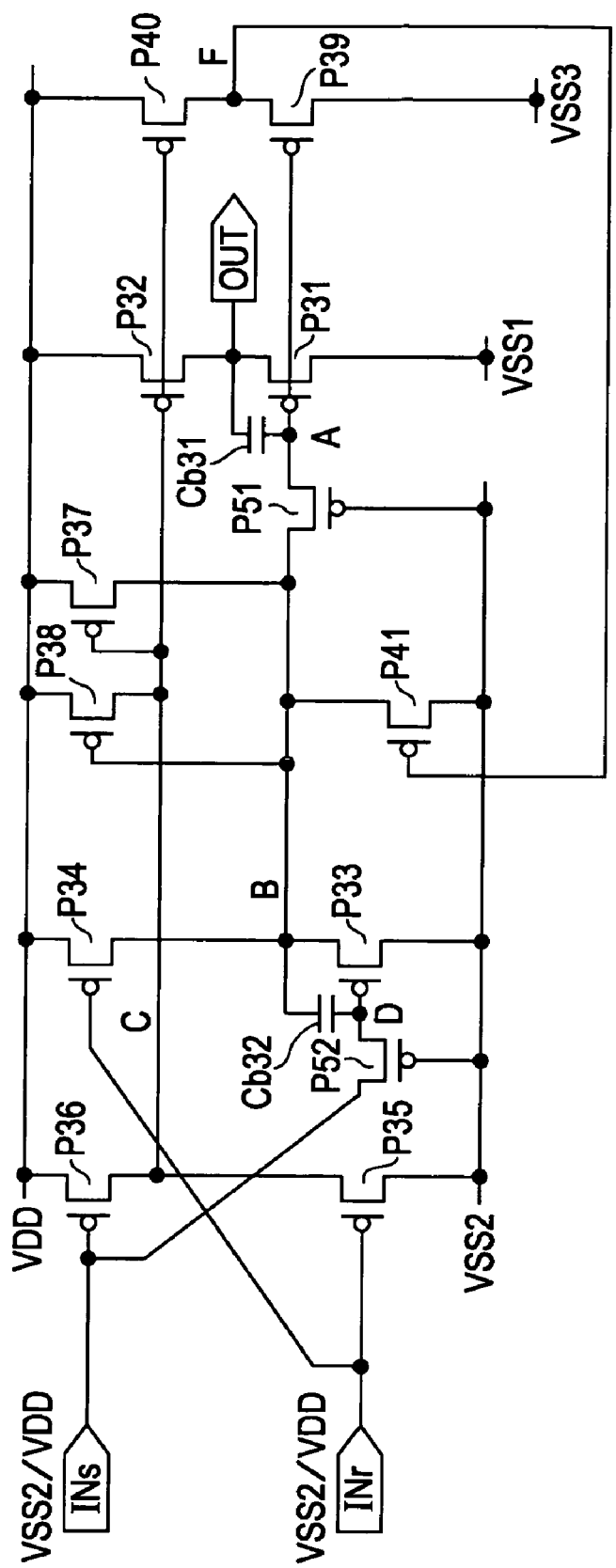
FIG. 107 is a circuit diagram of a buffer according to one embodiment of the present invention.

FIG. 107 illustrates the buffer 65 as the embodiment 37 of the present invention. In FIG. 107, elements identical to those illustrated in FIG. 97 are designated with the same reference numerals.

The buffer 65 of the embodiment 37 has the circuit structure of the embodiment 36 but with the thin-film transistor P53 removed therefrom. More specifically, the buffer 65 of the embodiment 37 has no bootstrap circuit on the second input stage. With this arrangement, the buffer 65 has a component count smaller than that of the embodiment 36. The buffer 65 of the embodiment 37 corresponds to the buffer 65 of the embodiment 28 in drive waveform.

Figure 108:
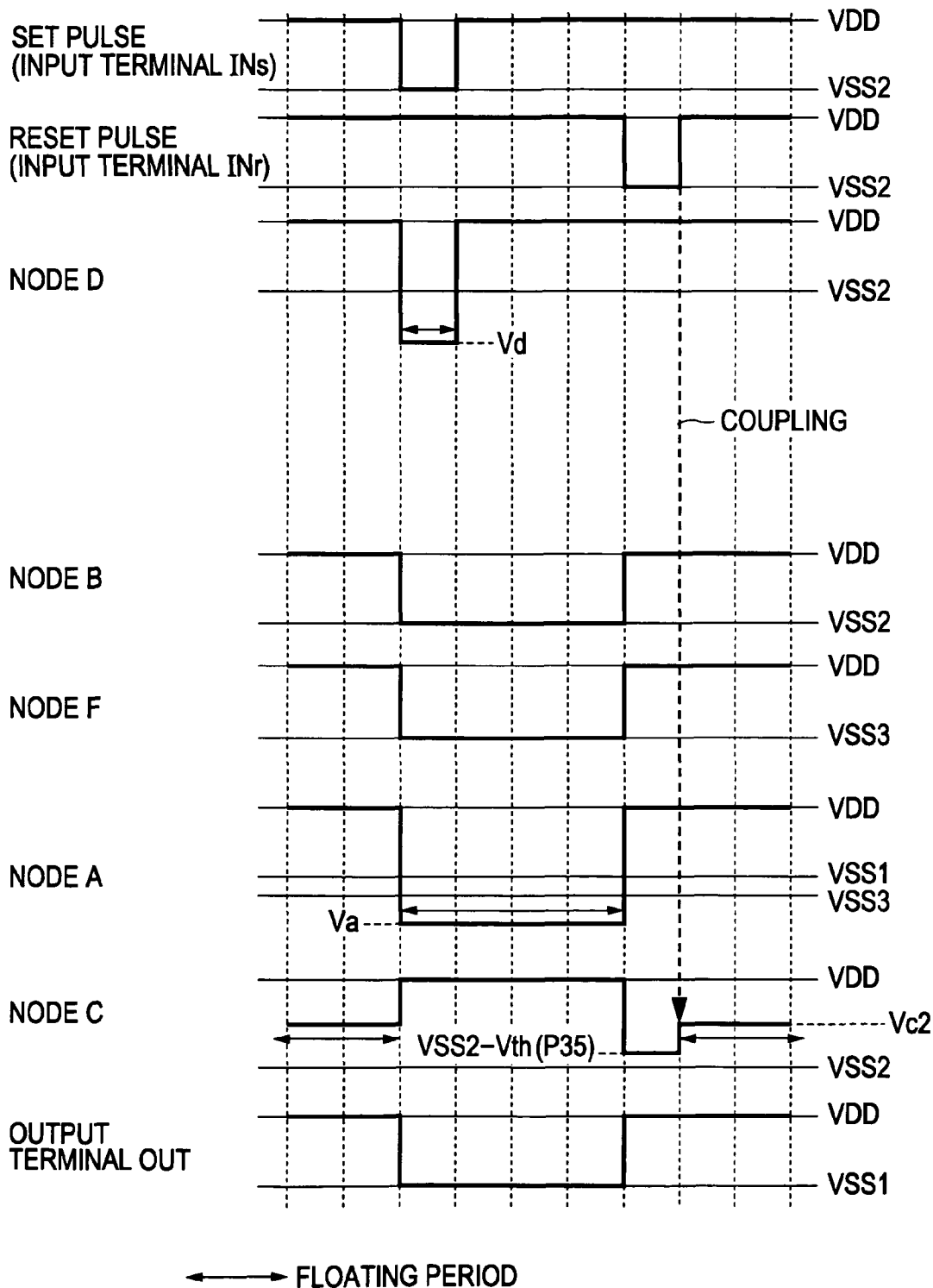
FIG. 108 illustrates drive waveforms of the buffer illustrated in FIG. 107.

FIG. 108 illustrates the relationship of the voltage statuses of the set pulse and the reset pulse and the voltage status of each node. The drive waveforms illustrated in FIG. 108 correspond to the respective drive waveforms illustrated in FIG. 90.

In accordance with the embodiment 37 of the present invention, each of the signal amplitude of the set pulse (input terminal INs) and the signal amplitude of the reset pulse (input terminal INr) is given between the two values VDD and VSS2 (>VSS1).

Referring to FIG. 108, the operation of the buffer 65 of the embodiment 37 remains unchanged from the operation of the buffer 65 of the embodiment 36 in the period from the falling edge of the set pulse to the low level to the falling edge of the reset pulse to the low level.

The operation of the buffer 65 of the embodiment 37 starting with the falling edge of the reset pulse is described below.

When the reset pulse falls from the high level to the low level, the thin-film transistors P34 and P35 become conductive.

In response, the node B rises to the high power-source voltage VDD, and the voltage at the node C falls as illustrated in FIG. 108. The voltage at the node C is a voltage higher than the second low power-source voltage VSS2 by a threshold voltage Vth(P35) of the thin-film transistor P35. More specifically, the voltage at the node C falls to VSS2−Vth(P35).

The low level (VSS2−Vth(P35)) satisfies the following three conditions:

$VSS2-Vth(P35)-VDD<Vth(P32),$ $VSS2-Vth(P35)-VDD<Vth(P37),$ and $VSS2-Vth(P35)-VDD<Vth(P40).$ Generally, the pulse amplitude (VSS2−VDD) is sufficiently larger than the threshold voltage value Vth, and all the above three conditions are satisfied.

When the node C falls to the low level, the thin-film transistor P32 turns conductive, and the voltage at the output terminal OUT rises to the high power-source voltage VDD as illustrated in FIG. 108. Also, the thin-film transistor P40 turns conductive, causing the node F to rise to the high power-source voltage VDD as illustrated in FIG. 108.

The thin-film transistor P34 that has turned conductive controls the voltage at the node B to the high power-source voltage VDD as illustrated in FIG. 108. As a result, the voltage at the node A is also controlled to the high power-source voltage VDD as illustrated in FIG. 108.

The reset pulse rises from the low level to the high level. During this voltage transition, a voltage change of the reset pulse interferes with the node C because of the capacitive coupling effect of the thin-film transistor P35 as illustrated in FIG. 108. Although the node C still maintains a low level, the voltage thereof rises to a voltage Vc2 as illustrated in FIG. 108.

The voltage Vc2 satisfies the following three conditions:

$Vc2-VDD<Vth(P32),$ $Vc2-VDD<Vth(P37),$ and $Vc2-VDD<Vth(P40).$

As long as the three conditions are satisfied, the thin-film transistors P32, P37, and P40 remain continuously conductive.

More specifically, the thin-film transistor P32 causes the high power-source voltage VDD to be supplied continuously to the output terminal OUT.

The thin-film transistor P37 causes the high power-source voltage VDD to be supplied continuously to the node B. This arrangement prevents the voltage change of the reset pulse from interfering with the node A via the thin-film transistor P34. The thin-film transistor P31 is free from the shifting of the off-operation point.

The voltage status described above is maintained for a period throughout which the voltage at the node C is maintained at the voltage Vc2. More specifically, the voltage at the node A is maintained at the high power-source voltage VDD until the set pulse is subsequently transitioned to the low level. As a result, the leak current of the thin-film transistor P31 is minimized.

As described above, the buffer 65 of the embodiment 37 even with a smaller component count provides the same operation and advantages as those of the buffer 65 of the embodiment 36.

Embodiment 38

A modification of the buffer 65 of the embodiment 23 is described below as an embodiment 38 of the present invention.

Figure 109:
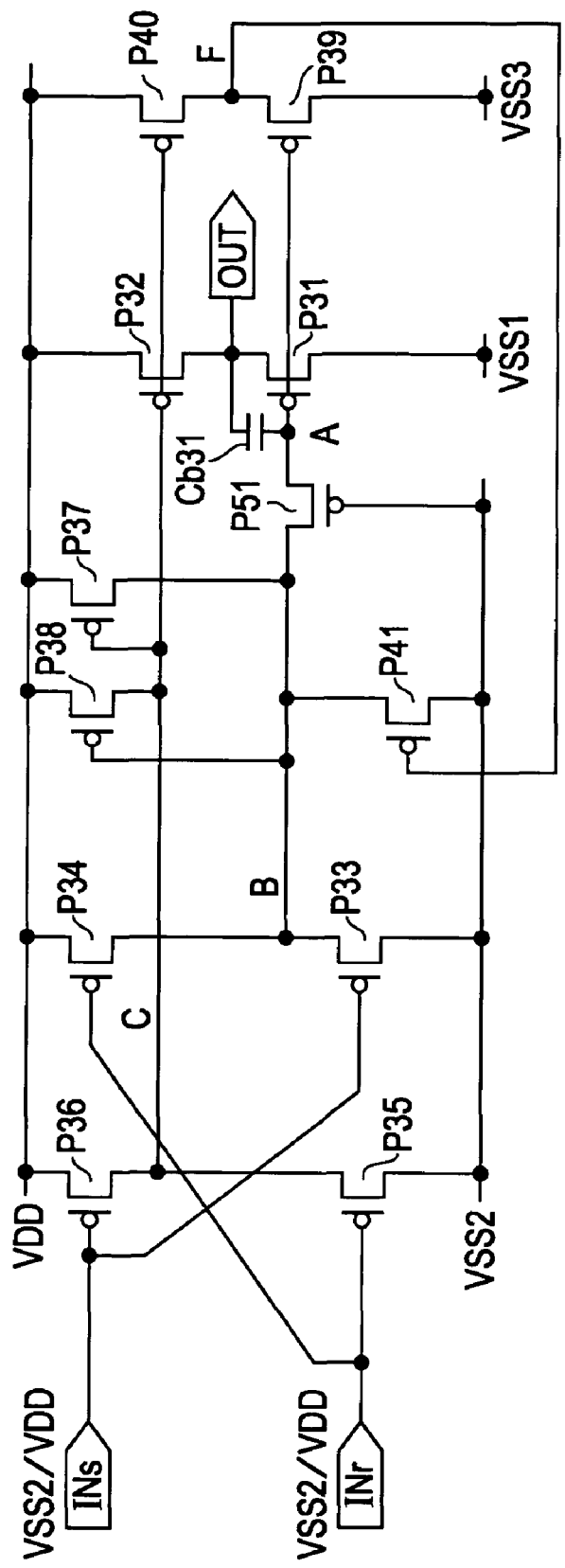
FIG. 109 is a circuit diagram of a buffer according to one embodiment of the present invention.

FIG. 109 illustrates the buffer 65 as the embodiment 38 of the present invention. In FIG. 109, elements identical to those illustrated in FIG. 105 are designated with the same reference numerals.

The buffer 65 of the embodiment 38 has the same circuit structure as the embodiment 37 but with the thin-film transistor P52 removed therefrom. More specifically, the buffer 65 of the embodiment 38 has the circuit structure of the embodiment 36 but with the bootstrap circuits removed from the first and second input stages thereof. In this way, the embodiment 38 of the present invention provides the buffer 65 having a component count smaller than that of the buffer 65 of the embodiment 37. The buffer 65 of the embodiment 38 corresponds to the buffer 65 of the embodiment 29 in drive waveform.

Figure 110:
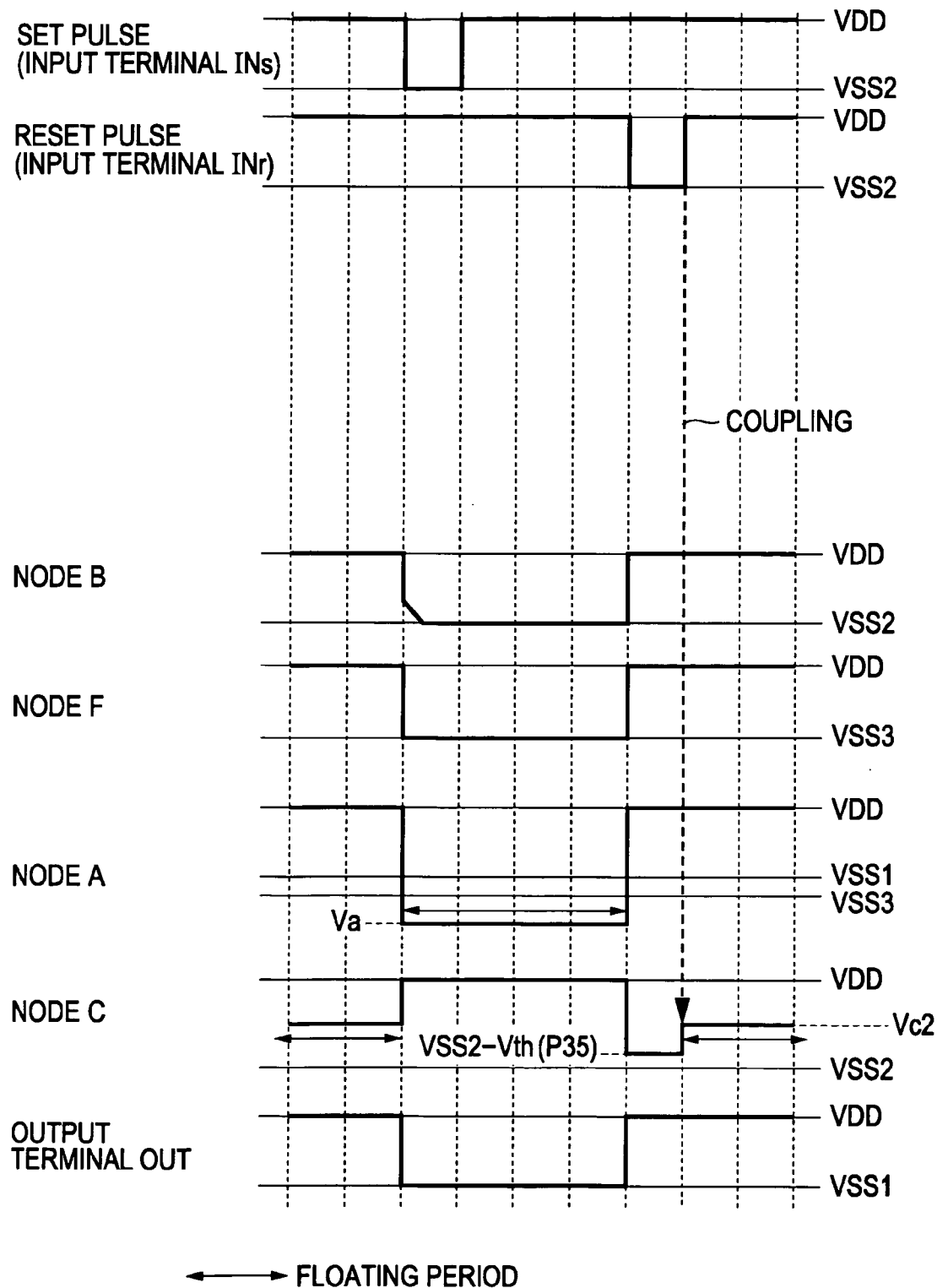
FIG. 110 illustrates drive waveforms of the buffer illustrated in FIG. 109.

FIG. 110 illustrates the relationship of the voltage statuses of the set pulse and the reset pulse and the voltage status of each node.

The drive waveforms illustrated in FIG. 110 correspond to the respective drive waveforms illustrated in FIG. 92.

In accordance with the embodiment 38 of the present invention, each of the signal amplitude of the set pulse (input terminal INs) and the signal amplitude of the reset pulse (input terminal INr) is given between the two values VDD and VSS2 (>VSS1).

As previously discussed, the buffer 65 of the embodiment 38 is identical in structure to the buffer 65 of the embodiment 37 in that the thin-film transistor P53 is eliminated. The operation of the buffer 65 subsequent to the rising edge of the reset pulse to the low level remains thus unchanged from the operation of the buffer 65 of the embodiment 37.

The discussion that follows focuses on the operation within the period from the falling edge of the set pulse to the low level to the falling edge of the reset pulse to the low level.

When the set pulse falls to the low level, the thin-film transistors P33 and P36 turn conductive.

In response, the voltage at the node B falls and the voltage at the node C rises to the high power-source voltage VDD as illustrated in FIG. 110.

The buffer 65 of the embodiment 38 includes no bootstrap circuit on the gate electrode side of the thin-film transistor P33. The voltage at the node B immediately subsequent to the falling edge of the set pulse to the low level falls only to a low level determined by VSS2−Vth(P33).

When the node B falls to the low level, the voltage at the output terminal OUT also falls to the low level. A bootstrap operation to the node A allows the voltage at the node F to fall to the third low power-source voltage VSS3.

The third low power-source voltage VSS3 subsequent to the voltage falling satisfies a condition of VSS3−VSS2<Vth (P41). The thin-film transistor P41 thus turns conductive, thereby supplying the second low power-source voltage VSS2 to the node B as illustrated in FIG. 110.

When the set pulse rises from the low level to the high level, the thin-film transistor P41 causes the node B to be maintained at the second low power-source voltage VSS2. While the node B is at the low level, the thin-film transistor P38 fixes the node C to the high power-source voltage VDD.

As described above, the buffer 65 of the embodiment 38 with a smaller component count thereof provides the same operation and advantages as those of the embodiment 37.

Embodiment 39

A modification of the buffer 65 of the embodiment 23 is described below as an embodiment 39 of the present invention.

Figure 111:
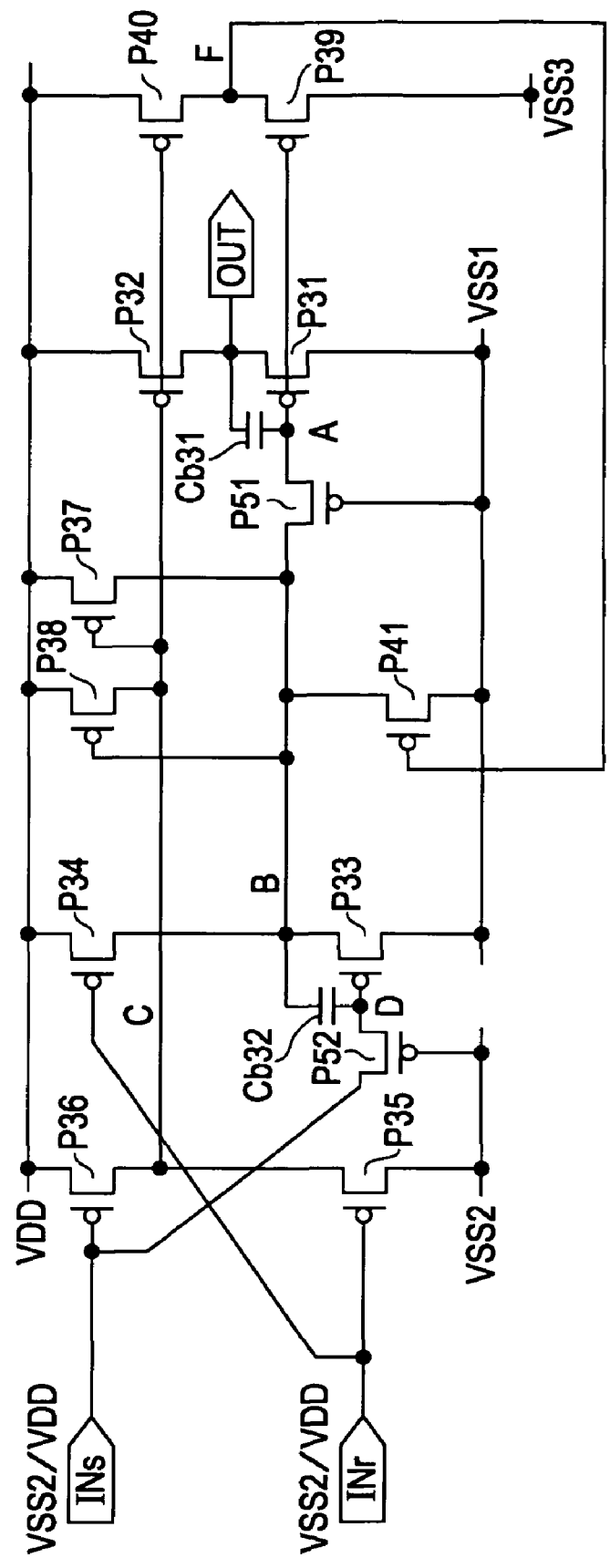
FIG. 111 is a circuit diagram of a buffer according to one embodiment of the present invention.

FIG. 111 illustrates the buffer 65 of the embodiment 39 of the present invention. In FIG. 111, elements identical to those illustrated in FIG. 99 are designated with the same reference numerals.

The buffer 65 of the embodiment 39 has the circuit structure of the embodiment 33 but with level shifting performed at the first input stage.

One of the main electrodes of the thin-film transistor P35 forming the second input stage and the gate electrode of the thin-film transistor P52 forming the first input stage are connected to the second low power-source voltage VSS2 (>VSS1). With this arrangement, each of the set pulse and the reset pulse has a smaller amplitude and front section of the buffer 65 consumes less power than the buffer 65 of the embodiment 33. The buffer 65 of the embodiment 39 corresponds to the buffer 65 of the embodiment 30 in drive waveform.

Figure 112:
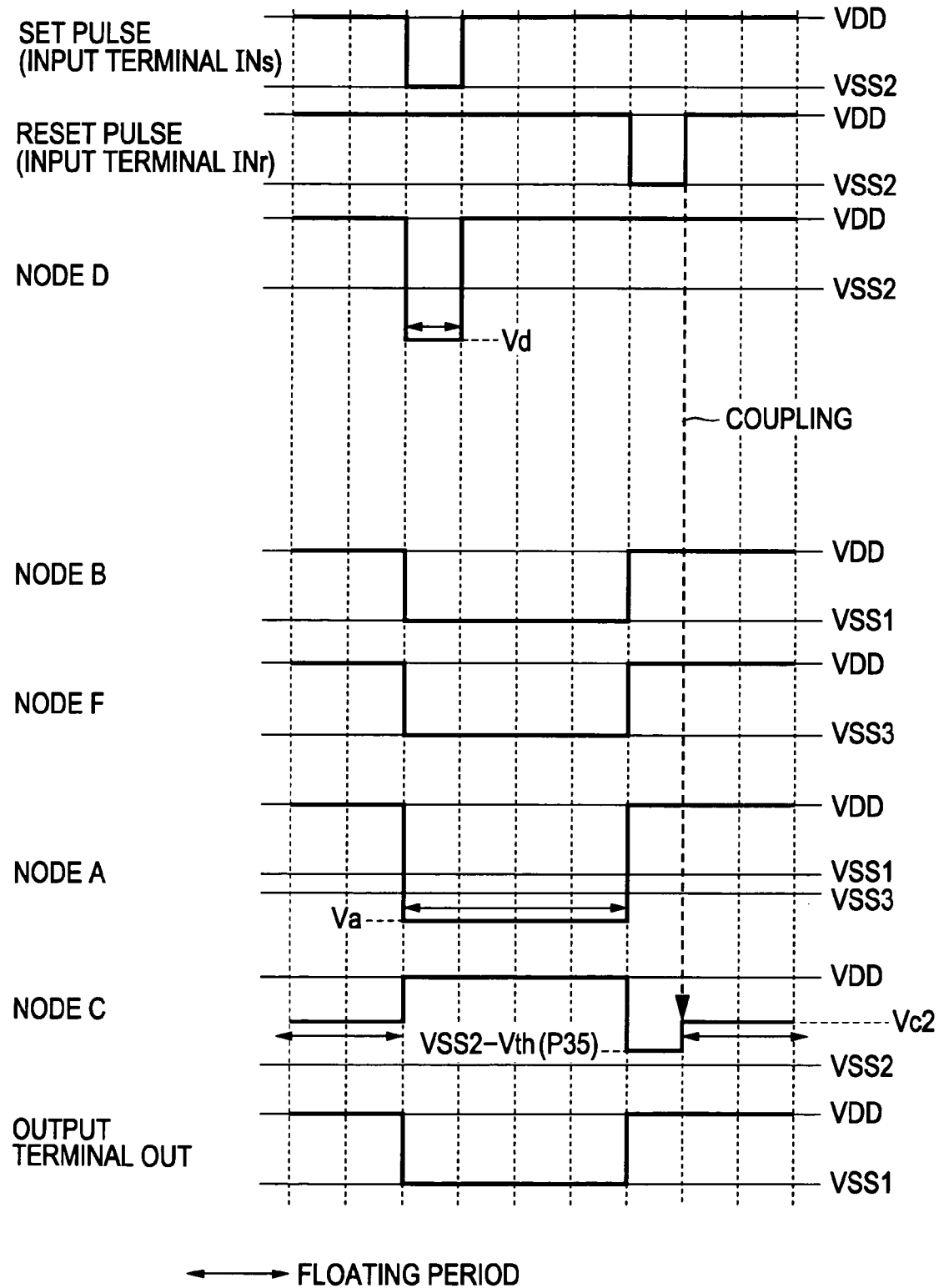
FIG. 112 illustrates drive waveforms of the buffer illustrated in FIG. 111.

FIG. 112 illustrates the relationship of the voltage statuses of the set pulse and the reset pulse and the voltage status of each node. The drive waveforms illustrated in FIG. 112 correspond to the respective drive waveforms illustrated in FIG. 94.

In accordance with the embodiment 39 of the present invention, each of the signal amplitude of the set pulse (input terminal INs) and the signal amplitude of the reset pulse (input terminal INr) is also given between the two values VDD and VSS2 (>VSS1) as illustrated in FIG. 112.

At the moment the set pulse falls to the low level, the node D at the first input stage falls to the low level. The thin-film transistor P33 then turns conductive, causing the voltage at the node B to fall as illustrated in FIG. 112.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 112. If the voltage Vd subsequent to the voltage falling satisfies Vd−VSS1<Vth(P33), the voltage at the node B becomes the low power-source voltage VSS1 with the thin-film transistor P33 conductive as illustrated in FIG. 112. In other words, changing of the pulse amplitude is performed.

When the node B falls to the low power-source voltage VSS1 as described above, the node A also falls to a low level. The thin-film transistors P31 and P39 turn conductive, causing the voltage at the output terminal OUT and the voltage at the node F to fall as illustrated in FIG. 112.

As the voltages at the output terminal OUT and the node F fall, the voltage at the node A falls by a voltage excursion responsive to a charge accumulated on the bootstrap auxiliary capacitance Cb31 as illustrated in FIG. 112.

If the voltage Va subsequent to the voltage falling satisfies Va−VSS1<Vth(P31), the voltage at the output terminal OUT becomes the low power-source voltage VSS1 with the thin-film transistor P31 conductive as illustrated in FIG. 112.

The voltage Va subsequent to the voltage falling satisfies a condition of Va−VSS3<Vth(P39), and the voltage at the node F becomes the third low power-source voltage VSS3 with the thin-film transistor P39 conductive as illustrated in FIG. 112.

The third low power-source voltage VSS3 is determined to satisfy a condition of VSS3−VSS1<Vth(P41).

The thin-film transistor P41 turns conductive, thereby supplying the low power-source voltage VSS1 to the node B.

The thin-film transistor P36 is also conductive with the set pulse at the low level. The gate voltage of the thin-film transistor P32 forming the output stage (voltage at the node C) is thus controlled to the high power-source voltage VDD as illustrated in FIG. 112.

The set pulse then rises from the low level to the high level. During this voltage transition, a voltage change of the set pulse can interfere with the nodes B and C because of the coupling effect.

The gate electrode of the thin-film transistor P41 is supplied with the third low power-source voltage VSS3 via the node F as illustrated in FIG. 112. For this reason, the thin-film transistor P41 remaining conductive causes the voltage at the node B to be fixed to the low power-source voltage VSS1 as illustrated in FIG. 112. This voltage status is characteristic of the embodiment 39.

Even after the set pulse rises to the high level, the voltages at the nodes A, B, and F remain at the same level as when the set pulse is at the low level.

Since the voltage at the node B is maintained at the low power-source voltage VSS1, the thin-film transistor P38 remaining conductive continuously supplies the high power-source voltage VDD to the node C as illustrated in FIG. 112.

This means that the node C is insusceptible to the interference responsive to the voltage change of the set pulse (means that the off-operation point of the thin-film transistor P32 is not shifted).

This voltage status is maintained while the node B is at the low power-source voltage VSS1. More specifically, the node C is maintained at the high power-source voltage VDD until the reset pulse is subsequently transitioned to the low level. As a result, the leak current of the thin-film transistor P32 is minimized.

The node B biased at the low power-source voltage VSS1 means that the thin-film transistor P51 is at the cutoff state. The node A is maintained at the floating state at a bootstrap voltage (i.e., Va) as illustrated in FIG. 112. For this reason, the low power-source voltage VSS1 continuously appears at the output terminal OUT of the first output stage as illustrated in FIG. 112.

When the reset pulse is transitioned from the high level to the low level at the input terminal INr in FIG. 112, the thin-film transistor P35 becomes conductive. The voltage at the node C falls as illustrated in FIG. 112. The voltage at the node C is a voltage higher than the second low power-source voltage VSS2 by the threshold voltage value Vth(P35) of the thin-film transistor P35. More specifically, the node C falls to VSS2−Vth(P35).

The low level (VSS2−Vth(P35)) satisfies the following three conditions:

$VSS2-Vth(P35)-VDD<Vth(P32)$, $VSS2-Vth(P35)-VDD<Vth(P37)$, and $VSS2-Vth(P35)-VDD<Vth(P40)$.

Generally, the pulse amplitude (VSS2−VDD) is sufficiently larger than the threshold voltage value Vth, and all the above three conditions are satisfied.

When the node C falls to the low level, the thin-film transistor P32 turns conductive, and the voltage at the output terminal OUT rises to the high power-source voltage VDD as illustrated in FIG. 112.

The reset pulse rises from the low level to the high level. During this voltage transition, a voltage change of the reset pulse interferes with the node C because of the capacitive coupling effect of the thin-film transistor P35 as illustrated in FIG. 112. Although the node C still maintains a low level, the voltage thereof rises to a voltage Vc2 as illustrated in FIG. 112.

The voltage Vc2 satisfies the following three conditions:

$Vc2-VDD<Vth(P32)$, $Vc2-VDD<Vth(P37)$, and $Vc2-VDD<Vth(P40)$.

As long as the three conditions are satisfied, the thin-film transistors P32, P37, and P40 remain continuously conductive.

More specifically, the thin-film transistor P32 causes the high power-source voltage VDD to be supplied continuously to the output terminal OUT.

The thin-film transistor P37 causes the high power-source voltage VDD to be supplied continuously to the node B. This arrangement prevents the voltage change of the reset pulse from interfering with the node A via the thin-film transistor P34. The thin-film transistor P31 is free from the shifting of the off-operation point.

The voltage status described above is maintained for a period throughout which the voltage at the node C is maintained at the voltage Vc2. More specifically, the voltage at the node A is maintained at the high power-source voltage VDD until the set pulse is subsequently transitioned to the low level. As a result, the leak current of the thin-film transistor P31 is minimized.

The buffer 65 of the embodiment 39 operates in the same operation as the buffer 65 of the embodiment 33 and provides the same advantages as those of the buffer 65 of the embodiment 33. The buffer 65 of the embodiment 39 operates with the front section (such as the shift register) consuming less power.

Embodiment 40

A modification of the buffer 65 of the embodiment 23 is described below as an embodiment 40 of the present invention.

Figure 113:
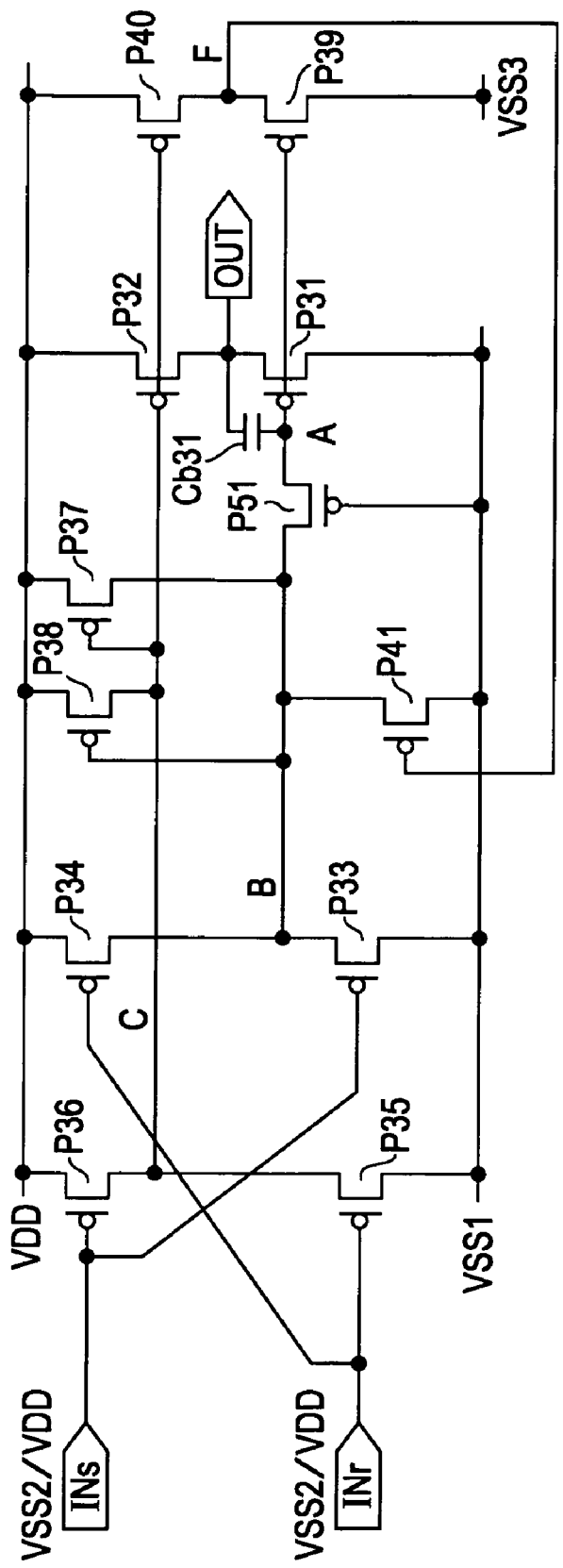
FIG. 113 is a circuit diagram of a buffer according to one embodiment of the present invention.

FIG. 113 illustrates the buffer 65 of the embodiment 40 of the present invention. In FIG. 113, elements identical to those illustrated in FIG. 101 are designated with the same reference numerals.

A comparison of FIG. 113 with FIG. 101 reveals that the buffer 65 of the embodiment 40 is generally similar in circuit structure to the buffer 65 of the embodiment 34.

The difference between the embodiments 34 and 40 is that the set pulse and the reset pulse are smaller in amplitude than the counterparts in the embodiment 34. More specifically, the set pulse and the reset pulse are driven at the two values of VDD and VSS2 (>VSS1) in the embodiment 40. The buffer 65 of the nineteenth embodiment corresponds to the buffer 65 of the embodiment 31 in drive waveform.

The relationship of the voltage statuses of the set pulse and the reset pulse and the voltage status of each node is described with reference to FIG. 114. The drive waveforms illustrated in FIG. 114 correspond to the respective drive waveforms illustrated in FIG. 96.

Figure 114:
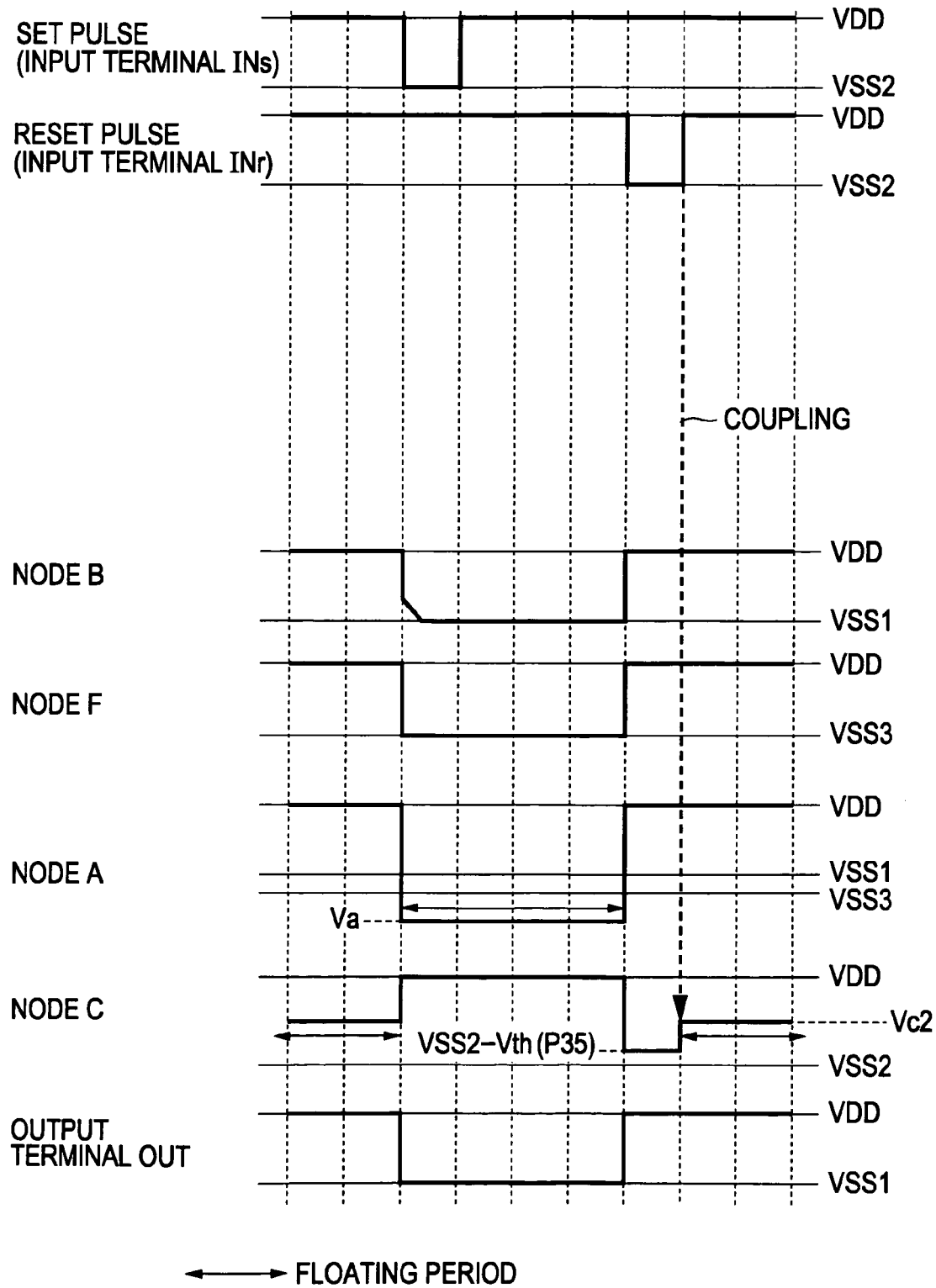
FIG. 114 illustrates drive waveforms of the buffer illustrated in FIG. 113.

In accordance with the nineteenth embodiment of the present invention, each of the signal amplitude of the set pulse (input terminal INs) and the signal amplitude of the reset pulse (input terminal INr) is also given between the two values VDD and VSS2 (>VSS1) as illustrated in FIG. 114.

At the moment the set pulse falls to the low level, the thin-film transistors P33 and P36 turn conductive.

In response, the voltage at the node B falls and the voltage at the node C rises to the high power-source voltage VDD as illustrated in FIG. 114.

The buffer 65 of the nineteenth embodiment includes no bootstrap circuit on the gate electrode side of the thin-film transistor P33. The voltage at the node B immediately subsequent to the falling edge of the set pulse to the low level falls only to a low level determined by a condition of VSS2−Vth(P33).

When the node B falls to the low level, the voltage at the output terminal OUT also falls to the low level. The voltage at the node A falls to the bootstrap voltage Va as illustrated in FIG. 114. Since the bootstrap voltage Va satisfies the condition of Va−VSS1<Vth(P31), the voltage at the output terminal OUT falls to the low power-source voltage VSS1 as illustrated in FIG. 114.

The voltage Va subsequent to the voltage falling satisfies a condition of Va−VSS3<Vth(P39), and the voltage at the node F becomes the third low power-source voltage VSS3 with the thin-film transistor P39 conductive as illustrated in FIG. 114.

The third low power-source voltage VSS3 is determined to satisfy the condition of VSS3−VSS1<Vth(P41) as previously described.

The thin-film transistor P41 turns conductive, thereby supplying the low power-source voltage VSS1 to the node B.

The thin-film transistor P36 is also conductive with the set pulse at the low level. The gate voltage of the thin-film transistor P32 forming the output stage (voltage at the node C) is thus controlled to the high power-source voltage VDD as illustrated in FIG. 114.

The set pulse then rises from the low level to the high level. During this voltage transition, a voltage change of the set pulse can interfere with the nodes B and C because of the coupling effect.

The gate electrode of the thin-film transistor P41 is supplied with the third low power-source voltage VSS3 via the node F as illustrated in FIG. 114.

For this reason, the thin-film transistor P41 remaining conductive causes the voltage at the node B to be fixed to the low power-source voltage VSS1 as illustrated in FIG. 114. This voltage status is characteristic of the nineteenth embodiment.

Even after the set pulse rises to the high level, the voltages at the nodes A, B, and F remain at the same level as when the set pulse is at the low level.

Since the voltage at the node B is maintained at the low power-source voltage VSS1, the thin-film transistor P38 remaining conductive continuously supplies the high power-source voltage VDD to the node C as illustrated in FIG. 114.

This means that the node C is insusceptible to the interference responsive to the voltage change of the set pulse (means that the off-operation point of the thin-film transistor P32 is not shifted).

This voltage status is maintained while the node B is at the low power-source voltage VSS1. More specifically, the node C is maintained at the high power-source voltage VDD until the reset pulse is subsequently transitioned to the low level. As a result, the leak current of the thin-film transistor P32 is minimized.

The node B biased at the low power-source voltage VSS1 means that the thin-film transistor P51 is at the cutoff state. The node A is maintained at the floating state at a bootstrap voltage (i.e., Va) as illustrated in FIG. 114. For this reason, the low power-source voltage VSS1 continuously appears at the output terminal OUT of the first output stage as illustrated in FIG. 114.

When the reset pulse is transitioned from the high level to the low level at the input terminal INr in FIG. 114, the thin-film transistor P35 becomes conductive. The voltage at the node C falls as illustrated in FIG. 114. The voltage at the node C is a voltage higher than the second low power-source voltage VSS2 by the threshold voltage value Vth(P35) of the thin-film transistor P35. More specifically, the node C falls to VSS2−Vth(P35).

The low level (VSS2−Vth(P35)) satisfies the following three conditions:

$$VSS2-Vth(P35)-VDD<Vth(P32),$$

$$VSS2-Vth(P35)-VDD<Vth(P37), \text{ and}$$

$$VSS2-Vth(P35)-VDD<Vth(P40).$$

Generally, the pulse amplitude (VSS2−VDD) is sufficiently larger than the threshold voltage value Vth, and all the above three conditions are satisfied.

When the node C falls to the low level, the thin-film transistor P32 turns conductive, and the voltage at the output terminal OUT rises to the high power-source voltage VDD as illustrated in FIG. 114.

The thin-film transistor P40 then turns conductive, thereby causing the voltage at the node F to rise to the high power-source voltage VDD as illustrated in FIG. 114.

The thin-film transistor P34 that has turned conductive controls the voltage at the node B to the high power-source voltage VDD as illustrated in FIG. 114. As a result, the node A is also controlled to the high power-source voltage VDD as illustrated in FIG. 114.

The reset pulse rises from the low level to the high level. During this voltage transition, a voltage change of the reset pulse interferes with the node C because of the capacitive coupling effect of the thin-film transistor P35 as illustrated in FIG. 114. Although the node C still maintains a low level, the voltage thereof rises to a voltage Vc2 as illustrated in FIG. 114.

The voltage Vc2 satisfies the following three conditions:

$$Vc2-VDD<Vth(P32),$$

$$Vc2-VDD<Vth(P37), \text{ and}$$

$$Vc2-VDD<Vth(P40).$$

As long as the three conditions are satisfied, the thin-film transistors P32, P37, and P40 remain continuously conductive.

More specifically, the thin-film transistor P32 causes the high power-source voltage VDD to be supplied continuously to the output terminal OUT.

The thin-film transistor P37 causes the high power-source voltage VDD to be supplied continuously to the node B. This arrangement prevents the voltage change of the reset pulse from interfering with the node A via the thin-film transistor P34. The thin-film transistor P31 is free from the shifting of the off-operation point.

The voltage status described above is maintained for a period throughout which the voltage at the node C is maintained at the voltage Vc2. More specifically, the voltage at the node A is maintained at the high power-source voltage VDD until the set pulse is subsequently transitioned to the low level. As a result, the leak current of the thin-film transistor P31 is minimized.

The buffer 65 of the nineteenth embodiment operates in the same operation as the buffer 65 of the embodiment 34 and provides the same advantages as those of the buffer 65 of the embodiment 34. The buffer 65 of the nineteenth embodiment operates with the front section (such as the shift register) consuming less power.

Embodiment 41

In the above description, the buffer 65 receives a pair of set and reset pulses. A buffer that receives a plurality of pairs of set and reset pulses can be implemented.

A buffer receiving two pairs of set and reset pulses is considered here.

Figure 115:
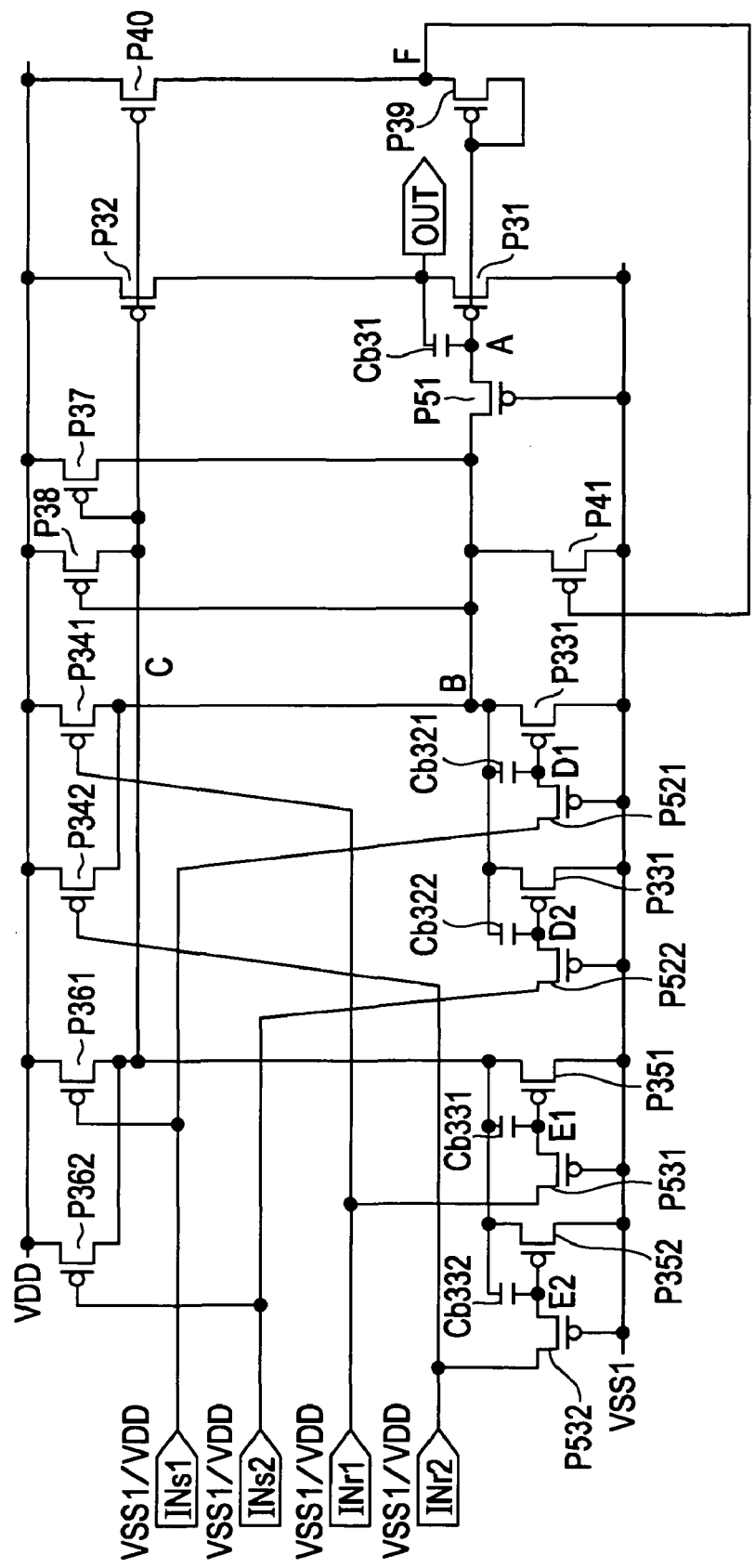
FIG. 115 is a circuit diagram of a buffer according to one embodiment of the present invention.

FIG. 115 illustrates a circuit structure in which the first input stage and the second input stage of the buffer 65 of the embodiment 23 (FIG. 79) are connected in parallel.

FIG. 115 also illustrates thin-film transistors P331, P341, P351, P361, P521, and P531, respectively corresponding to the thin-film transistors P33, P34, P35, P36, P52, and P53, for the first pair of set and reset pulses.

FIG. 115 illustrates thin-film transistors P332, P342, P352, P362, P522, and P532, respectively corresponding to the thin-film transistors P33, P34, P35, P36, P52, and P53, for the second pair of set and reset pulses.

With the two pairs of set and reset pulses input, a resulting buffer can vary in combination the pulse width of the output pulse and the output timing of the output pulse.

The number of inputs of set and reset pulses may be determined as necessary. It is not necessary that the number of inputs of set pulses be equal to the number of inputs of reset pulses. With such a circuit structure, a multi-input buffer receiving a plurality of control signals (including set and reset pulses) results.

Referring to FIG. 115, P331 and P332, P341 and P342, P351 and P352, P361 and P362, forming the first and second input stages, are respectively connected in parallel, with respect to the output terminals. Some or all of the pairs may be connected in series between the two operating power sources (such as VDD1 and VSS).

Figure 116:
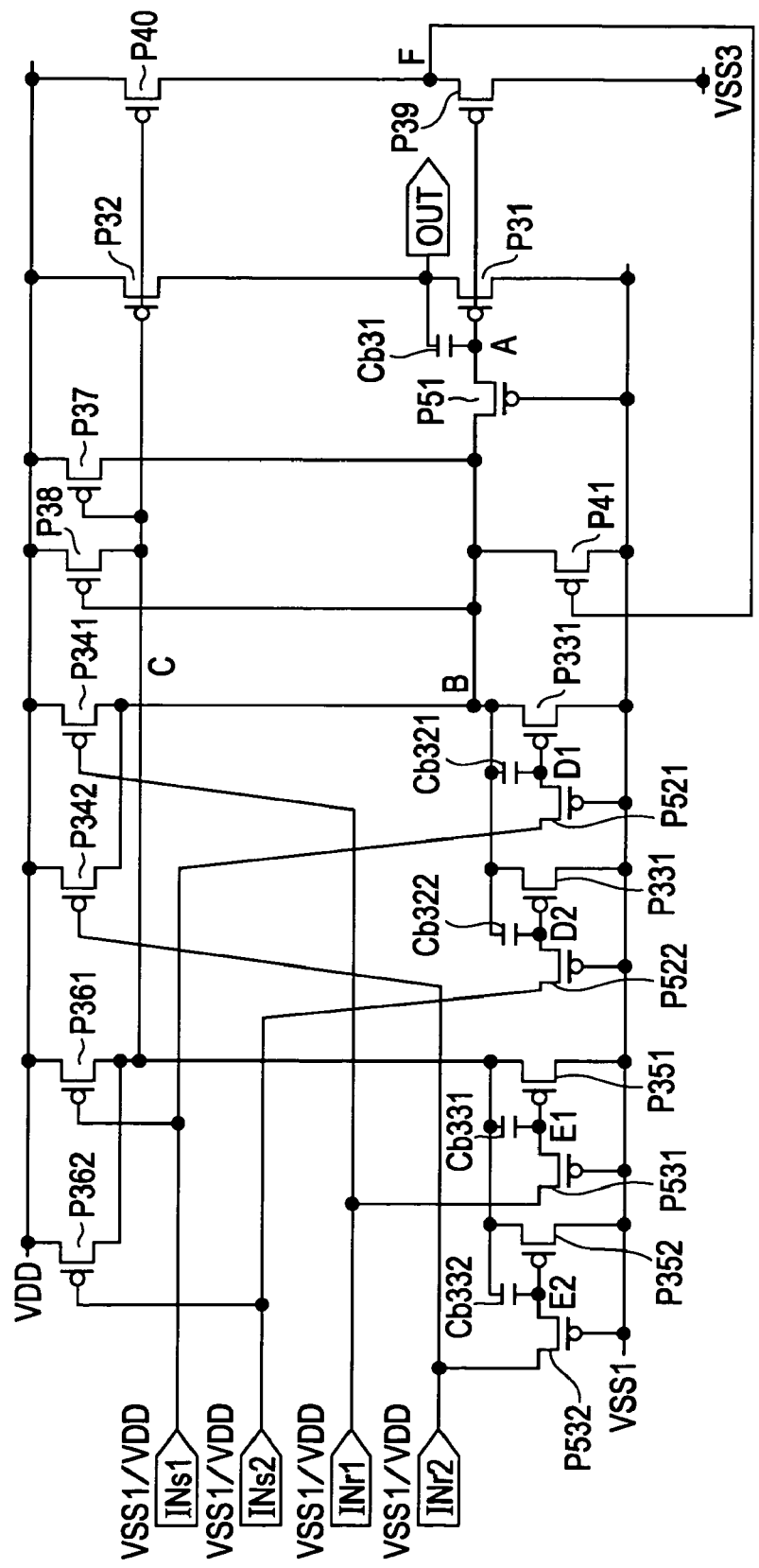
FIG. 116 is a circuit diagram of a buffer according to one embodiment of the present invention.

The circuit structure herein is applicable to any of the other embodiments. As illustrated in FIG. 116, for example, the first and second input stages of the buffer 65 of the embodiment 32 (FIG. 97) may be connected in parallel. In FIG. 116, the bootstrap auxiliary capacitance Cb is connected to the output terminal of each stage.

Referring to FIG. 116, the thin-film transistors P331, P341, P351, P361, P521, and P531 respectively correspond to the thin-film transistors P33, P34, P35, P36, P52, and P53 for the first pair of set and reset pulses.

Referring to FIG. 116, the thin-film transistors P332, P342, P352, P362, P522, and P532 respectively correspond to the thin-film transistors P33, P34, P35, P36, P52, and P53 for the second pair of set and reset pulses.

Embodiment 42

In each of the above-referenced embodiments, the one main electrode of the thin-film transistor P31 forming the first output stage is connected to the low power-source voltage VSS1.

Instead of supplying the low power-source voltage VSS1, a pulse signal line (a signal line providing any control pulse) may be connected.

Figure 117:
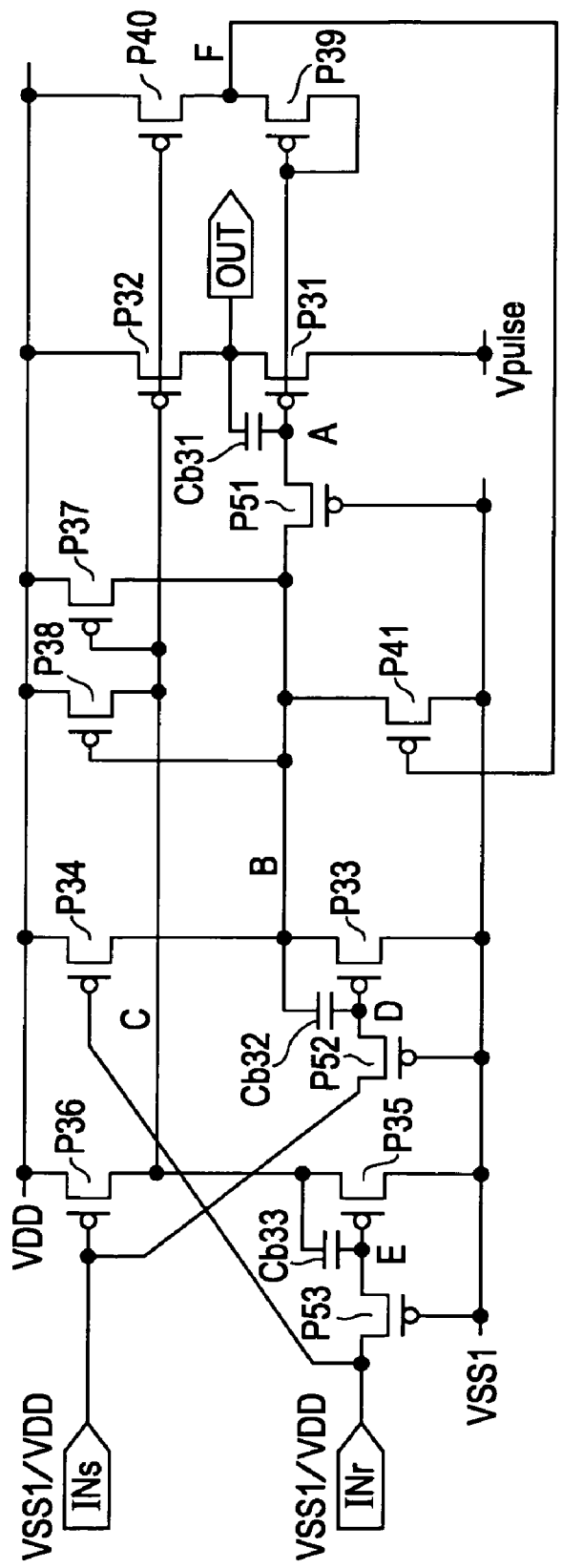
FIG. 117 is a circuit diagram of a buffer according to one embodiment of the present invention.

FIG. 117 illustrates a circuit structure in which a control pulse Vpulse is supplied to the thin-film transistor P31 forming the output stage of the embodiment 23.

Figure 118:
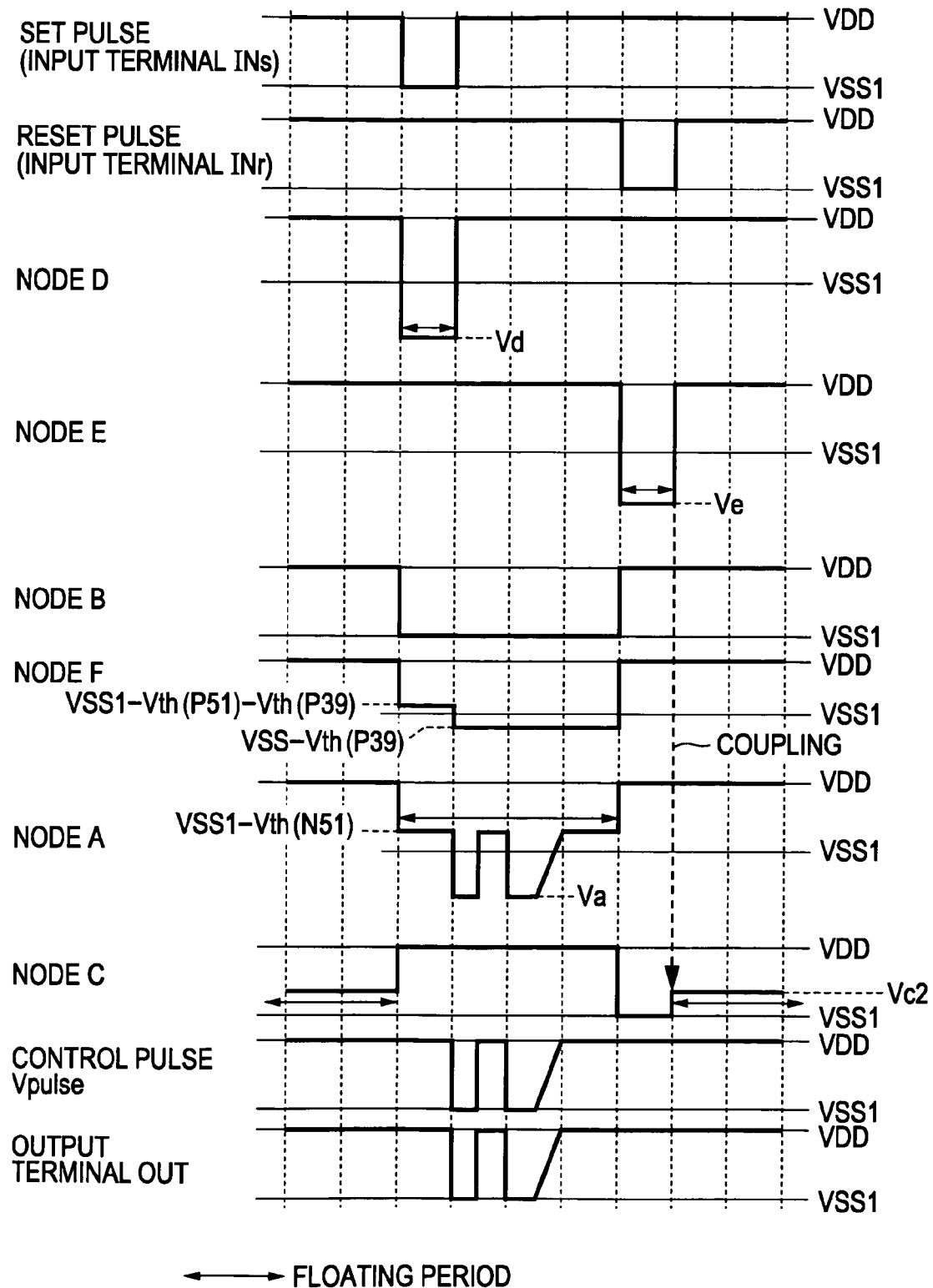
FIG. 118 illustrates drive waveforms of the buffer illustrated in FIG. 117.

FIG. 118 also illustrates the relationship of the voltage statuses of the set pulse and the reset pulse and the voltage status of each node in the circuit structure.

FIG. 118 further illustrates the voltage statuses of the set pulse at the input terminal INs, and the reset pulse at the input terminal INr.

FIG. 118 also illustrates the voltage status of the gate electrode of the thin-film transistor P33 (node D).

FIG. 118 further illustrates the voltage statuses of the gate electrode of the thin-film transistor P35 (node E), the control line connected to the output terminal of the first input stage (node B), the control line connected to the output terminal of the second output stage (node F), the gate electrode of the thin-film transistor P31 (node A), the control line connected to the output terminal of the second input stage (node C), and the output terminal OUT of the first output stage. FIG. 118 further illustrates the control pulse Vpulse supplied to a pulse signal line.

The operation starting with the falling edge of the set pulse is discussed.

At the moment the set pulse falls to the low level (first low power-source voltage VSS1), the node D at the first input stage falls to the low level. The thin-film transistor P33 then turns conductive, causing the voltage at the node B to fall as illustrated in FIG. 114.

As the voltage at the node B falls, the gate voltage of the thin-film transistor P33 (voltage at the node D) falls by a voltage excursion responsive to a charge accumulated on the bootstrap auxiliary capacitance Cb32 as illustrated in FIG. 118. The voltage subsequent to the voltage falling is Vd. If the voltage Vd satisfies Vd−VSS1<Vth(P33), the voltage at the node B becomes the low power-source voltage VSS1 with the thin-film transistor P33 conductive as illustrated in FIG. 118.

When the node B falls to the first low power-source voltage VSS1 as described above, the node A also falls to a low level determined by VSS1−Vth(P51) as illustrated in FIG. 118.

Since the voltage of the control pulse Vpulse supplied to the pulse signal line is the high power-source voltage VDD, the voltage of the output terminal OUT remains unchanged from the high power-source voltage VDD as illustrated in FIG. 118.

The voltage at the node A causes the thin-film transistor P39 to turn conductive. The voltage at the node F is VSS1−Vth(P51)−Vth(P39).

The voltage at the node F causes the thin-film transistor P41 to turn conductive, and the low power-source voltage VSS1 is supplied to the node B.

While the set pulse remains at the low level, the thin-film transistor P36 remains conductive. The gate voltage of the thin-film transistor P32 (voltage at the node C) is thus controlled to the high power-source voltage VDD as illustrated in FIG. 118.

The set pulse then rises from the low level to the high level. During this voltage transition, a voltage change of the set pulse interferes with the nodes B and C because of the coupling effect.

The thin-film transistor P41 remaining conductive continuously supplies the low level voltage to the node B. The effect of interference caused by the voltage change in the set pulse is thus marginal.

Since the voltage at the node B is maintained at the low power-source voltage VSS1, the thin-film transistor P38 remaining conductive continuously fixes the node C to the high power-source voltage VDD. This means that the node C is insusceptible to the interference responsive to the voltage change of the set pulse. As a result, the off-operation point of the thin-film transistor P32 is not shifted.

This voltage status is maintained until the reset pulse is subsequently transitioned to the low level.

In accordance with the embodiment 42, the control pulse Vpulse with the low level thereof being equal to the low power-source voltage VSS1 is input to the pulse signal line subsequent to the rising edge timing of the set pulse to the high power-source voltage VDD as illustrated in FIG. 118. The control pulse Vpulse includes two subpulses. The first subpulse has a pulse shape having a vertical falling edge followed a vertical rising edge. The second subpulse has a vertical falling edge followed by a rising slope. The thin-film transistor P31 turns conductive in response to the control pulse Vpulse, thereby causing the voltage at the output terminal OUT to fall. As the voltage at the output terminal OUT falls, the gate voltage of the thin-film transistor P31 (voltage at the node A) falls by a voltage excursion responsive to a charge accumulated on the bootstrap auxiliary capacitance Cb31 as illustrated in FIG. 118. If the voltage Va subsequent to the voltage falling satisfies Va−VSS1<Vth(P31), the voltage at the output terminal OUT becomes the low power-source voltage VSS1 with the thin-film transistor P31 conductive as illustrated in FIG. 118.

As the voltage at the node A falls, the voltage at the node F falls to Va−Vth(P39). The voltage subsequent to the voltage falling is sufficient to cause the thin-film transistor P41 to turn conductive.

When the reset pulse is transitioned from the high level to the low level at the input terminal INr in FIG. 86, the thin-film transistor P35 becomes conductive. The voltage at the node C falls as illustrated in FIG. 118. As the voltage at the node C falls, the gate voltage of the thin-film transistor P35 (voltage at the node E) falls by a voltage excursion responsive to a charge accumulated on the bootstrap auxiliary capacitance Cb33 as illustrated in FIG. 118. The resulting voltage subsequent to the voltage falling is Ve. If the voltage Ve satisfies a condition of Ve−VSS1<Vth(P35), the node C reaches the low power-source voltage VSS1 with the thin-film transistor P35 conductive as illustrated in FIG. 118.

When the node C falls to the low power-source voltage VSS1, the thin-film transistors P32 and P40 become conductive. The voltage of the output terminal OUT and the voltage at the node F then rise to the high power-source voltage VDD as illustrated in FIG. 118.

While the reset pulse remains at the low level, the thin-film transistor P34 remains conductive. The voltage at the node B is thus controlled to the high power-source voltage VDD as illustrated in FIG. 118. The gate electrode of the thin-film transistor P31 forming the first output stage (voltage at the node A) also rises to the high power-source voltage VDD. The reset pulse then rises from the low level to the high level. During this voltage transition, a voltage change of the reset pulse interferes with the node C because of the coupling effect.

Although the node C still maintains a low level, the voltage thereof rises from the low power-source voltage VSS1 to a voltage Vc2 as illustrated in FIG. 118.

The voltage Vc2 at the node C satisfies a condition of Vc2−VDD<Vth(P32). The thin-film transistor P32 continues to be conductive, and the voltage at the output terminal OUT is maintained at the high power-source voltage VDD as illustrated in FIG. 118.

Also, the voltage Vc2 at the node C satisfies Vc2−VDD<Vth(P37). The thin-film transistor P37 thus becomes conductive, and the high power-source voltage VDD is continuously supplied to the node B.

This means that the node C is insusceptible to the interference responsive to the voltage change of the set pulse (means that the off-operation point of the thin-film transistor P31 is not shifted).

The above-described voltage status is maintained while the node C is at the voltage Vc2. More specifically, the node B is kept to the high power-source voltage VDD until the set pulse is subsequently transitioned to the low level. As a result, the leak current of the thin-film transistor P31 is minimized.

With the above-described circuit structure, the bootstrap operation of the node A is executed in synchronization with the timing at which the control pulse Vpulse applied to the pulse signal line falls to the low power-source voltage VSS1 as illustrated in FIG. 118. An output pulse appearing at the output terminal OUT is a voltage change extracted from the control pulse Vpulse that is input between the timing of the falling edge of the set pulse and the timing of the falling edge of the reset pulse as illustrated in FIG. 118.

The above-referenced circuit structure allows the waveform of the output pulse to be adjusted. For example, the output pulse may be split into a plurality subpulses or may be adjusted in transient characteristics (falling edge and falling characteristics).

Figure 119:
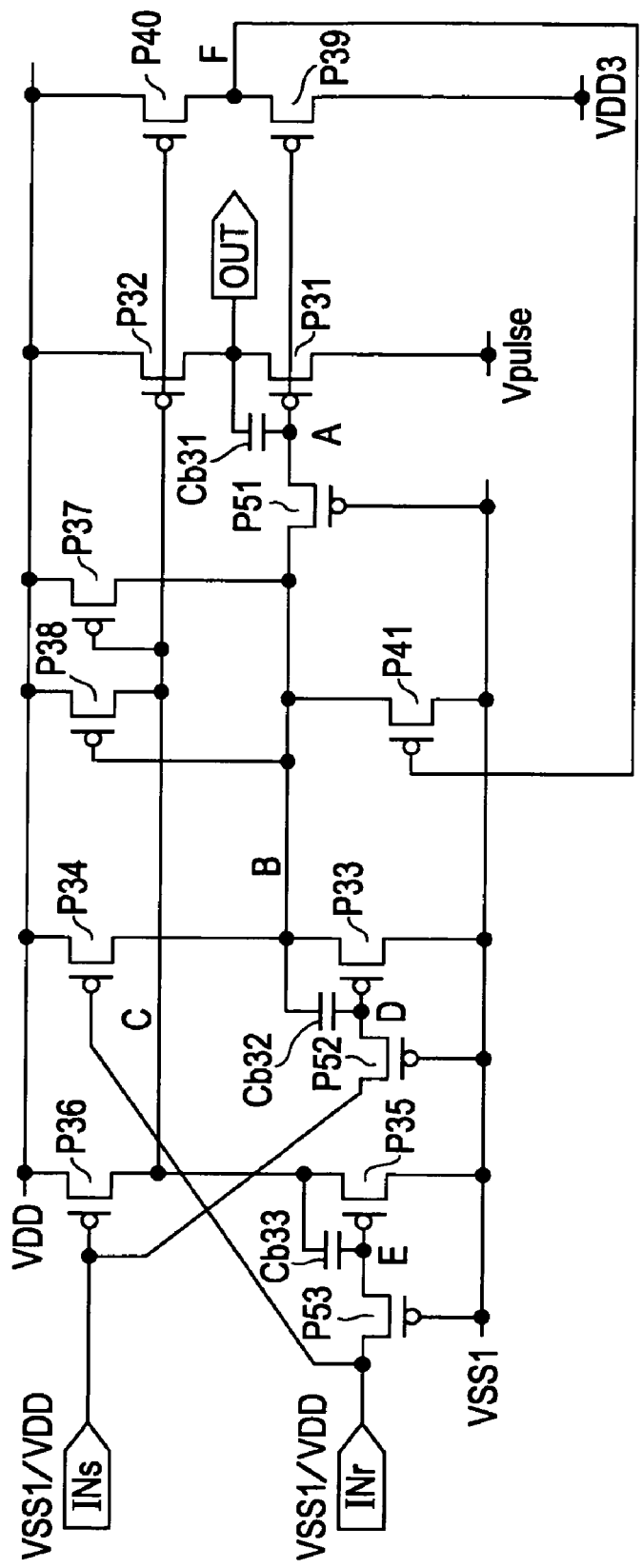
FIG. 119 is a circuit diagram of a buffer according to one embodiment of the present invention.

FIG. 119 illustrates a circuit structure in which a control pulse Vpulse is supplied to the thin-film transistor P31 forming the output stage of the embodiment 32.

Figure 120:
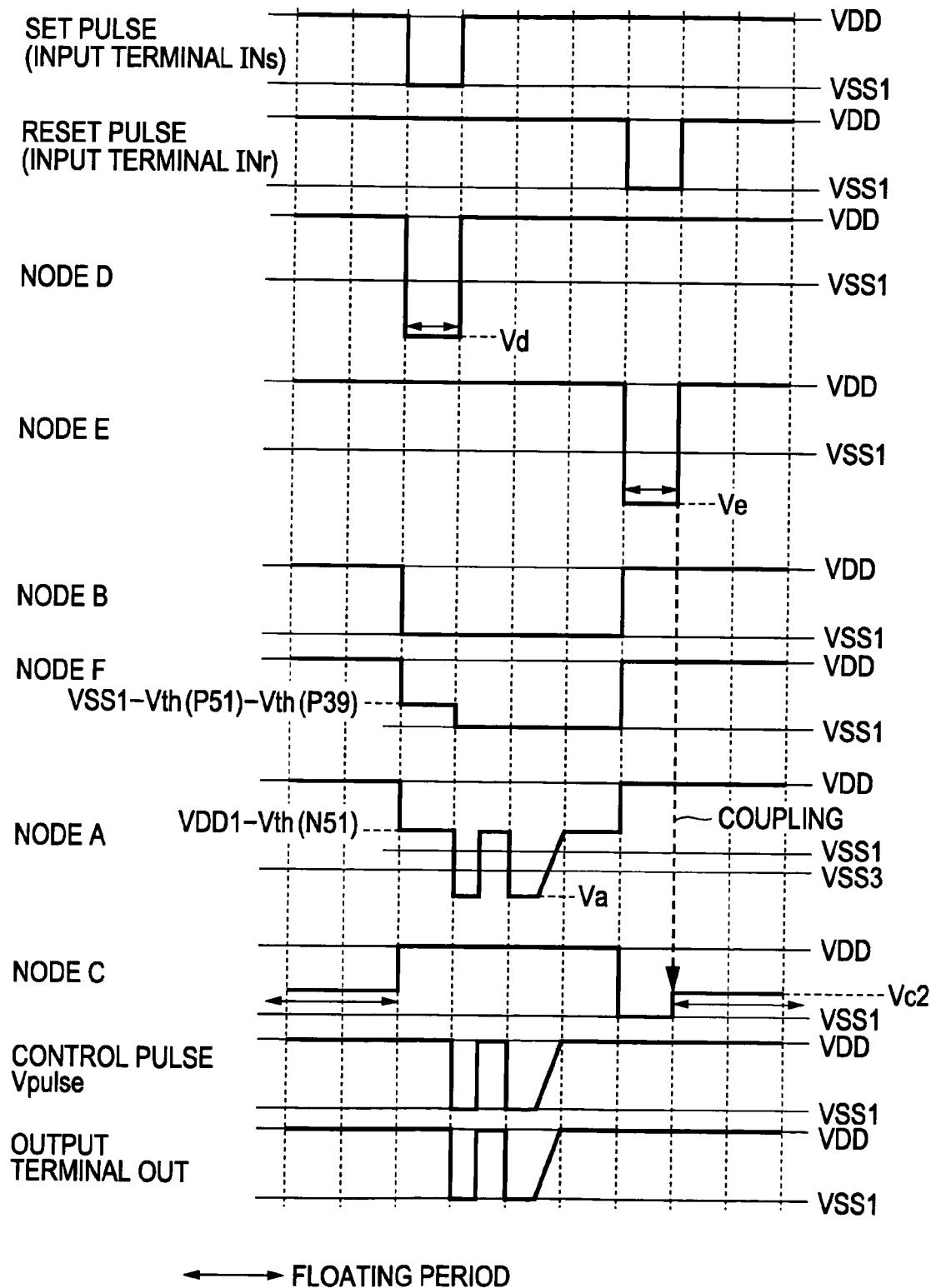
FIG. 120 illustrates drive waveforms of the buffer illustrated in FIG. 119.

FIG. 120 illustrates the relationship of the voltage statuses of the set pulse and the reset pulse and the voltage status of each node in the circuit structure.

The drive waveforms illustrated in FIG. 120 correspond to the respective drive waveforms illustrated in FIG. 118.

A comparison of FIG. 120 with FIG. 118 reveals that the two circuit structures are generally similar to each other. The difference between the two circuit structures lies in the voltage at the node F within the period from the rising edge of the set pulse to the falling edge of the reset pulse. The discussion that follows focuses on the difference.

The set pulse then rises from the low level to the high level. During this voltage transition, a voltage change of the set pulse interferes with the nodes B and C because of the coupling effect.

In this circuit structure, the thin-film transistor P41 remaining conductive continuously supplies the low level voltage to the node B. The effect of interference caused by the voltage change in the set pulse is also marginal.

In this condition, the control pulse Vpulse with the low level thereof being equal to the low power-source voltage VSS1 is input to the pulse signal line as illustrated in FIG. 120. The thin-film transistor P31 turns conductive in response to the control pulse Vpulse, thereby causing the voltage at the output terminal OUT to fall. As the voltage at the output terminal OUT falls, the gate voltage of the thin-film transistor P31 (voltage at the node A) falls by a voltage excursion responsive to a charge accumulated on the bootstrap auxiliary capacitance Cb31 as illustrated in FIG. 120. If the voltage Va subsequent to the voltage falling satisfies Va−VSS1<Vth(P31), the voltage at the output terminal OUT becomes the low power-source voltage VSS1 with the thin-film transistor P31 conductive as illustrated in FIG. 120.

As the voltage at the node A falls, a condition of Va−VSS3<Vth(P39) becomes satisfied. The voltage at the node F falls to the third low power-source voltage VSS3.

The voltage subsequent to the voltage falling is sufficient to cause the thin-film transistor P41 to turn conductive. The node B is thus continuously supplied with the low power-source voltage VSS1. The node B biased at the low level causes the thin-film transistor P38 to turn conductive, thereby fixing the voltage at the node C to the high power-source voltage VDD.

The rest of the operation of this circuit structure is identical to the preceding circuit structure illustrated in FIG. 117.

Other Embodiments

The above-referenced embodiments are related to the organic EL panel. In particular, the above-referenced embodiments are related to the control line driver transferring the control pulse in a vertical direction.

The above-described buffers are also applicable to a signal line driver triggering an application timing of the signal voltage Vsig to the signal line DTL.

The driver having the buffer described heretofore is also applicable to not only the organic EL panel but also another type of display panel.

The driver is applicable as a driver for panels including an light-emitting diode (LED) panel, a plasma display panel, a field emission display panel, and a liquid-crystal display panel. If a backlight source of a liquid-crystal display panel is an LED, the buffer described heretofore is applicable as a driver therefor. In order to variable-control the ratio of a on-light period within one field period, the on-light period is segmented into a plurality of durations within the one field period and the position and length of each on-light duration is variable-controlled. The driver described heretofore is suitable for such an application.

In the context of this specification, the display panel is not limited to a panel module in which one of a pixel array and a driver is formed on an insulator substrate through a semiconductor process. The display panels also include a panel that is constructed by manufacturing a driver on a separate substrate (such as application specific IC (ASIC)) and mounting the driver assembly onto an insulator substrate having a pixel array thereon.

Figure 121:
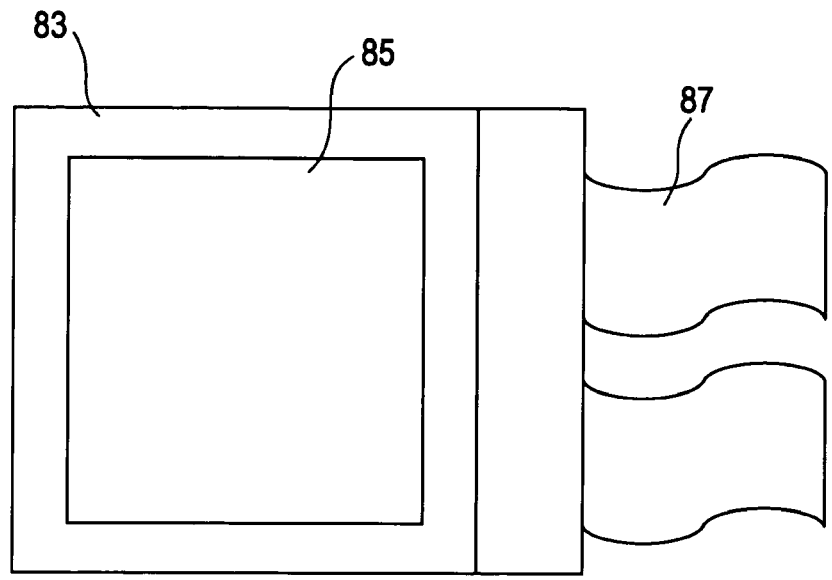
FIG. 121 is an external view of a display panel.

FIG. 121 illustrates an external appearance of a display panel 81. The display panel 81 includes a base substrate 83 and an opposing substrate 85 glued onto a formation area of a pixel array of the base substrate 83.

The base substrate 83 is made of glass, plastic, or any other insulating material.

The opposing substrate 85 is also made of glass, plastic, or any other insulating material.

Transparency of the substrate is different depending on the type of display panel. For example, the two substrate having a high transparency may be used for a liquid-crystal panel. In the case of a self-luminous display type, it is sufficient if the substrate on the output side of light flux is transparent.

The display panel 81 further includes a flexible printed circuit (FPC) 87 receiving an external signal and drive power.

Figure 122:
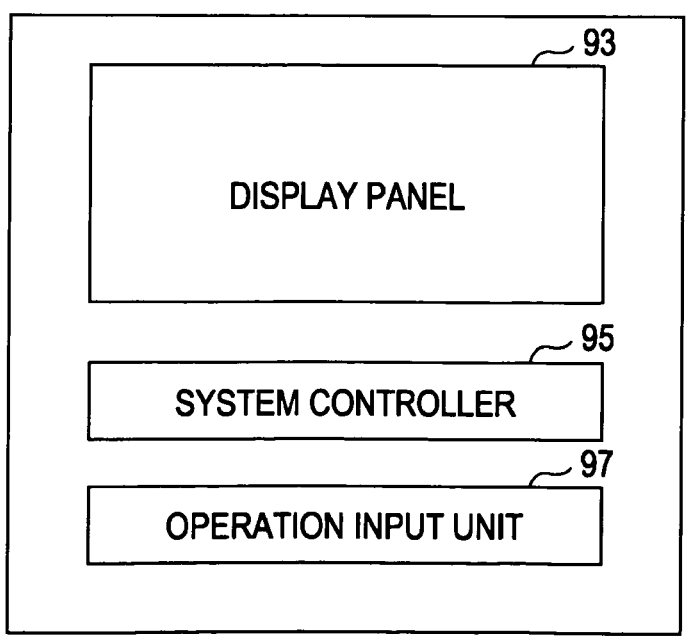
FIG. 122 is a functional block diagram of an electronic apparatus.

When the above-described display panel is shipped, the display panel is typically mounted in an electronic apparatus 91. FIG. 122 illustrates the concept of the electronic apparatus 91. The electronic apparatus 91 includes a display panel 93 having the above-described driver thereon, a system controller 95, and an operation input unit 97. The process executed by the system controller 95 is different depending on the type of the electronic apparatus 91 as a commercial product. The operation input unit 97 is a device receiving an operation input to the system controller 95. The operation input unit 97 includes switches, buttons, a mechanical interface, a graphic interface, etc.

Figure 123:
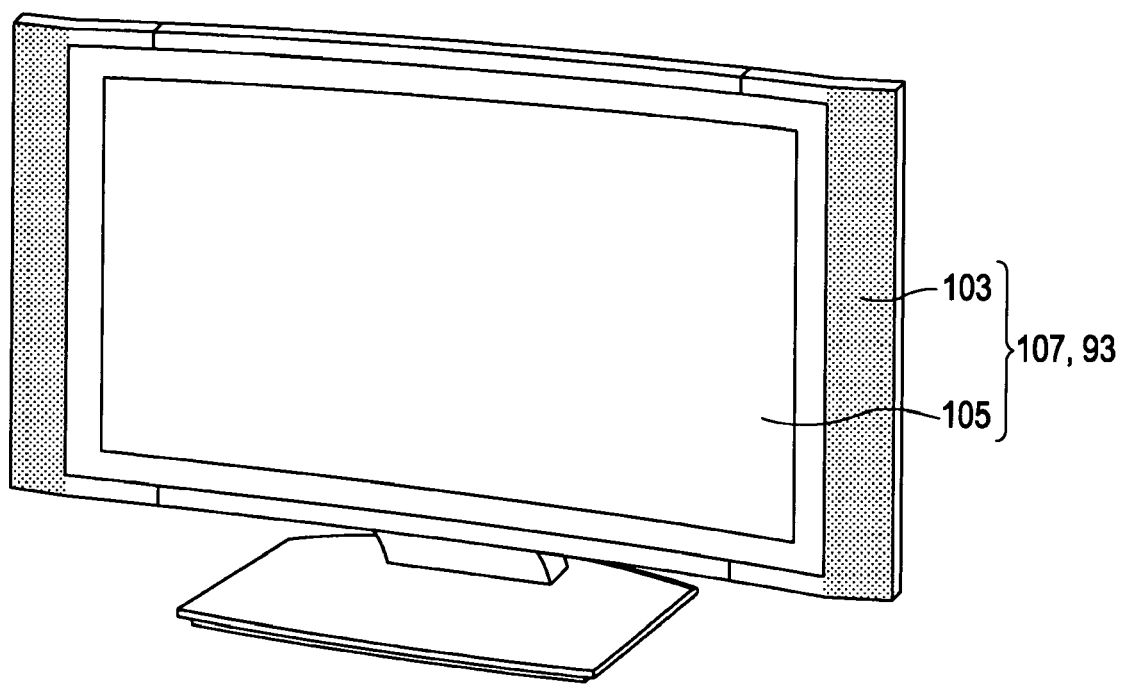
FIG. 123 illustrates a product example of the electronic apparatus.

FIG. 123 illustrates a television receiver 101 as an example of the electronic apparatus 91. The electronic apparatus 91 includes on the front side thereof a display screen 107 including a front panel 103, a filter glass 105, etc. The display screen 107 corresponds to the display panel 93 illustrated in FIG. 122.

Figure 124A:
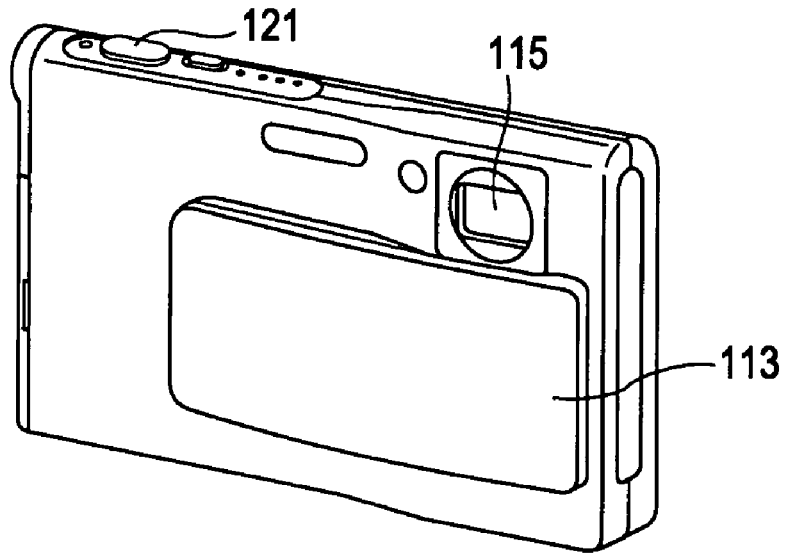
FIGS. 124A and 124B illustrate a product example of the electronic apparatus.
Figure 124B:
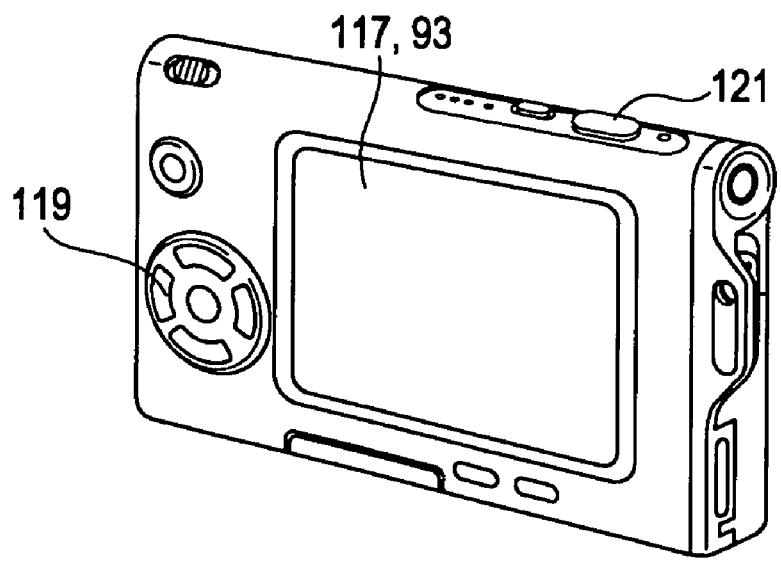

The electronic apparatus 91 may be applied as a digital camera 111. FIGS. 124A and 124B illustrate the external appearance of the digital camera 111. FIG. 124A is the external view of the front side (facing a subject) of the digital camera 111, and FIG. 124B is the external view of the rear side (facing a photographer) of the digital camera 111.

The digital camera 111 includes a protective cover 113, an imaging lens section 115, a display screen 117, control switches 119, and a shutter button 121. The display screen 117 corresponds to the display panel 93 illustrated in FIG. 122.

Figure 125:
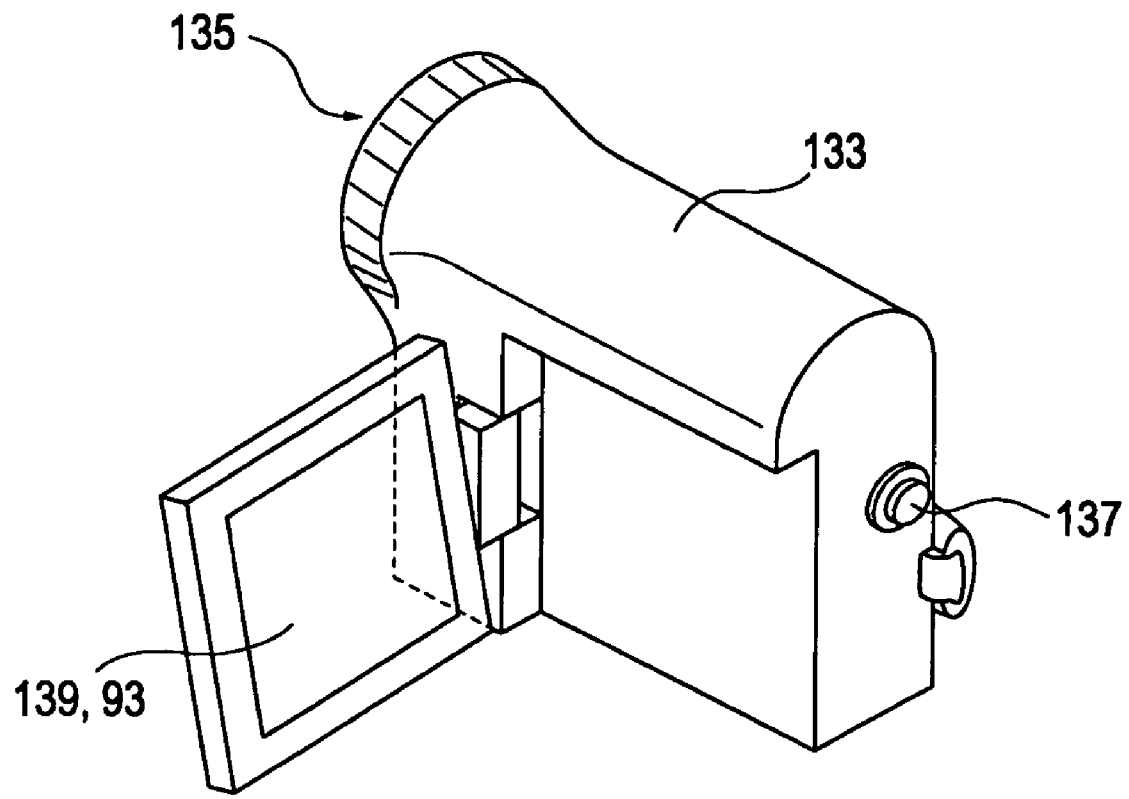
FIG. 125 illustrates a product example of the electronic apparatus.

The electronic apparatus 91 may be applied as a video camera 131. FIG. 125 illustrates the external appearance of the video camera 131.

The video camera 131 includes an imaging lens 135 capturing an image of a subject in front of a device body 133, an imaging start/stop switch 137, and a display screen 139. The display screen 139 corresponds to the display panel 93 illustrated in FIG. 122.

Figure 126A:
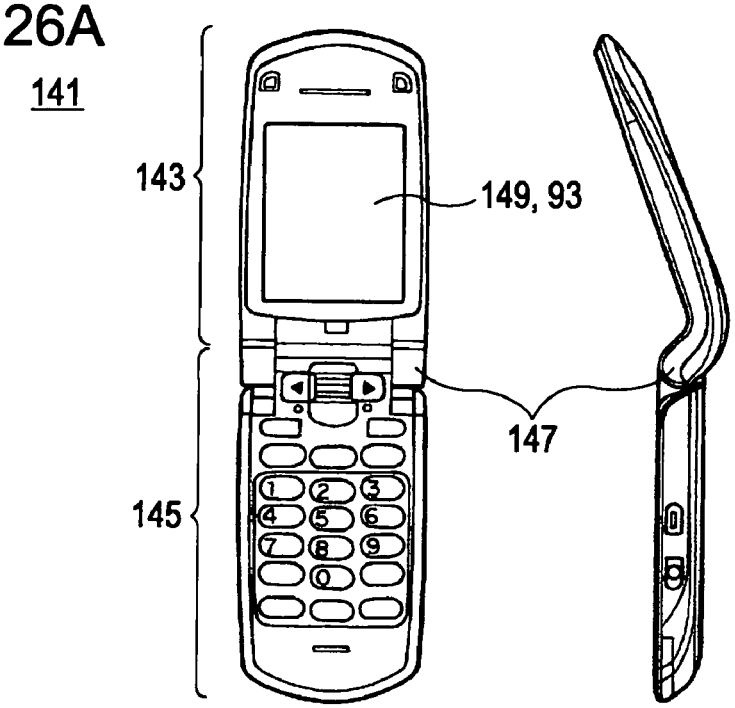
FIGS. 126A and 126B illustrates a product example of the electronic apparatus.
Figure 126B:
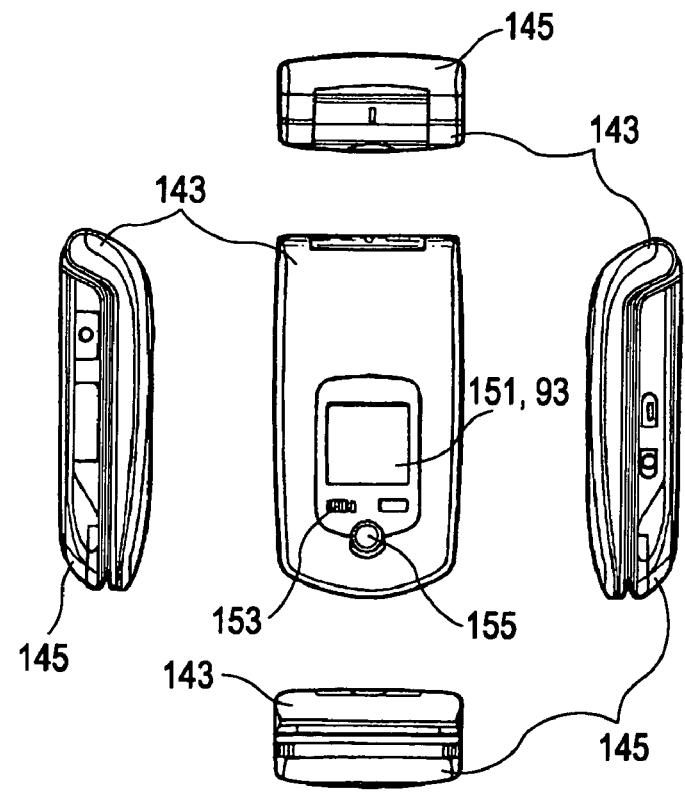

The electronic apparatus 91 may be applied as a cellular phone 141. FIGS. 126A and 126B illustrate the cellular phone 141 as a mobile terminal. The cellular phone 141 is a flip type phone. FIG. 126A is the external view of the cellular phone 141 flipped in an open state. FIG. 126B is the external view of the cellular phone 141 flipped in a closed state.

The cellular phone 141 includes an upper casing 143, a lower casing 145, a connection section (hinge section) 147, a display screen 149, an auxiliary display screen 151, a picture light 153, and an imaging lens 155. The display screen 149 and the auxiliary display screen 151 correspond to the display panel 93 illustrated in FIG. 122.

Figure 127:
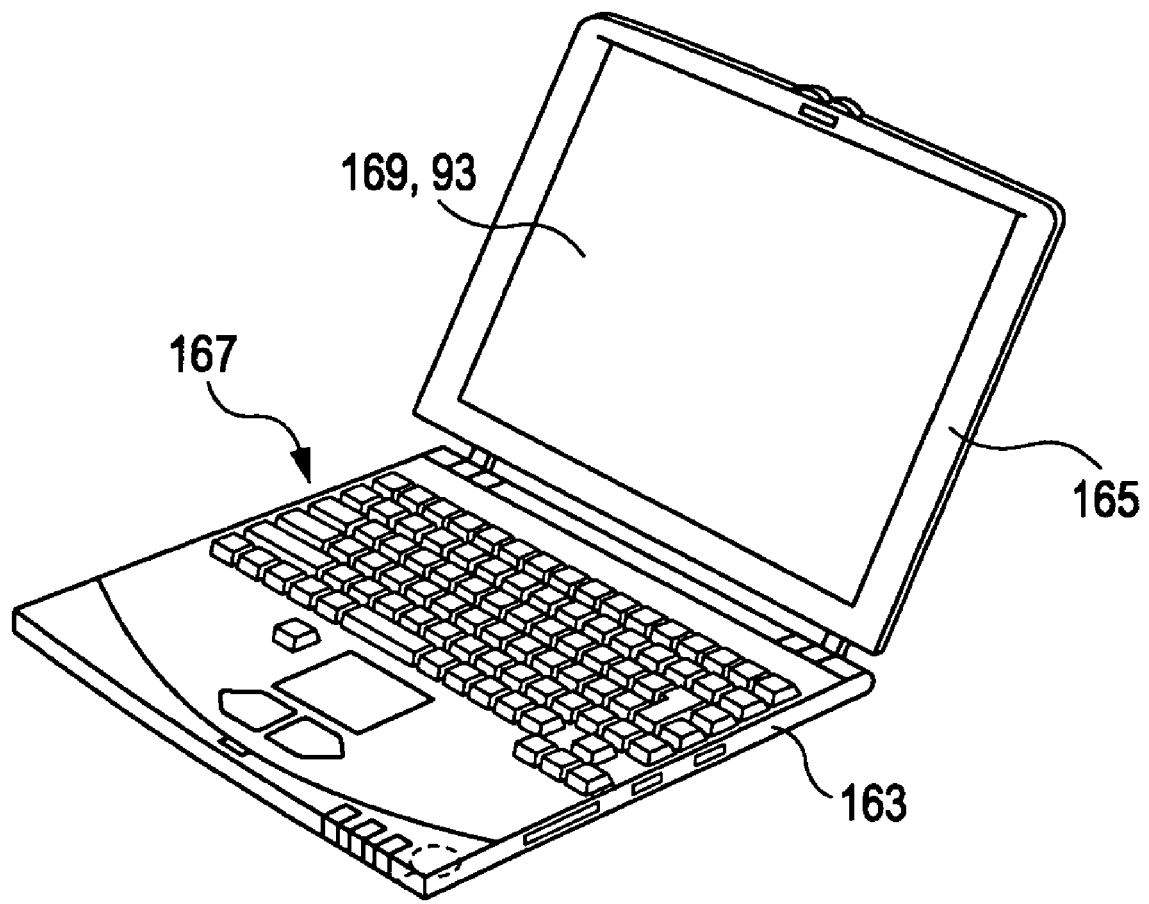
FIG. 127 illustrates a product example of the electronic apparatus.

The electronic apparatus 91 may be applied as a computer 161. FIG. 127 illustrates the computer 161.

The computer 161 includes a lower casing 163, an upper casing 165, a keyboard 167, and a display screen 169. The display screen 169 corresponds to the display panel 93 illustrated in FIG. 122.

Moreover, the electronic apparatuses may include an audio reproducing apparatus, a game playing apparatus, an electronic notebook and a computerized dictionary.

In the discussion heretofore, the buffer is applied as the driver that transfers the control pulse in the vertical direction of the display panel.

The buffer may be used to transfer the control pulse in the horizontal direction. The buffer may serve as a variety of types of buffers used in the display panel.

The buffer is a highly versatile basic circuit and may serve as a buffer for all the semiconductor devices.

The present application contains subject matter related to that disclosed in Japanese Priority Patent Application JP 2008-182115 filed in the Japan Patent Office on Jul. 12, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device having single-channel thin-film transistors formed on an insulator substrate, the semiconductor device comprising a buffer, the buffer including:
   a first output stage including a first thin-film transistor and a second thin-film transistor connected in series with the first thin-film transistor, the first output stage having as an output terminal as an intermediate junction point between the first thin-film transistor and the second thin-film transistor;
   a first input stage including a third thin-film transistor and a fourth thin-film transistor connected in series with the third thin-film transistor with the third thin-film transistor controlled by a set pulse and the fourth thin-film transistor controlled by a reset pulse, the first input stage controlling a voltage status of a first control line connected to a control electrode of the first thin-film transistor in response to a voltage appearing at an intermediate junction point between the third thin-film transistor and the fourth thin-film transistor so that the voltage status of the first control line is switched between a period from an application start timing of the set pulse to an application start timing of the reset pulse and the remaining period;

a second input stage including a sixth thin-film transistor and a fifth thin-film transistor connected in series with the sixth thin-film transistor with the six thin-film transistor controlled by the set pulse and the fifth thin-film transistor controlled by the reset pulse, the second input stage controlling a voltage status of a second control line connected to a control electrode of the second thin-film transistor in response to a voltage appearing at an intermediate junction point between the fifth thin-film transistor and the sixth thin-film transistor so that the voltage status of the second control line is switched in reverse phase to the voltage change of the first control line;

a seventh thin-film transistor having one main electrode connected to the first control line, the other main electrode connected to a power source commonly shared by the second, fourth, and sixth thin-film transistors, and a control electrode connected to the second control line;

an eighth thin-film transistor having one main electrode connected to the second control line, the other main electrode connected to the power source commonly shared by the second, fourth, and sixth thin-film transistors, and a control electrode connected to the first control line;

a second output stage including a ninth thin-film transistor and a tenth thin-film transistor connected in series with the ninth thin-film transistor with the ninth thin-film transistor having a control electrode connected to the first control line and the tenth thin-film transistor having a control electrode connected to the second control line, the second output stage supplying a voltage appearing at an intermediate junction point between the ninth thin-film transistor and the tenth thin-film transistor to a third control line; and an eleventh thin-film transistor having one main electrode connected to the first control line, and a control electrode connected to the third control line, the eleventh thin-film transistor supplying to the first control line a voltage at the same logical level as the set pulse for a period throughout which an output pulse appears at the output terminal.

2. The semiconductor device according to claim 1, wherein each of the set pulse and the reset pulse is smaller in amplitude than the output pulse appearing at the output terminal.

3. The semiconductor device according to claim 2, wherein the set pulse and the reset pulse are supplied by respective shift registers.

4. The semiconductor device according to claim 3, wherein the output pulse from the buffer controls a sampling timing on a display panel.

5. The semiconductor device according to claim 4, wherein the output pulse of the buffer controls a current supplying line on the display panel.

6. The semiconductor device according to claim 5, wherein the output pulse of the buffer controls a light-on operation of a self-luminous type display panel so that the period from the application start timing of the set pulse to the application start timing of the reset pulse results in the length of each light emission period falling within one field period.

7. The semiconductor device according to claim 6, wherein one main electrode of the first thin-film transistor receives a pulse signal that generates a plurality of output pulses within the period from the application start timing of the set pulse to the application start timing of the reset pulse.

8. The semiconductor device according to claim 7, wherein the ninth thin-film transistor is diode-connected.

9. A display panel comprising a pixel array having single-channel thin-film transistors formed on an insulator substrate; and a driver for driving a control line of the pixel array with a buffer, the buffer including:

a first output stage including a first thin-film transistor and a second thin-film transistor connected in series with the first thin-film transistor, the first output stage having as an output terminal as an intermediate junction point between the first thin-film transistor and the second thin-film transistor;

a first input stage including a third thin-film transistor and a fourth thin-film transistor connected in series with the third thin-film transistor with the third thin-film transistor controlled by a set pulse and the fourth thin-film transistor controlled by a reset pulse, the first input stage controlling a voltage status of a first control line connected to a control electrode of the first thin-film transistor in response to a voltage appearing at an intermediate junction point between the third thin-film transistor and the fourth thin-film transistor so that the voltage status of the first control line is switched between a period from an application start timing of the set pulse to an application start timing of the reset pulse and the remaining period;

a second input stage including a sixth thin-film transistor and a fifth thin-film transistor connected in series with the sixth thin-film transistor with the six thin-film transistor controlled by the set pulse and the fifth thin-film transistor controlled by the reset pulse, the second input stage controlling a voltage status of a second control line connected to a control electrode of the second thin-film transistor in response to a voltage appearing at an intermediate junction point between the fifth thin-film transistor and the sixth thin-film transistor so that the voltage status of the second control line is switched in reverse phase to the voltage change of the first control line;

a seventh thin-film transistor having one main electrode connected to the first control line, the other main electrode connected to a power source commonly shared by the second, fourth, and sixth thin-film transistors, and a control electrode connected to the second control line;

an eighth thin-film transistor having one main electrode connected to the second control line, the other main electrode connected to the power source commonly shared by the second, fourth, and sixth thin-film transistors, and a control electrode connected to the first control line;

a second output stage including a ninth thin-film transistor and a tenth thin-film transistor connected in series with the ninth thin-film transistor with the ninth thin-film transistor having a control electrode connected to the first control line and the tenth thin-film transistor having a control electrode connected to the second control line, the second output stage supplying a voltage appearing at an intermediate junction point between the ninth thin-film transistor and the tenth thin-film transistor to a third control line; and an eleventh thin-film transistor having one main electrode connected to the first control line, and a control electrode connected to the third control line, the eleventh thin-film transistor supplying to the first control line a voltage at the same logical level as the set pulse for a period throughout which an output pulse appears at the output terminal.

10. An electronic apparatus comprising a pixel array having single-channel thin-film transistors formed on an insulator substrate;
a driver for driving a control line of the pixel array with a buffer;
a system controller for controlling operation of the entire system of the electronic apparatus; and
an operation input unit for the system controller,
the buffer including:
a first output stage including a first thin-film transistor and a second thin-film transistor connected in series with the first thin-film transistor, the first output stage having as an output terminal as an intermediate junction point between the first thin-film transistor and the second thin-film transistor;
a first input stage including a third thin-film transistor and a fourth thin-film transistor connected in series with the third thin-film transistor with the third thin-film transistor controlled by a set pulse and the fourth thin-film transistor controlled by a reset pulse, the first input stage controlling a voltage status of a first control line connected to a control electrode of the first thin-film transistor in response to a voltage appearing at an intermediate junction point between the third thin-film transistor and the fourth thin-film transistor so that the voltage status of the first control line is switched between a period from an application start timing of the set pulse to an application start timing of the reset pulse and the remaining period;
a second input stage including a sixth thin-film transistor and a fifth thin-film transistor connected in series with the sixth thin-film transistor with the six thin-film transistor controlled by the set pulse and the fifth thin-film transistor controlled by the reset pulse, the second input stage controlling a voltage status of a second control line connected to a control electrode of the second thin-film transistor in response to a voltage appearing at an intermediate junction point between the fifth thin-film transistor and the sixth thin-film transistor so that the voltage status of the second control line is switched in reverse phase to the voltage change of the first control line;
a seventh thin-film transistor having one main electrode connected to the first control line, the other main electrode connected to a power source commonly shared by the second, fourth, and sixth thin-film transistors, and a control electrode connected to the second control line;
an eighth thin-film transistor having one main electrode connected to the second control line, the other main electrode connected to the power source commonly shared by the second, fourth, and sixth thin-film transistors, and a control electrode connected to the first control line;
a second output stage including a ninth thin-film transistor and a tenth thin-film transistor connected in series with the ninth thin-film transistor with the ninth thin-film transistor having a control electrode connected to the first control line and the tenth thin-film transistor having a control electrode connected to the second control line, the second output stage supplying a voltage appearing at an intermediate junction point between the ninth thin-film transistor and the tenth thin-film transistor to a third control line; and
an eleventh thin-film transistor having one main electrode connected to the first control line, and a control electrode connected to the third control line, the eleventh thin-film transistor supplying to the first control line a voltage at the same logical level as the set pulse for a period throughout which an output pulse appears at the output terminal.

* * * * *